(12) United States Patent
Nikitin et al.

(10) Patent No.: US 7,242,808 B2
(45) Date of Patent: *Jul. 10, 2007

(54) METHOD AND APPARATUS FOR ANALYSIS OF VARIABLES

(76) Inventors: Alexei V. Nikitin, 2124 Vermont St., Lawrence, KS (US) 66046; Ruslan L. Davidchack, 14a Grushevski St., Apt. 113, Stebnik, Lviv Re., 82172 (UA)

( * ) Notice: Subject to any disclaimer, the term of this patent is extended or adjusted under 35 U.S.C. 154(b) by 556 days.

This patent is subject to a terminal disclaimer.

(21) Appl. No.: 10/755,956

(22) Filed: Jan. 12, 2004

(65) Prior Publication Data

US 2004/0158592 A1 Aug. 12, 2004

Related U.S. Application Data

(62) Division of application No. 09/921,524, filed on Aug. 3, 2001, now Pat. No. 7,133,568.

(60) Provisional application No. 60/223,206, filed on Aug. 4, 2000.

(51) Int. Cl.
*G06K 9/76* (2006.01)
*G06K 9/40* (2006.01)

(52) U.S. Cl. .................... 382/210; 382/265

(58) Field of Classification Search ............ 382/265, 382/260, 210, 156, 157, 160, 261, 262, 263, 382/264

See application file for complete search history.

(56) References Cited

U.S. PATENT DOCUMENTS

| | | | |
|---|---|---|---|
| 3,631,509 A * | 12/1971 | Marshall | 347/143 |
| 4,513,440 A | 4/1985 | Delman | |
| 4,637,064 A * | 1/1987 | Roberts et al. | 455/67.14 |
| 4,682,230 A | 7/1987 | Perlman et al. | |
| 4,802,108 A * | 1/1989 | Bagdis et al. | 708/202 |
| 5,144,568 A | 9/1992 | Glover | |
| 5,315,171 A | 5/1994 | Blauer et al. | |
| 5,384,865 A | 1/1995 | Loveridge | |
| 5,408,675 A | 4/1995 | Florentino et al. | |
| 5,414,472 A | 5/1995 | Hwang | |
| 5,426,785 A | 6/1995 | Coffieid | |
| 5,446,501 A | 8/1995 | Takemoto et al. | |
| 5,532,948 A * | 7/1996 | Kohno et al. | 708/207 |
| 5,664,106 A * | 9/1997 | Caccavale | 709/224 |
| 5,913,188 A | 6/1999 | Tzirkel-Hancock | |
| 5,995,868 A | 11/1999 | Dorfmeister et al. | |
| 6,058,405 A * | 5/2000 | Kolte et al. | 708/304 |
| 6,121,817 A | 9/2000 | Yang et al. | |
| 6,199,084 B1 | 3/2001 | Wiseman | |
| 6,219,102 B1 | 4/2001 | Wagner et al. | |
| 6,223,083 B1 | 4/2001 | Rosar | |

FOREIGN PATENT DOCUMENTS

| | | |
|---|---|---|
| JP | 41047131 | 2/1999 |
| WO | 200175660 | 10/2001 |

OTHER PUBLICATIONS

Ochoa, E.; Allebach, J.P.; Sweeney, D.W.; Optical Median Filtering Using Threshold Decomposition; Applied Optics; Jan. 15, 1987; pp. 252-260; vol. 26, No. 2; US.

Paul, S.; Huper, K; Analog Rank Filtering; IEEE Transactions on Circuits and Systems—I: Fundamental Theory and Applications; Jul. 7, 1993; pp. 469-476; vol. 40, No. 7.

Urahama, K.; Nagao, T.; Direct Analog Rank Filtering; IEEE Transactions on Circuits and Systems—I: Fundamental Theory and Applications; Jul. 7, 1995; pp. 385-388; vol. 42, No. 7.

Nikitin, A.V.; Davidchack, R.L.; Armstrong, T.P.; The Effect of Pulse Pile-up on Threshold Crossing Rates in A System With A Known Impulse Response; Nuclear Instruments & Methods in Physics Research-Section A; 1998; pp. 1-29; A411; 159-171; Department of Physics and Astronomy, University of Kansas, Lawrence, Kansas, US.

Nikitin, A.V.; Pulse Pileup Effects In Counting Detectors; Ph.D. Thesis; Sep. 1998; Department of Physics and Astronomy, University of Kansas, Lawrence, Kansas, US.

Kebede, S; Kuosmanen, P.; Vainio, O; Astola, J.; Simple Circuit For Implementation Of An Analog Stack Filters; Symposium Article; Tampere University of Technology—Signal Processing Laboratory; May 1994; pp. 1-4; Tampere University of Technology; Finland.

Nicholson, D.R.; Introduction to Plasma Theory; Chapter 3—Plasma Kinetic Theory I: Klimontovich Equation; 1983; pp. 37-44; Krieger Publishing Company.

Nicholson, D.R.; Introduction to Plasma Theory; Chapter 4—Plasma Kinetic Theory II: Liouville Equation; 1983; pp. 45-47; Krieger Publishing Company.

* cited by examiner

*Primary Examiner*—Jerome Grant, II
(74) *Attorney, Agent, or Firm*—Mark E. Stallion; Blackwell Sanders Peper Martin LLP

(57) ABSTRACT

Various components of the present invention are collectively designated as Analysis of Variables Through Analog Representation (AVATAR). It is a method, processes, and apparatus for measurement and analysis of variables of different type and origin. AVATAR offers an analog solution to those problems of the analysis of variables which are normally handled by digital means. The invention allows (a) the improved perception of the measurements through geometrical analogies, (b) effective solutions of the existing computational problems of the order statistic methods, and (c) extended applicability of these methods to analysis of variables.

The invention employs transformation of discrete or continuous variables into normalized continuous scalar fields, that is, into objects with mathematical properties of density and/or cumulative distribution functions. In addition to dependence on the displacement coordinates (thresholds), these objects can also depend on other parameters, including spatial coordinates (e.g., if the incoming variables are themselves scalar or vector fields), and/or time (if the variables depend on time). Moreover, this transformation of the measured variables may be implemented with respect to any reference variable. Thus, the values of the reference variable provide a common unit, or standard, for measuring and comparison of variables of different natures, for assessment of mutual dependence of these variables, and for evaluation of changes in the variables and their dependence with time.

The invention enables, on a consistent general basis, a variety of new techniques for analysis of variables, which can be implemented through various physical means in continuous action machines as well as through digital means or computer calculations. Several of the elements of these new techniques do have digital counterparts, such as some rank order techniques in digital signal and image processing. However, this invention significantly extends the scope and applicability of these techniques and enables their analog implementation. The invention also introduces a wide range of signal analysis tools which do not exist, and cannot be defined, in the digital domain. In addition, by the present invention, all existing techniques for statistical processing of data, and for studying probability fluxes, are made applicable to analysis of any variable.

81 Claims, 67 Drawing Sheets

MTD FOR SINGLE VARIABLE / COMPONENT OF ENSEMBLE

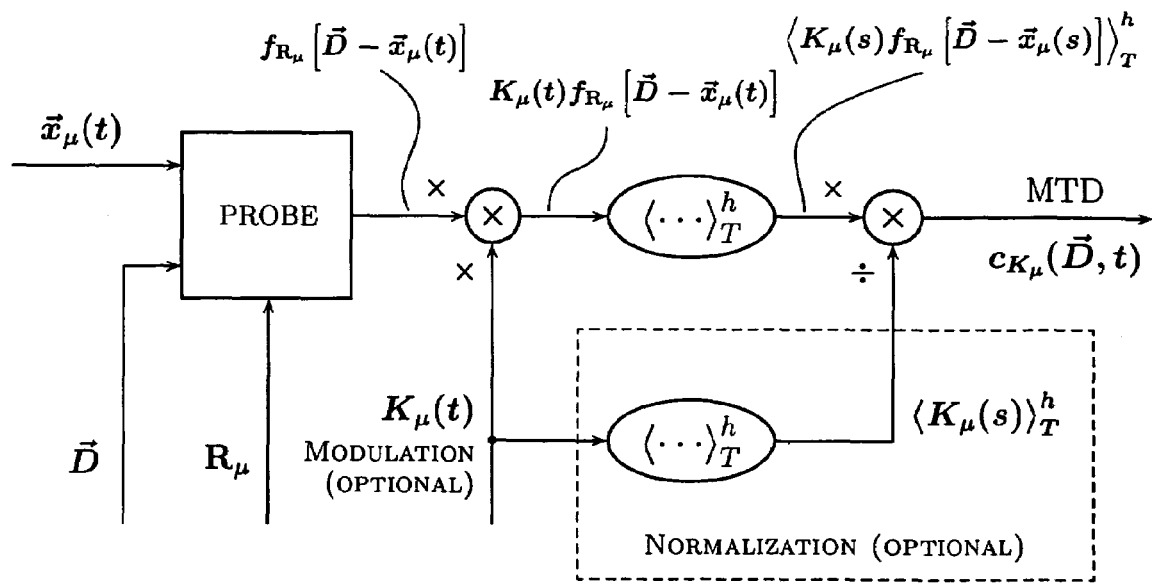

ACQUISITION SYSTEM: MEASURING DEVICE (PROBE)
HAS INPUT-OUTPUT CHARACTERISTIC OF DIFFERENTIAL DISCRIMINATOR.

$\vec{x}_\mu(t)$ IS INPUT VARIABLE, SCALAR OR VECTOR, OR COMPONENT OF ENSEMBLE.
E.G., SURFACE (IMAGE) GIVEN BY MATRIX CAN BE VIEWED AS DISCRETE ENSEMBLE.

$\vec{D}$ AND $R_\mu$ ARE PARAMETERS OF PROBE. $\vec{D}$ IS ANOTHER VARIABLE (NORMALLY OF SAME NATURE AS INPUT VARIABLE), SERVING AS UNIT, OR DATUM. $R_\mu$ IS WIDTH, OR RESOLUTION, PARAMETER.

$K_\mu(t)$ IS MODULATING VARIABLE, GENERALLY OF DIFFERENT NATURE THAN INPUT VARIABLE. E.G., $K_\mu(t) =$ constant LEADS TO MTD AS AMPLITUDE DENSITY, AND $K_\mu(t) = |\dot{\vec{x}}_\mu(t)|$ LEADS TO MTD AS COUNTING DENSITY/RATE.

Fig. 7

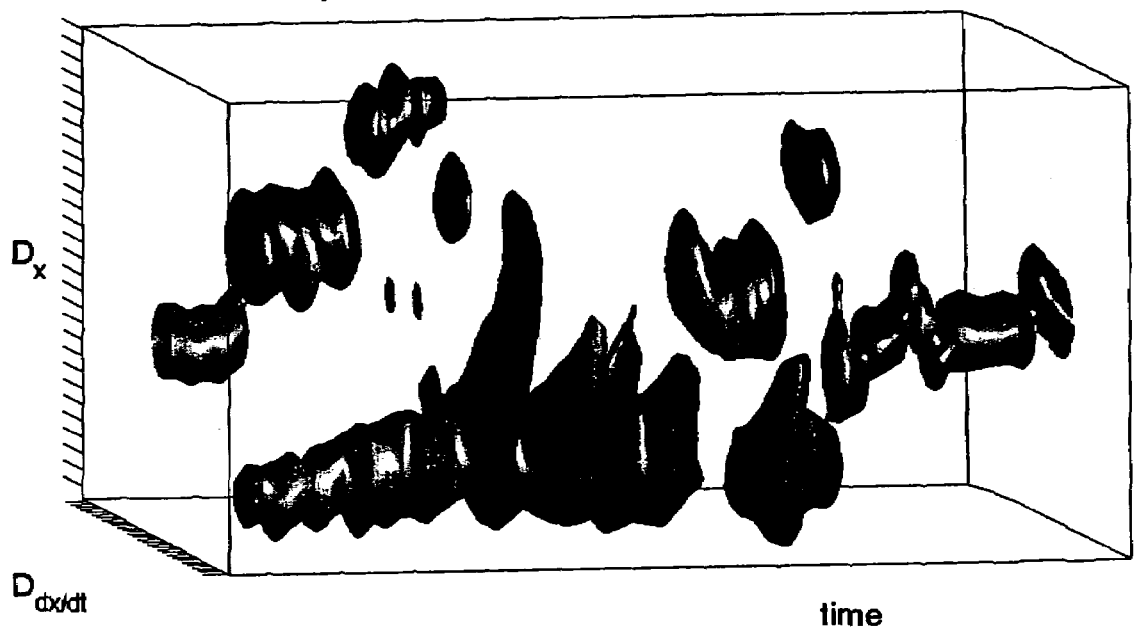
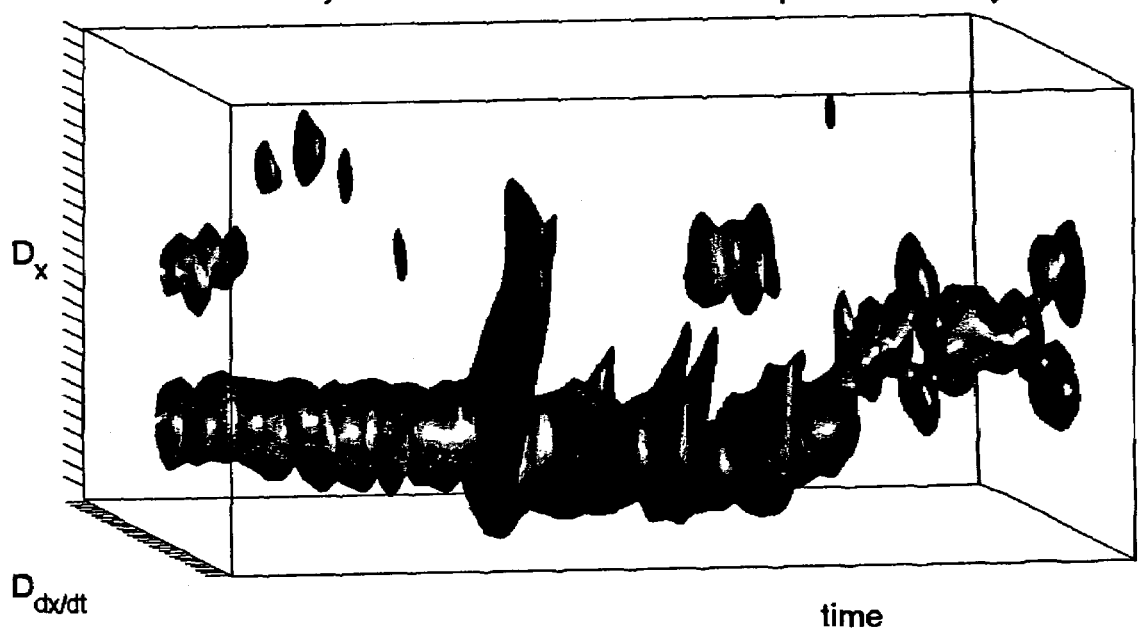
Fig. 16

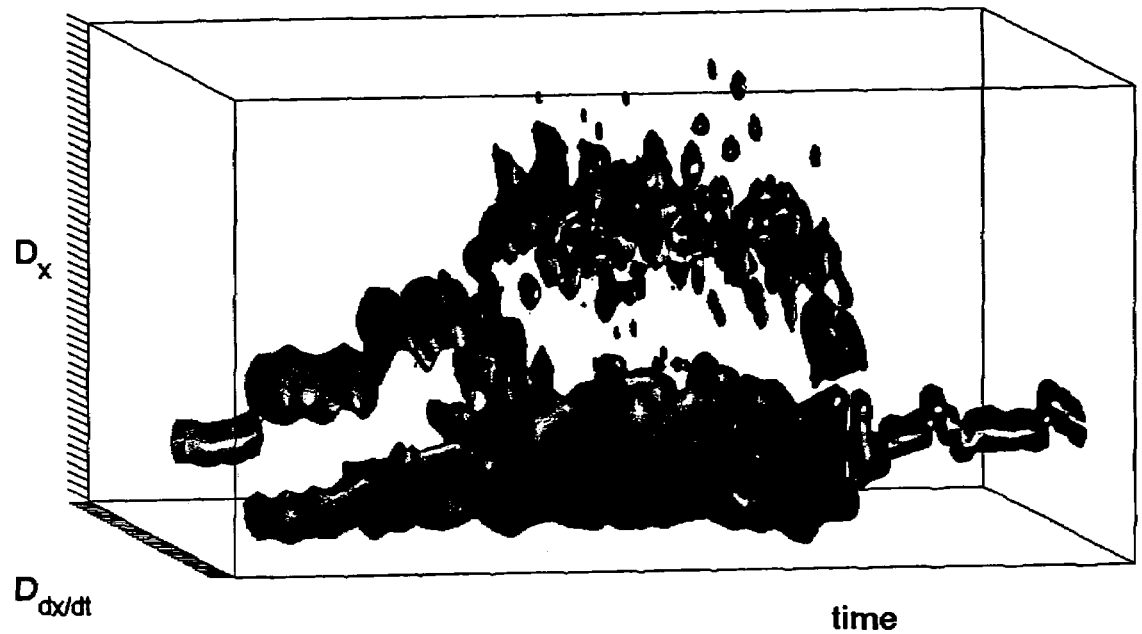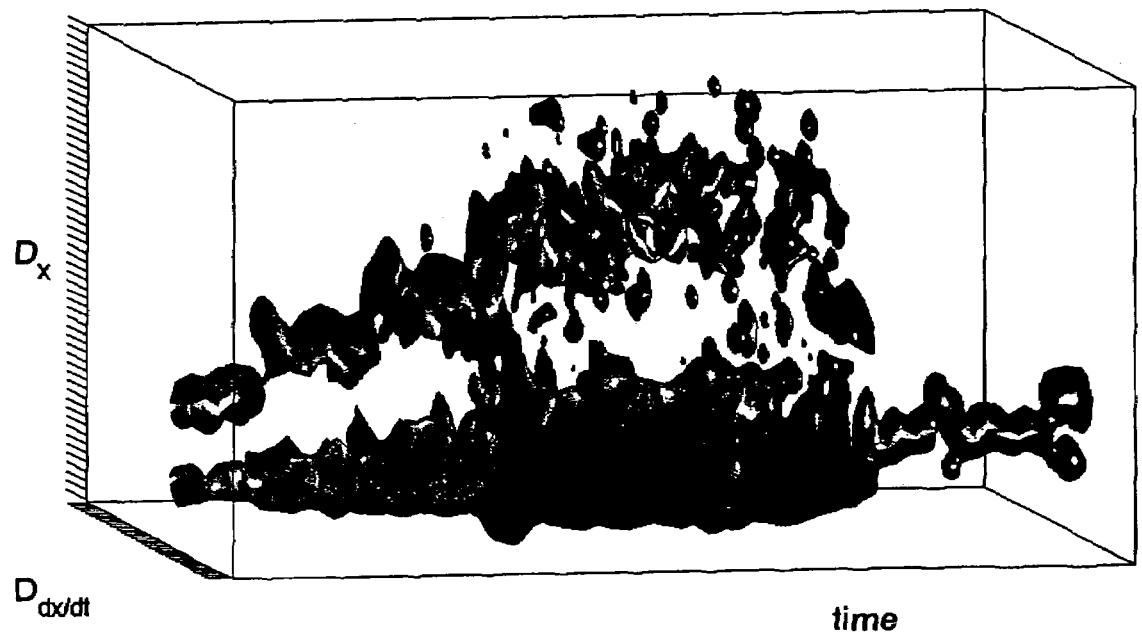
Fig. 17

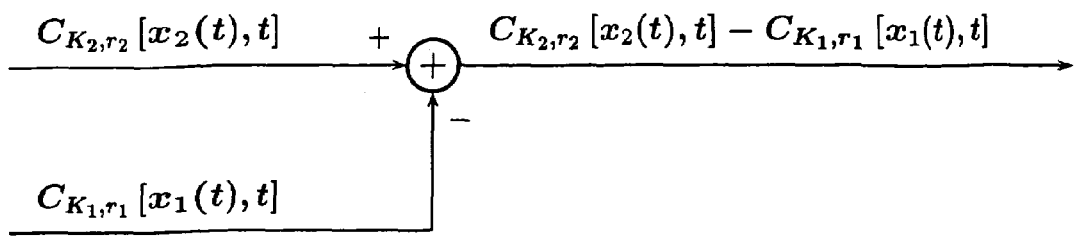
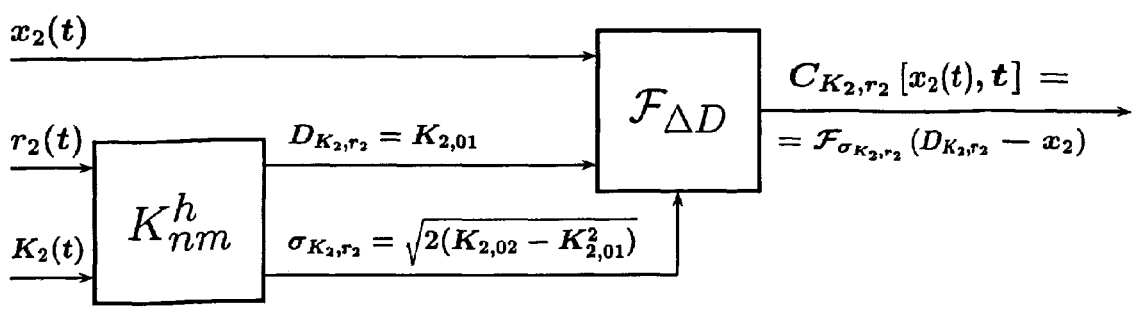
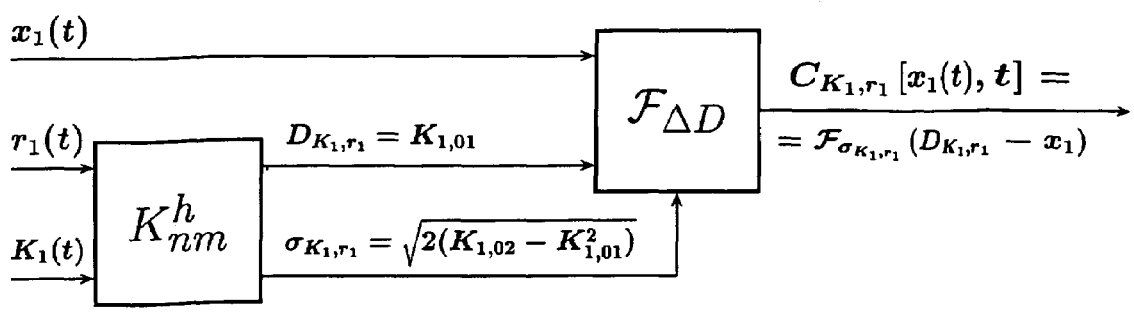
Fig. 31

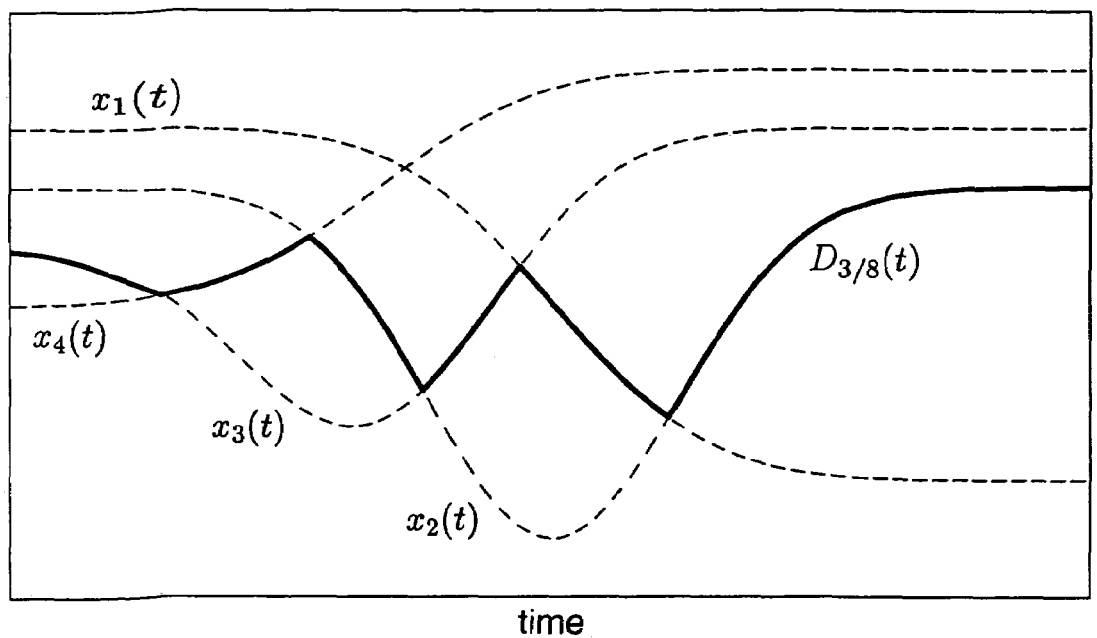
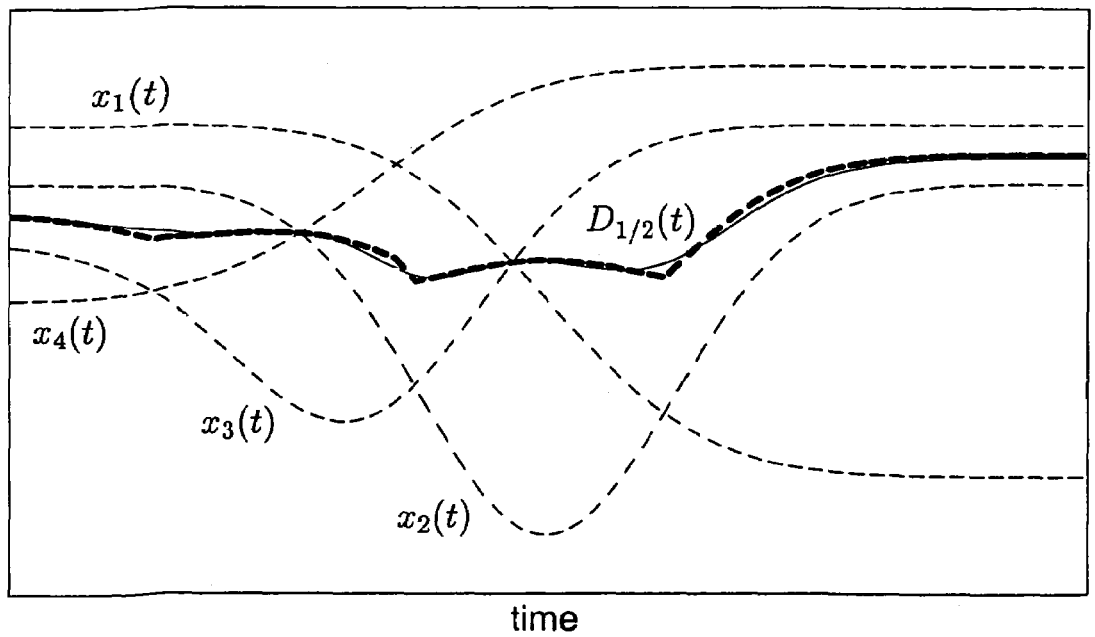
Fig. 44

MTD FOR SCALAR FIELD

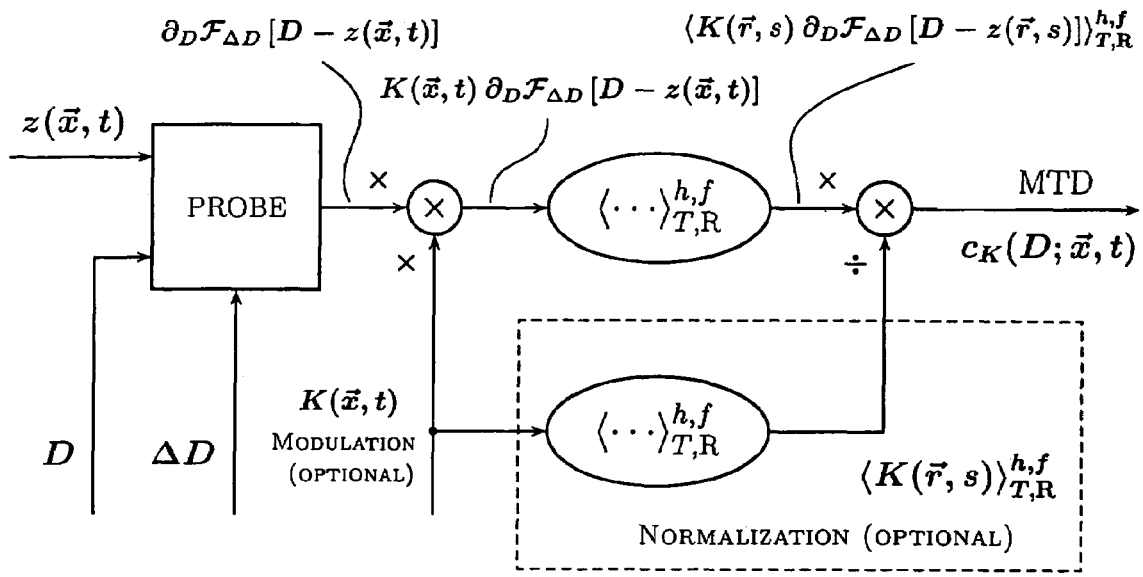

ACQUISITION SYSTEM: MEASURING DEVICE (PROBE)
HAS INPUT-OUTPUT CHARACTERISTIC OF DIFFERENTIAL DISCRIMINATOR.

$z(\vec{x}, t)$ IS INPUT SCALAR VARIABLE (FIELD). E.G., MONOCHROME 2D-SURFACE (IMAGE) CAN BE VIEWED EITHER AS CONTINUOUS 2D SCALAR FIELD, OR AS DISCRETE ENSEMBLE OF VARIABLES.

$D$ AND $\Delta D$ ARE PARAMETERS OF PROBE. $D$ IS DISPLACEMENT, OR THRESHOLD. IT IS ANOTHER VARIABLE (NORMALLY OF SAME NATURE AS INPUT VARIABLE), SERVING AS UNIT, OR DATUM. $\Delta D$ IS WIDTH, OR RESOLUTION, PARAMETER OF PROBE.

$K(\vec{x}, t)$ IS MODULATING VARIABLE, GENERALLY OF DIFFERENT NATURE THAN INPUT VARIABLE. E.G., $K(\vec{x}, t) = $ constant LEADS TO MTD AS AMPLITUDE DENSITY, AND $K(\vec{x}, t) = |\dot{z}(\vec{x}, t)|$ LEADS TO MTD AS COUNTING DENSITY/RATE.

Fig. 48

1
2
3a ($n=0$)
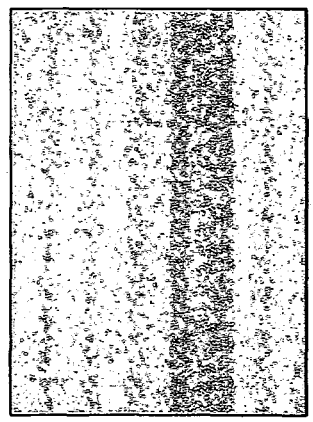
3b ($n=N$)
3c ($n=2N$)
3d ($n=3N$)
3e ($n=4N$)
3f ($n=6N$)
3g ($n=10N$)
Fig. 50

1a
2a
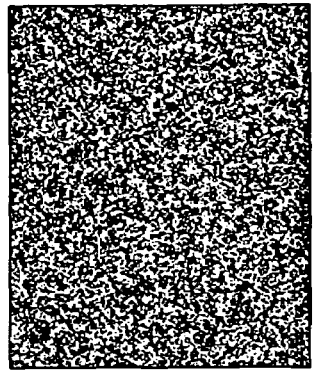
3a
1b
2b
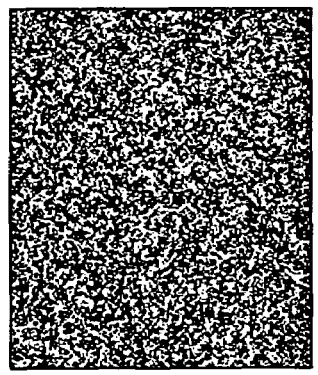
3b
1c
2c
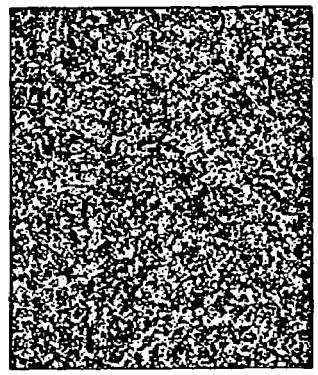
3c
Fig. 51

MTD FOR COMPONENT OF ENSEMBLE OF VECTOR FIELDS

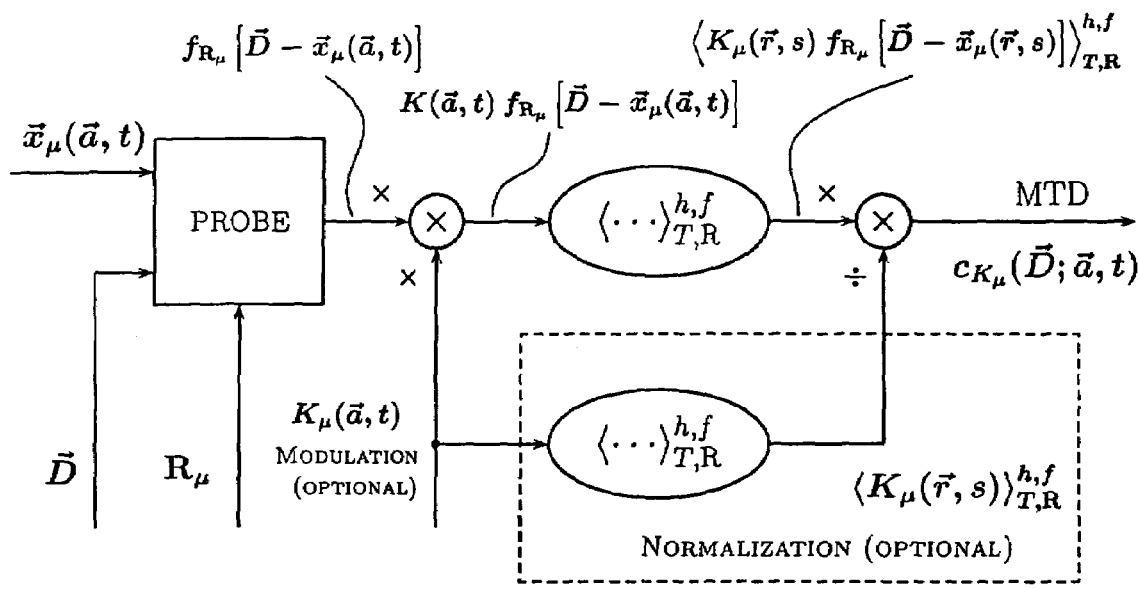

ACQUISITION SYSTEM: MEASURING DEVICE (PROBE)
HAS INPUT-OUTPUT CHARACTERISTIC OF DIFFERENTIAL DISCRIMINATOR.

$\vec{x}_\mu(\vec{a},t)$ IS INPUT VECTOR VARIABLE (FIELD). E.G., TRUECOLOR IMAGE CAN BE VIEWED AS CONTINUOUS 3D VECTOR FIELD (WITH 2D POSITION VECTOR $\vec{a}$).

$\vec{D}$ AND $R_\mu$ ARE PARAMETERS OF PROBE. $\vec{D}$ IS DISPLACEMENT, OR THRESHOLD. IT IS ANOTHER VARIABLE (NORMALLY OF SAME NATURE AS INPUT VARIABLE), SERVING AS UNIT, OR DATUM. $R_\mu$ IS WIDTH, OR RESOLUTION, PARAMETER.

$K_\mu(\vec{a},t)$ IS MODULATING VARIABLE, GENERALLY OF DIFFERENT NATURE THAN INPUT VARIABLE. E.G., $K(\vec{a},t) = $ constant LEADS TO MTD AS AMPLITUDE DENSITY, AND $K_\mu(\vec{a},t) = |\dot{\vec{x}}_\mu(\vec{a},t)|$ LEADS TO MTD AS COUNTING DENSITY/RATE.

Fig. 52

OUTPUTS OF DIGITAL MEDIAN FILTER AND SQUARE WINDOW MEDIAN AARF
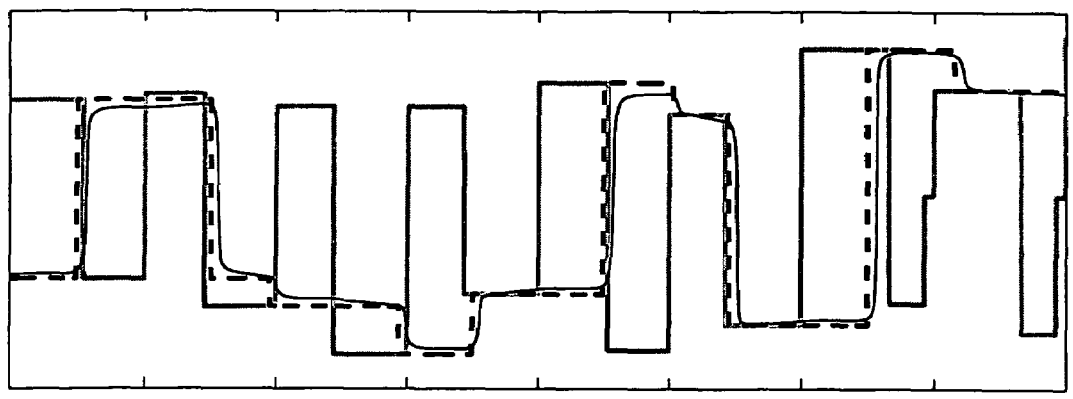
I
OUTPUTS OF DIGITAL MEDIAN FILTER AND SQUARE WINDOW MEDIAN ARS
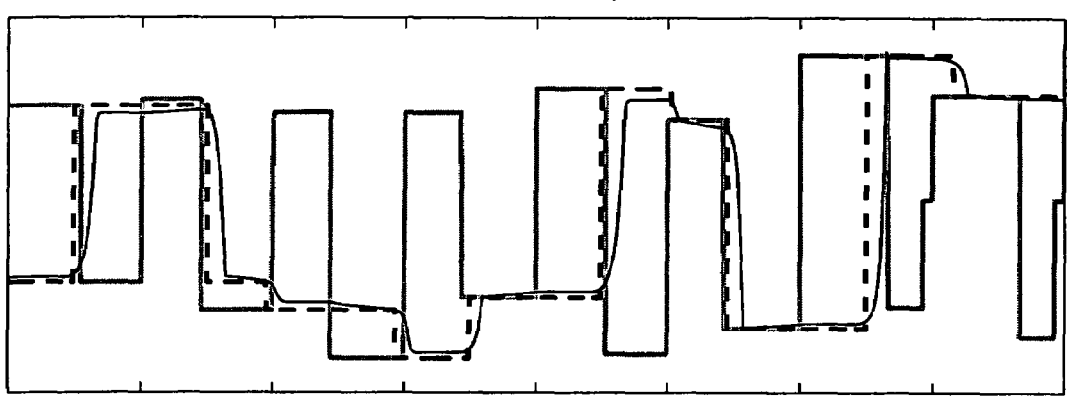
II
OUTPUTS OF DIGITAL MEDIAN FILTER AND ANALOG MEDIAN FILTER BASED ON IDEAL MEASURING SYSTEM
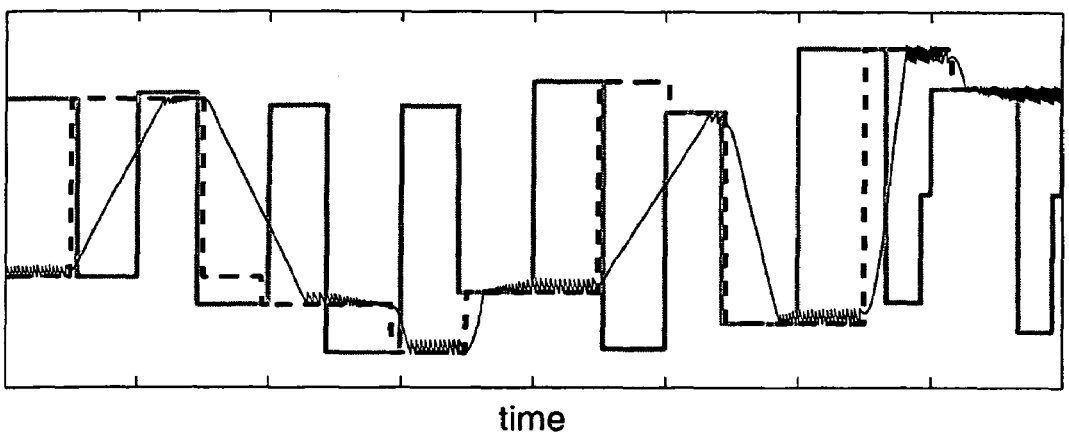
III
time
Fig. 59 b

METHOD AND APPARATUS FOR ANALYSIS OF VARIABLES

CROSS REFERENCES

This application is a divisional application of U.S. patent application Ser. No. 09/921,524 filed on Aug. 3, 2001 now U.S. Pat. No. 7,133,568, which claimed the benefit of U.S. Provisional Patent Application No. 60/223,206 filed on Aug. 04, 2000.

COPYRIGHT NOTIFICATION

Portions of this patent application contain materials that are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates to methods, processes and apparatus for measuring and analysis of variables, provided that the definitions of the terms "variable" and "measuring" are adopted from the 7th edition of the International Patent Classification (IPC). This invention also relates to generic measurement systems and processes, that is, the proposed measuring arrangements are not specially adapted for any specific variables, or to one particular environment. This invention also relates to methods and corresponding apparatus for measuring which extend to different applications and provide results other than instantaneous values of variables. The invention further relates to post-processing analysis of measured variables and to statistical analysis.

BACKGROUND ART

In a broad sense, the primary goal of a measurement can be defined as making a phenomenon available for human perception. Even when the results of measurements are used to automatically control machines and processes, the results of such control need to be meaningful, and thus the narrower technical meanings of a measurement still fall under the more general definition. In a technical sense, measurement often means finding a numerical expression of the value of a variable in relation to a unit or datum or to another variable of the same nature. This is normally accomplished by practical implementation of an idealized data acquisition system. The idealization is understood as a (simplified) model of such measuring process, which can be analyzed and comprehended by individuals. This analysis can either be performed directly through senses, or employ additional tools such as computers. When the measurement is reduced to a record, such record is normally expressed in discrete values in order to reduce the amount of information, and to enable storage of this record and its processing by digital machines. The reduction to a finite set of values is also essential for human comprehension. However, a physical embodiment of an idealized data acquisition system is usually an analog machine. That is, it is a machine with continuous action, where the components (mechanical apparatus, electrical circuits, optical devices, and so forth) respond to the input through the continuously changing parameters (displacements, angles of rotation, currents, voltages, and so forth). When the results of such implementation are reduced to numerical values, the uncertainties due to either limitations of the data acquisition techniques, or to the physical nature of the measured phenomenon, are often detached from these numerical values, or from each other. Ignoring the interdependence of different variables in the analyzed system, either intrinsic (due to their physical nature), or introduced by measuring equipment, can lead to misleading conclusions. An example of such idealization of a measurement is its digital record, where the measurement is represented by a finite set of numbers. It needs to be pointed out that the digital nature of a record is preserved even if such record were made continuous in time, that is, available as a (finite) set of instantaneous values.

Generally, measurement can be viewed as transformation of the input variable into another variable such that it can be eventually perceived, or utilized in some other manner. Measurement may consist of many intermediate steps, or stages between the incoming variable and the output of the acquisition system. For example, a TV broadcast can simplistically be viewed as (optical) measurement of the intensity of the light (incoming variable). where the output (image) is displayed on a TV screen. The same collectively would be true for a recorded TV program, although the intermediate steps of such a measurement will be different.

Regardless of the physical nature of measuring processes, they all exhibit many common features. Namely, they all involve transformation and comparison of variables at any stage. Transformation may or may not involve conversion of the nature of signals (for instance, conversion of pressure variations into electric signals by a microphone in acoustic measurements), and transformation can be either linear or nonlinear. Most transformations of variables in an acquisition system involve comparison as the basis for such transformations. Comparison can be made in relation to any external or internal reference, including the input variable itself. For example, simple linear filtering of a variable transforms the input variable into another variable, which is a weighted mean of the input variable either in time, space, or both. Here the comparison is made with the sample of the input variable, and the transformation satisfies a certain relation, that is, the output is the weighted average of this sample. An example of such filtering would be the computation of the Dow Jones Industrial Average.

In measurements of discrete events, a particular nonlinear filtering technique stands out due to its important role in many applications. This technique uses the relative positions, or rank, of the data as a basis for transformation. For example, the salaries and the family incomes are commonly reported as percentiles such as current median salary for a certain profession. The rationale for reporting the median rather than the mean income can be illustrated as follows. Consider some residential neighborhood generating ten million dollars annually. Now, if someone from this neighborhood wins twenty millions in a lottery, this will triple the total as well as the mean income of the neighborhood. Thus reporting the mean family income will create an illusion of a significant increase in the wealth of individual families. The median income, however, will remain unchanged and will reflect the economic conditions of the neighborhood more accurately. As another simple example, consider the way in which a student's performance on a standardized test such as the SAT (Scholastic Aptitude Test) or GRE (Graduate Record Examination) is measured. The results are provided as a cumulative distribution function, that is, are quoted both as a "score" and as the percentile. The passing criterion would be the score for a certain percentile. This passing score can be viewed as the output of the "admission filter".

In digital signal processing, a similar filtering technique is commonly used and is referred to as rank order or order statistic filtering. Unlike a smoothing filter which outputs a weighted mean of the elements in a sliding window, a rank order filter picks up an output according to the order statistic of elements in this window. See, for example, Arnold et al., 1992, and Sarhan and Greenberg, 1962, for the definitions and theory of order statistics. Maximum, minimum, and median filters are some frequently used examples. Median filters are robust, and can remove impulse noise while preserving essential features. The discussion of this robustness and usefulness of median filters can be found in, for example, Arce et al., 1986. These filters are widely used in many signal and image processing applications. See, for example, Bovik et al., 1983; Huang, 1981; Lee and Fam, 1987. Many examples can be found in fields such as seismic analysis Bednar, 1983, for example, biological signal processing Fiore et al., 1996, for example, medical imaging Ritenour et al., 1984, for example, or video processing Wischermann, 1991, for example. Maximum and minimum selections are also quite common in various applications Haralick et al., 1987, for example.

Rank order filtering is only one of the applications of order statistic methods. In a simple definition, the phrase order statistic methods refers to methods for combining a large amount of data (such as the scores of the whole class on a homework) into a single number or small set of numbers that give an overall flavor of the data. See, for example, Nevzorov, 2001, for further discussion of different applications of order statistics. The main limitations of these methods arise from the explicitly discrete nature of their definition (see, for example, the definitions in Sarhan and Greenberg, 1962, and Nevzorov, 2001), which is in striking dissonance with the continuous nature of measurements. The discrete approach imposes the usage of algebraic rather than geometric tools in order statistics, and thus limits both the perception of the results through the geometric interpretation and the applicability of differential methods of analysis.

Order statistics of a sample of a variable is most naturally defined in terms of the cumulative distribution function of the elements composing this sample see David, 1970, for example, which is a monotonic function. Thus computation of an order statistic should be equivalent to a simple task of finding a root of a monotonic function. However, the cumulative distribution of a discrete set is a discontinuous function, since it is composed of a finite number of step functions (see Scott, 1992, for example). As a result, its derivative (the density function) is singular, that is, composed of a finite number of impulse functions such as Dirac δ-function (see, for example, Dirac, 1958, p. 58–61, or Davydov, 1988, p. 609–612, for the definition and properties of the Dirac δ-function). When implementing rank order methods in software, this discontinuity of the distribution function prevents us from using efficient methods of root finding involving derivatives, such as the Newton-Raphson method (see Press et al., 1992, and the references therein for a discussion of root finding methods). In hardware, the inability to evaluate the derivatives of the distribution function disallows analog implementation. Even though for a continuous-time signal the distribution function may be continuous in special cases (since now it is an average of an infinitely large number of step functions), the density function is still only piecewise continuous, since every extremum in the sample produces singularity in the density function (Nikitin, 1998, Chapter 4, for example). In fact, the nature of a continuous-time signal is still discrete, since its instantaneous and even time averaged densities are still represented by impulse functions (Nikitin, 1998, for example). Thus the time continuity of a signal does not automatically lead to the continuity of the distribution and the density, functions of a sample of this signal.

Following from their discrete nature, the limitations of the existing rank order methods (rank order filtering as well as other methods based on order statistics) can roughly be divided into two categories. The first category deals with the issues of the implementation of these methods, and the second one addresses the limitations in the applicability. The implementation of the order statistics methods can in turn be divided into two groups. The first group realizes these methods in software on sequential or parallel computers (see Juhola et al., 1991, for example). The second one implements them on hardware such as Very Large Scale Integration (VLSI) circuits (see Murthy and Swamy, 1992, for example).

In software implementation, the basic procedure for order statistics calculation is comparison and sorting. Since sorting can be constructed by selection, which is an operation linear in complexity, the algorithms for finding only a specific rank (such as median) are more effective than the algorithms for computation of arbitrary statistics (Pasian, 1988, for example). In addition, the performance of rank order calculations can be improved by taking advantage of the running window where only a minor portion of the elements are deleted and replaced by the same number of new elements (Astola and Campbell, 1989, for example). Regardless of the efficiency of particular algorithms, however, all of them quickly become impractical when the size of the sample grows, due to the increase all both computational intensity and memory requirements.

The hardware implementation of rank order processing has several main approaches, such as systolic algorithms (Fisher, 1984, for example), sorting networks (Shi and Ward, 1993, and Opris, 1996, for example), and radix (binary partition) methods (Lee and Jen, 1993, for example). The various hardware embodiments of the order statistics methods, however, do not overcome the intrinsic limitations of the digital approach arising from the discontinuous nature of the distribution function, such as inefficient rank finding, difficulties with processing large samples of data, and inability to fully explore differential techniques of analysis. It needs to be pointed out that the differential methods allow studying the properties "at a point", that is, the properties which depend on an arbitrary small neighborhood of the point rather than on a total set of the discrete data. This offers more effective technical solutions. Several so-called "analog" solutions to order statistic filtering have been proposed see Jarske and Vainio, 1993, for example, where the term "analog" refers to the continuous (as opposed to quantized) amplitude values, while the time remains discrete. Although a definition of the continuous-time analog median filter has been known since the 1980's (see Fitch et al., 1986), no electronic implementations of this filter have been introduced. Perhaps the closest approximation of the continuous-time analog median filter known to us is the linear median hybrid (LMH) filter with active RC linear subfilters and a diode network (Jarske and Vainio, 1993, for example).

The singular nature of the density functions of discrete variables does not only impede both software and hardware implementations of rank order methods, but also constrains the applicability of these methods (for example, their geometric extension) to signal analysis. The origin of these constraints lies in the contrast between the discrete and the continuous: "The mathematical model of a separate object is the unit, and the mathematical model of a collection of discrete objects is a sum of units, which is, so to speak, the image of pure discreteness, purified of all other qualities. On the other hand, the fundamental, original mathematical model of continuity is the geometric figure; . . . " (Aleksandrov et al., 1999, v. I, p. 32). Even simple time continuity of the incoming variable enables differentiation with respect to time, and thus expands such applicability to studying distributions of local extrema and crossing rates of signals (Nikitin et al., 1998, for example), which can be extremely useful characteristics of a dynamic system. However, these distributions are still discontinuous (singular) with respect to the displacement coordinates (thresholds). Normally, this discontinuity does not restrain us from computing certain integral characteristics of these distributions, such as their different moments. However, many useful tools otherwise applicable to characterization of distributions and densities are unavailable. For instance, in studies of experimentally acquired distributions the standard and absolute deviations are not reliable indicators of the overall widths of density functions, especially when these densities are multimodal, or the data contain so-called outliers. A well-known quantity Full Width at Half Maximum (FWHM) (e.g., Zaidel' et al., 1976, p. 18), can characterize the width of a distribution much more reliably, even when neither standard nor absolute deviation exists. The definition of FWHM, however, requires that the density function be continuous and finite. One can introduce a variety of other useful characteristics of distributions and density functions with clearly identifiable geometrical and physical meaning, which would be unavailable for a singular density function. An additional example would be an $\alpha$-level contour surface (Scott, 1992, p. 22), which requires both the continuity and the existence of the maximum or modal value of the density function.

Discontinuity of the data (and thus singularity of density functions) is not a direct result of measurements but rather an artifact of idealization of the measurements, and thus a digital record should be treated simply as a sample of a continuous variable. For example, the threshold discontinuity of digital data can be handled by convolution of the density function of the discrete sample with a continuous kernel. Such approximation of the "true" density is well known as Kernel Density Estimates (KDE) (Silverman, 1986, for example), or the Parzen method (Parzen, 1967, for example). This method effectively transforms a digital set into a threshold continuous function and allows successful inference of "true" distributions from observed samples. See Lucy, 1974, for the example of the rectification of observed distributions in statistical astronomy. The main limitation of the KDE is that the method primarily deals with samples of finite size and does not allow treatment of spatially and temporally continuous data. For example, KDE does not address the time dependent issues such as order statistic filtering, and does not allow extension of the continuous density analysis to intrinsically time dependent quantities such as counting densities. Another important limitation of KDE is that it fails to recognize the importance of and to utilize the cumulative distribution function for analysis of multidimensional variables. According to David W. Scott (Scott, 1992, page 35), ". . . The multivariate distribution function is of little interest for either graphical or data analytical purposes. Furthermore, ubiquitous multivariate statistical applications such as regression and classification rely on direct manipulation of the density function and not the distribution function". Some other weaknesses of KDE with respect to the present invention will become apparent from the further disclosure.

Threshold, spatial, and temporal continuity are closely related to our inability to conduct exact measurements, for a variety of reasons ranging from random noise and fluctuations to the Heisenberg uncertainty. Sometimes the exact measurements are unavailable even when the measured quantities are discrete. An example can be the "pregnant chad" problem in counting election votes. As another example, consider the measurement of the energy of a charged particle. Such measurement is normally carried out by means of discriminators. An ideal discriminator will register only particles with energies larger than its threshold. In reality, however, a discriminator will register particles with smaller energies as well, and will not detect some of the particles with larger energies. Thus there will be uncertainties in our measurements. Such uncertainties can be expressed in terms of the response function of the discriminator. Then the results of our measurements can be expressed through the convolution of the "ideal" measurements with the response function of the discriminator (Nikitin, 1998, Chapter 7, for example). Even for a monoenergetic particle beam, our measurements will be represented by a continuous curve. Since deconvolution is at least an impractical, if not impossible, way of restoring the "original" signal, the numerical value for the energy of the incoming particles will be deduced from the measured density curve as, for example, its first moment (Zaidel' et al., 1976, pp. 11–24, for example).

A methodological basis for treatment of an incoming variable in terms of its continuous densities can be found in fields where the measurements are taken by an analog action machine, that is, by a probe with continuous (spatial as well as temporal) impulse response, such as optical spectroscopy (see Zaidel' et al., 1976, for example). The output of such a measuring system is described by the convolution of the impulse response of the probe with the incoming signal, and is continuous even for a discrete incoming signal. For instance, the position of a certain spectral line measured by a monochromator is represented by a smooth curve rather than by a number. If the reduction of the line's position to a number is needed, this reduction is usually done by replacing the density curve by its modal, median, or average value.

The measurement of variables and analysis of signals often go hand-in-land, and the distinction between the two is sometimes minimal and normally well understood from the context. One needs to understand, however, that a "signal", commonly, is already a result of a measurement. That is, a "signal" is already a result of a transformation (by an acquisition system) of one or many variables into another variable (electrical, optical, acoustic, chemical, tactile, etc.) for some purpose, such as further analysis, transmission, directing, warning, indicating, etc. The relationship between a variable and a signal can be of a simple type, such that an instantaneous value of the variable can be readily deduced from the signal. Commonly, however, this relationship is less easily decipherable. For example, a signal from a charged particle detector is influenced by both the energies of the particles and the times of their arrival at the sensor. In order to discriminate between these two variables, one either needs to use an additional detector (or change the acquisition parameters of the detector), or to employ additional transformation (such as differentiation) of the acquired signal. The analysis of the signal is thus a means for gathering information about the variables generating this signal, and ultimately making the phenomenon available for perception, which is the goal. The artificial division of this integral process into the acquisition and the analysis parts can be a serious obstacle in achieving this goal.

In the existing art, the measurement is understood as reduction to numbers, and such reduction normally takes place before the analysis. Such premature digitization often unnecessary complicates the analysis. The very essence of the above discussion can be revealed by the old joke that it might be hard to divide three potatoes between two children unless you make mashed potatoes. Thus we recognize that the nature of the difficulties with implementation and applicability of order statistics methods in analysis of variables lies in the digital approach to the problem. By digitizing, we lose continuity. Continuity does not only naturally occur in measurements conducted by analog machines, or arise from consideration of uncertainty of measurements. It is also important for perception and analysis of the results of complex measurements, and essential for geometrical and physical interpretation of the observed phenomena. The geometric representation makes many facts of analysis "intuitive" by analogy with the ordinary space. By losing continuity, we also lose differentiability, which is an indispensable analytical tool since it allows us to set up differential equations describing the studied system: " . . . In order to determine the function that represents a given physical process, we try first of all to set up an equation that connects this function in some definite way with its derivatives of various orders" (Aleksanidrov et al., 1999, v. I, p. 119).

The origin of the limitations of the existing art can thus be identified as relying on the digital record in the analysis of the measurements, which impedes the geometrical interpretation of the measurements and leads to usage of algebraic rather than differential means of analysis.

DISCLOSURE OF INVENTION

Brief Summary of the Invention

As was stated in the description of the existing art, the digital approach limits both the geometrical interpretation of the measurements and prevents usage of the differential means of analysis. In this invention, we present an analog solution to what is usually handled by digital means. We overcome the deficiencies of the prior approach by considering, instead of the values of the variables, such geometrical objects as the densities of these variables in their threshold space. The applicability of the differential analysis is achieved byt either (1) preserving, whenever possible, the original continuity of the measurement in the analysis, or (2) restoring continuity of discrete data through convolution with a continuous kernel which represents the essential qualities of the measuring apparatus. Our approach offers (a) improved perception of the measurements through geometrical analogies, (b) effective solutions of the existing computational problems of the order statistic methods, and (c) extended applicability of these methods to analysis of variables. In the subsequent disclosure we will demonstrate the particular advantages of the invention with respect to the known art.

In this invention, we address the problem of measuring and analysis of variables, on a consistent general basis, by introducing threshold densities of these variables. As will be described further in detail, the threshold densities result from averaging of instantaneous densities with respect to thresholds, space, and time. Since this averaging is performed by a continuous kernel (test function), it can be interpreted as analog representation, and thus we adopt the collective designation Analysis of Variables Through Analog Representation (AVATAR) for various components of the invention. The interdependence of the variables in the measurement system is addressed by introducing the modulated threshold densities of these variables, which result from the consideration of the joint densities of the interdependent variables in their combined threshold space. The particular way in which these densities are introduced leads to the densities being continuous in thresholds, space, and time, even if the incoming variables are of discrete nature. This approach allows us to successfully address the limitations of the prior art identified earlier, opens up many new opportunities for expanding the applicability of rank order analysis of variables, and provides a means for efficient implementation of this analysis in both hardware and software.

In order to convey the inventive ideas clearly, we adopt the simplified model for measurements as follows (see the analogous ideal system in Nikitin et al., 1998, for example). A variable is described in terms of displacement coordinates, or thresholds, as well as in terms of some other coordinates such as spatial coordinates and physical time. The values of these coordinates are measured by means of discriminators and/or differential discriminators (probes). An ideal discriminator with threshold D returns the value "1" if the measured coordinate exceeds D, "½" if it is equal to D, and it returns zero otherwise. Thus the mathematical expression for an ideal discriminator is the Heaviside unit step function of the difference between the threshold and the input coordinate (see Nikitin et al., 1998, and Nikitin, 1998, for example). Although ideal discriminators can be a useful tool for analysis of a measurement process, different functions of thresholds need to be employed to reflect the vagaries of real measurements (see discussion in Nikitin et al., 1998, for example). In this invention, the peculiarities of "real" discriminators are reflected by introducing uncertainty into the mathematical description of the discriminator, such that the returned value is in the range zero to one, depending on the values of the input coordinate. As described further in this disclosure, the introduction of such uncertainty can be interpreted as averaging with respect to a threshold test function, or threshold averaging. When the input-output characteristic of the discriminator is a continuous function, then differentiability of the output with respect to threshold is enabled. In addition, if the characteristic of the discriminator is a monotonic function, the rank relations of the input signal are preserved. If the original input signal is not differentiable with respect to time (e.g., the input signal is discontinuous in time), differentiability with respect to time can always be enabled by introducing time averaging into the acquisition system, where under time averaging we understand a suitable convolution transform with a continuous-time kernel. Likewise, differentiability with respect to spatial coordinates can be enabled by spatial averaging.

The mathematical expression for the response of an ideal probe, or differential discriminator, is the Dirac δ-function of the difference between the displacement and the input variable, which is the instantaneous density of the input variable. As follows from the properties of the Dirac δ-function (see, for example, Dirac, 1958, p. 58–61, and Davydov, 1988, p. 609–612, for the definition and properties of the Dirac δ-function), the output of the "real" probe is thus the convolution of the instantaneous density with the out-output of characteristic of the differential discriminator, which is equivalent to the threshold averaging of the instantaneous density. When this output is subsequently averaged with respect to space and time, the result is the Threshold-Space-Time Averaged Density.

Notice that the transition from the ideal to real probes and discriminators preserves the interpretation of their responses as the threshold density and cumulative distribution, respectively. For example, the spectrum acquired by an optical spectrograph can be considered the energy density regardless the width of the slits of its monochromator. Thus a particular way of utilizing the discriminators and probes in this invention is essentially a method of transformation of discrete or continuous variables, and/or ensembles of variables into normalized continuous scalar fields, that is, into objects with mathematical properties of density and cumulative distribution functions. In addition to dependence on the displacement coordinates (thresholds), however, these objects can also depend on other parameters, including spatial coordinates (e.g., if the incoming variables are themselves scalar or vector fields), and/or time (if the variables depend on time). For the purpose of this disclosure, the terms "space" and "time" are used to cover considerably more than their primary or basic meaning. "Time" should be understood as a monotonic scalar, continuous or discrete, common to all other analyzed variables, which can be used for sequential ordering of the measurements. "Space" is thus all the remaining coordinates which are employed (as opposed to sufficient) to govern the values of the input variables. It is important to note that the use of the invented transformation makes all existing techniques for statistical processing of data, and for studying probability fluxes, applicable to analysis of these variables. Moreover, the transformations of the measured variables can be implemented with respect to any reference variable, or ensemble of reference variables. In this disclosure, we consider two basic transformations with respect to the reference variable, which we refer to as normalization and modulation. The definitions of these transformations will be given later in the disclosure. In both of these transformations, the behavior of the input variable is represented in terms of behavior (and units) of the reference variable. Thus, the values of the reference variable provide a common unit, or standard, for measurement and comparison of variables of different nature, for assessment of the mutual dependence of these variables, and for evaluation of the changes in the variables and their dependence with time. For example, dependence of economic indicators on social indicators, and vice versa, can be analyzed, and the historical changes in this dependence can be monitored. When the reference variable is related in a definite way to the input variable itself, these additional transformations (that is, normalization and modulation) provide a tool for analysis of the interdependence of various properties of the input variable.

Among various embodiments of the invention, several are of particular importance for analysis of variables. These are the ability to measure (or compute from digital data) (1) quantile density, (2) quantile domain, and (3) quantile volume for a variable. Quantile density indicates the value of the density likely to be exceeded, quantile domain contains the regions of the highest density, and quantile volume gives the (total) volume of the quantile domain. The definitions of these quantities and a means of their implementation are unavailable in the existing art. Detailed definitions and description of these quantities will be given later in the disclosure. As another consequence of the proposed transformation of variables into density functions, the invention enables measurements of currents, or fluxes of these densities, providing a valuable tool for analysis of the variables.

Another important embodiment of AVATAR is rank normalization of a variable with respect to a cumulative distribution function, generated by another variable or ensemble of variables. The rank normalization of variables can be used for processing and analysis of different time ordered series, ensembles, scalar or vector fields, and time independent sets of variables, especially when the investigated characteristics of the variable are invariant to a monotonic transformation of its values, that is, to a monotonic transformation of the thresholds. This normalization can be performed with respect to a reference distribution of an arbitrary origin, such as the distribution provided by an external reference variable, or by the input variable itself. For example, the reference variable can be a random process with the parameters determined by the input variable. In this case, the reference variable provides a "container" in the threshold space where the input variable is likely to be found. More importantly, the rank normalization allows computation or measurement of integral estimators of differences between two distributions (or densities) as simple time and/or space averages.

Another important usage of the rank normalization is as part of preprocessing of the input variable, where under preprocessing we understand a series of steps (e.g., smoothing) in the analysis prior to applying other transformations. Since in AVATAR the extent of the threshold space is determined by the reference variable, the rank normalization allows as to adjust the resolution of the acquisition system according to the changes in the threshold space, as the reference variable changes in time. Such adjustment of the resolution is the key to a high precision of analog processing.

While rank normalization reflects the rank relations between the input and the reference variables, the modulated threshold density describes the input variable in terms of the rate of change of the reference variable at a certain threshold. As will be clarified further in the disclosure, the modulated threshold densities arise from the consideration of the joint densities of the input and the reference variables in their combined threshold space. Instead of analyzing such joint variable in its total threshold space, however, we consider the behavior of the input variable in the threshold space of the reference variable only. The modulated densities allow us to investigate the interdependence of the input and the reference variable by comparison of the time averages of the input variable at the thresholds of the reference variable with the simple time average of the input variable. As has been mentioned earlier, the important special case of modulated densities arises when there is a definite relation between the input and the reference variables. In this disclosure, we will primarily focus on the densities arising from the two particular instances of this relation, to which we will further refer as the amplitude and the counting densities. Since the definiteness in the relation eliminates the distinction between the input and the reference variables, such special cases of the modulated densities will be regarded simply as modulated threshold densities of the input variable.

The invention also allows the transformation which can be interpreted as rank filtering of variables. That is, it enables the transformation of a variable into another variable, the value of which at any given space and time is a certain quantile of a modulated cumulative distribution function generated by the input and reference variables. Thus in AVATAR the output of such a filter has simple and clear interpretation as a level line of such a distribution in the time-threshold plane. One needs to notice that the output of a rank filter as defined in the existing digital signal processing methods, will correspond to the discrete points on a level line drawn for an amplitude distribution only. Thus the rank filtering defined in AVATAR extends beyond the known applicability of rank filtering. It is also important that, in this invention, such filtering process is implemented by differential means and thus conducted without sorting. The invention also provides a means for finding (selecting) the rank of a time dependent or static variable or ensemble of variables without sorting. Such analog rank selection permits analog emulation of digital rank filters in an arbitrary window, of either finite or infinite type, with any degree of precision. Moreover, the rank selection is defined for modulated distributions as well, which extends the applicability of rank filtering. The continuous nature of the definitions and the absence of sorting allows easy implementation and incorporation of rank selecting and filtering in analog devices. Rank filtering and selecting also provide alternative embodiments for comparison of variables with respect to a common reference variable, and for detection and quantification of changes in variables.

Based on the embodiments of AVATAR discussed above, we can define and implement a variety of new techniques for comparison of variables and for quantification of changes in variables. By determining distributions from the signal itself, and/or by providing a common reference system for variables of different natures, the invention provides a robust and efficiently applied solution to the problem of comparing variables. It is important to note that the invention enables comparison of one-dimensional as well as multivariate densities and distributions by simple analog machines rather than through extensive numerical computations.

The particular advantages of AVATAR stem from the fact that the invention is based on the consideration of real acquisition systems while most of previous techniques assume idealized measurement processes. Even if the incoming variable is already a digital record (such as the result of an idealized measurement process), we restore this record to a continuous form by a convolution with a probe continuous in thresholds, space, and time. It is important to realize that the invention is also applicable to measurements of discrete data. The main distinction between such measurements and the restoration of a digital record lies in the realization that the former are normally taken by continuous action machines, and thus the results of such measurements need to be reformulated, that is, "mapped" into analog domain. As an example, consider the task of measuring the amplitude (energy) distribution of a train of charged particles. Since this measurement is usually taken by means of sensors with finite time response, the problem of measuring the amplitude density is naturally restated as the problem of finding the distribution of local extrema of a continuous-time signal (Nikitin et al., 1998). This distribution can in turn be found through the derivative of the crossing rates with respect to threshold (Nikitin et al., 1998).

The invention can be implemented in hardware devices as well as in computer codes (software). The applications of the invention include, but are not limited to, analysis of a large variety of technical, social, and biologic measurements, traffic analysis and control, speech and pattern recognition, image processing and analysis, agriculture, and telecommunications. Both digital and analog implementations of the methods can be used in various systems for data acquisition and analysis. All the above techniques, processes and apparatus are applicable to analysis of continuous (analog) variables as well as discrete (digital). By analyzing the variables through their continuous distributions and the density functions, the invention overcomes the limitations of the prior art by (a) improving perception of the measurements through geometrical analogies, (b) providing effective solutions to the existing computational problems of the order statistic methods, and (c) extending the applicability of these methods to analysis of variables.

Further scope of the applicability of the invention will be clarified through the detailed description given hereinafter. It should be understood, however, that the specific examples, while indicating preferred embodiments of the invention, are presented for illustration only. Various changes and modifications within the spirit and scope of the invention should become apparent to those skilled in the art from this detailed description. Furthermore, all the mathematical expressions and the examples of hardware implementations are used only as a descriptive language to convey the inventive ideas clearly, and are not limitative of the claimed invention.

Terms and Definitions with Illustrative Examples

For convenience, the essential terms used in the subsequent detailed description of the invention are provided below. These terms are listed along with their definitions adopted for the purpose of this disclosure. Examples clarifying and illustrating the meaning of the definitions are also provided. Note that the equations in this section are numbered separately from the rest of this disclosure.

1 Variable

For the purpose of this disclosure, we define a variable as an entity x which, when expressed in figures (numbers), can be represented by one of the mathematical expressions listed below. Throughout this disclosure, the standard mathematical terms such as vector, scalar, or field mostly preserve their commonly acceptable mathematical and/or physical interpretation. The specific meaning of most of the common terms will be clarified through their usage in the subsequent detailed description of the invention. Notice that the most general form of a variable adopted in this disclosure is an Ensemble of Vector Fields. All other types of variables in this disclosure can be expressed through various simplifications of this general representation. For example, setting the ensemble weight $n(\mu)$ in the expression for an ensemble of vector fields to the Dirac $\delta$-function $\delta(\mu)$ reduces said expression to a single Vector Field variable. Further, by eliminating the dependence of the latter on spatial coordinates (that is, by setting the position vector a=constant), said single vector field variable reduces to a single Vector variable. Notice also that while ensembles of variables are expressed as integrals/sums of the components of an ensemble, it should be understood that individual components of an ensemble are separately available for analysis.

1. Single Variable. A single variable in this disclosure can be a vector/scalar variable, or a vector/scalar field variable.

(a) A Vector Field variable can be expressed as $$x = x(a,t), \tag{D-1}$$

where a is the vector of spatial coordinates, and t is the time coordinate.

Representative Examples: (1) A truecolor image can be expressed by a vector field $x=x(a,t)$, where the color is described by its coordinates in the three-dimensional color space (red, green, and blue) at the position a. (2) The combination of both the color intensity of a monochrome image and the rate of change of said intensity can be expressed by a vector field $x=(x(a,t),\dot{x}(a,t))$.

(b) A Scalar Field variable can be expressed as $$x = x(a,t), \tag{D-2}$$

where a is the vector of spatial coordinates, and t is the time coordinate.

Representative Example: A monochrome image at a given time is determined by the intensity of the color at location a, and thus it is conveniently described by a scalar field x=x(a,t).

(c) A Vector variable can be represented by the expression $$x=x(t), \tag{D-3}$$

where t is the time coordinate. Notice that the components of a vector variable do not have to be of the same units or of the same physical nature.

Representative Examples: (1) The position of a vehicle in a traffic control problem can be described by a single vector variable x=x(t). (2) The position and the velocity of a vehicle together can be described by a single vector variable x=(x(t), ẋ(t)).

(d) A Scalar variable can be represented by the expression $$x=x(t), \tag{D-4}$$

where t is the time coordinate.

Representative Example: The current through an element of an electrical circuit can be expressed as a single scalar variable x=x(t).

2. Ensemble of Variables. Several different variables of the same nature can be considered as a (composite) single entity designated as an ensemble of variables. An individual variable in an ensemble is a component of the ensemble. The relative contribution of a component in the ensemble is quantified by a weight $n(\mu)$ of the component.

(a) Ensemble of Vector Fields:

$$x = \int_{-\infty}^{\infty} d\mu n(\mu) x_\mu(a, t), \tag{D-5}$$

where $n(\mu) \, d\mu$ is the weight of the $\mu$th component of the ensemble such that $$\int_{-\infty}^{\infty} d\mu n(\mu) = N,$$

a is the vector of spatial coordinates, and t is the time coordinate.

Representative Example: A truecolor image can be expressed by a vector field x=x(a,t), where the color is described by its coordinates in the three-dimensional color space (red, green, and blue), at the position a. A "compound" image consisting of a finite or infinite set of such truecolor images, weighted by the weights $n(\mu)$, can be viewed as an ensemble of vector fields. For example, such a compound image can be thought of as a statistical average of the video recordings taken by several different cameras.

(b) Ensemble of Scalar Fields:

$$x = \int_{-\infty}^{\infty} d\mu n(\mu) x_\mu(a, t), \tag{D-6}$$

where $n(\mu) \, d\mu$ is the weight of the $\mu$th component of the ensemble such that $$\int_{-\infty}^{\infty} d\mu n(\mu) = N,$$

a is the vector spatial coordinates, and t is the time coordinate.

Representative Example: A monochrome image at a given time is determined by the intensity of the color at location a, and thus it is conveniently described by a scalar field x=x(a,t). A "compound" image consisting of a finite or infinite set of such monochrome images, weighted by the weights $n(\mu)$, can be viewed as an ensemble of scalar fields. For example, such a compound image can be thought of as a statistical average of the video recordings taken by several different cameras.

(c) Ensemble of Vectors:

$$x = \int_{-\infty}^{\infty} d\mu n(\mu) x_\mu(t), \tag{D-7}$$

where $n(\mu) \, d\mu$ is the weight of the $\mu$th component of the ensemble such that $$\int_{-\infty}^{\infty} d\mu n(\mu) = N,$$

and t is the time coordinate.

Representative Example: A variable expressing the average position of N different vehicles in a traffic control problem can be described by an ensemble of vector variables $$x = \int_{-\infty}^{\infty} d\mu n(\mu) x_\mu(t), \quad \text{where } n(\mu) = n(\mu) \sum_{i=1}^{N} \delta(\mu - i).$$

(d) Ensemble of Scalars:

$$x = \int_{-\infty}^{\infty} d\mu n(\mu) x_\mu(t), \tag{D-8}$$

where $n(\mu) \, d\mu$ is the weight of the $\mu$th component of the ensemble such that $$\int_{-\infty}^{\infty} d\mu n(\mu) = N,$$

and t is the time coordinate.

Representative Example: The total current through N elements of an electrical circuit can be expressed as an ensemble of scalar variables $$x = \int_{-\infty}^{\infty} d\mu n(\mu) x_\mu(t),$$

where $$n(\mu) = n(\mu) \sum_{i=1}^{N} \delta(\mu - i).$$

Notice that the most general form of a variable among those listed above is the Ensemble of Vector Fields. All other types of variables in this disclosure can be expressed through various simplifications of this general representation. For example, setting the ensemble weight $n(\mu)$ in the expression for an ensemble of vector fields to the Dirac $\delta$-function $\delta(\mu)$ reduces said expression to a single Vector Field variable. Further, by eliminating the dependence of the latter on spatial coordinates (that is, by setting the position vector a=constant), said single vector field variable reduces to a single Vector variable. Notice also that while ensembles of variables are expressed as integrals/sums of the components of an ensemble, it should be understood that individual components of an ensemble are separately available for analysis.

2 Threshold Filter

In this disclosure, we define a Threshold Filter as a continuous action machine (a physical device, mathematical function, or a computer program) which can operate on the difference between a Displacement Variable D and the input variable x, and the result of such operation can be expressed as a scalar function of THE Displacement Variable, that is, as a value at a given displacement D. The dependence of the output of a Threshold Filter on the input is equivalent to those of a probe (smoothing threshold filter) or a discriminator (integrating threshold filter) as specified below.

1. Probe. A continuous action machine (a physical device, mathematical function, or a computer program) which can operate on the difference between a Displacement Variable D and the input variable x, and the result of such operation can be expressed as a scalar function of the Displacement Variable, that is, as a value at a given displacement D. The dependence of the output y of a probe on its input r is equivalent to the following expression:

$$0 \leq y = f_R(r), \tag{D-9}$$

where y is a scalar, r is a vector or a scalar, R is a scalar width parameter of the probe, and the test function $f f_R$ is a continuous function satisfying the conditions $$\begin{cases} \int_{-\infty}^{\infty} d^n r f_R(r) = 1, \text{ and} \\ \lim_{R \to 0} f_R(r) = \delta(r), \end{cases} \tag{D-10}$$

where $\delta(r)$ is the Dirac $\delta$-function.

Representative Examples: (1) The Gaussian test function $$f_R(r) = \prod_{i=1}^{n} \partial_{D_i} \mathcal{F}_{\Delta D_i}(r_i) = \frac{\pi^{-\frac{n}{2}}}{\prod_{i=1}^{n} \Delta D_i} \exp\left[-\sum_{i=1}^{n} \left(\frac{r_i}{\Delta D_i}\right)^2\right] \tag{D-11}$$

can act as a probe. In Eq. (D-11), the response of the probe $f_R(r)$ to the vector input $r=(r_1, \ldots, r_n)$ is a product of the responses of the probes $$\partial_{D_i} \mathcal{F}_{\Delta D_i}(r_i) = \frac{1}{\Delta D_i \sqrt{\pi}} e^{-\left(\frac{r_i}{\Delta D_i}\right)^2}$$

to the components $r_i$ of the input vector. (2) FIG. 6 illustrates an optical threshold smoothing filter (probe). This probe consists of a point light source S and a thin lens with the focal length f. The lens is combined with a gray optical filter with transparency described by $f_{2f}(x)$. Both the lens and the filter are placed in an XOY plane at a distance 2f from the source S. The lens-filter combination can be moved in the XOY plane by the incoming signal r so that the center of the combination is located at $$\frac{2fr}{4f - R}$$

in this plane. Then the output of the filter is proportional to the intensity of the light measured at the location $D=(D_x, D_y)$ in the $D_x$-O-$D_y$ plane parallel to the XOY plane and located at the distance R from the image S' of the source S (toward the source). That is, the output of this filter can be described by $f_R(D-r)$.

2. Discriminator. A continuous action machine (a physical device, mathematical function, or a computer program) which can operate on the difference between a Displacement Variable D and the input variable x, and the result of such operation can be expressed as a scalar function of the Displacement Variable, that is, as a value at a given displacement D. The dependence of the output y of a discriminator on the input r is obtained by integrating the response of the respective probe, that is, it is related to the input-output characteristic of the respective probe as $$0 \leq y = F_R(x) = \int_{-\infty}^{x} d^n r f_R(r) \leq 1. \tag{D-12}$$

Representative Examples: (1) The integral of a Gaussian test function $$\mathcal{F}_R(x) = \int_{-\infty}^{x} d^n r f_R(r) = \prod_{i=1}^{n} \mathcal{F}_{\Delta D_i}(x_i) = 2^{-n} \prod_{i=1}^{n} \text{erfc}\left(\frac{-x_i}{\Delta D_i}\right), \tag{D-13}$$

where erfc(x) is the complementary error function, can act as a discriminator. In Eq. (D-13), the response of the discriminator $F_R(x)$ to the vector input $x=(x_1, \ldots, x_n)$ is a product of the responses of the discriminators $$\mathcal{F}_{\Delta D_i}(x_i) = \frac{1}{2} \text{erfc}\left(\frac{-x_i}{\Delta D_i}\right)$$

to the components $x_i$ of the input vector. (2) By replacing the transparency function $f_{2f}(x)$ of the gray filter with $F_{2f}(x)$, the optical probe shown in FIG. 6 is converted into a discriminator with the output $F_R(D-r)$.

3 Displacement Variable

A Displacement Variable is the argument of a function describing the output of a Threshold Filter. For example, if the Threshold Filter is an amplifier operating on the difference between two electrical signals D and x(t), and an output of the amplifier is described as a function of the input signal D, this signal D is a Displacement Variable.

4 Modulating Variable

A Modulating Variable is a unipolar scalar field variable K=K(a,t) which can be applied to the output of a Threshold Filter in a manner equivalent to multiplication of said output by the Modulating Variable.

Representative Example: Imagine that the point light source S in FIG. 6 is produced by an incandescent lamp powered by a unit current. If we now power the lamp by the current K(t), the output of the threshold filter will be modulated by the modulating Variable |K(t)|.

5 Averaging Filter

An Averaging Filter is a continuous action machine (a physical device, mathematical function, or a computer program) which can operate on a variable x(a,t), and the result of such operation can be expressed as convolution with a test function $f_R(a)$ and a time impulse response function h(t;T), namely as $$\langle x(r,s)\rangle_{T,R}^{h,f} = \langle \langle x(r,s)\rangle_R^f \rangle_T^h = \langle \langle x(r,s)\rangle_T^h \rangle_R^f = \qquad (D\text{-}14)$$
$$= \int_{-\infty}^{\infty} ds \int_{-\infty}^{\infty} d^m r\, h(t-s;T) f_R(a-r) x(r,s),$$

where a is the position vector (vector of spatial coordinates), and t is the time coordinate. Thus an averaging filter performs both spatial and time averaging. We shall call the product $h(t;T) f_R(a)$ the impulse response of the Averaging Filter.

1. Time Averaging Filter. An averaging filter which performs only time averaging is obtained by setting the spatial impulse response (test function) of the averaging filter to be equal to the Dirac δ-function, $f_R(a)=\delta(a)$. The result of the operation of a time averaging filter with an impulse response h(t;T) on a variable x(a,t) can be expressed by the convolution integral $$\langle x(a,s)\rangle_T^h = \int_{-\infty}^{\infty} ds\, h(t-s;T) x(a,s), \qquad (D\text{-}15)$$

where T is the width (time scale) parameter of the filter. For two filters with the width parameters T and ΔT such that T>>ΔT, the former filter is designated as wide, and the latter as narrow.

Representative Example: An image formed on a luminescent screen coated with luminophor with the afterglow half-time $T_{1/2}=T\ln(2)$ is time averaged by an exponentially forgetting Time Averaging Filter $$h(t;T) = e^{-\frac{t}{T}} \theta(t)/T.$$

2. Spatial Averaging Filter. An averaging filter which performs only spatial averaging is obtained by setting the time impulse response of the averaging filter to be equal to the Dirac δ-function, $h(t;T)=\delta(t)$. The result of the operation of a spatial averaging filter with an impulse response (test function) $f_R(a)$ on a variable x(a,t) can be expressed by the convolution integral $$\langle x(r,t)\rangle_R^f = \int_{-\infty}^{\infty} d^m r\, f_R(a-r) x(r,t), \qquad (D\text{-}16)$$

where R is the width parameter of the filter. For two filters with the width parameters R and ΔR such that R>>ΔR, the former filter is designated as wide, and the latter as narrow.

Representative Example: A monochrome image given by the matrix $Z=Z_{ij}(t)$ can be spatially averaged by a smoothing filter $w_{mn}$, $\Sigma_{m,n} w_{mn}=1$, as $$\langle Z\rangle_{M,N}^w = \sum_{m=-M}^{M} \sum_{n=-N}^{N} \omega_{mn} Z_{i+m,j+n}(t).$$

Some other terms and their definitions which appear in this disclosure will be provided in the detailed description of the invention.

NOTATIONS

For convenience, lists of the acronyms and selected notations used in the detailed description of the invention are provided below.

| SELECTED ACRONYMS AND WHERE THEY FIRST APPEAR | |
|---|---|
| AVATAR | Analysis of Variables Through Analog Representation, |
| MTD | Modulated Threshold Density, |
| MRT | Mean at Reference Threshold, |
| MCTD | Modulated Cumulative Threshold Distribution, |
| ARN | Analog Rank Normalizer, |
| ARF | Analog Rank Filter, |
| AARF | Adaptive Analog Rank Filter, |
| ARS | Analog Rank Selector, |
| AQDEF | Analog Quantile Density Filter, |
| AQDOF | Analog Quantile Domain Filter, |
| AQVF | Analog Quantile Volume Filter, |

| SELECTED NOTATIONS AND WHERE THEY FIRST APPEAR | |
|---|---|
| $F_{AD}(D)$ | input-output characteristic of a discriminator, Eq. (3) |
| $\theta(x)$ | Heaviside unit step function, Eq. (4) |
| $\delta(x)$ | Dirac delta function. Eq. (4) |
| $\partial_D F_{AD}(D)$ | input-output characteristic of a differential discriminator (probe), Eq. (6) |
| $\int_{-\infty}^{x} d^m r$ | volume integral as defined by Eq. (8) |
| $F_K(x; a, t)$ | cumulative distribution function, Eq. (9) |
| $f_K(x; a, t)$ | density function, Eq. (10) |
| $x_q(a, t)$ | qth quantile for $F_K(x: a, t)$, Eq. (15) |
| $g_\alpha(z; a, \beta)$ | convolution transform of the density function $f_K(z; a)$, Eq. (19) |
| $f_q(a, t)$ | quantile density, Eq. (24) |
| $R_q(a, t)$ | quantile volume, Eq. (25) |
| $\langle \ldots \rangle_T^h, \langle \ldots \rangle_T$ | time averages on a time scale T, Eqs. (32) and (33) |
| $\{M_x K\}_T^h(D, t)$ | weighted mean of K with respect to x, Eq. (41) |
| $\langle \ldots \rangle_R^f$ | spatial averaging with the test function $f_R(x)$, Eq. (47) |
| $f_R[D - x(t)]$ | macroscopic threshold density, Eq. (46) |

-continued

| | |
|---|---|
| $c_K(D, t)$ | modulated threshold density, Eq. (52) |
| $\{M_xK\}_T(D, t)$ | mean at reference threshold, Eq. (53) |
| $b(D, t)$ | amplitude density, Eq. (54) |
| $r(D, t)$ | counting density, Eq. (55) |
| $R(D, t)$ | counting rates, Eq. (56) |
| $h_n(t)$ | $RC_{ln}$ time impulse response function, Eq. (57) |
| $\Xi_q(D, t)$ | estimator of differences in quantile domain between the mean at reference threshold and the time average, Eq. (63) |
| $C_K(D, t)$ | modulated cumulative threshold distribution, Eq. (64) |
| $C_{K,r}[x(t), t]$ | signal x(t), rank normalized with respect to the reference distribution $C_{K,r}(D, t)$, Eq. (81) |
| $K_{nm}$ | $K_{nm} = \langle Kr^n \rangle_T (\langle Kr^m \rangle_T)^{-1}$, Eq. (84) |
| $Q_{ab}(t; q)$ | estimator of differences between distributions $C_a(D.t)$ and $C_b(D.t)$. Eq. (92) |
| $\Lambda_{ij}(t)$ | statistic of a type of Eqs. (95) and (97) for comparison of two distributions |
| $P_q(t)$ | probability that a value drawn from the first sequence is q times larger than the one drawn from the second sequence. Eq. (100) |
| $b(D; t, n(\mu))$ | threshold averaged instantaneous density for a continuous ensemble of variables. Eq. (120) |
| $B(D; t, n(\mu))$ | threshold averaged instantaneous cumulative distribution for a continuous ensemble of variables, Eq. (121) |
| $c_K(D; t, n(\mu))$ | modulated threshold density for a continuous ensemble, Eq. (122) |
| $C_K(D; t, n(\mu))$ | modulated cumulative distribution for a continuous ensemble, Eq. (123) |
| $c_K(D; a, t)$ | modulated threshold density for a scalar field, Eq. (131) |
| $c_K(D; a, t)$ | modulated threshold density for a vector field, Eq. (138) |
| $c_K(D; a, t, n(\mu))$ | modulated threshold density for an ensemble of vector fields, Eq. (139) |
| $\{M_xK\}_{T,A}(D; a, t)$ | mean at reference threshold for a vector field input variable, Eq. (140) |
| $S_q(D; a, t)$ | quantile domain factor, Eq. (144) |

DETAILED DESCRIPTION OF THE INVENTION

The Detailed Description of the Invention is Organized as Follows.

In Section 1 (p. 34) we identify the general form of a variable which is subject to analysis by this invention, and provide several examples demonstrating the convenience of such a general representation.

In Section 2 (p. 35) we use the example of a single scalar variable to describe the basic elements of the analysis system adopted in this disclosure, and introduce the discriminators and probes as the sensors of such a system. The example of a single scalar variable is used to illustrate that the use of discriminators and probes enables us to reformulate many algebraic problems of the conventional analysis of variables as geometrical problems in the threshold space. The particular continuous fashion in which this geometrical extension is performed enables the solution of these problems by methods of differential geometry.

In Section 3 (p. 39) we describe some of the exemplary discriminators and the respective probes.

In Section 4 (p. 40) we introduce the normalized scalar fields in the meaning adopted for the purpose of this disclosure as the density and cumulative distribution functions in the threshold space. We provide a tangible example of how the usefulness of these objects extends beyond making details of the analysis intuitive and more available for human perception by analogy with the ordinary space.

In Section 5 (p. 42) we provide several examples of equations which reflect the geometrical properties of the threshold distributions, and are later used for development of various practical embodiments of AVATAR. In particular, the definitions of the quantile density, domain, and volume are given along with the explanatory examples.

Section 6 (p. 47) contains a brief additional discussion of possible relationships between the input and the reference variables.

In Section 7 (p. 49) we give an introduction to a more general definition of the modulated threshold densities by analyzing an example of the threshold crossing density, a quantity which cannot be defined for digitized data.

In Section 8 (p. 51) we generalize the result of Section 7 by introducing the modulated threshold densities and the weighted means at thresholds. Along with explanatory examples, we show that the weighted mean at reference threshold is indeed a measurement of the input variable in terms of the reference variable. We also outline an approach to computation of the mean at reference threshold by analog machines.

In Section 9 (p. 55) we interpret the process of measurement by real analog machines as a transition from the microscopic to macroscopic threshold densities, or as threshold averaging by a probe. Thus we introduce the main practical embodiments of AVATAR as the modulated threshold density (Eq. (52)) and the mean at reference threshold (Eq. (53)), along with the specific embodiments of the amplitude (Eq. (54)) and counting (Eq. (55)) densities, and the counting rates (Eq. (56)). We also provide a simplified diagram of a continuous action machine implementing the transformation of the multivariate input variable(s) into the modulated threshold densities.

In Section 10 (p. 58) we consider a specific type of weighting function, which is a convenient choice for time averaging in various embodiments of AVATAR.

In Section 11 (p. 59) we focus on some of the applications of AVATAR for enhancement of analysis through geometric interpretation of the results. We give several examples of displaying the modulated threshold densities and provide illustrative interpretation of the observed results. Among various examples of this section, there are examples of displaying the time evolution of the quantile density, domain, and volume. In this section, we introduce such practical embodiments of AVATAR as the phase space amplitude density (Eq. (60)), the phase space counting density (Eq. (61)), and the phase space counting rates (Eq. (62)). We also provide the illustrative examples of displaying these densities and the rates. In Subsection 11.1 we give some illustrative examples of continuous action machines for displaying the modulated threshold densities and their time evolution.

In Section 12 (p. 65) we provide a practical embodiment (Eq. (63)) of an estimator of differences in the quantile domain between the mean at reference threshold and the time average of a variable.

In Section 13 (p. 66) we provide a practical embodiment of the modulated cumulative distribution (Eq. (64)) and describe how the transition from the densities to the cumulative distribution functions in various practical embodiments is formally done by replacing the probes by their respective discriminators. Even though the multivariate cumulative distribution function is often disregarded as a useful tool for either graphical or data analytical purposes (Scott, 1992, page 35, for example), it is an important integral component of AVATAR and is used in its various embodiments.

In Section 14 (p. 67) we develop simple unimodal approximations for an ideal density function, that is, the density function resulting from the measurements by all ideal probe. Although these approximations are of limited usage by themselves, they provide a convenient choice of approximations for the rank normalization.

In Section 15 (p. 71) we introduce several practical embodiments of rank normalization, such as the general formula for the rank normalization with respect to the reference distribution $C_{K,r}(D,t)$ (Eq. (86)), normalization by a discriminator with an arbitrary input-output response (Eq. (88)), and normalization of a scalar variable by a discriminator with an arbitrary input-output response (Eq. (89)).

In Section 16 (p. 74) we discuss the usage of the rank normalization for comparison of variables and for detection and quantification of changes in variables. We provide several simplified examples of such usage and describe a practical embodiment of a simple estimator of differences between two distributions (Eq. (92)). In Subsection 16.1 we provide additional exemplary practical embodiments of the estimators of differences between two time dependent distributions, Eqs. (95) and (97). In Subsection 16.2 we provide an example of the usage of these estimators for comparing phase space densities and for addressing an exemplary speech recognition problem. We also give an outline of an approach to implementation of such comparison in an analog device. In Subsection 16.3 we provide an embodiment for a time dependent probabilistic comparison of the amplitudes of two signals (Eq. (102)).

In Section 17 (p. 81) we discuss the usage of AVATAR for analog implementation of rank filtering.

In Section 18 (p. 82) we discuss the two principal approaches to analog rank filtering of a single scalar variable enabled by AVATAR: (1) an explicit expression for the output of a rank filter (Subsection 18.1), and (2) a differential equation for the output of such a filter (Subsection 18.2). In Subsection 18.1, we also describe a practical embodiment (Eq. (105)) for the explicit analog rank filter.

In Section 19 (p. 84) we briefly discuss the usage of a particular choice of a time weighting function in analog rank filters.

In Section 20 (p. 84) we describe the main embodiment (Eq. (113)) of an adaptive analog rank filter. In Subsection 20.1, we also provide an alternative embodiment (Eq. (117)) of this filter.

In Section 21 (p. 87) we extend the definitions of the modulated threshold densities and cumulative distributions to include ensembles of variables. We provide the expressions for the threshold averaged instantaneous density and cumulative distribution of a continuous ensemble, Eqs. (120) and (121), and for the modulated density and cumulative distribution of a continuous ensemble of variables, Eqs. (122) and (123).

In Section 22 (p. 88) we introduce the analog rank selectors, and provide the equations for the analog rank selectors for continuous (Eq. (126)) and discrete (Eq. (129)) ensembles.

In Section 23 (p. 90) we describe the embodiment of an adaptive analog rank filter for an ensemble of variables, Eq. (130).

In Section 24 (p. 90) we introduce the modulated threshold densities for scalar fields, Eq. (131).

In Section 25 (p. 91) we describe the analog rank selectors and analog rank filters for scalar fields, Eqs. (133), (134), and (135). In Subsection 25.1, we provide an example of filtering monochrome images using a simple numerical algorithm (Eq. (136)), implementing an analog rank selector for scalar fields.

In Section 26 (p. 93) we complete the description of the primary embodiment of the AVATAR by generalizing the modulated threshold densities to include vector fields, Eq. (138), and ensembles of vector fields, Eq. (139).

In Section 27 (p. 94)) we provide the description of the mean at reference threshold for a vector field input variable, Eq. (140).

In Section 28 (p. 95) we describe such important embodiments of AVATAR as the analog filters for the quantile density, domain, and volume. These quantities are defined in AVATAR for multivariate densities, and thus they are equally applicable to the description of the scalar variables and fields as well as to the ensembles of vector fields.

In Section 29 (p. 97) we provide several additional examples of performance of analog rank filters and selectors.

In Section 30 (p. 102) we provide a summary of some of the main transformations of variables employed in this disclosure.

1 Variables

In order to simplify dividing the problem of measurement and analysis of different variables into specific practical problems, let us assume that a variable x can be presented as an ensemble of vector fields, that is, it can be written as $$x = \int_{-\infty}^{\infty} d\mu n(\mu) x_\mu(a, t), \quad (1)$$

where $n(\mu) d\mu$ is the weight of the μth component of the ensemble such that $$\int_{-\infty}^{\infty} d\mu n(\mu) = N,$$

a is the spatial coordinate, and t is the time coordinate.

Convenience of the general representation of a variable by Eq. (1) can be illustrated by the following simple examples. As the first example, consider a vehicle in a traffic control problem. The position of this vehicle can be described by a single vector variable $x=x(t)$. If, however, we are measuring the weight of the vehicle's cargo, it might be more convenient to describe it as a scalar field $x=x(a,t)$, since the weight x at a given time depends on the position vector a. If we now extend our interest to the total weight of the cargo carried by N different vehicles, this weight is conveniently expressed by an ensemble of scalar fields $$x = \int_{-\infty}^{\infty} d\mu n(\mu) x_\mu(a, t),$$

where a is the position vector, $$n(\mu) = n(\mu) \sum_{i=1}^{N} \delta(\mu - i),$$

is the cargo capacity (volume of the cargo space) of the i th vehicle, and n(i) is the density (weight per unit volume) of the cargo in the i th vehicle. Notice that all the different variables in this example can be written in the general form of Eq. (1).

As a second example, a monochrome image at a given time is determined by the intensity of the color at location a, and thus it is conveniently described by a scalar field $x=x(a,t)$. A truecolor image is then naturally expressed by a vector field $x=x(a,t)$, where the color is described by its coordinates in the three-dimensional color space (red, green, and blue), at the position a. We can also consider a "compound" image as a finite or infinite set of such images, weighted by the weights $n(\mu)$. For example, such a compound image can be thought of as a statistical average of the video recordings, taken by several different cameras.

Additional particular examples of analysis of the variables satisfying the general form of Eq. (1) will be provided later in the disclosure.

2 Basic Elements of System for Analysis of Variables

A system for analysis of variables adopted in this disclosure comprises such basis elements as a Threshold Filter, which can be either a Discriminator or a Probe, and an Averaging Filter operable to perform either time or spatial average or both time and spatial average. This system can also include optional modulation and normalization by a Modulating Variable. A simplified schematic of such a basic system for analysis of variables is shown in FIG. 1a. This system is operable to transform an input variable into an output variable having mathematical properties of a scalar field of the Displacement Variable. The Threshold Filter (a Discriminator or a Probe) is applied to a difference of the Displacement Variable and the input variable, producing the first scalar field of the Displacement Variable. This first scalar field is then filtered with a first Averaging Filter, producing the second scalar field of the Displacement Variable. Without optional modulation, this second scalar field is also the output variable of the system, and has a physical meaning of either an Amplitude Density (when the Threshold Filter is a Probe), or a Cumulative Amplitude Distribution (when the Threshold Filter is a Discriminator) of the input variable.

A Modulating Variable can be used to modify the system as follows. First, the output of the Threshold Filter (that is, the first scalar field) can be multiplied (modulated) by the Modulating Variable, and thus the first Averaging Filter is applied to the resulting modulated first scalar field. For example, when the Threshold Filter is a Probe and the Modulating Variable is a norm of the first time derivative of the input variable, the output variable has an interpretation of a Counting (or Threshold Crossing) Rate. The Modulating Variable can also be filtered with a second Averaging Filter having the same impulse response as the first Averaging Filter, and the output of the first Averaging Filter (that is, the second scalar field) can be divided (normalized) by the filtered Modulating Variable. As will be discussed further in the disclosure, the resulting output variable will then have a physical interpretation of either a Modulated Threshold Density (when the Threshold Filter is a Probe), or a Modulated Cumulative Threshold Distribution (when the Threshold Filter is a Discriminator). For example, when the Threshold Filter is a Probe and the Modulating variable is a norm of the first time derivative of the input variable, the output variable will have an interpretation of a Counting (or Threshold Crossing) Density.

Let us now describe the basic elements of the analysis system adopted in this disclosure in more details, using the measurement a single scalar variable $x=x(t)$ as all example.

We assume the data acquisition and analysis system which comprises the elements schematically shown in FIG. 1b. Let the input signal be a scalar function of time $x(t)$. This input signal (Panel I) is transformed by the discriminator (Panel IIa) into a function of two variables, the time t and the displacement D. The latter will also be called threshold in the subsequent mathematical treatment. The result of such transformation of the input signal by the discriminator is illustrated in Panel IIIa. We will provide illustrative examples of such a measuring system below.

The input-output characteristic of the discriminator is described by the continuous monotonic function $\mathcal{F}_{\Delta D}(x)$ and is illustrated in Panel IIa. We shall agree, without loss of generality, that $$\begin{cases} \lim_{x \to -\infty} \mathcal{F}_{\Delta D}(x) = 0 \\ \mathcal{F}_{\Delta D}(0) = \frac{1}{2} \\ \lim_{x \to \infty} \mathcal{F}_{\Delta D}(x) = 1 \end{cases} \qquad (2)$$

Although the convention of Eq. (2) is not necessary, it is convenient for the subsequent mathematical treatment. One skilled in the art will now recognize that a discriminator can thus be interpreted as a threshold integrating filter. The dependence of $F_{\Delta D}$ on the width parameter $\Delta D$ then can be chosen in such way that $F_{\Delta D}$ approaches the Heaviside unit step function (Arfken, 1985, p. 490, for example) as $\Delta D$ approaches a suitable limit, namely $$\lim_{\Delta D \to 0} \mathcal{F}_{\Delta D}(D - x) = \theta(D - x), \qquad (3)$$

where $\theta(x)$ is defined as $$\theta(x) = \int_{-\infty}^{x} ds\, \delta(s) = \begin{cases} 0 & \text{for } x < 0 \\ \frac{1}{2} & \text{for } x = 0, \\ 1 & \text{for } x > 0 \end{cases} \qquad (4)$$

and $\delta(x)$ is the Dirac $\delta$-function. When the functional form of the discriminator is the Heaviside unit step function $\theta(x)$, such discriminator will be called an ideal discriminator. Some other exemplary functional choices for discriminators will be discussed further.

As an illustration, consider the following example. Imagine that the signal $x(t)$ in Panel I is an electrical current which we measure with the ammeter of Panel IIa. The scale of the ammeter is calibrated in units of current, and D is our reading of this scale. Then $F_{\Delta D}(D-x)$ can be interpreted as the probability that our measurement (reading) D exceeds the "true" value of the input current x, and $\Delta D$ is indicative of the precision of the instrument (ammeter). Thus $F_{\Delta D}[D-x(t)]$ (Panel IIIa) is just such probability with respect to a time-varying input signal, and this probability is now a function of both threshold and time. Notice that this function $$z = F_{\Delta D}[D - x(t)] = f(t, D) \qquad (5)$$

is represented in a three-dimensional rectangular coordinate system by a surface, which is the geometric locus of the points whose coordinates t, D, and z satisfy Eq. (5). Thus the methodological purpose of the measurements by a means of discriminators and probes can be phrased as "raising" the "flat" problem of the analysis of the curve on a plane into the "embossed" surface problem of a three-dimensional space. This alone enables new methods of analysis of the signal x(t), and allows more effective solutions of the existing problems of the prior methods. As a simple analogy, consider the problem of constructing four equilateral triangles out of six wooden matches. This task cannot be achieved on a plane, but can be easily accomplished by constructing a tetrahedron in a three-dimensional space.

The output of the discriminator can be differentiated with respect to the displacement (threshold). The same can be achieved by a means of transforming the input signal by a differential discriminator, or probe, as illustrated in Panels IIb and IIIb. The input-output characteristic of a probe is coupled with the one of the discriminator by the relation $$\partial_D \mathcal{F}_{\Delta D}(D-x) = \frac{d}{dD} \mathcal{F}_{\Delta D}(D-x), \qquad (6)$$

where $\partial_D$ denotes differentiation with respect to the threshold D. As follows from the description of a discriminator, it is convenient, though not necessary, to imagine $\partial_D F_{AD}$ to be nonnegative. It is simplest to assume that $\partial_D F_{AD}(x)$ has a single extremum at x=0, and vanishes at x=±∞.

As another example, consider a voltage x(t) (Panel I) applied to the vertical deflecting plates of an oscilloscope (Panel IIb). If the vertical scale of the graticule is calibrated in units of voltage, we can imagine $\partial_D F_{AD}(D-x)$ to be the brightness (in the vertical direction) of the horizontal line displayed for the constant voltage x, with ΔD indicative of the width of this line. Then $\partial_D F_{AD}[D-x(t)]$ (Panel IIIb) describes the vertical profile of the brightness of the displayed line for the time-varying input signal x(t).

As will be discussed subsequently, the input-output characteristic of a probe call be called the threshold impulse response function of the detection system. One skilled in the art will recognize that a probe can thus be interpreted as a threshold smoothing filter. The functional form of the probe will also be called the (threshold) test function in the subsequent mathematical treatment. Clearly, as follows from Eqs. (4) and (6), the threshold impulse response of an ideal detection system, that is, a system employing ideal discriminators, is described by the Dirac δ-function. Some other exemplary functional choices for probes will be discussed further.

For the purpose of this disclosure, we will further refer to the measuring system comprising the non-ideal discriminators and probes as a "real" measuring system. The output of such a system, and thus the starting point of the subsequent analysis, is no longer a line in the time-threshold plane (as in the case of an ideal system), but a continuous surface (see Eq. (5), for example). Based on the described properties of the discriminators and probes, one skilled in the art will now recognize that discriminators and differential discriminators effectively transform the input signal into objects with mathematical properties of cumulative distribution and density functions, respectively. The main purpose of such transformation is to enable differentiation with respect to displacement (threshold), while preserving, if originally present, differentiability with respect to space and time. If the original input signal is not time-differentiable (e.g., the input signal is time-sampled), differentiability with respect to time can always be enabled by introducing time averaging into the acquisition system. Likewise, differentiability with respect to spatial coordinates can be enabled by spatial averaging.

Particular practical embodiments of the discriminators and probes will depend on the physical nature of the analyzed signal(s). For example, for a scalar signal of electrical nature, the discriminator can be viewed as a nonlinear amplifier, and the threshold as a displacement voltage (or current, or charge). If the incoming signal describes the intensity of light, then the displacement can be a spatial coordinate z, and the discriminator can be an optical filter with the transparency profile described by $F_{AD}(z)$. The differential discriminator (probe) can then be implemented through the techniques of modulation spectroscopy (see Cardona, 1969, for example, for a comprehensive discussion of modulation spectroscopy). As an additional example, consider the modification of the previously discussed current measurement as follows. Imagine that a gray optical filter is attached to the needle of the ammeter, and the white scale is observed through this filter. Assume that when no current flows through the ammeter, the blackness observed at the position D on the scale is $F_{AD}(D)$, with zero corresponding to the maximum intensity of the white color, and "1" representing the maximum blackness. Then $F_{AD}[D-x(t)]$ will describe the observed blackness of the scale for the time-varying signal x(t) (see Panel IIIa in FIG. 1b). If the profile of the filter were changed into $\partial_D F_{AD}(D)$, then the observed darkness of the scale will correspond to the output of a probe rather than a discriminator (see Panel IIIb in FIG. 1b). Since the mathematical description of any practical embodiment will vary little, if at all, with the physical nature of the measuring system and analyzed signal, we will further use the mathematical language without references to any specific physical (hardware) implementation of the invention. It is also understood that all the formulae manifestations of the embodiments immediately allow software implementation.

3 Exemplary Discriminators and Probes

Given the input x, the value of θ(D–x) is interpreted as the output of an ideal discriminator set at threshold D (see Nikitin et al., 1998, and Nikitin, 1998, for example). Thus the value of $$\delta(D-x) = \frac{d}{dD}\theta(D-x)$$

is the output of an ideal probe.

Input-output characteristics of some exemplary discriminators and the respective probes are shown in FIG. 2. Notice that although we show only symmetric discriminators, asymmetric ones can be successfully applied for particular tasks, as well as any linear combination of the discriminators. A particular mathematical expression describing the input-output characteristic of a discriminator is important only for mathematical computations and/or computer emulations. Any physical device can serve as a discriminator, as long as its input-output characteristic and the characteristic of the respective probe satisfy the requirements for a test function, e.g., Eqs. (2), (3), and (6).

For those shown in FIG. 2, the mathematical expressions are as follows:

Gaussian: $\partial_D \mathcal{F}_{\Delta D}(D-x) = \dfrac{1}{\Delta D \sqrt{\pi}} e^{-\left(\frac{D}{\Delta D}\right)^2}$, $\mathcal{F}_{\Delta D}(D) = \dfrac{1}{2}\operatorname{erfc}\left(\dfrac{-D}{\Delta D}\right)$; (7)

Cauchy: $\partial_D \mathcal{F}_{\Delta D}(D) = \dfrac{1}{\pi \Delta D}\left[1+\left(\dfrac{D}{\Delta D}\right)^2\right]^{-1}$, $\mathcal{F}_{\Delta D}(D) = \dfrac{1}{2} + \dfrac{1}{\pi}\arctan\left(\dfrac{D}{\Delta D}\right)$;

Laplace: $\partial_D \mathcal{F}_{\Delta D}(D) = \dfrac{1}{2\Delta D} e^{-\frac{|D|}{\Delta D}}$, $\mathcal{F}_{\Delta D}(D) = \dfrac{1}{2}\left[1 + e^{\frac{D\theta_1 - D_1}{\Delta D}} - e^{\frac{-D\theta(D_1)}{\Delta D}}\right]$;

Hyperbolic: $\partial_D \mathcal{F}_{\Delta D}(D) = \dfrac{2}{\Delta D}\left(e^{\frac{D}{\Delta D}} + e^{-\frac{D}{\Delta D}}\right)^{-2}$, $\mathcal{F}_{\Delta D}(D) = \dfrac{1}{2}\left[1 + \tanh\left(\dfrac{D}{\Delta D}\right)\right]$.

4 Normalized Scalar Fields

Since the invention employs transformation of discrete or continuous variables into objects with mathematical properties of space and time dependent density or cumulative distribution functions, these properties and their consequent utilization need to be briefly discussed. We will further also use the collective term normalized scalar fields to denote the density and cumulative distribution functions. Note that the term "time" is used as a designation for any monotonic variable, continuous or discrete, common to all other analyzed variables, which can be used for sequential ordering of the measurements. Thus "space" is all the remaining coordinates which are employed to govern the values of the input variables. The term "threshold space" will be used for the coordinates describing the values of the variables. For the purpose of this disclosure only, we will further also use the term "phase space", which will be understood in a very narrow meaning as the threshold space employed for measuring the values of the variable together with the values of the first time derivative of this variable.

Let us further use the notation for a volume integral as follows:

$$\int_{-\infty}^{x} d^n r f(r) = \int_{-\infty}^{x_1} dr_1 \ldots \int_{-\infty}^{x_n} dr_n f(r), \quad (8)$$

where $x=(x_1, \ldots, x_n)$ and $r=(r_1 \ldots r_n)$ are n-dimensional vectors. This definition implies cartesian coordinates, which we also assume in further presentation. If the subsequent equations need to be re-written in curvilinear coordinates (e.g., for the purpose of separation of variables), this can be done by the standard transformation techniques. Refer to Arfken, 1985, Margenau and Murphy, 1956, or Morse and Feshbach, 1953, for example, for a detailed discussion of such techniques.

Now let $F_K(x;a,t)$ be a space and time dependent cumulative distribution function, i.e., $$F_K(x; a, t) = \int_{-\infty}^{x} d^n r f_K(r; a, t), \quad (9)$$

where $f_K(x;a,t)$ is a density function, i.e, $f_K(x;a,t) \geq 0$, and $$\int_{-\infty}^{\infty} d^n r f_K(r; a, t) = 1. \quad (10)$$

Phase space density (see Nicholson, 1983, for example) in plasma physics and probability density (see Davydov, 1988, and Sakurai, 1985, for example) in wave mechanics are textbook examples of time dependent density functions. Another common example would be the spectral density acquired by a spectrometer with spatial and temporal resolution (see Zaidel' et al., 1976, for example). In Eqs. (9) and (10), the subscript K denotes functional dependence of $F_K$ and $f_K$ on some space and time dependent quantity (variable) K. That is although these equations hold for any given space and time, the shape of $f_K$ (and, as a result, the shape of $F_K$) might depend on K. The particular wave in which such dependence is introduced and utilized in this invention will be discussed further in the disclosure.

The usefulness of density and cumulative distribution functions for analysis of variables extends beyond the fact that the geometric representation makes details of the analysis intuitive and more available for human perception by analogy with the ordinary space. It also lies in one's ability to set up equations better describing the behavior of the variables than the algebraic equations of the prior art. As has been discussed previously, for example, a level line of the cumulative distribution function of a scalar variable in the time-threshold plane corresponds to the output of an order statistic filter. It is an easy-to-envision simple geometric image, having many analogies in our everyday experience (e.g., topographical maps showing elevations). Since it is a curve of the plane, it is completely determined by an algebraic equation with two variables, $F(x,y)=0$, with the easiest transition from the implicit to the explicit form as a well-known differential equation (see Bronshtein and Semendiaev, 1986, p. 405, Eq. (4.50), for example):

$$y'(x) = -\dfrac{F'_x(x, y(x))}{F'_y(x, y(x))}. \quad (11)$$

As another example, imagine that the function $f_K(x;a,t)$ in a traffic control problem describes the density of cars (number of cars per unit length of the road). Then the properties of this density function might be analogous to the properties of the density of fluid. They will, for example, satisfy the continuity equation (Arfken, 1985, p. 40, for example). Then fluid equations will be the most appropriate for the description of the properties of the density function of the traffic problem. Specific applications of the density functions will, of course, depend on the physical nature (or applicable physical analogy) of the variables involved, that is, on the nature of t, a, and x, and on the constraints imposed on these variables. In the next subsection, we will provide several examples of the equations involving the threshold distribution and density functions, which might be of general usage for analysis of variables.

5 Rank Normalization, Rank Finding, and Rank Filtering

Using the above definitions for the normalized scalar fields, we can now introduce several examples of additional transformations of variables. Some of these equations will be used further in the disclosure for development of various practical embodiments of AVATAR. Let us first identify rank normalization and filtering of variables as follows.

Let us consider a new (dimensionless scalar) variable (field) $y(a,t)$ defined as $$y(a, t) = F_K[x(a, t); a, t] = \int_{-\infty}^{x(a,t)} d^n r f_K(r; a, t), \quad (12)$$

where $x(a,t)$ is an arbitrary variable. Apparently, $0 \leq y(a,t) \leq 1$. Since $\partial_{x_i} F_K(x;a,t) \geq 0$, where $\partial_{x_i}$ denotes a partial derivative with respect to $x_i$, Eq. (12) defines rank normalization of the variable $x(a,t)$ with respect to the reference distribution $F_K$. Rank normalization transforms a variable into a scalar variable (or scalar field, if the transformed variable is a field variable), the magnitude of which at any given time equals to the value of the reference distribution evaluated at the value of the input variable at a this time. Thus $F_K$ provides a (nonlinear) scale for measurement of $x(a,t)$. We will discuss rank normalization in more details later in the disclosure.

Differentiating Eq. (12) with respect to time leads to yet another defining equation for an analog rank normalizer (ARN) as follows:

$$\dot{y} \partial_t F_K(x;a,t) + (\dot{x} \cdot \nabla_x) F_K(x;a,t), \quad (13)$$

where $\partial_t$ denotes a partial derivative with respect to t, and $\dot{x} \cdot \nabla_x$ in cartesian coordinates is simply $$\dot{x} \cdot \nabla_x = \sum_{i=1}^{n} \dot{x}_i \partial_{x_i}. \quad (14)$$

Let us now introduce another transformation of variables, which can be interpreted as rank filtering. By definition, $x_q$ is the qth quantile of $F_K(x;a,t)$ when $$F_K(x_q; a, t) = \int_{-\infty}^{x_q} d^n r f_K(r; a, t) = q = \text{constant}, \quad (15)$$

where $0 \leq q \leq 1$ is the quantile value. Note that Eq. (15) describes a simple surface in the threshold space. When the variable x is a scalar, that is, $x(a,t)=x(a,t)$, this surface is a point on the threshold line, and thus (as has been previously discussed) $F_K(x_q;a,t)=q$ describes a level line in the time-threshold plane. Taking the full time derivative of $F_K(x_q;a,t)$ allows us to rewrite Eq. (15) in differential form for a family of equiquantile surfaces in the threshold space as $$\partial_t F_K(x_q;a,t) + (\dot{x}_q \cdot \nabla_x) F_K(x_q;a,t) = 0. \quad (16)$$

We can further introduce some constraints on $x_q$, such as constraints on the direction of $\dot{x}_q$, or other subsidiary conditions. For example, if we allow only the nth component of $x_q$ to depend on time, the time derivative of this component can be written as $$\dot{x}_{q,n} = -\frac{\partial_t F_K(x_q; a, t)}{\partial_{x_{q,n}} F_K(x_q; a, t)}, \quad (17)$$

assuming that all derivatives in this equation exist. Eq. (17) thus defines an analog rank filter (ARF). The latter can also be called analog order statistic filter (AOSF), or analog quantile filter (AQF). Note that even though we adopt the existing digital signal processing terminology such as "order statistic filter", this is done by a simple analogy between the geometric extension of the AVATAR and the definitions in the discrete domain. Our definitions cannot be derived from the algebraic equations defining order statistic filtering in digital signal processing. Note also that a particular form of Eq. (17) depends on the nature of constraints imposed on $x_q$. For the important special case of the input variable as an m-dimensional surface, that is, a scalar field $x=z(a,t)$, where $a=(a_1 \ldots, a_m)$, Eq. (17) reads as $$\dot{z}_q(a, t) = -\frac{\partial_t F_K(z_q(a, t); a, t]}{F_K[z_q(a, t); a, t]}. \quad (18)$$

In numerical computations, Eqs. (17) and (18) can be considered to be modifications of the Newton-Raphson method of root finding (see Press et al., 1992, for example, and the references therein for the discussion of the Newton-Raphson method).

When the distribution function does not depend on time explicitly, $F_K = F_K(z;a)$, we can introduce an explicit parametric dependence of the density function on some $\beta$, for example, through the convolution transform $$g_\alpha(z; a, \beta) = \int_{-\infty}^{\infty} d\varepsilon \phi_\alpha(\beta - \varepsilon) f_K(z; a), \quad (19)$$

such that $g_\alpha(z;a, \beta)$ approaches $f_K(z;a)$ as $\alpha$ approaches a suitable limit, for example, when $\phi_\alpha(\beta-\epsilon)$ approaches the Dirac $\delta$-function $\delta(\beta-\epsilon)$. Then the equality $$\int_{-\infty}^{z_q(a,\beta)} d\varepsilon g_\alpha(\varepsilon; a, \beta) = q \quad (20)$$

leads to the equation for an analog rank finder, or analog rank selector, as follows:

$$\frac{d}{d\beta} z_q(a, \beta) = -\frac{\int_{-\infty}^{z_q(a,\beta)} d\varepsilon \partial_\beta g_\alpha(\varepsilon; a, \beta)}{g_\alpha[z_q(a, \beta); a, \beta]}. \quad (21)$$

Introducing parametric dependence through the convolution transform will later be shown to be convenient in rank selectors for an ensemble of time dependent variables, since the parameter $\beta$ can be chosen to be the time itself. Clearly, there are plenty of alternatives for introduction of such parametric dependence. For example, one can choose $f_K(\epsilon; a, \alpha) = \phi(\alpha) f_K(\epsilon;a)$ with $\phi(\alpha)$ such that $\lim_{\alpha \to \infty} \phi(\alpha) = 1$. As an illustration, the choice $\phi(\alpha) = 1 - (1-q)e^{-\alpha}$ leads to $$\frac{d}{d\alpha} z_q = \frac{q - F_K(z_q; a)}{[1 - (1-q)e^{-\alpha}]f_K(z_q; a)}, \quad (22)$$

where $z_q(a, \alpha)$ rapidly converges to the "true" value of $z_q(a)$. Notice again that the definitions of the analog rank selectors require the existence of $f_K$, that is, the threshold continuity of $F_K$, and thus cannot be introduced in the digital domain.

Finally, the threshold continuity of the distribution function allows us to write, for both time dependent and time independent scalar fields, an explicit expression for the qth quantile of $F_K(x;a,t)$ as $$x_q(a, t) = \int_{-\infty}^{\infty} dr \, r f_K(r; a, t) \delta[F_K(r; a, t) - q]. \quad (23)$$

The derivation and properties of this equation for rank filtering will be discussed later in the disclosure. Further, we will also provide a means of evaluating this expression by analog machines.

Let us also define another type of rank filtering, which, unlike the rank filtering defined earlier, is applicable to multivariate variables and does not (and cannot) have a digital counterpart, as follows:

$$\int_{-\infty}^{\infty} d^n r f_K(r; a, t) \theta[f_K(r; a, t) - f_q(a, t)] = q = \text{constant}, \quad (24)$$

where $f_q(a,t)$ is quantile density. Since the density function $f_K(x;a,t)$ vanishes at $x_n = \pm \infty$, the surface in the threshold space defined by Eq. (24) encloses the series of volumes (regions in the threshold space) such that $f_K(x;a,t) > f_q(a,t)$, and the integral of $f_K(x;a,t)$ over these volumes is equal to q. We shall call this series of regions in the threshold space the quantile domain. Notice that the left-hand side of Eq. (24) is non-increasing function of $f_q(a,t) \geqq 0$. Later in the disclosure, we will provide a means of finding $f_q(a,t)$ by continuous action machines.

We shall designate the total volume enclosed by the surface defined by Eq. (24) as quantile volume $R_q$, which can be computed as $$R_q(a, t) = \int_{-\infty}^{\infty} d^n r \theta[f_K(r; a, t) - f_q(a, t)]. \quad (25)$$

Notice that the quantile density indicates the value of the density likely to be exceeded, and the quantile volume gives the total volume of the highest density regions in the threshold space. As an example, consider the density of the cars in a city. The median density will indicate the degree of congestion on the roads, providing the number of cars per unit length of a road (or, inversely, "bumper-to-bumper" distance) such that half of the traffic is equally or more dense. Then the median domain will indicate the regions (stop lights and intersections) of such congested traffic, and the median volume will give the total length of the congested roads. As another simple example, consider the price (amount per area) of the land in some geographic region. The median density will be the price such that the total amount paid for the land equally or more expensive will be half of the total cost of the land in the region. Then the median domain will map out these more expensive regions, and the median volume will give the total area of this expensive land. Notice that even though in the latter example the "median density" is price (it has the units of amount per area), it is not the "median price" in its normal definition as "the price such that half of the area is less (or more) expensive". Later in the disclosure, we will provide a means of computation of the quantile domain and volume by continuous action machines.

Since the distribution and density functions $F_K$ and $f_K$ depend on the quantity K, comparison of these functions with respective $F_{K'}$ and $f_{K'}$ for a different quantity K' will provide a means for assessment of K and K' in their relation to the reference variable, that is, to the variable for which the distribution and density were computed. For example, the equality $F_K = F_{K'}$ when $K \neq K'$ will indicate that even though K and K' are not equal, they are equivalent to each other in their relation to the reference variable, at least under the conditions of the conducted measurement. When the quantity K represents the reference variable in some way so that the behavior of K reflects some aspects of the behavior of the reference variable, the reference variable should be considered a component of the measured signal or process rather than a part of the acquisition system. In this case, we shall designate the reference variable as the input variable and call the quantity K an associated variable, or an associated signal. When such interdependence between K and x is not only implied or suspected, but defined in some particular way, we will also call x the input variable, and K a property of the input variable.

The particular way in which the dependence of the density and the cumulative distribution functions on K are introduced in this invention can be interpreted as measuring the input variable K in terms of the rate of change of the reference variable x at a certain threshold D. The details of this interpretation will be provided later in the disclosure. In the next subsection, we will briefly discuss some aspects of the relationship between the input and the associated variables.

6 Relationship between Input and Associated Variables

In order to implement comparison of variables of different natures, it is important to have a reference system, common for all variables. Naturally, time (t) is one of the coordinates in this reference system, since it equally describes evolution of all measured variables. Time can also serve as a proxy for any monotonically ordered index or coordinate. For brevity, we shall call the remaining coordinates governing the values of the variables the spatial coordinates (a). Time and space are the third and second arguments, respectively, in the dimensionless object, cumulative distribution function, we are to define. We will call the first argument of the cumulative distribution the threshold, or displacement (D), and the units of measurements of this argument will be the same as the units of the input (reference) variable.

There is plenty of latitude for a particular choice of an associated variable K, and a variety of ways to introduce the coupling between K and the input variable. For the purpose of this disclosure, it would be of little interest to us to consider an a priori known K other than K=constant. Thus K must not be confused with the part of the acquisition system and rather should be considered a component of the measured phenomenon. The relationship between K and the input variable can be of a deterministic nature, such as mathematical transformation, or a result of physical dependence. For example, the reference variable can be the instantaneous air temperature, and the associated variable can be the instantaneous humidity. Then we might be interested in measuring the dependence of the humidity on the temperature variations at a given temperature. Or, the reference variable can be the total population of the psychiatric wards in the United States, and the associated variable the Dow Jones Industrial Average. Then one might try to investigate how the rate of change in the mental health of the nation affects the economic indicators. One skilled in the art will recognize that such dependence between the input and the reference variable is most naturally described in terms of their joint distribution. However, such a joint distribution will be a function of the threshold coordinates of both the input and the reference variables. Thus a different input variable will require a different threshold space for the description of its dependence on the reference variable. In order to enable comparison between input variables of different natures, we would desire to use the reference system common to both input variables, that is, the threshold coordinates of the reference variable.

As we will try to illustrate further, the choice of both reference and associated variables should be based on the simplicity of treatment and interpretation of the results. For our illustrative purposes, pursuant to easy and useful interpretation, we introduce nonconstant associated variables only as norms of the first two time derivatives of the input signal, |ẋ| and |ẍ|. Our choice of coupling as modulation, as further described in detail, is based solely on the immediate availability of physical interpretation of the results in the case of K=|ẋ|. For example, the cases K=constant and K=|ẋ| relate to each other as the charge and the absolute current in electric phenomena. This coupling (as modulation) allows the input (reference) variable to provide a common unit, or standard, for measuring and comparison of variables of different nature. This coupling also enables assessment of mutual dependence of numerous variables, and for evaluation of changes in the variables and in their dependence with time. For example, dependence of economic indicators on social indicators, and vice versa, can be analyzed, and the historical changes in this dependence can be monitored. Different choices of associated variables, however, may benefit from different ways of coupling.

For the purpose of this disclosure, we assume that continuous is synonymous to differentiable. Whenever necessary, we assume a continuous input variable x(a,t). When the definition of a particular property requires continuity of derivatives of the input variable, such continuity will also be assumed. For instance, the definitions of the densities for the threshold accelerations and for the phase space threshold crossing rates of a scalar variable x(t) will require continuity of the first time derivative ẋ(t) of the input variable. Of course, all the resulting equations are applicable to digital analysis as well, provided that they are re-written in finite differences.

7 Threshold Density for Counting Rates of Single Scalar Variable

As an introduction to a more general definition, let us consider a single scalar continuous-time variable (signal) x(t), and define a time dependent threshold density for this signal's counting (threshold crossing) rates. First, we notice that the total number of counts, i.e., the total number of crossings of the threshold D by the signal x(t) in the time internal $0 \leq t \leq T$, can be written as (see Nikitin et al., 1998, and Nikitin, 1998, for example)

$$N(D) = \sum_i \int_0^T dt \delta(t - t_i), \tag{26}$$

where $\delta(x)$ is the Dirac $\delta$-function, and $t_i$ are such that $x(t_i)=D$ for all i. Using the identity (Rumer and Ryvkin, 1977, p. 543, for example)

$$\delta[a - f(x)] = \sum_i \frac{\delta(x - x_i)}{|f'(x_i)|}, \tag{27}$$

we can rewrite Eq. (26) as $$N(D) = \int_0^T dt |\dot{x}(t)| \delta[D - x(t)], \tag{28}$$

where the dot over x denotes the time derivative. In Eq. (27), |f'(x)| denotes the absolute value of the function derivative with respect to x and the sum goes over all $x_i$ such that $f(x_i)=a$. Thus the expression $$\mathcal{R}(D) = \frac{1}{T} \int_0^T dt |\dot{x}(t)| \delta[D - x(t)] \tag{29}$$
$$= \int_{-\infty}^{\infty} ds \frac{\theta(s)\theta(T-s)}{T} |\dot{x}(s)| \delta[D - x(s)]$$

defines the counting, or threshold crossing, rate.

FIG. 3 illustrates the counting process for a continuous signal. This illustration utilizes the fact that $$\delta(x) = \frac{d}{dx}\theta(x),$$

where $\theta(x)$ is the Heaviside unit step function, and thus $\dot{\theta}[x(t)-D]=\dot{x}(t)\delta[x(t)-D]$ by differentiation chain rule.

Replacing the rectangular weighting function in Eq. (29) by an arbitrary time window h(t), the rate of crossing of the threshold D by the signal x(t) can be written as the convolution integral $$R_h(D, t) = \int_{-\infty}^{\infty} ds\, h(t-s) |\dot{x}(s)| \delta[D - x(s)], \tag{30}$$

where the time weighting function h(t) is such that $$\int_{-\infty}^{\infty} ds\, h(s) = 1, \tag{31}$$

and is interpreted as a moving (or sliding) window. It is simplest, though not necessary, to imagine h(t) to be non-negative. Notice that now the threshold crossing rate (Eq. (30)) depends on time explicitly. Note also that in Eq. (30) this rate is measured by means of an ideal probe $\partial_D F_{\Delta D}(D-x) = \delta(D-x)$ with time impulse response h(t).

If T is a characteristic time, or duration of h(t), we will use shorthand notations for the integral $$\int_{-\infty}^{\infty} ds\, h(t-s;T)\, \ldots = \langle \ldots \rangle_T^h \tag{32}$$

$$= \langle \ldots \rangle_T. \tag{33}$$

These equations define a time average on a time scale T. We will consequently use the notations of Eqs. (32) and (33) for both continuous and discrete time averages. The notation of Eq. (32) will be used whenever the particular choice of the weighting function is important.

Noticing that $$\int_{-\infty}^{\infty} dD\, R_h(D,t) = \langle |\dot{x}| \rangle_T,$$

we can now define the counting (threshold crossing) density as $$r(D,t) = \frac{\langle |\dot{x}| \delta(D-x) \rangle_T}{\langle |\dot{x}| \rangle_T}, \tag{34}$$

where we used the shorthand notation of Eq. (33).

The meaning of the above equation can be clarified by its derivation from another simple reasoning as follows. Note that a threshold crossing occurs whenever the variable has the value D, and its first time derivative has a non-zero value. Then the density of such events is expressed in terms of the joint density of the amplitudes of the variable and its time derivative as $$r(D,t) = \frac{\int_{-\infty}^{\infty} dD_{\dot{x}} |D_{\dot{x}}| \langle \delta(D_{\dot{x}} - \dot{x})\delta(D-x) \rangle_T}{\int_{-\infty}^{\infty} dD \int_{-\infty}^{\infty} dD_{\dot{x}} |D_{\dot{x}}| \langle \delta(D_{\dot{x}} - \dot{x})\delta(D-x) \rangle_T} \tag{35}$$

$$= \frac{\left\langle \int_{-\infty}^{\infty} dD_{\dot{x}} |D_{\dot{x}}| \delta(D_{\dot{x}} - \dot{x})\delta(D-x) \right\rangle_T}{\left\langle \int_{-\infty}^{\infty} dD \int_{-\infty}^{\infty} dD_{\dot{x}} |D_{\dot{x}}| \delta(D_{\dot{x}} - \dot{x})\delta(D-x) \right\rangle_T}$$

$$= \frac{\langle |\dot{x}| \delta(D-x) \rangle_T}{\langle |\dot{x}| \rangle_T}.$$

The significance of the definition of the time dependent counting (threshold crossing) density, Eq. (34), stems from the importance of zero-crossings, or, more generally, threshold crossings, and zero/threshold crossing rates for many signal processing applications. These quantities characterize the rate of change in the analyzed signal, which is of the most important characteristics of a dynamic system. The importance of threshold crossing rates can be illustrated by the following simple physical analogy: If x(t) describes the location of a unit point charge, then $\delta(D-x)$ is the charge density, and thus $|\dot{x}|\delta(D-x)$ is the absolute current density at the point D. In the next subsection, we generalize the above result and provide its additional interpretation.

8 Modulated Threshold Densities and Weighted Means at Thresholds

In order to generalize the above result, let us first analyze the example shown in FIG. 4. Consider intersections of a scalar variable x(t) in the interval [0, T] with the thresholds $\{D_j\}$, where $D_{j+1}=D_j+\Delta D$. The instances of these crossings are labeled as $\{t_i\}$, $t_{i+1}>t_i$. The thresholds $\{D_j\}$ and the crossing times $\{t_i\}$ define a grid. We shall name a rectangle of this grid with the lower left coordinates $(t_i, D_j)$ as a $s_{ij}$ box. We will now identify the time interval $\Delta t_{ij}$ as $t_{i+1}-t_i$ if the box $s_{ij}$ covers the signal (as shown in FIG. 4), and zero otherwise.

We can thus define the threshold density, modulated (weighted) by the associated variable K, or simply Modulated Threshold Density (MTD), as $$c_K(D_j, t) = \lim_{\Delta D \to 0} \frac{1}{\Delta D} \frac{\sum_i \Delta t_{ij} K(t_i)}{\sum_{i,j} \Delta t_{ij} K(t_i)}. \tag{36}$$

Utilizing Eq. (27) we can rewrite Eq. (36) as $$c_K(D, t) = \frac{\frac{1}{T}\int_0^T dt\, K(t)\delta(D-x(t))}{\frac{1}{T}\int_0^T dt\, K(t)} = \frac{\langle K\delta(D-x) \rangle_T}{\langle K \rangle_T}. \tag{37}$$

For example, $K(t)=|\dot{x}(t)|$ leads to the previously described result, that is, to the counting density. For K=constant, Eq. (37) reduces to the amplitude density (Nikitin. 1998), namely $$b(D,t) = \int_{-\infty}^{\infty} ds\, h(t-s)\delta[D-X(s)] = \langle \delta(D-x) \rangle_T. \tag{38}$$

Notice that the modulated threshold density also formally reduces to the amplitude density whenever $$\langle K\delta(D-x) \rangle_T = \langle K \rangle_T \langle \delta(D-x) \rangle_T, \tag{39}$$

that is, when K(t) and the pulse train $\delta[D-x(t)]=|\dot{x}(t)|^{-1}\sum_i \delta(t-t_i)$ are uncorrelated.

To further clarify the physical meaning of MTD, let us first use Eq. (27) and rewrite the numerator of Eq. (37) as $$\langle K\delta(D-x) \rangle_T^h = \sum_i h(t-t_i) \frac{K_i}{|\dot{x}(t_i)|}, \tag{40}$$

which reveals that it is just a weighted sum of the ratios $K_i/|\dot{x}(t_i)|$, evaluated at the intersections of x with the threshold D. Noticing that the ratio $dD/|\dot{x}(t_i)|$ is equal to the time interval the variable r spends between D and D+dD at the ith intersection, we shall realize that $$\{M_xK\}_T^h(D,t) = \frac{\langle K\delta(D-x)\rangle_T^h}{\langle \delta(D-x)\rangle_T^h} = \frac{\sum_i K_i \frac{h(t-t_i)}{|\dot{x}(t_i)|}}{\sum_i \frac{h(t-t_i)}{|\dot{x}(t_i)|}} \quad (41)$$

is the time weighted mean of K with respect to x at the threshold D, or simply Mean at Reference Threshold (MRT). Using this designation (MRT) can further be justified by rewriting the middle term of Eq. (41) as $$\frac{\langle K\delta(D-x)\rangle_T^h}{\langle \delta(D-x)\rangle_T^h} = \frac{\left\langle \left[\int_{-\infty}^{\infty} dD_K D_K \delta(D_K - K)\right]\delta(D-x)\right\rangle_T^h}{\langle \delta(D-x)\rangle_T^h} \quad (42)$$

$$= \int_{-\infty}^{\infty} dD_K D_K \frac{\langle \delta(D_K - K)\delta(D-x)\rangle_T^h}{\langle \delta(D-x)\rangle_T^h}$$

$$= \int_{-\infty}^{\infty} dD_K D_K f(D_K; D, t),$$

which demonstrates that MRT is indeed the first moment of the density function $f(D_K;D,t)$. Notice that here the threshold coordinates D of the variable x are the spatial coordinates of the density function $f$. Later in the disclosure, we will generalize this result to include the multivariate modulated threshold densities. Then, for example, if the reference variable x(t) is the positions of the particles in an ensemble, and $K(t)=\dot{x}(t)=v(t)$ is their velocities, then $\{M_xK\}_T^h(D, t)$ will be the average velocity of the particles at the location D as a function of time t. Using Eq. (41), Eq. (39) can be rewritten as $$\{M_xK\}_T^h(D,t)=\langle K\rangle_T^h \quad (43)$$

and understood as the equality, at any given threshold, between the weighted mean of K with respect to x and the simple time average of K. That is, if Eq. (43) holds for any threshold, the weighted mean of K with respect to x is a function of time only. Obviously, Eq. (43) always holds for K=constant.

It is very important to notice that although the modulated threshold density given by Eq. (37) implies that K never changes the sign from "plus" to "minus" (or vice versa), the weighted mean at threshold of a reference variable defined by Eq. (41) is meaningful for an arbitrary K, and thus the comparison of Eq. (43) can always be implemented. For example, this comparison is implementable for $\langle K\rangle_T^h=0$, when the modulated density does not exist.

Eq. (43) signifies that a simple comparison of the weighted mean at threshold $\{M_xK\}_T^h$ with the simple time average $\langle K\rangle_T^h$, that is, comparison of a modulated density with unmodulated (amplitude), will indicate the presence of correlation between the reference and the associated variables as a function of threshold (and time) on a given time scale. In other words, the equality of Eq. (43) holds when, at a given threshold D, the values of the variable K are uncorrelated with the time intervals the variable x spends between D and D+dD. As a simplified example, consider K(t) as a clipped x(t), that is, as $$K(t) = \begin{cases} D_0 & \text{for } x(t) < D_0 \\ x(t) & \text{for } x(t) \geq D_0 \end{cases} \quad (44)$$

In this case, Eq. (43) will hold for $D \leq D_0$, and will generally fail for $D > D_0$.

As another example, let the signal x(t) represent a response of a detector system to a train of pulses with high incoming rate, Poisson distributed in time. The high rate might cause high order pileup effects in some low energy channels of the detector. Then, as follows from (Nikitin, 1998), the amplitude and the threshold crossing densities for such a signal, measured in these channels, will be identical. Thus the channels afflicted by the pileup effects can be identified by comparing the counting rate with the amplitude distribution in different channels.

As an opposite extreme of Eq. (43), the mean at reference threshold can be a function of threshold only, and thus K would be completely determined by the reference variable. As an illustration, consider a linear reference variable x=at, a>0, and thus $$\delta(D-x) = \frac{1}{a}\delta\left(\frac{D}{a} - t\right),$$

which leads to the MRT as $$\{M_{at}K\}_T^h(D,t) = \frac{\frac{1}{a}\int_{-\infty}^{\infty} dsh(t-s)K(s)\delta\left(\frac{D}{a}-s\right)}{\frac{1}{a}\int_{-\infty}^{\infty} dsh(t-s)\delta\left(\frac{D}{a}-s\right)} = K\left(\frac{D}{a}\right), \quad (45)$$

which depends only on the threshold. One skilled in the art will now recognize that a simple reincarnation of Eq. (45) in a physical device would be an ideal oscilloscope (that is, a precise oscilloscope projecting an infinitesimally small spot on the screen) where the reference variable x=at is the voltage across the horizontal deflecting plates, and the MRT is the vertical position of the luminescent spot on the screen at x=D. Thus the measurement of the MRT is indeed "measuring the input variable K in terms of the reference variable x". For an arbitrary reference variable, the MRT is the average of these vertical positions weighted by the time intervals the reference variable spends at the horizontal position D. Since the afterglow of the luminophor coating of the screen conveniently provides the (exponentially forgetting) time averaging, the MRT can be measured as the average vertical deflection, weighted by the brightness of the vertical line at the horizontal deflection D. In the next three subsections we will clarify how this idealized example relates to the real measurements.

FIG. 5 provides another example of using modulated densities for measuring the input variable K in terms of the reference variable x. Notice that the amplitude densities (center panels) of the fragments of the signals $x_1(t)$ and $x_2(t)$ shown in the left-hand panels of the figure are identical. Notice also that the modulating signals $K_1(t)$, $K_2(2)$, and $K_3(t)$ are identical for the respective modulated densities of the signals $x_1(t)$ and $x_2(t)$, while the modulated densities are clearly different. Thus even though the amplitude densities and the modulating signals are identical, different reference signals still result in different modulated densities.

Although the first argument in the density function $c_K(D, t)$ is always a threshold value, we will call the modulated densities for K=constant, K=|ẋ|, and K=|ẍ|, for brevity, the amplitude, counting (or threshold crossing), and acceleration densities, respectively. We now proceed with the general definitions of the multivariate modulated threshold densities and the weighted means at thresholds.

9 Multivariate Threshold Densities Averaged with Respect to Test Function

Time averaging with a time weighting function h(t) signifies transition from microscopic (instantaneous) densities $\delta(D-x)$ to macroscopic (time scale T) densities $\langle\delta(D-x)\rangle_T$. Carrying out the same transition from microscopic to macroscopic threshold domain can be done by a means of averaging with respect to a test function $f_R(x)$, a standard approach in such fields as electrodynamics (Jackson, 1975, Section 6.7, for example) or plasma physics (Nicholson, 1983, Chapter 3, for example). We thus can define a (multivariate) macroscopic threshold density as a threshold average on a scale R, namely as $$\langle \delta(D-r)\rangle_R^f = \int_{-\infty}^{\infty} d^n r f_R(x-r)\delta(D-r) = f_R(D-x), \quad (46)$$

where R is a characteristic volume element. We will assume $f_R(x)$ to be real, nonzero in some neighborhood of x=0, and normalized to unity over all space. It is simplest, though not necessary, to imagine $f_R(x)$ to be nonnegative. Such threshold averaging with respect to a test function reflects finite amplitude resolution of data acquisition systems. For digitally recorded data, the lower limit for the characteristic volume is the element of the threshold grid. We will further use the shorthand notation $$\int_{-\infty}^{\infty} d^n r f_R(x-r)\ldots = \langle\ldots\rangle_R^f \quad (47)$$

to denote the spatial averaging with the test function $f_R(x)$.

For hardware devices, the choice of $f_R(x)$ is dictated by the threshold impulse response of the discriminators (probes) (Nikitin, 1998, Chapter 7, for example). In software, this choice is guided by computational considerations. For the purpose of this disclosure, it is convenient to assume that the total threshold impulse response function is the product of the component impulse responses, that is, it can be written as $$f_R(x) = \prod_{i=1}^{n} \partial_{D_i} \mathcal{F}_{\Delta D_i}(x_i); \quad (48)$$

where capital pi denotes product, as capital sigma indicates a sum, that is, $$\prod_{i=1}^{n} f_i = f_1 f_2 f_3 \ldots f_n. \quad (49)$$

Unless otherwise noted, the subsequent computational examples employ Gaussian test function, namely $$f_R(x) = \prod_{i=1}^{n} \partial_{D_i} \mathcal{F}_{\Delta D_i}(x_i) = \frac{\pi^{-\frac{n}{2}}}{\prod_{i=1}^{n} \Delta D_i} \exp\left[-\sum_{i=1}^{n}\left(\frac{x_i}{\Delta D_i}\right)^2\right]. \quad (50)$$

Notice that, for the Gaussian test function, $$\int_{-\infty}^{x} d^n r f_R(r) = \mathcal{F}_R(x) = \prod_{i=1}^{n} \mathcal{F}_{\Delta D_i}(x_i) = 2^{-n}\prod_{i=1}^{n} \mathrm{erfc}\left(\frac{-x_i}{\Delta D_i}\right), \quad (51)$$

where erfc(x) is the complementary error function (Abramowitz and Stegun, 1964, for example). $F_R(X)$ should be interpreted as threshold step response.

FIG. 6 illustrates an optical threshold smoothing filter (probe). This probe consists of a point light source S and a thin lens with the focal length f. The lens is combined with a gray optical filter with transparency described by $f_{2f}(x)$. Both the lens and the filter are placed in a XOY plane at a distance 2f from the source S. The lens-filter combination can be moved in the XOY plane by the incoming signal r so that the center of the combination is located at $$\frac{2fr}{4f-R}$$

in this plane. Then the output of the filter is proportional to the intensity of the light measured at the location $D=(D_x, D_y)$ in the $D_x$-O-$D_y$ plane parallel to the XOY plane and located at the distance R from the image S' of the source S (toward the source). That is, the output of this filter can be described by $f_R(D-r)$.

When a test function is employed for threshold averaging, Eq. (37) can be rewritten for the multivariate modulated threshold densities as Threshold-Time Averaged Density, namely as $$c_K(D, t) = \frac{\langle K(s) f_R[D-x(s)]\rangle_T}{\langle K(s)\rangle_T} \quad (52)$$

$$= \frac{\left\langle K(s)\prod_{i=1}^{n} \partial_{D_i} \mathcal{F}_{\Delta D_i}[D_i-x_i(s)]\right\rangle_T}{\langle K(s)\rangle_T}.$$

As for a scalar variable, in this disclosure we shall call the multivariate modulated threshold densities for K=constant the amplitude densities, and the densities for $$K = \left[\sum_{i=1}^{n} (\dot{x}_i / \Delta D_i)^2\right]^{\frac{1}{2}}$$

the (multivariate) counting densities. The amplitude density thus indicates for how long the signal occupies an infinitesimal volume in the threshold space, and the counting density indicates how often the signal visits this volume. For example, the amplitude density will indicate the number of cars at a certain intersection (that is, at the intersection positioned at D) at a certain time, and the counting density will describe the total traffic flow through this intersection at a given time. Carrying out the threshold averaging in Eq. (41), we can write the equation for the mean at reference threshold as $$\{M_x K\}_T(D, t) = \frac{\langle K(s) f_R[D - x(s)]\rangle_T}{\langle f_R[D - x(s)]\rangle_T} \quad (53)$$

$$= \frac{\left\langle K(s) \prod_{i=1}^{n} \partial_{D_i} \mathcal{F}_{\Delta D_i}[D_i - x_i(s)]\right\rangle_T}{\left\langle \prod_{i=1}^{n} \partial_{D_i} \mathcal{F}_{\Delta D_i}[D_i - x_i(s)]\right\rangle_T}.$$

Notice that, unlike in the definition of the modulated threshold density, the variable K no longer has to be a scalar. In the traffic example above, it is obvious that the same traffic flow (number of cars per second) can be achieved either by low density high speed traffic, or by high density low speed traffic. The ratio of the counting rates and the amplitude density will thus give us the average speed at the intersection. If the variable K is different from the speed—for example, it is the rate of carbon monoxide emission by a car—then the mean at reference threshold will indicate this emission rate at location D, and it may (for example, because of the terrain or speed limit) or may not depend on the location.

In this disclosure, we assume the validity of Eq. (48), and thus the explicit expressions for the amplitude density b(D,t) and the counting density r(D,t) are as follows:

$$b(D, t) = \left\langle \prod_{i=1}^{n} \partial_{D_i} \mathcal{F}_{\Delta D_i}[D_i - x_i(s)]\right\rangle_T \quad (54)$$

for the amplitude density, and $$r(D, t) = \frac{\left\langle \sqrt{\sum_{i=1}^{n} \left[\frac{\dot{x}_i(s)}{\Delta D_i}\right]^2} \prod_{i=1}^{n} \partial_{D_i} \mathcal{F}_{\Delta D_i}[D_i - x_i(s)]\right\rangle_T}{\left\langle \sqrt{\sum_{i=1}^{n} \left[\frac{\dot{x}_i(s)}{\Delta D_i}\right]^2}\right\rangle_T} \quad (55)$$

for the counting density. In Eq. (55), the numerator in the right-hand side is proportional to the counting rate. Explicitly, the expression for the counting rates reads as $$\mathcal{R}(D, t) = \left\langle \sqrt{\sum_{i=1}^{n} \left[\frac{\dot{x}_i(s)}{\Delta D_i}\right]^2} \prod_{i=1}^{n} \Delta D_i \, \partial_{D_i} \mathcal{F}_{\Delta D_i}[D_i - x_i(s)]\right\rangle_T. \quad (56)$$

A type of problem addressed by Eq. (56) might be as follows: How often does a flying object cross a radar beam?

FIG. 7 shows a simplified diagram illustrating the transformation of an input variable into a modulated threshold density according to Eq. (52). The sensor (probe) of the acquisition system has the input-output characteristic $f_{R_\mu}$ of a differential discriminator. The width of this characteristic is determined (and may be controlled) by the width, or resolution, parameter $R_\mu$. The threshold parameter of the probe D signifies another variable serving as the unit, or datum. In FIG. 7, the input variable $x_\mu(t)$ is a scalar or vector, or a component of an ensemble. For example, a discrete surface (such as an image given by a matrix) can be viewed as a discrete ensemble, being scalar for a monochrome image, and a 3D-vector for a truecolor image. The output of the probe then can be modulated by the variable $K_\mu(t)$, which can be of a different nature than the input variable. For example, $K_\mu(t)$=constant will lead to the MTD as an amplitude density, and $K_\mu(t)=|\dot{x}_\mu(t)|$ will lead to the MTD as a counting density/rate. Both the modulating variable $K_\mu$ and its product with the output of the probe $K_\mu f_{R_\mu}$ can then be time-averaged by a convolution with the time weighting function h(t;T), leading to the averages $\langle K_\mu f_{R_\mu}(D-x_\mu)\rangle_T^h$ and $\langle K_\mu\rangle_T^h$. The result of a division of the latter average by the former will be the modulated threshold density $c_{K_\mu}(D,t)$. Notice that all the steps of this transformation can be implemented by continuous action machines.

10 Time Averaging of Multivariate Threshold Densities by $RC_{In}$ Impulse Response Functions Let us consider a specific choice of a time weighting function as follows:

$$h_n(t) = \frac{1}{n! T^{n+1}} t^n e^{-\frac{t}{T}} \theta(t). \quad (57)$$

This is a response of a circuit consisting of one RC differentiator and n RC integrators (all time constants RC=T) to a unit step of voltage $\theta(t)$. Thus we shall call such weighting function an $RC_{In}$ impulse response. FIG. 8 shows the $RC_{In}$ time weighting functions for n=0 (exponential forgetting), n=1, and n=2.

Differentiation of $h_n(t)$ leads to $$\dot{h}_n(t) = \frac{1}{T}[h_{n-1}(t) - h_n(t)] \quad (58)$$

for $n \geq 1$, and $$\dot{h}_0(t) = \frac{1}{T}[\delta(t) - h_0(t)] \quad (59)$$

for n = 0.

An exponential factor in time weighting functions is ubiquitous in nature as well as in technical solutions. In particular, $RC_{ln}$ impulse response time averaging functions are quite common, and easily implementable in software as well as in various devices. Although normally the time weighting function does not need to be specified in detail, an exponential factor in the time weighting function allows us to utilize the fact that $(e^x)'=e^x$. In particular, the relations of Eqs. (58) and (59) allow us to simplify various practical embodiments of AVATAR. This will become apparent from further disclosure.

11 Shape Recognition and Time Evolution of Densities, Displaying Densities and their Time Evolution As has been mentioned earlier in this disclosure, the main purpose of the analysis of variables through their continuous density and distribution functions is twofold: (1) to facilitate the perception through geometric interpretation of the results, and (2) to enable the analytical description by differential methods. Let us first address the former part of this goal, that is, the visual presentation of the densities and the interpretation of the underlying qualities of the variable based on these observations.

Let us first notice that the amplitude density at a given threshold D is proportional to the time the variable spends around this threshold, and thus is proportional to the average inverted (absolute) slope of the variable at this threshold. One might say that the amplitude density is a measure of "flatness" of the signal. For example, the amplitude density generally increases with the increase in the number of extrema at the threshold D. The counting density is proportional to the number of crossings, or "visits", of this threshold by the variable, and the acceleration density is generally proportional to the density of sharp turns (such as extrema and inflection points) of the variable at this threshold. Thus the acceleration ($K=|\ddot{x}|$), amplitude ($K=1$), and counting ($K=|\dot{x}|$) densities complement each other in a manner necessary for selective shape recognition of a signal, as illustrated in FIGS. 9a and 9b. The left columns of the panels in these figures show the fragments of three different signals in rectangular windows. The second columns of the panels show the amplitude densities, the third columns show the counting densities, and the right columns show the acceleration densities for these fragments. These figures illustrate that the acceleration and counting densities generally reveal different features of the signal than do the amplitude densities. For the fragment $x_1(t)$ in FIG. 9a (the upper row of the panels), $|\dot{x}(t)|$=constant, and thus the counting and the amplitude densities are identical. For the fragment $x_2(t)$ in FIG. 9a (the middle row of the panels), $|\ddot{x}(t)|$=constant, and thus the acceleration and the amplitude densities are identical.

The example in FIG. 10 shows time dependent acceleration densities, threshold crossing rates, and amplitude densities computed in a 1-second rectangular moving time window for two computer generated non-stationary signals (Panels 1a and 1b). Panels 2a and 2b show the acceleration densities, Panels 3a and 3b show the threshold crossing rates, and Panels 4a and 4b show the amplitude densities. The signals represent sequences of (nonlinearly) interacting unipolar Poisson-distributed random pulses, recorded by an acquisition system with an antialiasing bandpass RC-filter with nominal passbands 0.5–70 Hz at −3 dB level. The sequences of the pulses before interaction are identical in both examples, but the rules of the interaction of the pulses are slightly different. These differences are reflected in the shape of the resulting signals, which can in turn be quantified through the displayed densities and the rates.

As an example of the interpretation of the displayed densities, consider the stretch of the signals in the interval 45 through 70 seconds. For both signals, the amplitude density (Panels 4a and 4b) is highest at the lowest amplitude, and is approximately uniform at other thresholds. This is likely to indicate that the signals in this time interval consist of relatively narrow tall pulses of comparable amplitude, originating from a flat background. The approximate uniformity of the counting rates (Panels 3a and 3b) between the lowest and the highest thresholds confirms the absence of the secondary extrema, that is, these are single pulses. The increased rates in the intervals 50 to 60 seconds and 65 to 70 seconds indicate that there are more pulses per unit time in these intervals than in the intervals 45 to 50 and 60 to 65 seconds. An approximate equality of the acceleration densities (Panels 2a and 2b) at the highest and lowest thresholds is likely to indicate that these pulses might have sharp onsets and sharp "tails", in order for the "sharpness" of the peaks to be equal to the combined "sharpness" of the onsets and the tails.

Earlier in this disclosure, we introduced a new type of rank filtering, which is applicable to analysis of scalar as well as multivariate densities. In Eqs. (24) and (25), we introduced the quantile density, domain, and volume. Let us now illustrate how these quantities are applicable to the analysis of scalar variables. Panel I of FIG. 11 shows the fragment of the signal from Panel 1a of FIG. 10 in the time interval between 7 and 29 seconds. The amplitude density of this fragment is plotted in Panels II through IV. In these panels, the quantile densities $f_{1/4}$ (Panel II), $f_{1/2}$ (Panel III), and $f_{3/4}$ (Panel IV) are shown by the horizontal lines. These lines intersect the density in such a way that the shaded areas are equal to ¼, ½, and ¾, respectively. Then the respective quartile domains will be represented by the intervals on the threshold axis confined between the left and the right edges of these areas, and the respective quartile volumes will be the sums of the lengths of these intervals.

In FIGS. 12a and 12b, the quantile densities, volumes, and domains are displayed as time dependent quantities computed in a 1-second rectangular sliding window. Panels 1a and 4a of FIG. 12a show the median densities, computed for the amplitude and the counting densities of the signal from Panel 1a of FIG. 10. Panels 1b and 4b of FIG. 12b show the respective median densities for the signal from Panel 1b of FIG. 10. Panels 2a and 5a of FIG. 12a, and Panels 2b and 5b of FIG. 12b, show the median volumes of the amplitude and the counting densities of the respective signals. As can be seen from these examples, both quantile densities and quantile volumes characterize the total width of the densities, that is, the total size of high density regions in the threshold space. Panels 3a and 6a of FIG. 12a, and Panels 3b and 6b of FIG. 12b, display the quartile domains, with the median domain shaded by the gray color, the q=¾ domain shaded by the light gray, and the first quartile domain shaded black. These examples illustrate how the quantile domain reveals the location of the high density regions in the threshold space.

Earlier in this disclosure, we adopted the restricted definition of a "phase space" as the threshold space of the values of the variable, complemented by the threshold space of the first time derivative of this variable. Thus for a scalar variable the modulated threshold densities in such phase space are the two-variate densities. The introduction of the phase space densities expands the applicability of the density analysis, and allows more detailed study of the changes in the variables. For example, FIG. 13 provides an illustration of the sensitivity of the phase space threshold densities to the signal's shape. The first column of the panels in the figure shows the fragments of three different signals in rectangular windows. The second column of the panels shows the phase space amplitude densities $$b(D_x, D_{\dot{x}}, t) = \langle \partial_{D_x} F_{\Delta D_x}[D_x - x(s)] \partial_{D_{\dot{x}}} F_{\Delta D_{\dot{x}}}[D_{\dot{x}} - \dot{x}(s)] \rangle_T, \quad (60)$$

and the third column displays the phase space counting densities $$r(D_x, D_{\dot{x}}, t) = \frac{\left\langle \sqrt{\left(\frac{\dot{x}}{D_x}\right)^2 + \left(\frac{\ddot{x}}{D_{\dot{x}}}\right)^2} \, \partial_{D_x} \mathcal{F}_{\Delta D_x}[D_x - x(s)] \partial_{D_{\dot{x}}} \mathcal{F}_{\Delta D_{\dot{x}}}[D_{\dot{x}} - \dot{x}(s)] \right\rangle_T}{\left\langle \sqrt{\left(\frac{\dot{x}}{D_x}\right)^2 + \left(\frac{\ddot{x}}{D_{\dot{x}}}\right)^2} \right\rangle_T}. \quad (61)$$

This figure also illustrates that while the amplitude density is indicative of the "occupancy" (that is, the time the variable occupies the infinitesimal volume in the phase space), the counting density reveals the "traffic" in the phase space, that is, it is indicative of the rates of visiting a small volume in the phase space.

The example in FIG. 14 shows time dependent phase space amplitude densities computed according to Eq. (60) in a 1-second rectangular moving time window for two computer generated non-stationary signals shown in Panels 1a and 1b of FIG. 10. The figure plots the level lines of the phase space amplitude densities (Panels 1a and 2a), at times indicated by the time ticks. Panels 1b and 2b show the time slices of these densities at time $t=t_0$.

FIG. 15 shows time dependent phase space counting rates $$R(D_x, D_{\dot{x}}, t) = \langle \sqrt{(\dot{x} D_{\dot{x}})^2 + (\ddot{x} D_x)^2} \, \partial_{D_x} F_{\Delta D_x}[D_x - x(s)] \partial_{D_{\dot{x}}} F_{\Delta D_{\dot{x}}}[D_{\dot{x}} - \dot{x}(s)] \rangle_T, \quad (62)$$

computed in a 1-second rectangular moving window for the two signals shown in Panels 1a and 1b of FIG. 10. The figure plots the level lines of the phase space counting rates (Panels 1a and 2a) at times indicated by the time ticks. Panels 1b and 2b show the time slices of these rates at time $t=t_0$. As was discussed in the explanation of FIG. 10, the general shape of the pulses around this time for both signals is similar. Thus the difference in the phase space crossing rates apparent from these time slices results mostly from the small differences in the shape of the "tops" of these pulses.

FIGS. 16 and 17 display the boundaries of the median domains for the phase space amplitude and counting densities, respectively. The upper panels of these figures short the respective boundaries for the signal of Panel 1a of FIG. 10, and the lower panels show the median domain boundaries for the signal of Panel 1b of FIG. 10.

The examples in FIGS. 9 through 17 illustrate the usefulness of AVATAR for visual assessment of various features of a signal, and of the evolution of these features in time. Although FIGS. 13 through 17 deal with the phase space densities of a scalar variable, it should be obvious that densities of any two-dimensional variable can be treated in the same way. For instance, the same technique will apply for describing the time evolution of the population in a geographic region (amplitude density) and for mapping out the routes of migration of this population (counting density). FIG. 16, for example, can represent the time evolution of a quantile domain of the population of a biologic species, that is, the locations of the largest number of specimens per unit area in a region. Then FIG. 17 will represent the time evolution of the respective quantile domain of the traffic of the species, that is, the regions of the most active movement of the species.

11.1 Eliminating the Digitizatiom-Computation Steps in Displaying Densities and their Time Evolution: Direct Measurement by Continuous Action Machines Since many physical sensors have input-output characteristics equivalent to those of the probes in this disclosure, there is a large number of feasible physical embodiments of AVATAR for displaying the modulated threshold densities and their time evolution by continuous action machines. In this subsection, we provide several illustrative examples of such embodiments. The underlying motivation behind constructing an analog machine directly displaying the densities is schematically stated in FIG. 18.

As the first example, FIG. 19 outlines a conceptual schematic of a simple device for displaying time dependent amplitude densities of a single scalar signal. An electron gun in a cathode-ray tube produces a beam of fast electrons. The tube contains a pair of vertical deflecting plates. By feeding a voltage to this pair of plates, we can produce a proportional displacement of the electron beam in the vertical direction. The screen of the tube is coated with luminophor with the afterglow half-time $T_{1/2} = T \ln 2$. We assume that the brightness of the luminescent spot on the screen is proportional to the intensity of the electron beam, and is described by $\partial_Y F_{AY}(Y)$ when the voltage across the deflecting plates is zero. Then the brightness of the displayed band on the screen, at any given time, will correspond to the amplitude density of the input signal x(t), computed in the exponential moving window of time ($RC_{10}$) with the time constant T. This band can then be projected on a screen by, for example, a (concave) mirror M. By rotating this mirror, we can display the time evolution of the amplitude density of x(t). If we now modulate the intensity of the electron beam by the signal K(t), then the brightness of the displayed picture will be proportional to $\langle K \partial_Y F_{AY}(Y-x) \rangle_T$. For example, when $K(t) = |\dot{x}(t)|$, the screen will display the threshold crossing rates. A simple conceptual schematic of such a device for displaying time dependent threshold crossing rates of a signal is illustrated in FIG. 20. Note that by displaying only the lines of equal intensity, or by thresholding the intensity, we will reveal the boundaries of the respective quantile domains.

FIG. 21 provides an illustration for possible hardware implementation of a device for displaying time slices of the phase space amplitude densities. An electron gun in a cathoderay tube of an oscilloscope produces a beam of fast electrons. The tube contains two pairs of mutually perpendicular deflecting plates. By feeding a voltage to any pair of plates, we can produce a proportional displacement of the electron beam in a direction normal to the given plates. The screen of the tube is coated with luminophor with the afterglow half-time $T_{1/2} = T \ln 2$. We assume that the brightness of the luminescent spot on the screen is proportional to the intensity of the electron beam, and is described by $\partial_X F_{AX}(X) \partial_Y F_{AY}(Y)$ when the voltage across the deflecting plates is zero. If the input signals are x(t) and $\dot{x}(t)$, respectively, then the displayed picture on the screen, at any given time, will correspond to the phase space amplitude density of the input signal x(t), computed in the exponential moving window of time ($RC_{10}$) with the time constant T. Thus, the screen will display figures similar to those shown in the second column of the panels in FIG. 13, and in Panels 1b and 2b of FIG. 14. If we now modulate the intensity of the electron beam by the signal K(t), then the brightness of the displayed picture will be proportional to $\langle \partial_X F_{\Delta X}(X-x)\partial_Y F_{\Delta Y}(Y-x)\rangle_T$. For example, when $K(t)=\sqrt{(\dot{x}\Delta Y)^2+(\ddot{x}\Delta X)^2}$, the screen will display the time slices of the phase space threshold crossing rates of the input signal x(t). computed in the exponential moving window of time ($RC_{10}$) with the time constant T. Thus, the screen will display figures similar to those shown in the third column of the panels in FIG. 13 and in Panels 1b and 2b of FIG. 15. A simple conceptual schematic of such a device for displaying time slices of the phase space threshold crossing rates is illustrated in FIG. 22.

One skilled in the art will now recognize that the task of displaying the densities can also be achieved by a variety of other physical devices. In addition to displaying the modulated densities and their time evolution, these devices can also be modified to display the quantile domain, density, and volume, the means at reference thresholds, various other quantities of the MTDs such as their level lines, and to accomplish other tasks of AVATAR. Some of the additional embodiments of such devices will be described later in this disclosure.

12 Using Means at Reference Thresholds for Detection and Quantification of Changes in Variables As has been indicated earlier in this disclosure, a comparison of the mean at reference threshold with the simple time average will indicate the interdependence of the input and the reference variables. For the purpose of this disclosure, we will adopt one of many possible ways to measure such dependence within the quantile domain as follows:

$$\Xi_q(D,t) = \frac{|\{M_x K\}_T(D,t) - \langle K\rangle_T|}{|\langle K\rangle_T|} \theta[\langle f_R(D-x)\rangle_T - f_q(t)], \quad (63)$$

where $f_q(t)$ is the quantile density defined by Eq. (24), and we will assume that the norm is computed simply as the distance in the Euclidean space. Eq. (63) represents an estimator of differences in the quantile domain between the mean at reference threshold and the time average.

FIG. 23 displays the values of the estimator $\Xi_q(D,t)$ of Eq. (63) in $q=9/10$ quantile domain, computed for the two computer generated nonstationary scalar signals (Panels 1a and 1b), used in a number of our previous examples. Panels 2a and 2b display the values of the estimator for $K=|\dot{x}|$, and Panels 3a and 3b display these values for $K=|\ddot{x}|$.

13 Modulated Cumulative Distributions

As follows from Eq. (9), the time dependent Modulated Cumulative Threshold Distribution (MCTD) $C_K(D,t)$, or Threshold-Time Averaged Cumulative Distribution, is defined as $$C_K(D,t) = \int_{-\infty}^{D} d^n r\, c_K(r,t) \quad (64)$$

$$= \frac{\langle K(s)\mathcal{F}_R[D-x(s)]\rangle_T}{\langle K(s)\rangle_T}$$

-continued $$= \frac{\left\langle K(s)\prod_{i=1}^{n} \mathcal{F}_{\Delta D_i}[D_i - x_i(s)]\right\rangle_T}{\langle K(s)\rangle_T},$$

where $C_K(D,t)$ is the modulated threshold density given by Eq. (52). It is easy to see from Eq. (64) and from the definition of the Heaviside unit step function, Eq. (4), that all equations for the counting, amplitude, and acceleration densities (for example, Eqs. (54), (55), (60), and (61)) are valid for the cumulative distributions as well, provided that the symbols 'b', 'r', 'c', 'δ', and '$\partial_D$' in those equations are replaced by 'B', 'R', 'C', 'θ', and 'F', respectively.

Note that the transition from the densities to the cumulative distribution functions is equivalent to the threshold integration of the former, and thus the principal examples of the embodiments for the densities can be easily modified for handling the respective cumulative distributions. For instance, the embodiments of FIGS. 19 and 20 can be easily converted to display the cumulative distributions instead of the densities. Then, for example, the lines of equal intensity on the screen will correspond to the level lines of these cumulative distributions, and thus will be equivalent to the outputs of the respective rank filters.

Note also that the ability to compute or measure the time dependent threshold densities and cumulative distributions for a signal gives access to a full range of time dependent statistical measures and estimates, such as different threshold moments (e.g., mean and median, skew, kurtosis, and so on) with respect to these distributions. Although the defining equations for the threshold densities and cumulative distributions are given for a continuous variable or signal, in numerical computations these quantities can be calculated in finite differences. Clearly, the introduction of threshold averaging alleviates the computational problems caused by the singularity of the delta function.

14 Unimodal Approximations for Ideal Modulated Densities and Cumulative Distributions For time independent thresholds, numerical (or hardware) computation of densities and cumulative distributions according to Eqs. (52) and (64) should not cause any difficulties. However, in the equations for rank normalization. Eqs. (12) and (13), and for filtering. Eqs. (17) and (18), densities and cumulative distributions appear with thresholds dependent on time, and their evaluation may present a significant computational challenge.

This challenge is greatly reduced when the thresholds vary slowly, which is usually the case in rank filtering. In such cases, it might be sufficient to approximate (replace) $\langle f_R[D(t)-x(s)]\rangle_T$ by the first term in its Taylor expansion, namely by $\langle f_R[D(t)-x(s)]\rangle_T$, and higher order terms can be retained when necessary. This approximation will be our prime choice in most embodiments of AVATAR discussed further in this disclosure. For rank normalization, however, this approach is only adequate when certain relations between the input and reference signals are held, and thus different approximations should be developed.

Let us first develop a unimodal approximation for the ideal modulated density function $\langle K\rangle_T^{-1}\langle K\delta(D-x)\rangle_T$, that is, the density function resulting from the measurements by an ideal probe. Although we will later present more accurate approximations for rank normalization, the unimodal approximation has certain merits of its own, e.g., simplicity of implementation and analytical treatment of the results. To develop such unimodal approximation, we can use, for example, the integral representation of the delta function as (Arfken, 1985, p. 799, for example)

$$\delta(D-x) = \frac{1}{2\pi}\int_{-\infty}^{\infty} du\, e^{iu(D-x)}. \quad (65)$$

The expression for the density can thus be rewritten as $$\frac{1}{\langle K \rangle_T}\langle K\delta(D-x)\rangle_T = \frac{1}{2\pi}\int_{-\infty}^{\infty} du\, e^{iuD\frac{\langle Ke^{-iux}\rangle_T}{\langle K\rangle_T}}; \quad (66)$$

and the time averages in the right-hand side of Eq. (66) can be expressed as $$\frac{\langle Ke^{-iux}\rangle_T}{\langle K \rangle_T} = e^{\ln\frac{\langle Ke^{-iux}\rangle_T}{\langle K \rangle_T}} = e^{\Lambda(u)}. \quad (67)$$

It is worth mentioning that the cumulant function $\Lambda(u)=\ln(\langle K\rangle_T^{-1}\langle Ke^{-iux}\rangle_T)$ corresponds to the thermodynamic characteristic function (free energy divided by kT) in statistical mechanics (Kubo et al., 1995, for example). We now notice that the real part of $\Lambda(u)$ has a global maximum at $u=0$. Therefore, the main contribution of the integrand to the integral in Eq. (66) man come from the region around $u=0$ (see, for example, Erdélyi, 1956, Copson, 1967, or Arfken, 1985). Thus we can expand $\Lambda(u)$ in Taylor series around $u=0$ as $$\Lambda(u) = \frac{1}{K_0}\sum_{n=1}^{\infty}\frac{(-iu)^n}{n!}K_n - \frac{1}{2K_0^2}\left[\sum_{n=1}^{\infty}\frac{(-iu)^n}{n!}K_n\right]^2 + \ldots, \quad (68)$$

where $$K_n = \langle Kx^n \rangle_T. \quad (69)$$

Truncating this expansion after the quadratic term, we substitute the result in Eq. (66) and easily arrive at the following expression:

$$\frac{1}{\langle K \rangle_T}\langle K\delta(D-x)\rangle_T \approx \frac{\exp\left[-\frac{1}{2}\frac{(D-K_{10})^2}{K_{20}-K_{10}^2}\right]}{\sqrt{2\pi(K_{20}-K_{10}^2)}}, \quad (70)$$

where $K_{n0}=K_n K_0^{-1}$.

Unimodal approximations for higher-dimensional densities can be developed in a similar manner. For example, $$\langle\delta(D_x-x)\delta(D_y-y)\rangle_T = \frac{1}{4\pi^2}\int_{-\infty}^{\infty}du\,e^{iuD_x}\int_{-\infty}^{\infty}dv\,e^{ivD_y}e^{\Lambda(u,v)}, \quad (71)$$

where $$\Lambda(u,v) = \ln\langle e^{-iux-ivy}\rangle_T \approx -i[u\langle x\rangle + v\langle x\rangle] - \quad (72)$$

$$\frac{1}{2}\{u^2[\langle x^2\rangle - \langle x\rangle^2] + 2uv[\langle xy\rangle - \langle x\rangle\langle y\rangle] + v^2[\langle y^2\rangle - \langle y\rangle^2]\}.$$

This results in $$\langle\delta(D_x-x)\delta(D_y-y)\rangle_T \approx \frac{1}{2\pi\sigma_x\sigma_y\sqrt{1-r^2}}\times\exp\left\{-\frac{1}{2(1-r^2)}\right. \quad (73)$$

$$\left.\left[\frac{(D_x-\langle x\rangle)^2}{\sigma_x^2} - \frac{2r(D_x-\langle x\rangle)(D_y-\langle y\rangle)}{\sigma_x\sigma_y} + \frac{(D_y-\langle y\rangle)^2}{\sigma_y^2}\right]\right\}.$$

where $\sigma_x = \langle x^2\rangle - \langle x\rangle^2$, $\sigma_y = \langle y^2\rangle - \langle y\rangle^2$, and $r = (\langle xy\rangle - \langle x\rangle\langle y\rangle)/\sqrt{\sigma_x\sigma_y}$.

The approximations of Eqs. (70) and (73) are somewhat accurate, for example, on a large time scale, when the signals x(t) and y(t) represent responses of (linear) detector systems to trains of pulses with high incoming rates (Nikitin et al. 1998; Nikitin, 1998, for example), Poisson distributed in time. FIG. 24 illustrates the adequacy of the approximation of Eq. (73) for two-dimensional amplitude densities of such signals. The top panel of this figure shows the signals x(t) and y(t)=ẋ(t) in a rectangular window of duration T, where x(t) is the response of an $RC_{12}$ filter to a pulse train with an energy spectrum consisting of two lines of equal intensity with one having twice the energy of the other. The lower left panel shows the measured density $\langle\partial_{D_x}F_{\Delta D_x}(D_x-x)\partial_{D_y}F_{\Delta D_y}(D_y-y)\rangle_T$ (with small $\Delta D_x$ and $\Delta D_y$), and the lower right panel shows the density computed through Eq. (73).

More generally, Eqs. (70) and (73) are accurate when x(t) and y(t) (on a time scale T) are sums of a large number of mutually uncorrelated signals. Obviously when x(t) and y(t) are (nonlinear) functions of such sums, simple transformations of variables can be applied to modify Eqs. (70) and (73). For example, if Eq. (70) is adequate for the signal x(t) and, in addition, $K_{10}^2 \ll K_{20}$, then the following approximations are also adequate:

$$\frac{1}{\langle K\rangle_T}\langle K\delta(D-z)\rangle_T \approx \frac{\theta(D)}{\sqrt{2\pi DK_{10}}}\exp\left(-\frac{D}{2K_{10}}\right) \quad (74)$$

for the signal $z(t)=x^2(t)$, and $$\frac{1}{\langle K\rangle_T}\langle K\delta(D-z)\rangle_T \approx \frac{\theta(D)\sqrt{2}}{\sqrt{\pi K_{20}}}\exp\left(-\frac{D^2}{2K_{20}}\right) \quad (75)$$

for $z(t)=|x(t)|$.

When the signal x (t) is a sum of two uncorrelated signals $x_1(t)$ and $x_2(t)$, $$\langle \delta(D-x) \rangle_T = \int_{-\infty}^{\infty} d\varepsilon \langle \delta(\varepsilon - x_1) \delta(D - \varepsilon - x_2) \rangle_T = \quad (76)$$

$$= \int_{-\infty}^{\infty} d\varepsilon \langle \delta(\varepsilon - x_1) \rangle_T \langle \delta(D - \varepsilon - x_2) \rangle_T,$$

and thus the resulting density is just the convolution of the densities of the components $x_1(t)$ and $X_2(t)$. This approach can be used, for example, when the signal is a sum of a random noise component and a deterministic component with known density functions. FIG. 25 illustrates this for the noisy signal $x_1=\sin(t)$. The signals $x_1(t)$, $x_2(t)$, and $x_1(t)+X_2(t)$ are shown in the left column of the panels, and the respective panels in the right column show the amplitude densities. The signal $X_2(t)$ is random (non-Gaussian) noise. The amplitude density of the sinusoid $x_1(t)$ in a square window of length $T=2\pi n$ is computed as $$\langle \delta[D - x_1(s)] \rangle_T = \frac{1}{2\pi n} \int_0^{2\pi n} dt \delta[D - \cos(t)] = \quad (77)$$

$$= \frac{1}{2\pi n} \sum_{k=0}^{2n-1} \int_0^{2\pi n} dt \frac{\delta(t - t_k)}{|\sin(t_k)|} = \frac{\theta(1 - D^2)}{\pi \sin[\arccos(D)]},$$

where $$t_k = (-1)^k \arccos(D) + \frac{\pi}{2} [2k + 1 - (-1)^k]. \quad (78)$$

In the lower right panel, the measured density of the combined signal is shown by the solid line, and the density computed as the convolution of the densities $b_1(D)$ and $b_2(D)$ is shown by the dashed line.

Substitution of Eq. (70) into Eq. (64) leads to the approximation for the time dependent cumulative distribution as follows:

$$\frac{1}{\langle K \rangle_T} \langle K \theta(D-x) \rangle_T \approx \frac{1}{2} \operatorname{erfc} \left[ \frac{K_{10} - D}{\sqrt{2(K_{20} - K_{10}^2)}} \right], \quad (79)$$

where erfc(x) is the complementary error function (Abramowitz and Stegun, 1964, for example).

The unimodal approximations of this section are of limited usage by themselves, since they are adequate only for special types of a signal on a relatively large time scale. For example, the approximation of Eq. (70) is generally a poor approximation, since every extremum of the signal x(t) inside of the moving window may produce a singularity in the density function $\langle K \rangle_T^{-1} \langle K \delta(D-x) \rangle_T$. This can be clearly seen from Eq. (40), which shows that a modulated density might be singular whenever $|\dot{x}(t_i)|=0$, with the exception of the counting density. For the latter, the approximation of Eq. (70) might be an adequate choice for some usages. This is illustrated by FIG. 26, which shows the amplitude $\langle \delta(D-x) \rangle_T$ and the counting $\langle K \rangle_T^{-1} \langle K \delta(D-x) \rangle_T$ densities of the fragment of the signal displayed in the upper panel. One can see that the Gaussian unimodal approximation (dashed lines) is more suitable for the counting density than for the amplitude density. The latter is singular at every threshold passing through an extremum of x(t).

However, the unimodal approximations of this section might be a good practical choice of approximations for rank normalization, since the main purpose of the latter is just providing a "container" in the threshold space, where the reference variable is likely to be found. This will be discussed in more detail further in the disclosure.

15 Rank Normalization

Although Eqs. (12) and (13) introduce rank normalization for vector fields, in various practical problems this normalization may be more meaningfully applied to scalar variables and fields, e.g., to the selected components of vector variables. For the time being, we will also consider only single scalar or vector variables rather than the fields. As will be illustrated further in the disclosure, the transition to the fields can always be accomplished by spatial averaging.

Let us write a reference threshold distribution, modulated by some associated signal K, as $$C_{K,r}(D, t) = \frac{1}{\langle K(s) \rangle_T} \langle K(s) \mathcal{F}_R[D - r(s)] \rangle_T, \quad (80)$$

where r(t) is the reference signal, i.e., the signal for which the distribution is computed.

Then $$y(t) = C_{K,r}[x(t), t] = \frac{1}{\langle K(s) \rangle_T} \langle K(s) \mathcal{F}_R[x(t) - r(s)] \rangle_T \quad (81)$$

is a signal, rank normalized with respect to the reference distribution $C_{K,r}(D,t)$. Eq. (81) is thus a defining equation for an Analog Rank Normalizer (ARN). In other words, an ARN outputs the rank of the value of x(t) with respect to the sample of the values of the reference variable r(t). For example, if the reference distribution for normalization of a scalar variable x(t) is provided by a Gaussian process with the mean $\bar{x}$ and the variance $\sigma$, then $$y(t) = \frac{1}{2} \operatorname{erfc} \left[ \frac{\bar{x} - x(t)}{\sqrt{2}\sigma} \right], \quad (82)$$

where we have neglected the threshold averaging, that is, we assumed that $F_{AD}(x)=\theta(x)$. Using Gaussian approximation for modulated threshold densities of a scalar reference r(t), Eq. (70), we can write the following expression for the Gaussian normalization:

$$y(t) = \frac{1}{2} \operatorname{erfc} \left[ \frac{K_{10}(t) - x(t)}{\sqrt{2[K_{20}(t) - K_{10}^2(t)]}} \right], \quad (83)$$

where

-continued $$K_{nm} = \frac{\langle K \tau^n \rangle_T}{\langle K \tau^m \rangle_T}. \qquad (84)$$

Let us now observe that $$y(t) = \qquad (85)$$

$$\int_{-\infty}^{\infty} d^n D \delta[D - x(t)] C_{K,r}(D, t) \approx \int_{-\infty}^{\infty} d^n D f_R[D - x(t)] C_{K,r}(D, t),$$

where we replaced the Dirac δ-function δ(x) by the response of a probe $f_R(x)$ with a small width parameter R. Thus, for a small width parameter R, the practical embodiment of ARN reads as follows:

$$y(t) = \langle f_R[D-x(t)] C_{K,r}(D,t) \rangle_\infty^D, \qquad (86)$$

where we used the shorthand notation for the threshold integral as $$\langle \cdots \rangle_\infty^D = \int_{-\infty}^{\infty} d^n D \cdots . \qquad (87)$$

FIG. 30 shows a simplified flowchart of an analog rank normalizer according to Eq. (86).

For the purpose of "confinement" of the variable in the threshold space of the reference variable, rank normalization can be defined by means of a discriminator with arbitrary input-output response, namely by $$y(t) = \mathcal{F}_{R_r(t)}[D_r(t) - x(t)] = \prod_{i=1}^{n} \mathcal{F}_{\Delta D_{r,i}(t)}[D_{r,i}(t) - x_i(t)], \qquad (88)$$

where $D_r(t)$ is indicative of the central tendency (such as mean or median) of the reference density $c_{K,r}(D,t)$, and $R_r(t)$ is indicative of the width (such as standard or absolute deviation, or such as FWHM) of the reference density $c_{K,r}(D,t)$. For instance, using the mean and standard deviation of the reference distribution as the displacement and width parameters, respectively, for a scalar variable we have $$y(t) = \mathcal{F}_{\sqrt{2(K_{20} - K_{10}^2)}} [K_{10}(t) - x(t)]. \qquad (89)$$

Eq. (89) thus performs rank normalization as transformation of the input signal by a discriminator with the width parameter $\sqrt{2[K_{20}(t) - K_{10}^2(t)]}$, and the displacement parameter $K_{10}(t)$.

Rank normalization can also be accomplished through evaluating the integral of Eq. (81) by straightforward means. For instance, for a causal time weighting function.

$$\langle \mathcal{F}_R[x(t) - r(s)] \rangle_T = \int_{-\infty}^{t} ds \, h(t - s) \mathcal{F}_R[x(t) - r(s)] \qquad (90)$$

-continued $$= \int_0^\infty ds \, h(s) \mathcal{F}_R[x(t) - r(t - s)],$$

which for a rectangular time function of duration T leads to $$\langle \mathcal{F}_R[x(t) - r(s)] \rangle_T = \frac{1}{T} \int_0^T ds \, \mathcal{F}_R[x(t) - r(t - s)] \qquad (91)$$

$$\approx \frac{1}{N} \sum_{n=0}^{N} \mathcal{F}_R[x(t) - r(t - n \Delta t)],$$

where $\Delta t = T/N$.

One of the main usages of the rank normalization is as part of preprocessing of the input variable, where under preprocessing we understand a series of steps (e.g., smoothing) in the analysis prior to applying other transformations such as MTD. Since in AVATAR the extent of the threshold space is determined by the reference variable, the rank normalization allows us to adjust the resolution of the acquisition system according to the changes in the threshold space, as the reference variable changes in time. Such adjustment of the resolution is the key to a high precision of analog processing. In the next section, we provide several examples of the usage of rank normalization.

16 Using Rank Normalization for Comparison of Variables and for Detection and Quantification of Changes in Variables The output of a rank normalizer represents the rank of the test signal with respect to the reference distribution. Thus comparison of the outputs of differently normalized test signals constitutes comparison of the reference distributions. Various practical tasks will dictate different implementations of such comparison. Let us consider several simple examples of using rank normalization for comparison of reference distributions.

First, let us define a simple estimator $Q_{ab}(t;q)$ of differences between the distributions $C_a(D,t)$ and $C_b(D,t)$ as $$\left. \begin{array}{l} Q_{ab}(t; q) = C_b[y_q(t), t] \\ C_a[y_q(t), t] = q \end{array} \right\}. \qquad (92)$$

In Eq. (92), $y_q(t)$ is the level line (qth quantile) of the distribution $C_a(D,t)$. Clearly, when $C_a(D,t)$ and $C_b(D,t)$ are identical, the value of $Q_{ab}(t;q)$ equals the quantile value q. FIG. 27 provides an example of the usage of the estimator given by Eq. (92) for quantification of changes in a signal. In this example, the signals are shown in Panels 1a and 1b. The distributions $C_a(D,t)$ are computed in a 1-second rectangular moving window as the amplitude (for Panels 2a and 2b) and counting (for Panels 3a and 3b) cumulative distributions. Thus $y_q(t)$ are the outputs of the respective rank filters for these distributions. The estimators $Q_{ab}(t;q)$ are computed as the outputs of the Gaussian normalizer of Eq. (83). The values of these outputs for different quartile values are plotted by the gray (for q=½), black (for q=¼), and light gray (for q=¾). In this example, the estimator $Q_{ab}(t;q)$ quantifies the deviations of $C_a(D,t)$ from the respective normal distributions.

Since the shape of the signal has different effects on the amplitude, counting, and acceleration distributions, comparison of the signal normalized with respect to these distributions can allow us to distinguish between different pulse shapes. FIG. 28 provides a simplified example of the usage of rank normalization for such discrimination between different pulse shapes of a variable. Panel. 1 shows the input signal consisting of three different stretches, 1 through 3, corresponding to the variables shown in FIG. 9. Panel II displays the difference between $C_{|\dot{x}|,r}{}^{h_0}(x,t)$ and $C_{1,r}{}^{h_0}(x,t)$, where the superscripts $h_0$ denote the particular choice of the time weighting function as an $RC_{10}$ filter, and the reference signal r is a Gaussian process with the mean $K_{10}$ and the variance $K_{20}-K_{10}{}^2$, where $K_{nm}$ are computed for the input signal x(t). This difference is zero for the first stretch of the input signal, since for this stretch the amplitude and the counting densities are identical (see FIG. 9). Panel III displays the difference between $C_{|\ddot{x}|,r}{}^{h_0}(x,t)$ and $C_{1,r}{}^{h_0}(x,t)$. This difference is zero for the second stretch of the input signal, since for this stretch the amplitude and the acceleration densities are identical (see FIG. 9). The distance between the time ticks is equal to the constant T of the time filter. FIG. 31 shows a simplified flowchart of a device for comparison of two signals. In order to reproduce the results shown in FIG. 28, Panels II and III, the specifications of the device are as follows:

$$\begin{cases} x_1(t) = x_2(t) = r_1(t) = r_2(t) = x(t); \\ K_1(t) = \text{constant}; \\ K_2(t) = |\dot{x}(t)| \text{ for Panel II}, K_2(t) = |\ddot{x}(t)| \text{ for Panel III}; \\ \mathcal{F}_{\Delta D}(x) = \frac{1}{2}\text{erfc}\left(-\frac{x}{\Delta D}\right); \\ h(t) = h_0(t) \quad (RC_{10} \text{ filter}). \end{cases} \quad (93)$$

FIG. 29 provides an additional example of sensitivity of the difference between two rank normalized signals to the nature of the reference distributions. Panel I shows the input signal, and Panel II displays the amplitude density computed in an $RC_{10}$ window with the time constant T, equal to the distance between the time ticks. Panel III plots the difference between $C_{|\dot{x}|,r}{}^{h_0}(x,t)$ and $C_{1,r}{}^{h_0}(x,t)$, where the reference signal r is a Gaussian process with the mean $K_{10}$ and the variance $K_{20}-K_{10}{}^2$, computed for the input signal x(t). The magnitude of this difference increases due to broadening of the amplitude density while the counting density remains unchanged.

Even though various practical tasks will dictate different implementations of comparison of variables through rank normalization, the simple examples provided above illustrate that sensitivity of the difference between two rank normalized signals to the nature of the reference distributions provides a useful tool for development of such implementations.

16.1 Estimators of Differences between Two Cumulative Distributions

Since AVATAR transforms a variable into density and cumulative distribution functions an expert in the art would recognize that any of the standard techniques for statistical analysis of data and for comparison of distributions/densities can also be applied to time dependent quantification of the signal and its changes. For example, one can use an estimator of the differences between the two distributions $C_a$ and $C_b$ as $$\Phi(t) = \Phi[\Lambda(t)] = \Phi[\Lambda_{ab}(t)], \quad (94)$$

where $\Phi$ is some function, and $\Lambda_{ab}$ is the statistic of a type $$\Lambda_{ab}(t) = \int_{-\infty}^{\infty} d^n x h(x) H[C_a(x,t), C_b(x,t), c_a(x,t), c_b(x,t)], \quad (95)$$

where h is a truncation function, and H is some score function. For convenience, we shall call $C_a$ the test distribution, and $C_b$ the reference distribution. The statistics of Eq. (95) thus quantify the differences and changes in the input signal with respect to the reference signal. One can think of any number of statistics to measure the overall difference between two cumulative distribution functions (Press et al., 1992, for example). For instance, one would be the absolute value of the volume between them. Another could be their integrated mean square difference. There are many standard measures of such difference, e.g., Kolmogorov-Smirnov (Kac et al., 1955), Cramér-von Mises (Darling, 1957), Anderson-Darling, or Kuiper's statistics, to name just a few (Press et al., 1992, for example). For example, one can use the statistics of a Cramér-von Mises type (Darling, 1957, for example)

$$\Lambda_{ab} = \int_{-\infty}^{\infty} dC_a(x) w[C_a(x)] W[C_a(x) - C_b(x)], \quad (96)$$

where w is a truncating function, and W is some score function. Generalization of Eq. (96) to many dimensions is straightforward as $$\Lambda_{ab}(t) = \int_{-\infty}^{\infty} dC_a(x,t) \, w[C_a(x,t)] \, W[C_a(x,t) - C_b(x,t)] \quad (97)$$

$$= \int_{-\infty}^{\infty} dx_1 \ldots \int_{-\infty}^{\infty} dx_n \frac{\partial^n C_a(x,t)}{\partial x_1 \ldots \partial x_n} w[C_a(x,t)]$$

$$W[C_a(x,t) - C_b(x,t)]$$

$$= \int_{-\infty}^{\infty} d^n x \, c_a(x,t) \, w[C_a(x,t)] \, W[C_a(x,t) - C_b(x,t)],$$

where $c_a(x, t)$ is the density function.

If $C_a$ is computed for the same signal as $C_b$, then the difference between $C_a$ and $C_b$ is due to either the different nature of $C_a$ and $C_b$ (e.g., one is the amplitude, and the other is counting distribution), or to the difference in the discriminators and time windows used for computing $C_a$ and $C_b$.

Notice that rank normalization is just a particular special case of the estimator of Eq. (97), when w(x)=1, W(x)=½−x, and the test density is the instantaneous density, $c_a(D,t)=\delta[D-x(t)]$, and thus $$\Lambda_{ab}(t) = \int_{-\infty}^{\infty} d^n D\, \delta[D-x(t)] \left\{ \frac{1}{2} + C_b(D,t) - \theta[D-x(t)] \right\} \quad (98)$$

$$= C_b[x(t), t].$$

One should also notice that an estimator of differences between two distributions of the type of Eq. (94) can be computed as a time average when the distribution functions are replaced by the respective rank normalized signals. A simplified example of such an estimator is shown in FIG. 32. This figure plots the time averages of the absolute values of the differences, $\langle |C_{K,x}^{h_0}(x,t) - C_{1,x}^{h_0}(x,t)| \rangle_T$, for $K=|\dot{x}|$ and $K=|\ddot{x}|$, for the signal shown above the panel of the figure. The distance between the time ticks is equal to the time constants T of the time filtering windows.

16.2 Speech Recognition

Selectivity of comparison of the amplitude and counting densities of a scalar variable can be greatly increased by comparing these densities in the phase space of this variable. Here under phase space we understand simply the two-dimensional threshold space for the values of the variable as well as the values of its first time derivative. FIG. 33 illustrates sensitivity of the amplitude and counting phase space densities to differences in the signal's wave form. The panels in the left column show the sound signals for several letters of the alphabet. The top signals in the individual panels are the original input signals. The normalized input signals and their normalized first derivatives, respectively, are plotted below the original input signals. The middle column of the panels shows the amplitude, and the right column the counting densities of these pairs of normalized signals. Notice that rank normalization of the components of the signal allows us to more efficiently utilize the threshold space, and thus to increase precision of analog processing. Rank normalization also alleviates the dependence of the phase space densities on the magnitude of these components.

FIG. 34 illustrates how statistics of Eq. (97) can be used in combination with rank normalization to address the speech recognition problem. Panel I: The original speech signal "Phase Space" is shown in the top of the panel. This signal is normalized with respect to a Gaussian process with the mean and variance of the original signal in a moving rectangular window of 45 ms, and the result is plotted just below the original signal. The bottom of the panel shows the time derivative of the speech signal, normalized the same way. Panel II: Time slices of the threshold density $c(D_x, D_y, t)$, where x and y are the normalized original signal and its normalized derivative, respectively, and $c(D_x, D_y, t)$ is their amplitude density in the time window 45 ms. The slices are taken approximately through the middles of the phonemes. Panel III: Time slices of the cumulative distribution $C(D_x, D_y, t)$, where x and y are the normalized original signal and its normalized derivative, respectively, and $C(D_x, D_y, t)$ is their distribution in the time window 45 ms. The slices are taken approximately through the middles of the phonemes. Panel IV: The value of the estimator of a type of Eq. (94), where the reference distribution is taken as the average distribution computed in the neighborhood of the phonemes "ā". The larger values of the estimator indicate a greater similarity between the signals.

Employing different variables for analysis, different time weighting windows (i.e., of different shape and duration), different types of reference distributions for normalization (i.e., Gaussian or of different random or deterministic signal), different functions for spatial averaging, different type estimators of the differences between the two distributions (i.e., different truncating functions h(x), and different functions H(x) in Eq. (95)), and so on, one can reach any desired compromise between robustness and selectivity in identifying various elements (e.g., phonemes or syllables) in a speech signal.

As has been discussed previously, the embodiments of AVATAR allow their implementation by continuous action machines. For example, FIG. 35 outlines an approach one may take for eliminating the digitization-computation steps in the analysis and for direct implementation of speech recognition in an optical device. Imagine that we can modulate the intensity of a beam of light in its cross section by $F_{\Delta X}(X-r)F_{\Delta Y}(Y-y)$, where x(t) and y(t) are proportional to the components of the input signal. This can be done, for example, by moving an optical filter with the absorption characteristic $F_{\Delta X}(X)F_{\Delta Y}(Y)$ in the plane perpendicular to the beam, as illustrated in Panel I of FIG. 35. In the example of FIG. 35, the two components of the input signal are taken as squared rank normalized original speech signal, and its squared rank normalized first time derivative. A second beam of light, identical to the first one, is modulated by $1-F_{\Delta X}(X-r)F_{\Delta Y}(Y-q)$ (Panel II), where r(t) and q(t) are proportional to the components of the reference signal. In the example of FIG. 35, the reference signal is taken as the input signal in the neighborhood of the phonemes "ā". These two light beams are projected through an (optional) optical filter with the absorption characteristic h(X,Y) (Panel III) onto the window of a photomultiplier, coated with luminophor with the afterglow time T (Panel IV). We assume that the photomultiplier is sensitive only to the light emitted by the luminophor. Therefore, the anode current of the photomultiplier will be proportional to $$\Lambda(t) = \int\int dX dY h(X,Y) \langle 1 - F_{\Delta X}(X-r)F_{\Delta Y}(Y-q) + F_{\Delta X}(X-x)F_{\Delta Y}(Y-y) \rangle_T, \quad (99)$$

and the variance of the anode current on a time scale T will be proportional to $\langle (\Lambda-1)^2 \rangle_T$. Thus any measurement of the variance of the anode current will be equivalent to computation of the estimator of Eq. (94), as illustrated in Panel V of FIG. 35. In this example, the larger variance corresponds to a greater similarity between the test and the reference signals.

16.3 Probabilistic Comparison of Amplitudes

As an additional example of usefulness of the rank normalization for comparison of signals, consider the following probabilistic interpretation of such comparison. For a nonnegative time weighting function h(t), $$\int_{-\infty}^{\infty} dt h(t) = 1,$$

we define x(s) to be a value drawn from a sequence x(t), provided that s is a random variable with the density function h(t−s). When $h(t-s)=g_1(t-s)$, then x(s) is a value drawn from the first sequence, and when $h(t-s)=g_2(t-s)$, x(s) is a value drawn from the second sequence. Now consider the following problem: What is the (time dependent) probability that a value drawn from the first sequence is q times larger than the one drawn from the second sequence! Clearly, this probability can be written as $$P_q(t) = \int_{-\infty}^{\infty} dy c_{1,x}^{g_1}(y,t) C_{1,x}^{g_2}\left(\frac{y}{q}, t\right). \quad (100)$$

Substituting the expression for $c_{1,x}^{g_1}(y,t)$ (without spatial averaging, for simplicity).

$$c_{1,x}^{g_1}(y,t) = \int_{-\infty}^{\infty} ds g_1(t-s)\delta[y-x(s)], \quad (101)$$

into Eq. (100) leads to $$P_q(t) = \int_{-\infty}^{\infty} ds g_1(t-s) C_{1,x}^{g_2}\left[\frac{x(s)}{q}, t\right] = \left\langle C_{1,x}^{g_2}\left[\frac{x(s)}{q}, t\right]\right\rangle_T^{g_1}. \quad (102)$$

In Eq. (102), $$C_{1,x}^{g_2}\left[\frac{x(s)}{q}, t\right]$$

is the result of the rank normalization of the sequence $x(t)/q$, with respect to $x(t)$, in the second time window $g_2(t-s)$. $P_q(t)$ is thus a simple time average (with the first time weighting function) of this output.

The probabilistic estimator $P_q(t)$ can be used in various practical problems involving comparison of variables. For example, one of the estimators of changes in a nonstationary sequence of data can be the ratio of the medians of the amplitudes of the data sequence, evaluated in moving time windows of sufficiently different lengths. This approach is used, for instance, in the method by Dorfmeister et al. for detection of epileptic seizures (Dorfmeister et al., 1999, for example). In this method, the onset of a seizure is detected when the ratio $x_1(t)/x_2(t)$, where $x_i(t)$ is a median of the squared signal in the ith window, exceeds a predetermined threshold q. It is easy to show that the inequality $x_1(t)/z_2(t) \geq q$ corresponds to the condition $$P_q(t) \geq \frac{1}{2}, \quad (103)$$

where $P_q(t)$ is given by Eq. (102), in which $x(t)$ is the squared input signal. Thus the computational cost of the seizure detection algorithm by Dorfmeister et al. can be greatly reduced, and this algorithm can be easily implemented in an analog device.

17 Analog Rank Filters (ARFs)

In some applications, one might be interested in knowing the quantile function for the signal, that is, in knowing the value of $D_q(t)$ such that $C_K(D_q,t)=q=$ constant, where $C_K(D, t)$ is a cumulative distribution function. Thus $D_q(t)$ is an output of an analog rank (also order statistic, or quantile) filter. For example, $D_{1/2}(t)$ is the output of an analog median filter. Notice that, since the partial derivatives of $C_K(D,t)$ with respect to thresholds are nonnegative, $C_K(D_q,t)=q$ describes a simple open surface in the threshold space.

For amplitudes of a scalar signal, or ensemble of scalar signals, numerical rank filtering is a well-known tool in digital signal processing. It is a computationally expensive operation, even for the simple case of a rectangular moving window. First, it requires knowing, at any given time, the values of N latest data points, where N is the length of the moving window, times the number of signals in the ensemble, and the numerical and chronological order of these data points. In addition to the computational difficulties due to the digital nature of their definition, this memory requirement is another serious obstruction of an analog implementation of rank filters, especially for time weighting windows of infinite duration. Another computational burden on different (numerical) rank filtering algorithms results from the necessity to update the numerically ordered list, i.e., to conduct a search. When the sampling rate is high, N can be a very large number, and numerical rank filtering, as well as any analog implementation of digital algorithms, becomes impractical.

In AVATAR, the output of a rank filter for a scalar variable is defined as the threshold coordinate of a level line of the cumulative distribution function. Since the partial derivatives of the latter with respect to both threshold and time are enabled by definition, the transition from an implicit $C_K(D_q, t)=q$ form to the explicit $D_q=D_q(t)$ can be made, for example, through the differential equation given by Eq. (11) (see Bronshtein and Semendiaev, 1986, p. 405, Eq. (4.50), for example). The differentiability with respect to threshold also enables an explicit expression for the output of a rank filter, for example, through Eq. (23). Thus AVATAR enables implementation of order statistic analysis in analog devices, and offers significant improvement in computational efficiency of digital order statistic processing.

18 Analog Rank Filters of Single Scalar Variable

AVATAR enables two principal approaches to analog rank filtering, unavailable in the prior art: (1) an explicit analytical expression for the output of an ARF, and (2) a differential equation for this output. In this section, we briefly describe these two approaches.

18.1 Explicit Expression for Output of Analog Rank Filter

An explicit expression for the output of an analog rank filter can be derived as follows. Notice that $$D_q = \int_{-\infty}^{\infty} dD D \delta(D - D_q), \quad (104)$$

where $D_q$ is a root of the function $C_K(D,t)-q$, $0<q<1$. Since, at any given time, there is only one such root, we can use Eq. (27) (Rumer and Ryvkin, 1977, p. 543, for example) to rewrite Eq. (104) as $$D_q(t) = \int_{-\infty}^{\infty} dD D c_K(D, t) \delta[C_K(D, t) - q] \quad (105)$$
$$\approx \langle D c_K(D, t) \partial_q \mathcal{F}_{\Delta q}[C_K(D, t) - q]\rangle_{\infty}^{D},$$

where we replaced the Dirac δ-function δ(x) by the response of a probe $\partial_q F_{\Delta q}(x)$, and used the shorthand notation of Eq. (87) for the threshold integral. Note that the rank filter represented by Eq. (105) can be implemented by continuous action machines as well as by numerical computations.

FIG. 36 illustrates the relationship between the outputs of a rank filter and the level lines of the amplitude distribution of a scalar signal. Panel I of the figure shows the input signal x(t) on the time-threshold plane. This signal can be viewed as represented by its instantaneous density δ[D−x(t)]. Threshold integration by the discriminator $F_{\Delta D}(D)$ transforms this instantaneous density into the threshold averaged distribution $F_{\Delta D}[D-x(t)]$ (Panel II). mils distribution is further averaged with respect to time, and the resulting distribution $B(D,t) = \langle F_{\Delta D}[D-x(s)] \rangle_T$ is shown in Panel III. The quartile level lines are computed as the outputs of the rank filter given by Eq. (105), and are plotted in the same panel. Panel IV shows the input signal x(t), the level lines of the amplitude distribution for q=¼, ½, and ¾ (gray lines), and the outputs of a digital rank order filter (black lines). It can be seen from this panel that the outputs of the respective analog and digital rank filters are within the width parameter ΔD of the discriminator.

FIG. 37 repeats the example of FIG. 36 for the respective analog and digital median filters for the discrete input signals. The instantaneous density of a discrete signal can be represented by $\delta[D-x(t)]\Sigma_i \delta(t-t_i)$, as shown in Panel I. Panel II shows the threshold averaged distribution $F_{\Delta D}[D-x(t)]\Sigma_i \delta(t-t_i)$, and Panel III of the figure compares the level line $B(D,t) = \langle F_{\Delta D}[D-x(s)]\Sigma_i \delta(s-t_i) \rangle_T = ½$ (solid black line) with the respective output of a digital median filter (white dots).

FIG. 38 shows a simplified schematic of a device for analog rank filtering according to Eq. (105).

18.2 Differential Equation for Output of Analog Rank Filter

Substituting the expression for the modulated cumulative threshold distribution function, Eq. (64), into Eq. (18), we arrive at the differential equation for an analog rank filter of a single scalar variable as follows:

$$\dot{D}_q = -\frac{\partial_t C_K(D_q, t)}{c_K(D_q, t)} = \frac{\langle K \rangle_T^h [q - C_K^h(D_q, t)]}{\langle K \rangle_T^h c_K^h(D_q, t)}, \quad (106)$$

where the dots over $D_q$ and h denote the time derivatives, and we used the fact that $C_K^h(D_q,t)=q$. In Eq. (106) we used the superscripts h and ħ to indicate the particular choice of the time weighting functions in the time integrals.

Notice that if h(t) is a time impulse response of an analog filter, then Eq. (106) can be solved in an analog circuit, provided that we have the means of evaluating $C_K^h(D_q,t)$ and $c_K^h(D_q,t)$. The example in FIG. 39 shows a simplified schematic of such a device for analog rank filtering. Module I of the device outputs the signal $\langle K \rangle_T^h [q-C_K^h(D_q,t)]$, and Module II estimates $\langle K \rangle_T^h c_K^h(D_q,t)$. The outputs of Modules I and II are divided to form $\dot{D}_q(t)$, which is integrated to produce the output of the filter $D_q(t)$.

Notice also that in the absence of time averaging $$c_K(D_q,t) = c_K^\delta(D_q,t) = \partial_D F_{\Delta D}[D_q(t)-x(t)]. \quad (107)$$

and $$\partial_t C_K(D_q,t) = \partial_t C_K^\delta(D_q,t) = C_K^\delta(D_q,t) = -\dot{x}(t)\partial_D F_{\Delta D}[D_q(t)-x(t)]. \quad (108)$$

and thus Eq. (106) is still valid, although it leads to the trivial result $\dot{D}_q(t)=\dot{x}(t)$ for any value of q.

19 $RC_{In}$ Analog Rank Filters

Since $RC_{In}$ time impulse response functions commonly appear in various technical solutions, and are easily implementable in analog machines as well as in software, they are a natural practical choice for h(t). In addition, the exponential factor in these time weighting functions allows us to utilize the fact that $(e^x)'=e^x$, and thus to simplify various practical embodiments of AVATAR. Substitution of Eqs. (58) and (59) into Eq. (106) leads to the following expressions for the analog rank filters:

$$\dot{D}_q = \frac{\langle K \rangle_T^{h_n-1}[q - C_K^{h_n-1}(D_q, t)]}{T\langle K \rangle_T^{h_n} c_K^{h_n}(D_q, t)} \quad (109)$$

for n≥1, and $$\dot{D}_q = \frac{K[q - \mathcal{F}_{\Delta D}(D_q - x)]}{T\langle K \rangle_T^{h_0} c_K^{h_0}(D_q, t)} \quad (110)$$

for the exponentially forgetting ($RC_{10}$) filter.

20 Adaptive Analog Rank Filters (AARFs)

For practical purposes, the averages $\langle f_R[D(t)-x(s)] \rangle_T$ and $\langle F_R[D(t)-x(s)] \rangle_T$ in the expressions for analog rank filters can be replaced by $\langle f_R[D(t)-x(s)] \rangle_T$ and $\langle F_R[D(t)-x(s)] \rangle_T$, respectively. However, since we allow the variable x(t) to change significantly over time, the size of the characteristic volume R needs to be adjusted in accordance with these changes, in order to preserve the validity of these approximations. For instance, the adaptation scheme can be chosen as $$\Delta D = \Delta D(t) = \epsilon + r\sigma(t), \quad (111)$$

where ϵ is the minimal desired absolute resolution, $\sigma^2$ is the variance of the input signal, $\sigma^2(t) = K_{20} - K_{10}^2$, and r<<1 is a small positive number. As a rule of thumb, r should be inversely proportional to the characteristic time T of the time weighting function. Other adaptation schemes can be used as needed. The preferred generic adaptation should be such that the width parameter ΔD(t) is indicative of variability of $D_q(t)$. For example, such adaptation can be as $$\Delta D = \Delta D(t) = \epsilon + r[\langle D_q^2(s) \rangle_T - \langle D_q(s) \rangle_T^2], \quad (112)$$

where ϵ is the minimal desired absolute resolution, and r<<1 is a small positive number.

Then the equation for adaptive analog rank filters (AARFs) reads as $$\dot{D}_q = \frac{q\langle K(s) \rangle_T^h - \langle K(s) \mathcal{F}_{\Delta D(s)}[D_q(s) - x(s)] \rangle_T^h}{\langle K(s) \partial_D \mathcal{F}_{\Delta D(s)}[D_q(s) - x(s)] \rangle_T^h}, \quad (113)$$

and in the special (due to its simplicity) case of the exponentially forgetting ($RC_{10}$) filter, as $$\dot{D}_q = \frac{K[q - \mathcal{F}_{\Delta D(s)}(D_q - x)]}{T \langle K(s) \partial_D \mathcal{F}_{\Delta D(s)}[D_q(s) - x(s)] \rangle_T^{h_0}}. \quad (114)$$

FIG. 40 shows a simplified diagram of the implementation of Eq. (113) in an analog device, with the adaptation according to Eq. (111). Module I takes the outputs of Modules II and III as inputs. The output of Module I is also a feedback input of Module II. Module IV outputs ΔD(t), which is used as one of the inputs of Module II (the width parameter of the discriminator and the probe) for adaptation.

When Eq. (113) is used for the implementations of the $RC_{In}$ time window ARFs, the resulting algorithms do not only allow easy analog implementation, but also offer significant advantages in numerical computations. Since numerical $RC_{In}$-filtering requires only n+1 memory registers, an $RC_{In}$ moving window adaptive ARF for an arbitrary associated signal K(t), regardless of the value of the time constant T, requires remembering only 6n+4 data points, and only 3n+1 without adaptation. An easy-to-evaluate threshold test function can always be chosen, such as Cauchy. This extremely low computational cost off AARFs allows their usage (either in analog or digital implementations) in system and apparatus with limited power supplies, such as on spacecraft or in implanted medical devices.

FIG. 41 compares the quartile outputs (for q=0.25, 0.5, and 0.75 quantiles) of the Cauchy test function $RC_{11}$ AARF for signal amplitudes with the corresponding conventional square window digital order statistic filter. The outputs of the AARF are shown by the thick black solid lines, and the respective outputs of the square window order statistic filter are shown by the thin black lines. The time constant of the impulse response of the analog filter is T, and the corresponding width of the rectangular window is 2aT, where a is the solution of the equation a−ln(1+a)=ln(2). The incoming signal is shown by the gray line, and the distance between the time ticks is equal to 2aT.

20.1 Alternative Embodiment of AARFs

In some cases, after conducting the time averaging in the equation for the AARF, Eq. (113), this expression loses the explicit dependence on the quantile value q. This will always be true, for example, for the case of a rectangular time weighting function and a constant K. This difficulty can be easily overcome by observing that $$C_K(D_q, t) = \lim_{\Delta T \to 0} \langle C_K(D_q, s) \rangle_{\Delta T}^{h_0}, \quad (115)$$

which leads to the approximate expression for the partial time derivative of $C_K(D_q,t)$ as $$\partial_t C_K(D_q, t) \approx \frac{1}{\Delta T}[C_K(D_q, t) - q]. \quad (116)$$

Thus Eq. (113) can be written for this special case as $$\dot{D}_q = \frac{q \langle K(s) \rangle_T^h - \langle K(s) \mathcal{F}_{\Delta D(s)}[D_q(t) - x(s)] \rangle_T^h}{\Delta T \langle \langle K(s) \partial_D \mathcal{F}_{\Delta D(s)}[D_q(t) - x(s)] \rangle_T^{h_0} \rangle_{\Delta T}}, \quad (117)$$

where ΔT is small.

Note that a numerical algorithm resulting from rewriting Eq. (106) as $$\dot{D}_q = \frac{q - C_K(D_q, t)}{\Delta T \langle c_K(D_q, s) \rangle_{\Delta T}^{h_0}} \quad (118)$$

will essentially constitute the Newton-Raphson method of finding the root of the function $C_K(D_q,t)−q=0$ (Press et al., 1992, for example).

FIG. 42 compares the quartile outputs (for q=0.25, 0.5, and 0.75 quantiles) of the Cauchy test function square window AARF for signal amplitudes with the corresponding conventional square window digital order statistic filter. The outputs of the AARF are shown by the black solid lines, and the respective outputs of the square window order statistic filter are shown by the dashed lines. The widths of the time windows are T in all cases. The incoming signal is shown by the gray line, and the distance between the time ticks is equal to T.

The alternative embodiment of the AARF given by Eq. (117) is especially useful when an AARF is replacing a conventional square window digital order statistic filter, and thus needs to replicate this filter's performance. Another way of emulating a digital rank order filter by a means of analog rank selectors will be discussed later in the disclosure.

21 Densities and Cumulative Distributions for Ensembles of Variables

In various practical problems, it is often convenient to express the measured variable as an ensemble of variables, that is, as $$x(t) = \int_{-\infty}^{\infty} d\mu n(\mu) x_\mu(t), \quad (119)$$

where n(μ) dμ is the weight of the μth component of the ensemble such that $\int_{-\infty}^{\infty} d\mu n(\mu)=1$. For such an entity, the threshold averaged instantaneous density and cumulative distribution can be written as $$b(D; t, n(\mu)) = \int_{-\infty}^{\infty} d\mu n(\mu) f_R[D - x_\mu(t)], \text{ and} \quad (120)$$

$$B(D; t, n(\mu)) = \int_{-\infty}^{\infty} d\mu n(\mu) F_R[D - x_\mu(t)], \quad (121)$$

respectively. We will use these equations further to develop practical embodiments of analog rank selectors.

Eqs. (120) and (121) lead to the expressions for the respective modulated density and cumulative distributions as $$c_K(D; t, n(\mu)) = \int_{-\infty}^{\infty} d\mu n(\mu) \frac{\langle K_\mu(s) f_R[D - x_\mu(s)] \rangle_T}{\langle K_\mu(s) \rangle_T}, \quad (122)$$

and $$C_K(D; t, n(\mu)) = \int_{-\infty}^{\infty} d\mu n(\mu) \frac{\langle K_\mu(s) \mathcal{F}_R[D - x_\mu(s)] \rangle_T}{\langle K_\mu(s) \rangle_T}. \quad (123)$$

The definitions of Eqs. (122) and (123) will be used further to develop the AARFs for ensembles of variables.

22 Analog Rank Selectors (ARSs)

Let us find a qth quantile of an equally weighted discrete set of numbers $\{x_i\}$. Substitution of Eqs. (122) and (123)

$$\left( \text{with } n(\mu) = \frac{1}{N} \sum_{i=1}^{N} \delta(\mu - i) \right)$$

into Eq. (22) leads to the embodiment of an analog rank selector as $$\frac{d}{d\alpha} x_q = \frac{Nq - \sum_i \mathcal{F}_{\Delta D}(x_q - x_i)}{[1 - (1 - q)e^{-\alpha}] \sum_i \partial_D \mathcal{F}_{\Delta D}(x_q - x_i)}. \quad (124)$$

FIG. 43 illustrates finding a rank of a discrete set of numbers according to Eq. (124). Five numbers $x_i$ are indicated by the dots on the X-axis of the top panel. The solid line shows the density resulting from the threshold averaging with a Gaussian test function, and the dashed lines indicate the contributions into this density by the individual numbers. The solid line in the middle panel plots the cumulative distribution. The crosses indicate $x_q(\alpha)$ and $F_{\Delta D}[x_q(\alpha)]$ at the successive integer values of the parameter $\alpha$. The bottom panel plots the evolution of the value of $x_q(\alpha)$ in relation to the values of $x_i$.

If we allow the variables to depend on time, $\{a_\mu\} = \{x_\mu(t)\}$, then a convenient choice for the parameter is the time itself, and we can use Eqs. (19) through (21) to develop (instantaneous) analog rank selectors. Setting $$g_T(x, t) = \int_{-\infty}^{\infty} d\alpha \phi_T(t - \alpha) b(x; \alpha, n(\mu)) = \langle b(x; \alpha, n(\mu)) \rangle_T^\phi, \quad (125)$$

we can rewrite Eq. (21) as $$\dot{x}_q = -\frac{\int_{-\infty}^{x_q(t)} d\varepsilon \partial_t g_T(\varepsilon, t)}{g_T[x_q(t), t]} = -\frac{\langle B(x_q; \alpha, n(\mu)) \rangle_T^\phi}{\langle b(x_q; \alpha, n(\mu)) \rangle_T^\phi}.$$

For example, choosing $\Phi_T(t-\alpha)$ in Eq. (125) as $$\phi_T(t - \alpha) = \frac{1}{T} e^{\frac{\alpha - t}{T}} \theta(t - \alpha) = h_0(t - \alpha) \quad (127)$$

leads to the relation $$\lim_{T \to 0} g_T(x, t) = \lim_{T \to 0} \frac{e^{-t/T}}{T} \int_{-\infty}^{t} d\alpha e^{\alpha/T} b(x; \alpha, n(\mu)) \quad (128)$$
$$= b(x; t, n(\mu)).$$

Then the equation for a discrete ensemble analog rank selector reads as follows:

$$\dot{x}_q = e^{t/T} \frac{q - \sum_i n_i \mathcal{F}_{\Delta D}[x_q(t) - x_i(t)]}{\int_{-\infty}^{t} d\alpha e^{\alpha/T} \sum_i n_i \partial_D \mathcal{F}_{\Delta D}[x_q(\alpha) - x_i(\alpha)]} \quad (129)$$
$$= \frac{q - \sum_i n_i \mathcal{F}_{\Delta D}[x_q(t) - x_i(t)]}{T \left\langle \sum_i n_i \partial_D \mathcal{F}_{\Delta D}[x_q(s) - x_i(s)] \right\rangle_T^{h_0}},$$

where T is assumed to be small. For digitally sampled data, T should be several times the sampling interval $\Delta t$. FIG. 44 provides a simple example of performance of an analog rank selector for an ensemble of variables. In Panel I, the solid line shows the 3rd octile of a set of four variables ($x_1(t)$ through $x_4(t)$, dashed lines), computed according to Eq. (129). In Panel II, the solid line shows the median (q=½ in Eq. (129)) of the ensemble. The thick dashed line plots the median digitally computed at each sampling time. The time constant of the analog rank selector is ten times the sampling interval.

Obviously, when $\{x_i(t)\} = \{x(t-i\Delta t)\}$ and $n_i = 1/N$, Eq. (129) emulates an N-point square window digital order statistic filter. Emulation of digital order statistic filters with arbitrary window is done by replacing the (uniform) weights $1/N$ by $n_i$, $\Sigma n_i = 1$. An expert in the art will recognize that any digital rank filter in any finite or infinite time window can be emulated through this technique. FIG. 45 compares quartile outputs (for q=0.25, 0.5, and 0.75 quantiles) of a square window digital order statistic filter (dashed lines) with its emulation by the Cauchy test function ARS (solid black lines). The incoming signal is shown by the gray line, and the distance between the time ticks is equal to the width of the time window T.

FIG. 46 shows a simplified schematic of a device (according to Eq. (129)) for analog rank selector for three input variables.

23 Adaptive Analog Rank Filters for Ensembles of Variables

The equation for AARFs, Eq. (113), can be easily- rewritten for an ensemble of variables. In particular, for a discrete ensemble we have $$\dot{D}_q = \frac{q\langle\Sigma_i n_i K_i(s)\rangle_T^h - \langle\Sigma_i n_i K_i(s)\mathcal{F}_{\Delta D(s)}[D_q(s) - x_i(s)]\rangle_T^h}{\langle\Sigma_i n_i K_i(s)\partial_D \mathcal{F}_{\Delta D(s)}[D_q(s) - x_i(s)]\rangle_T^h}. \quad (130)$$

For a continuous ensemble, the summation $\Sigma_i$ is simply replaced by the respective integration.

FIG. 47 provides an example of performance of AARFs for ensembles of variables. This figure also illustrates the fact that counting densities do not only reveal different features of the signal than do the amplitude densities, but also respond to different changes in the signal. The figure shows the outputs of median AARFs for an ensemble of three variables. The input variables are shown by the gray lines. The thicker black lines in Panels I and II show the outputs of the median AARFs for amplitudes, and the thinner black lines in both panels show the outputs of the median AARFs for counting densities. All AARFs employ Cauchy test function and $RC_{10}$ time averaging. The distance between the time ticks in both panels is equal to the time constant of the time filters.

24 Modulated Threshold Densities for Scalar Fields

In treatment of the variables which depend, in addition to time, on the spatial coordinates a, the threshold and the time averages need to be complemented by the spatial averaging. For example, the modulated threshold density of a variable representing a scalar field, $x=x(a,t)$, can be written as $$c_K(D;a,t) = \frac{\langle K(r,s)\partial_D \mathcal{F}_{\Delta D}[D - z(r,s)]\rangle_{T,R}^{h,f}}{\langle K(r,s)\rangle_{T,R}^{h,f}}. \quad (131)$$

Notice that the time and the spatial averaging obviously commute, that is, $$\langle\langle\ldots\rangle_R^f\rangle_T^h = \langle\langle\ldots\rangle_T^h\rangle_R^f = \langle\ldots\rangle_{T,R}^{h,f}. \quad (132)$$

In the next section, we use Eq. (131) to present the analog rank selectors and analog rank filters for scalar fields.

FIG. 48 shows a simplified diagram illustrating the transformation of a scalar field into a modulated threshold density according to Eq. (131). The sensor (probe) of the acquisition system has the input-output characteristic $\partial_D F_{\Delta D}$ of a differential discriminator. The width of the probe is determined (and may be controlled) by the width, or resolution, parameter $\Delta D$. The displacement parameter of the probe D signifies another variable serving as the unit, or datum. In FIG. 48, the input variable $z(x,t)$ is a scalar field, or a component of an ensemble of scalar fields. For example, a monochrome image can be viewed as a scalar field, and a truecolor image can be viewed as a discrete ensemble of scalar fields. The output of the probe then can be modulated by the variable $K(x,t)$, which can be of a different nature than the input variable. For example, $K(x,t)$=constant will lead to the MTD as an amplitude density, and $K(x,t)=|\dot{z}(x,t)|$ will lead to the MTD as a counting density/rate. Both the modulating variable K and its product with the output of the probe $K\partial_D F_{\Delta D}$ can then be averaged by a convolution with the time and the space weighting functions $h(t;T)$ and $f(x;R)$. respectively, leading to the averages $\langle\partial_D F_{\Delta D}[D-z(r,t)]\rangle_{T,r}^{h,f}$ and $\langle K(r,t)\rangle_{T,R}^{h,f}$. The result of a division of the latter average by the former will be the modulated threshold density $c_K(D;x,t)$. Notice that all the steps of this transformation can be implemented by continuous action machines.

25 Analog Rank Selectors and Analog Rank Filters for Scalar Fields

For a scalar field (n-dimensional surface) $z=z(x,t)$, where $x=(x_1, \ldots, x_n)$ is an n-dimensional vector, Eq. (129) can be easily re-written as an $RC_{10}$ analog rank selector/filter for a scalar field $$\dot{z}_q = \frac{q - \langle\mathcal{F}_{\Delta D}[z_q(x,t) - z(r,t)]\rangle_R^f}{T\langle\langle\partial_D \mathcal{F}_{\Delta D}[z_q(x,s) - z(r,s)]\rangle_R^f\rangle_T^{h_0}}, \quad (133)$$

where, as before (see Eq. (47)), $$\langle\ldots\rangle_R^f = \int_{-\infty}^{\infty} d^n r f_R(x-r)\ldots$$

denotes the spatial averaging with some test function $f_R(x)$.

FIG. 49 shows a simplified schematic of a device according to Eq. (133) for an analog rank filter of a discrete monochrome surface with 3×3 spatial averaging.

The explicit expression for an ARF, Eq. (105), can be easily re-written for scalar field variables as $$D_q(a,t) = \int_{-\infty}^{\infty} dD D c_K(D;a,t)\partial_q F_{\Delta q}[C_K(D;a,t) - q], \quad (134)$$

and the differential equation for an adaptive analog rank filter for a scalar field will read as $$\dot{D}_q(a,t) = \frac{q\langle K(r,s)\rangle_{T,A}^{h,f} - \langle K(r,s)\mathcal{F}_{\Delta D(a,s)}[D_q(a,s) - x(r,s)]\rangle_{T,A}^{h,f}}{\langle K(r,s)\partial_D \mathcal{F}_{\Delta D(a,s)}[D_q(a,s) - x(r,s)]\rangle_{T,A}^{h,f}} \quad (135)$$

where A is the width parameter of the spatial averaging filter.

25.1 Image Processing: ARSs and ARFs for Two-Dimensional Digital Surfaces

The simple forward Euler method (Press et al., 1992, Chapter 16, for example) is quite adequate for integration of Eq. (133). Thus a numerical algorithm for analog rank processing of a monochrome image given by the matrix $Z=Z_{ij}(t)$ can be written as $$\left. \begin{array}{l} Q_k = Q_{k-1} + (q - F)/f_k \\ F = \sum_{m,n} w_{mn}\mathcal{F}_{\Delta D}[Q_{k-1} - (Z_{i-m,j-n})_{k-1}] \\ f_k = g + \frac{N-1}{N}f_{k-1} \\ g = \sum_{m,n} \omega_{mn}\partial_D \mathcal{F}_{\Delta D}[Q_{k-1} - (Z_{i-m,j-n})_{k-1}] \end{array} \right\}, \quad (136)$$

where Q is the qth quantile of Z, and $w_{mn}$ is some (two-dimensional) smoothing filter, $\Sigma_{m,n}w_{mn}=1$. Employing the Cauchy test function, we can rewrite the algorithm of Eq. (136) as $$\left.\begin{aligned}Q_k &= Q_{k-1} + (q-F)/f_k \\ F &= \frac{1}{2} + \frac{1}{\pi}\sum_{m,n} w_{mn}\arctan\left[\frac{Q_{k-1} - (Z_{i-m,j-n})_{k-1}}{\Delta D}\right] \\ f_k &= g + \frac{N-1}{N}f_{k-1} \\ g &= \frac{1}{\pi\Delta D}\sum_{m,n} w_{mn}\left\{1 + \left[\frac{Q_{k-1} - (Z_{i-m,j-n})_{k-1}}{\Delta D}\right]^2\right\}^{-1}\end{aligned}\right\} \quad (137)$$

FIG. 50 provides a simple example of filtering out static impulse noise from a monochrome image (a photograph of Werner Heisenberg, 1927) according to the algorithm of Eq. (137). Panel 1 shows the original image Z. Panel 2 shows the image corrupted by a random unipolar impulse noise of high magnitude. About 50% of the image is affected. Panel 3*a* shows the initial condition for the filtered image is a plane of constant magnitude. Panels 3*b* through 3*g* display the snapshots of the filtered image Q (the first decile of the corrupted one, q=1/10) at steps n.

FIG. 51 illustrates filtering out time-varying impulse noise from a monochrome image (a photograph of Jules Henri Poincare) using the algorithm of Eq. (137). Panels 1*a* through 1*c*: Three consecutive frames of an image corrupted by a random (bipolar) impulse noise of high magnitude. About 40% of the image is affected. Panels 2*a* through 2*c*: The image filtered through a smoothing filter, $\langle Z\rangle_{i,j} = \Sigma_{m,n}w_{mn}Z_{i-m,j-n}$. Panels 3*a* through 3*c*: The rank filtered image Q (the median, q=1/2). The smoothing filter in Eq. (137) is the same used in Panels 2*a* through 2*c*.

26 Modulated Threshold Densities for Vector Field and Ensemble of Vector Fields The equation for the modulated threshold density of a scalar field, Eq. (131), can be easily extended for a vector field as $$c_K(D; a, t) = \frac{\langle K(r,s) f_R[D - x(r,s)]\rangle_{T,A}^{h,f}}{\langle K(r,s)\rangle_{T,A}^{h,f}}, \quad (138)$$

where A is the width parameter of the spatial averaging filter, and for an ensemble of vector fields as $$c_K(D; a, t, n(\mu)) = \int_{-\infty}^{\infty} d\mu n(\mu) \frac{\langle K_\mu(r,s) f_R[D - x_\mu(r,s)]\rangle_{T,A}^{h,f}}{\langle K_\mu(r,s)\rangle_{T,A}^{h,f}}. \quad (139)$$

FIG. 52 shows a simplified diagram illustrating the transformation of a vector field into a modulated threshold density according to Eq. (139). The sensor (probe) of the acquisition system has the input-output characteristic, $f_{R_\mu}$ of a differential discriminator. The width of this characteristic is determined (and may be controlled) by the width, or resolution, parameter $R_\mu$. The threshold parameter of the probe D signifies another variable serving as the unit, or datum. In FIG. 52, the input variable $x_\mu(a,t)$ is a component of an ensemble of a vector field. For example, a truecolor image can be viewed as a continuous 3D vector field (with the 2D position vector a). The output of the probe then can be modulated by the variable $K_\mu(a,t)$, which can be of a different nature than the input variable. For example, $K_\mu(a,t)$=constant will lead to the MTD as an amplitude density, and $K_\mu(a,t)=|\dot{x}_\mu(a,t)|$ will lead to the MTD as a counting density/rate. Both the modulating variable $K_\mu$ and its product with the output of the probe $K_\mu f_{R_\mu}$ can then be averaged by a convolution with the time and the space weighting functions h(t;T) and f (a;R), respectively, leading to the averages $\langle K_\mu f_{R_\mu}(D-x_\mu)\rangle_{T,R}^{h,f}$ and $\langle K_\mu\rangle_{T,R}^{h,f}$. The result of a division of the latter average by the former will be the modulated threshold density $c_{K_\mu}(D;a,t)$. Notice that all the steps of this transformation can be implemented by continuous action machines.

27 Mean at Reference Threshold for Vector Field

The equation for the mean at reference threshold, Eq. (53), can be easily extended for a vector field input variable K(a,s) as $$\{M_x K\}_{T,A}(D; a, t) = \frac{\langle K(r,s) f_R[D - x(r,s)]\rangle_{T,A}}{\langle f_R[D - x(r,s)]\rangle_{T,A}} = \quad (140)$$

$$= \frac{\left\langle \prod_{i=1}^{n} K_i(r,s)\partial_{D_i}\mathcal{F}_{\Delta D_i}[D_i - x_i(r,s)]\right\rangle_{T,A}}{\left\langle \prod_{i=1}^{n} \partial_{D_i}\mathcal{F}_{\Delta D_i}[D_i - x_i(r,s)]\right\rangle_{T,A}},$$

where A is the width parameter of the spatial averaging filter.

28 Analog Filters for Quantile Density, Domain and Volume (AQDEFs, AQDOFs, and AQVFs)

Notice that the quantile density, domain, and volume (Eqs. (24) and (25)) are defined for multivariate densities, and thus they are equally applicable to the description of the scalar variables and fields as well as to the ensembles of vector fields. The quantile density $f_q(a,t)$ defined by Eq. (24), and the quantile volume $R_q(a,t)$ defined by Eq. (25), are both good indicators of an overall (threshold) width of the density $f_K(x;a,t)$. The analog filters for these quantities can be developed as follows.

Let us denote, for notational convenience, the density function $f_K(x;a,t)$ in Eq. (24) as z(x,t). Notice that $$\langle z(r,t)\rangle_\infty^f = \int_{-\infty}^{\infty} d^n r f_K(r; a, t) = 1,$$

and thus Eq. (24) can be re-written in terms of a modulated cumulative threshold distribution of a scalar field, namely as $$C_z[z_q(t); a, t] = \lim_{\Delta D\to 0} \frac{\langle z(r,t)\mathcal{F}_{\Delta D}[z_q(t) - z(r,t)]\rangle_\infty^f}{\langle z(r,t)\rangle_\infty^f} = \quad (141)$$

$$= \lim_{\substack{\Delta D\to 0 \\ T\to 0}} \frac{\langle z(r,s)\mathcal{F}_{\Delta D}[z_q(t) - z(r,s)]\rangle_{\infty,T}^{f,h}}{\langle z(r,s)\rangle_{\infty,T}^{f,h}} = 1 - q.$$

Keeping T and $\Delta D$ in Eq. (141) small, but finite, allows us to write the equation for an Analog Quantile Density Filter (AQDEF) as $$\dot{z}_q(t) = -\frac{\partial_t C_z[z_q(t); a, t]}{c_z[z_q(t); a, t]} \qquad (142)$$

$$= \frac{\left\langle \int_{-\infty}^{\infty} d^n r\, z(r, s)\{1 - q - \mathcal{F}_{\Delta D}[z_q(t) - z(r, s)]\}\right\rangle_T^h}{\left\langle \int_{-\infty}^{\infty} d^n r\, z(r, s)\, \partial_D \mathcal{F}_{\Delta D}[z_q(t) - z(r, s)]\right\rangle_T^h} =$$

$$\approx \frac{\left\langle \int_{-\infty}^{\infty} d^n r\, z(r, s)\{1 - q - \mathcal{F}_{\Delta D}[z_q(s) - z(r, s)]\}\right\rangle_T^h}{\left\langle \int_{-\infty}^{\infty} d^n r\, z(r, s)\, \partial_D \mathcal{F}_{\Delta D}[z_q(s) - z(r, s)]\right\rangle_T^h}.$$

For the exponentially forgetting ($RC_{10}$) time filter, $h = h_0$, Eq. (142) translates into $$\dot{z}_q(t) = \frac{\int_{-\infty}^{\infty} d^n r\, z(r, s)\{1 - q - \mathcal{F}_{\Delta D}[z_q(s) - z(r, s)]\}}{T\left\langle \int_{-\infty}^{\infty} d^n r\, z(r, s)\, \partial_D \mathcal{F}_{\Delta D}[z_q(s) - z(r, s)]\right\rangle_T^{h_0}}. \qquad (143)$$

When the difference between the density function $z(D,t)$ and the quantile density $z_q(t)$ is the argument of a discriminator $F_{\Delta D}$, the resulting quantity $S_q(D;a,t)$.

$$S_q(D;a,t) = F_{\Delta D}[z(D,t) - z_q(t)], \qquad (144)$$

can be called a quantile domain factor since the surface $S_q(D;a,t) = \frac{1}{2}$ confines the regions of the threshold space where $z(D,t) \geq z_q(t)$. Thus Eq. (144) can be used as the definition of an Analog Quantile Domain Filter (AQDOF). Integrating over all threshold space, we arrive at the expression for an Analog Quantile Volume Filter (AQVF) as follows:

$$R_q(a, t) = \int_{-\infty}^{\infty} d^n r\, S_q(r; a, t) = \langle S_q(r; a, t)\rangle_\infty^r. \qquad (145)$$

FIG. 53 shows a diagram of a process for the transformation of the incoming vector field $x(a,t)$ into a modulated threshold density $c_K(D;a,t)$, and the subsequent evaluation of the quantile density $z_q(t)$, quantile domain factor $S_q(D;a,t)$, and the quantile volume $R_q(a,t)$ of this density.

FIGS. 54a and 54b show the median densities and volumes computed for the amplitude and counting densities of the two signals used in several previous examples (see, for example, FIGS. (10) through (12b), (14) through (17), (23), and (27)). These figures compare the median densities and volumes computed directly from the definitions (Eqs. (24) and (25), gray lines) with those computed through Eqs. (143) and (145) (black lines). Panels 1a, 2a, 1b, and 2b relate to the amplitude densities, and Panels 3a, 4a, 3b, and 4b relate to the counting densities.

29 Some Additional Examples of Performance of ARSs and AARFs

29.1 Comparison of Outputs of $RC_{11}$ AARFS for Accelerations, Threshold Crossings, and Amplitudes FIG. 55 shows the quartile outputs (for $q=\frac{1}{4}$ through $\frac{3}{4}$ quantiles) of the $RC_{10}$ Cauchy test function AARFs for the signal amplitudes (Panel I), threshold crossing rates (Panel II), and threshold crossing accelerations (Panel III). The signal consists of three different stretches, 1 through 3, corresponding to the signals shown in FIG. 9. In Panels I through III, the signal is shown by the thin black solid lines, the medians are shown by the thick black solid lines, and other quartiles are shown by the gray lines. Panel IV plots the differences between the third and the first quartiles of the outputs of the filters. The incoming signal ($\frac{1}{10}$ of the amplitude) is shown at the bottom of this panel. The distance between the time ticks is equal to the time constant of the filters T.

29.2 Detection of Intermittency

FIG. 56 provides an example of usage of AARFs for signal amplitudes and threshold crossings to detect intermittency. Panel I illustrates that outputs of AARFs for signal amplitudes and threshold crossing rates for a signal with intermittency can be substantially different. The quartile outputs (for $q=0.25, 0.5$, and $0.75$ quantiles) of an AARF for signal threshold crossing rates are shown by the solid black lines, and the respective outputs of an AARF for signal amplitudes, by dashed lines. Panel II shows the median outputs of AARFs for threshold crossing rates (black solid lines) and amplitudes (dashed lines), and Panel III plots the difference between these outputs. In Panels I and II, the input signal is shown by gray lines.

29.3 Removing Outliers (Filtering of Impulse Noise)

One of the most appealing features of the rank filters is their insensitivity to outliers although the definition of outliers is different for the accelerations, threshold crossings, and amplitudes. For signal amplitudes, the insensitivity to outliers means that sudden changes in the amplitudes of the signal $x(t)$, regardless of the magnitude of these changes, do not significantly affect the output of the filter $D_q(t)$ unless these changes persist for about the $(1-q)$th fraction of the width of the moving window. The example in FIG. 57 illustrates such insensitivity of median amplitude AARFs and ARSs to outliers. The original uncorrupted signal is shown by the thick black line in the upper panel, and the signal+noise total by a thinner line. In the middle panel, the noisy signal is filtered through an $RC_{10}$ Cauchy test function median AARF (thick line), and an averaging $RC_{10}$ filter with the same time constant (thinner line). The distance between the time ticks is equal to 10T, where T is the time constant of the filters. In the lower panel, the signal is filtered through an ARS emulator of a 5-point digital median filter (thick line), and a 5-point running mean filter (thinner line). The distance between the time ticks is equal to 50 sampling intervals.

Another example of insensitivity of the $RC_{10}$ moving window median filter of signal amplitudes to outlier noise is given in FIG. 58. Outlier noise (Panel I) is added to the signal shown in Panel II. The total power of the noise is more than 500 times larger than the power of the signal, but the noise affects only $\approx 25\%$ of the data points. The periodogram of the signal+noise total is shown in Panel III, and the periodogram of the signal only is shown in Panel IV. The composite signal is filtered through an ARS emulator of a 10-point digital median filter, and the periodogram of the result is shown in Panel V.

29.4 Comparison of Outputs of Digital Rank Order Filters with Respective Outputs of AARFS, ARSS, and ARFS Based on Ideal Measuring System As an additional example of the particular advantage of employing the "real" acquisition systems as opposed to the "ideal" systems, let us compare the output of a digital median filter with the respective outputs of AARF, ARS, and the median filter based on an ideal measuring system.

29.4.1 Respective Numerical Algorithms

A formal equation for an analog rank filter based on an ideal measuring system is obviously contained in the prior art. For example, the equation for a square window rank filter based on an ideal measuring system is derived as follows. The time-averaged output of the ideal discriminator is described by the function (Nikitin et al., 1998, p. 169, Eq. (38), for example)

$$\Omega(D, t) = \langle \theta[D - x(s)] \rangle_T = \frac{1}{T} \int_{t-T}^{t} ds\, \theta[D - x(s)], \quad (146)$$

which is formally a surface in a three-dimensional rectangular coordinate system, whose points with the coordinates t, D, and $\Omega$ satisfy Eq. (146). Thus the output of a rank filter for the qth quantile is the level line $\Omega(D,t)=q$ of this surface. Even though this surface is a discontinuous surface, it can be formally differentiated with respect to threshold using the relation $d\theta(x)/dx = \delta(x)$ (see, for example, Eq. (4)). Substitution of Eq. (146) into the equation for the level line, Eq. (11), leads to the formal expression for the ideal rank filter in a square window as $$\dot{D}(t) = -\frac{\partial_t \Omega(D, t)}{\partial_D \Omega(D, t)} = \frac{\theta[D - x(t)] - \theta[D - x(t-T)]}{T \langle \delta[D - x(s)] \rangle_T}, \quad (147)$$

which is practically useless since it does not contain q explicitly. This difficulty can be easily overcome by setting $$\Omega(D, t) = \lim_{\Delta T \to 0} \langle\langle \theta[D - x(s)] \rangle_T^{h_0}\rangle_{\Delta T} \approx \langle\langle \theta[D - x(s)] \rangle_T^{h_0}\rangle_{\Delta T}. \quad (148)$$

which leads to the approximate expression for the partial time derivative of $\Omega(D,t)$ as $$\partial_t \Omega(D, t) \approx \frac{1}{\Delta T} \{\langle \theta[D - x(s)] \rangle_T - q\}. \quad (149)$$

Since the denominator of Eq. (147) cannot be numerically computed, we replace $\langle \delta[D - x(s)] \rangle_T$ by its unimodal approximation, for example, by the approximation of Eq. (70). The combination of this approximation with Eqs. (147) and (149) leads to the numerical algorithm for the square window (amplitude) rank filter, based on the ideal measuring system, which can read as follows:

$$\left. \begin{array}{l} D_{n+1} = D_n + \frac{1}{M f_n}\left[q - \frac{1}{N}\sum_{i=0}^{N-1} \theta(D_n - x_{n-i})\right] \\[4pt] f_n = \frac{1}{M}\left\{(M-1)f_{n-1} + \frac{1}{\sigma_n\sqrt{2\pi}}\exp\left[-\frac{(D_n - \bar{x}_n)^2}{2\sigma_n^2}\right]\right\} \\[4pt] \sigma_n^2 = \frac{1}{N}\sum_{i=0}^{N-1} x_{n-i}^2 - \bar{x}_n^2 \\[4pt] \bar{x}_n = \frac{1}{N}\sum_{i=0}^{N-1} x_{n-i} \end{array} \right\} \quad (150)$$

where we set $\Delta T$ equal to $M\Delta t$, $\Delta t$ being the sampling interval.

The respective numerical algorithms for the AARF and ARS are based on the integration of Eqs. (117) and (129), respectively, by the forward Euler method (Press et al., 1992, Chapter 16, for example).

29.4.2 Pileup Signal

As was discussed in Section 14 (see also the more detailed discussion in Nikitin, 1998, for example), the unimodal approximation of Eq. (70) should be adequate for a signal with strong pileup effects. Thus one would expect that a rank filter based on an ideal measuring system might be satisfactory for such a signal. FIG. 59a compares the outputs of a digital median filter with the respective outputs of an AARF (Panel I), an ARS (Panel II), and an ARF based on an ideal measuring system (Panel III). In all panels, the pileup signal is shown by the gray lines, the outputs of the digital median filter are shown by the dashed black lines, and the respective outputs of the analog median filters are shown by the solid black lines. As can be seen from this figure, even though the AARF and the ARS outperform the median filter based on an ideal measuring system, the performance of the latter might still be considered satisfactory.

29.4.3 Asymmetric Square Wave Signal

For the amplitude density of the asymmetric square wave signal, shown by the gray lines in FIG. 59b, the unimodal approximation of Eq. (70) is a poor approximation. As a result, the median filter based on an ideal measuring system (solid black line in Panel III) fails to adequately follow the output of the digital median filter (dashed line in the same panel). Panels I and II of FIG. 59b compare the outputs of the digital median filter with the respective outputs of an AARF (Panel I) and an ARS (Panel II). In all examples, $\Delta T$ was chosen as T/10, where T is the width of the rectangular window. This figure illustrates the advantage of employing the "real" acquisition systems over the solutions based on the "ideal" systems of the prior art.

29.4.4 Comparison of $RC_{10}$ AARF with $RC_{10}$ ARF Based on Ideal Measuring System Since conventional digital rank order filters employ rectangular time windows, it is difficult to directly compare the outputs of such filters with the $RC_{1n}$ adaptive analog rank filters. Panel I of FIG. 60 implements such comparison of the quartile outputs of a digital square window rank filter (dashed lines) with the respective outputs of the $RC_{10}$ AARF (solid black lines). Panel II of the same figure compares the quartile outputs of the digital rank filter (dashed lines) with the respective outputs of the $RC_{10}$ ARF, based on an ideal measuring system (solid black lines). The time constants of the analog filters were chosen as T/2 in both examples. The incoming signal is shown by the gray lines. Since the amplitude density of this signal is bimodal, the unimodal approximation of Eq. (70) does not insure a meaningful approximation of the respective digital rank filter by the "ideal" ARF.

30 Summary of Main Transformations

30.1 Modulated Density and Cumulative Distribution

FIG. 1a shows a simplified schematic of the basic AVATAR system, summarizing various transformations of an input variable into scalar field variables (e.g., into densities, cumulative distributions, or counting rates), such as the transformations described by Eqs. (52), (54), (55), (56), (60), (61), (62), (64), (131), and (138) in this disclosure. This system can be implemented through various physical means such as electrical or electro-optical hardware devices, as well as in computer codes (software). The detailed description of FIG. 1a is as follows:

The system shown in FIG. 1a is operable to transform an input variable into an output variable having mathematical properties of a scalar field of the Displacement Variable. A Threshold Filter (a Discriminator or a Probe) is applied to a difference of the Displacement Variable and the input variable, producing the first scalar field of the Displacement Variable. This first scalar field is then filtered with a first Averaging Filter, producing the second scalar field of the Displacement Variable. Without optional modulation, this second scalar field is also the output variable of the system, and has a physical meaning of either an Amplitude Density (when the Threshold Filter is a Probe), or a Cumulative Amplitude Distribution (when the Threshold Filter is a Discriminator) of the input variable.

A Modulating Variable can be used to modify the system in the following manner. First, the output of the Threshold Filter (that is, the first scalar field) can be multiplied (modulated) by the Modulating Variable, and thus the first Averaging Filter is applied to the resulting modulated first scalar field. For example, when the Threshold Filter is a Probe and the Modulating Variable is a norm of the first time derivative of the input variable, the output variable has an interpretation of a Counting (or Threshold Crossing) Rate. The Modulating Variable can also be filtered with a second Averaging Filter having the same impulse response as the first Averaging Filter, and the output of the first Averaging Filter (that is, the second scalar field) can be divided (normalized) by the filtered Modulating Variable. The resulting output variable will then have a physical interpretation of either a Modulated Threshold Density (when the Threshold Filter is a Probe), or a Modulated Cumulative Threshold Distribution (when the Threshold Filter is a Discriminator). For example, when the Threshold Filter is a Probe and the Modulating Variable is a norm of the first time derivative of the input variable, the output variable will have an interpretation of a Counting (or Threshold Crossing) Density.

30.2 Mean at Reference Threshold

FIG. 61 illustrates such embodiment of AVATAR as the transformation of an input variable into a Mean at Reference Threshold variable (see Eqs. (53) and (140)). As has been previously described in this disclosure, a comparison of the Mean at Reference Threshold with the simple time (or spatial) average will indicate the interdependence of the input and the reference variables. This transformation can be implemented by various physical means such as electrical or electro-optical hardware devices, as well as in computer codes (software). The detailed description of FIG. 61 is as follows:

The system shown in the figure is operable to transform an input variable into an output Mean at Reference Threshold variable. A Probe is applied to the difference of the Displacement Variable and the reference variable, producing a first scalar field of the Displacement Variable. This first scalar field is then modulated by the input variable, producing a modulated first scalar field of the Displacement Variable. This modulated first scalar field is then filtered with a first Averaging Filter, producing a second scalar field of the Displacement Variable. The first scalar field is also filtered with a second Averaging Filter having the same impulse response as the first Averaging Filter, and the output of the first Averaging Filter (that is, the second scalar field) is divided by the filtered first scalar field. The resulting quotient is the Mean at Reference Threshold variable.

30.3 Quantile Density, Quantile Domain Factor, and Quantile Volume

Among various embodiments of AVATAR, the ability to measure (or compute from digital data) (1) Quantile Density, (2) Quantile Domain Factor, and (3) Quantile Volume for a variable are of particular importance for analysis of variables. Quantile Density indicates the value of the density likely to be exceeded, Quantile Domain contains the regions of the highest density, and Quantile Volume gives the (total) volume of the quantile domain. The definitions of these quantities and a means of their implementation are unavailable in the existing art. FIG. 62 provides a simplified schematic of transforming an input variable into output Quantile Density, Quantile Domain Factor, and Quantile Volume variables according to Eqs. (142), (144), and (145). Notice that these transformations can be implemented by various physical means such as electrical or electro-optical hardware devices, as well as in computer codes (software). The detailed description of FIG. 62 is as follows:

The upper portion of FIG. 62 reproduces the system shown in FIG. 1a where the threshold filter is a Probe. The output of such system is either an Amplitude Density, or a Modulated Threshold Density (MTD). This density can be further transformed into Quantile Density, Quantile Domain Factor, and Quantile Volume as described below.

A second Probe is applied to the difference between a feedback of the Quantile Density variable and the Amplitude Density/MTD, producing a first function of the Quantile Density variable. This first function of Quantile Density is then multiplied by the Amplitude Density/MTD, producing a first modulated function of Quantile Density. The first modulated function of Quantile Density is then filtered with a first Time Averaging Filter producing a first time averaged modulated function of Quantile Density, and integrated over the values of the Displacement Variable producing a first threshold integrated function of Quantile Density.

A first Discriminator, which is a respective discriminator of the second Probe, is applied to the difference between the feedback of the Quantile Density variable and the Amplitude Density/MTD, producing a second function of the Quantile Density variable. A quantile value and the second function of Quantile Density is then subtracted from a unity, and the difference is multiplied by the Amplitude Density/MTD.

This produces a second modulated function of Quantile Density. This second modulated function of Quantile Density is then filtered with a second Time Averaging Filter having the impulse response of the first derivative of the impulse response of the first Time Averaging Filter. This filtering produces a second time averaged modulated function of Quantile Density. This second time averaged modulated function is then integrated over the values of the Displacement Variable producing a second threshold integrated function of Quantile Density. By dividing the second threshold integrated function by the first threshold integrated function and time-integrating the quotient, the system outputs the Quantile Density variable.

By applying a second Discriminator to the difference of the Amplitude Density/MTD and the Quantile Density variable, the latter variable is transformed into the Quantile Domain Factor variable. By integrating the Quantile Domain Factor over the values of the Displacement Variable, the system outputs the Quantile Volume variable.

30.4 Rank Normalization

FIG. 63 provides a simplified schematic of such important embodiment of AVATAR as Rank Normalization of an input variable with respect to a cumulative distribution function generated by a reference variable (see, for example, Eq. (86)). The system shown in FIG. 63 can be implemented through various physical means such as electrical or electro-optical hardware devices, as well as in computer codes (software). The detailed description of FIG. 63 is as follows:

A Discriminator is applied to the difference of the Displacement Variable and the reference variable producing a first scalar field of the Displacement Variable. This first scalar field is then filtered with a first Averaging Filter, producing a second scalar field of the Displacement Variable. A Probe is applied to the difference of the Displacement Variable and the input variable producing a third scalar field of the Displacement Variable. This third scalar field is multiplied by the second scalar field and the product is integrated over the values of the Displacement Variable to output the Rank Normalized variable.

A Modulating Variable can be used to modify the system as follows. First, the output of the Discriminator (that is, the first scalar field) is modulated by the Modulating Variable, and thus the first Averaging Filter is applied to the resulting modulated first scalar field. The Modulating Variable is also filtered with a second Averaging Filter having the same impulse response as the first Averaging Filter, and the output of the first Averaging Filter (that is, the second scalar field) is divided (normalized) by the filtered Modulating Variable. The resulting Rank Normalized variable will then have a physical interpretation of the input variable normalized with respect to a MTD of the reference variable.

30.5 Explicit Analog Rank Filter

FIG. 64 shows a schematic of an explicit Analog Rank Filter operable to transform an input scalar (or scalar field) variable into an output Rank Filtered variable according to Eq. (105) or Eq. (134). This filtering system can be implemented by various physical means such as electrical or electro-optical hardware devices, as well as in computer codes (software). The detailed description of FIG. 64 is as follows:

A first Probe is applied to the difference of the Displacement Variable and the input variable producing a first scalar function of the Displacement Variable. This first scalar function is then filtered by a first Averaging Filter producing a first averaged scalar function of the Displacement Variable. A Discriminator, which is a respective discriminator of the first Probe, is applied to the difference of the Displacement Variable and the input variable, producing a second scalar function of the Displacement Variable. This second scalar function is then filtered with a second Averaging Filter having the same impulse response as the first Averaging Filter, producing a second averaged scalar function of the Displacement Variable.

A second Probe with a small width parameter is applied to the difference of a quantile value and the second averaged scalar function producing an output of the second Probe. This output is multiplied by the first averaged scalar function and by the Displacement Variable. This product is then integrated over the values of the Displacement Variable producing the output Rank Filtered variable.

The first scalar function and the second scalar function can be also modulated by a Modulating Variable, and the first averaged scalar function and the second averaged scalar function can be divided by the Modulating Variable filtered with a third Averaging Filter, which third Averaging Filter has an impulse response identical to the impulse response of the first and second Averaging Filters. Then the Rank Filtered variable will correspond to a certain quantile of the Modulated Cumulative Threshold Distribution of the input variable.

30.6 Feedback Analog Rank Filter

FIG. 65 provides a simplified schematic of a feedback Analog Rank Filter for a single scalar variable or a scalar field variable, following the expressions of Eqs. (113) and (135). This filter can be embodied in various hardware devices such as electrical or electro-optical, or in computer codes (software). The detailed description of FIG. 65 is as follows:

A Probe is applied to the difference between a feedback of the Rank Filtered variable and the input variable producing a first scalar function of the Rank Filtered variable. This first scalar function is filtered with a first Time Averaging Filter producing a first averaged scalar function of the Rank Filtered variable. A Discriminator, which is a respective discriminator of the Probe, is applied to the difference between the feedback of the Rank Filtered variable and the input variable producing a second scalar function of the Rank Filtered variable. This second scalar function is subtracted from a quantile value, and the difference is filtered with a second Time Averaging Filter having the impulse response of the first derivative of the impulse response of the first Time Averaging Filter, producing a second averaged scalar function of the Rank Filtered variable. The second averaged scalar function is divided by the first averaged scalar function, and the quotient is time-integrated to output the Rank Filtered variable.

The first scalar function, and the difference between the quantile value and the second scalar function, can also be modulated by a Modulating Variable. Then the Rank Filtered variable will correspond to a certain quantile of the Modulated Cumulative Threshold Distribution of the input variable.

The input variable can also be a scalar field variable. Then averaging by Spatial Averaging Filters with identical impulse responses may be added to the averaging by the first and second Time Averaging Filters. These Spatial Averaging Filters should be operable on the spatial coordinates of the input variable. When modulation by a Modulating Variable is implemented in a system for rank filtering of a scalar field variable, the Spatial Averaging Filters should be operable on the spatial coordinates of the input variable and on the spatial coordinates of the Modulating Variable.

30.7 Analog Rank Filter for Ensemble of Scalar Variables

FIG. 66 provides a diagram of a feedback Analog Rank Filter for a discrete ensemble or scalar variables, as described by Eq. (130). This filter can be embodied in various hardware devices such as electrical or electro-optical, or in computer codes (software). The detailed description of FIG. 66 is as follows:

A Probe is applied to each difference between a feedback of the Rank Filtered variable and each component of the ensemble of input variables, producing a first ensemble of scalar functions of the Rank Filtered variable. Each component of the first ensemble of scalar functions is multiplied by the weight of the respective component of the ensemble of input variables, and the products are added together producing a first scalar function of the Rank Filtered variable. This first scalar function is then filtered with a first Time Averaging Filter, producing a first averaged scalar function of the Rank Filtered variable.

A Discriminator, which is a respective discriminator of the Probe, is applied to each difference between the feedback of the Rank Filtered variable and each component of the ensemble of input variables producing a second ensemble of scalar functions of the Rank Filtered variable. Each difference between a quantile value and each component of the second ensemble of scalar functions is multiplied by the weight of the respective component of the ensemble of input variables, and the products are summed, which produces a second scalar function of the Rank Filtered variable. This second scalar function is further filtered with a second Time Averaging Filter having the impulse response of the first derivative of the impulse response of the first Time Averaging Filter, producing a second averaged scalar function of the Rank Filtered variable. The second averaged scalar function is then divided by the first averaged scalar function, and the quotient is time-integrated to output the Rank Filtered variable.

Optional modulation by an ensemble of Modulating Variables can be added to the system. Then the output of the Probe (that is, the first ensemble of scalar functions) is modulated by the ensemble of Modulating Variables (component-by-component), and the difference between the quantile value and the output of the Discriminator (that is, the difference between the quantile value and the second ensemble of scalar functions) is modulated by the ensemble of Modulating Variables (component-by-component).

REFERENCES

M. Abramowitz and I. A. Stegun, editors. *Handbook of Mathematical Functions with Formulas, Graphs, and Mathematical Tables*. Applied Mathematics Series No. 55. National Bureau of Standards, 1964.

A. D. Aleksandrov, A. N. Kolmogorov and M. A. Lavrent'ev, editors. *Mathematics: Its Content, Methods, and Meaning*. Dover, 1999. Unabridged reprint in one volume of the second edition of *Mathematics: Its Content, Methods, and Meaning*. published in three volumes by The M.I.T. Press, Cambridge, Mass., in 1969. Translated from 1956 Russian edition.

G. R. Arce, N. C. Gallagher, and T. A. Nodes. *Advances in Computer Vision and Image Processing*, volume 2, Image Enhancement and Restoration, chapter Median filters: Theory for one- and two-dimensional filters, pages 89–166. JAI Press. 1986.

G. Arfken. *Mathematical Methods for Physicists*. Academic Press, San Diego, Calif. 3rd edition, 1985.

B. C. Arnold, N. Balakrishnan, and H. N. Nagaraja. *A First Course in Order Statistics*. John Wiley & Sons, Inc., 1992.

B. C. Arnold, N. Balakrishnan, and H. N. Nagaraja. *Records*. Wiley, New York, 1998.

J. T. Astola and T. G. Campbell. On computation of the running median. *IEEE Trans. Acoust., Speech, Signal Processing*, 37:572–574, 1989.

J. B. Bednar. Applications of median filtering to deconvolution, pulse estimation, and statistical editing of seismic data. *Geophysics*, 48(12):1598–1610, 1983.

A. C. Bovik, T. S. Huang, and D. C. Munson, Jr. A generalization of median filtering using linear combinations of order statistics. *IEEE Trans. Acoust., Speech, Signal Processing*, 31:1342–1350, 1983.

I. N. Bronshtein and K. A. Semendiaev. *Spavochnik po matematike: dlia inzhenerov i uchashchikhsia vtuzov*. "Nauka", Moskva, 13th edition, 1986.

M. Cardona. *Modulation spectroscopy*. Academic Press, New York, 1969.

E. T. Copson. *Asymptotic Expansions*. Cambridge University Press, 1967.

D. A. Darling. The Kolmogorov-Smirnov, Cramér-von Mises Tests. *Ann. Math. Stat.*, 28:823–838, 1957.

H. A. David. *Order statistics*. Wiley, New York, 1970.

A. S. Davydov. *Quantum Mechanics*. International Series in Natural Philosophy. Pergamon Press, 2nd edition, 1988. Second Russian Edition published by Nauka. Moscow. 1973.

P. A. M. Dirac. *The Principles of Quantum Mechanics*. Oxford University Press. London, 4th edition, 1958.

J. Dorfmeister, M. Frei, D. Lerner, I. Osorio, and J. Ralston. System for the prediction, rapid detection, warning, prevention, or control of changes in activity states in the brain of a subject, November, 1999. U.S. Pat. No. 5,995,868.

A. Erdélyi. *Asymptotic Expansions*. Dover Publications, 1956.

L. Fiore, G. Corsini, and L. Geppetti. Application of non-linear filters based on the median filter to experimental and simulated multiunit neural recordings. *Journal of Neuroscience Methods*, 70(2):177–184, 1996.

A. L. Fisher. Systolic algorithms for running order statistics in signal and image processing. *J. Digital Systems*, 4:251–264, May 1984.

J. P. Fitch, E. J. Coyle, and N. C. Gallagher. The Analog Median Filter. *IEEE Transactions on Circuits and Systems*, 33(1):94–102, 1986.

R. M. Haralick, S. R. Sternberg, and X. Zhuang. Image analysis using mathematical morphology. *IEEE Trans. Patt. Anal. Machine Intell.*, 9(4):532–550, 1987.

T. S. Huang, editor. *Two-Dimensional Digital Signal Processing II: Transforms and Median Filters*, New York, 1981. Springer-Verlag.

J. D. Jackson. *Classical Electrodynamics*. John Wiley & Sons, N.Y., 2nd edition, 1975.

T. Jarske and O. Vainio. A Review of Median Filter Systems for Analog Signal Processing. *Analog Integrated Circuits and Signal Processing*, 3:127–135, 1993.

M. Juhola, J. Katajainen, and T. Raita. Comparison of Algorithms for Standard Median Filtering. *IEEE Transactions on Signal Processing*, 39(1):204–208, 1991.

M. Kac, J. Kiefer, and J. Wolfowitz. On tests of normality and other tests of goodness of fit based on distance methods. *Ann. Math. Stat.*, 26:189–211, 1955.

R. Kubo, M. Toda, and N. Hashitsume. *Statistical Physics II: Nonequilibrium Statistical Mechanics*. Springer, 2nd edition, 1995.

C. L. Lee and C.-W. Jen. Binary Partition Algorithms and VLSI Architectures for Median and Rank Order Filtering. *IEEE Transactions on Signal Processing*. 41(9):2937–2942, 1993.

Y. H. Lee and A. T. Fam. An edge gradient enhancing adaptive order statistic filter. *IEEE Trans. Acoust., Speech, Signal Processing*, 35:680–695, 1987.

L. B. Lucy. An Iterative Technique for the Rectification of Observed Distributions. *The Astronomical Journal*, 79(6): 745–754, 1974.

H. Margenau and G. M. Murphy. *The Mathematics of Physics and Chemistry*. D. Van Nostrand, Princeton, N.J., 2nd edition, 1956.

C. D. McGillem and G. R. Cooper. *Continuous and Discrete Signal and System Analysis*. Saunders College Publishing, 3rd edition, 1991.

P. M. Morse and H. Feshbach. *Methods of Theoretical Physics*. McGraw-Hill, New York, 1953.

N. R. Murthy and M. N. S. Swamy. On the VLSI Implementation of Real-Time Order Statistic Filters. *IEEE Transactions on Signal Processing*, 40(5):1241–1252, 1992.

V. B. Nevzorov. *Records: Mathematical Theory*. American Mathematical Society, Providence, R.I., 2001.

D. R. Nicholson. *Introduction to Plasma Theory*. Krieger Publishing Company, 1983.

A. V. Nikitin. R. L. Davidchack, and T. P. Armstrong. The Effect of Pulse Pile-up on Threshold Crossing Rates in a System with a Known Impulse Response. *Nucl. Instr. & Meth.*, A411:159–171, 1998.

A. V. Nikitin. *Pulse Pileup Effects in Counting Detectors*. PhD thesis, University of Kansas, Lawrence, 1998.

I. E. Opris. *Analog Rank Extractors and Sorting Networks*. Ph.D. Thesis, Stanford University, Calif., 1996.

E. Parzen. *Time series analysis papers*. Holden-Day series in time series analysis. Holden-Day, San Francisco, 1967.

F. Pasian. Sorting algorithms for filters based on ordered statistics: Performance considerations. *Signal Processing*, 14:287–293, 1988.

W. H. Press, S. A. Teukolsky, W. T. Vetterling, and B. P. Flannery. *Numerical Recipes in FORTRAN: The Art of Scientific Computing*. Cambridge University Press, 2nd edition. 1992.

E. R. Ritenour, T. R. Nelson, and U. Raff. Applications of the median filter to digital radiographic images. *In Proc. Int. Conf. Acoust., Speech, Signal Processing*, pages 23.1.1–23.1.4, 1984.

Iu. B. Rumer and M. S. Ryvkin. *Termodinamika, statisticheskaia fizika i kinetika*. "Mir", Moskva, 2nd edition, 1977.

J. J. Sakurai. *Modern Quantum Mechanics*. Addison-Wesley, 1985.

A. E. Sarhan and B. G. Greenberg, editors. *Contributions to order statistics*, New York, 1962. John Wiley & Sons.

D. W. Scott. *Multivariate Density Estimation: Theory, practice, and visualization*. Wiley, New York, 1992.

P. Shi and R. K. Ward. OSNet: A Neural Network Implementation of Order Statistic Filters. *IEEE Transactions on Neural Networks*, 4(2):234–241, 1993.

B. W. Silverman. *Density Estimation for Statistics and Data Analysis*. Chapman and Hall, London, 1986.

A. A. Sveshnikov. *Problems in Probability Theory, Mathematical Statistics, and Theory of Random Functions*. W. B. Saunders Company, 1968. First Russian Edition published by Nauka Press, Moscow, 1965.

G. Wischermann. Median filtering of video signals—A powerful alternative. SMPTE J., pages 541–546, July 1991.

A. N. Zaidel', G. V. Ostrovskaia, and IU. I. Ostrovskii. *Tekhnika i praktika spektroskopii*. "Nauka", Moskva, 2rd edition, 1976. "Fizika i tekhnika spektralnogo analiza. Biblioteka inzhenera." First Russian Edition published by Nauka, Moscow, 1972.

BRIEF DESCRIPTION OF FIGURES

The patent or application file contains at least one drawing executed in color. Copies of this patent or patent application publication with color drawing(s) will be provided by the Office upon request and payment of necessary fee.

FIG. 7. Diagram illustrating transformation of an input variable into a modulated threshold density.

For the fragment $x_1(t)$ (the upper row of the panels), $|\dot{x}(t)|$=constant, and thus the counting and the amplitude densities are identical. For the fragment $x_2(t)$ (the middle row of the panels), $|\ddot{x}(t)|$=constant, and thus the acceleration and the amplitude densities are identical.

Figure 1A:
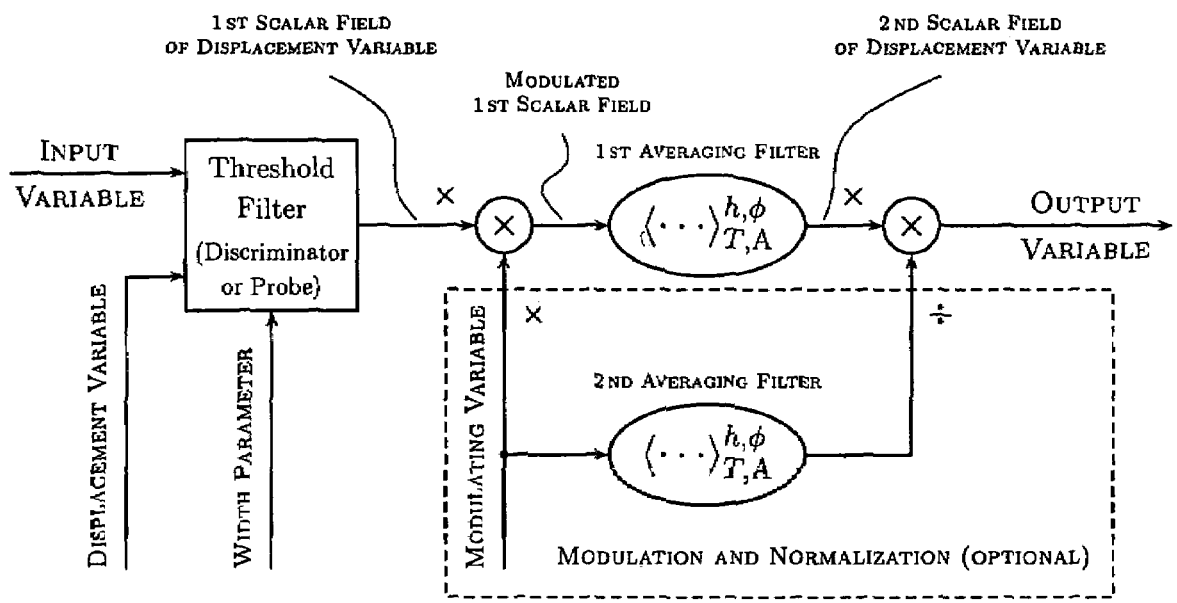
FIG. 1a. Simplified schematic of basic system for analysis of variables.
Figure 1:
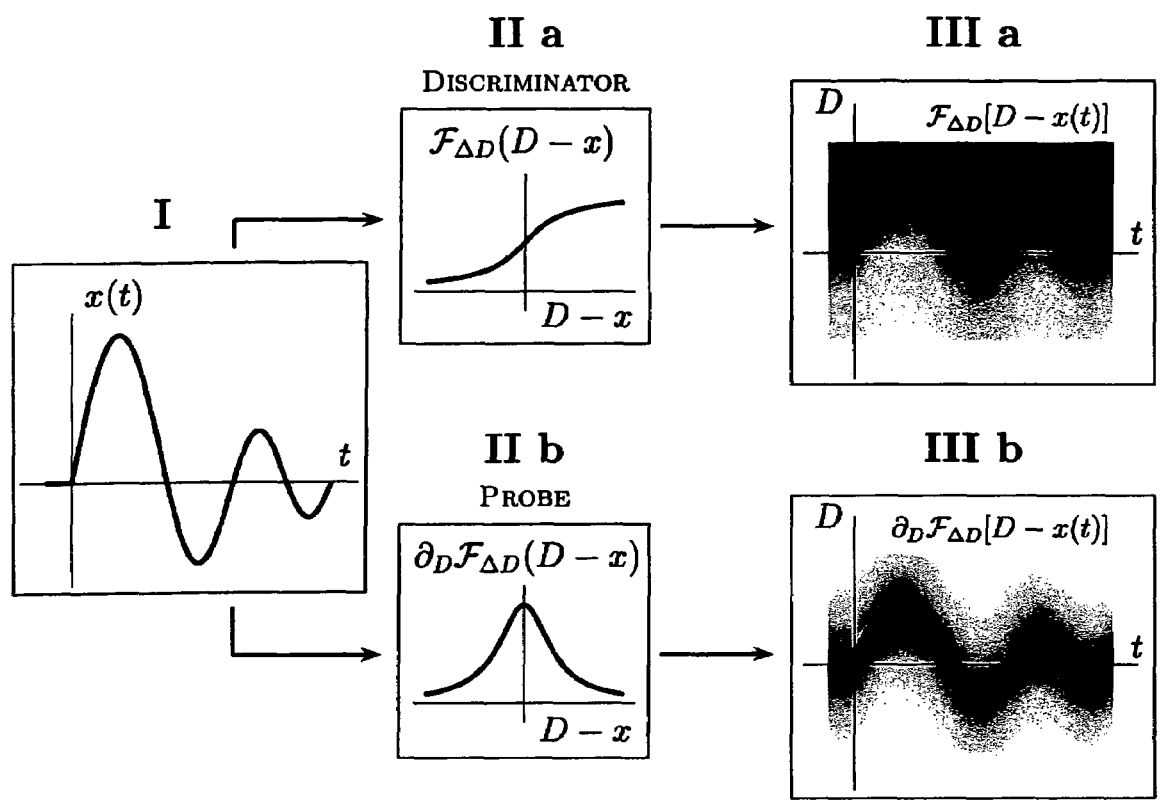
FIG. 1b. Simplified schematic of basic elements of system for analysis of variables. A scalar input variable x(t) (Panel I) is transformed by a discriminator (Panel IIa) and by a differential discriminator, or probe (Panel IIb), into continuous functions of two variables, displacement (threshold) D and time t, as shown in Panels IIIa and IIIb.
Figure 2:
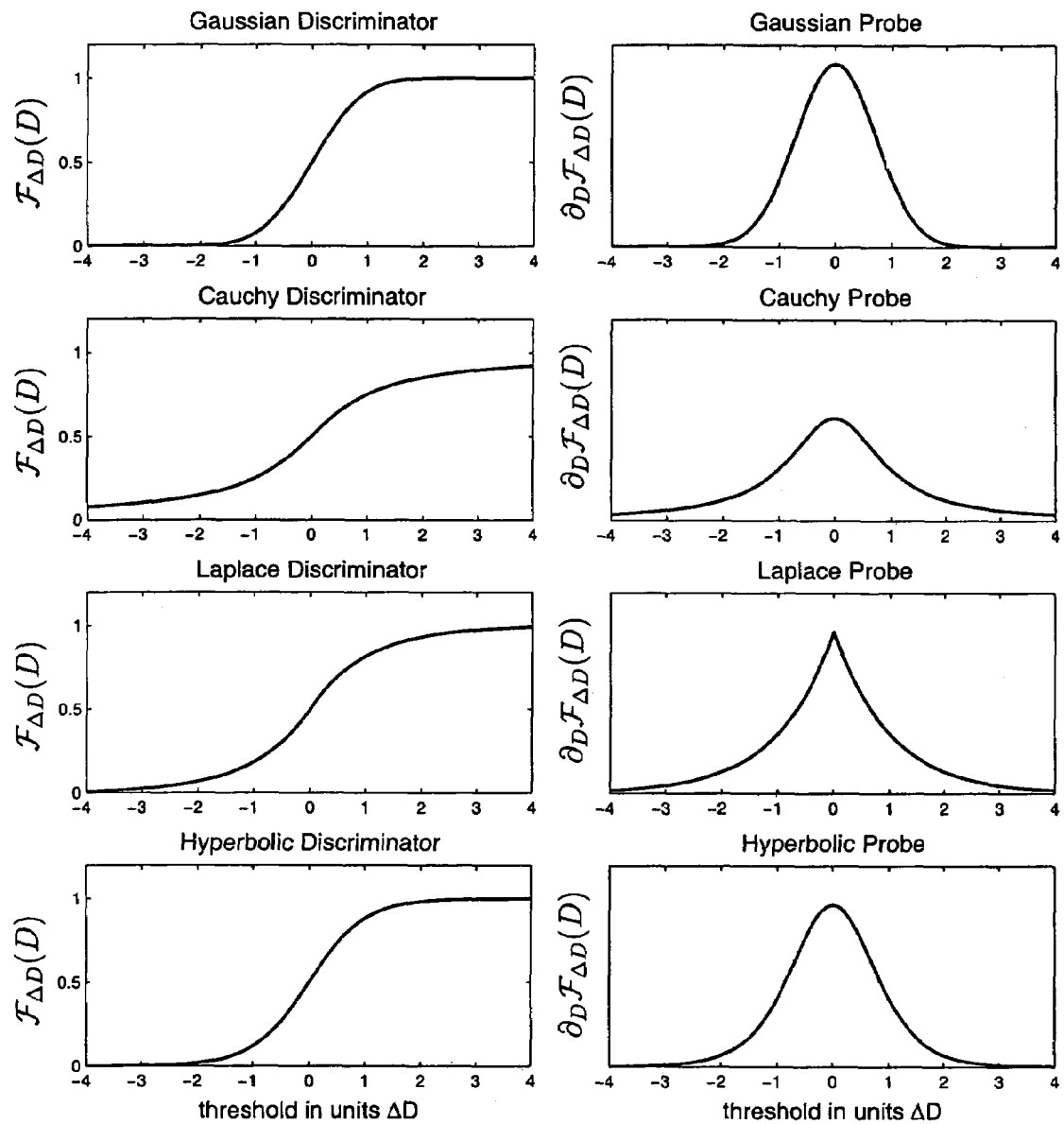
FIG. 2. Input-output characteristics of some exemplary discriminators and the respective probes (differential discriminators).
Figure 3:
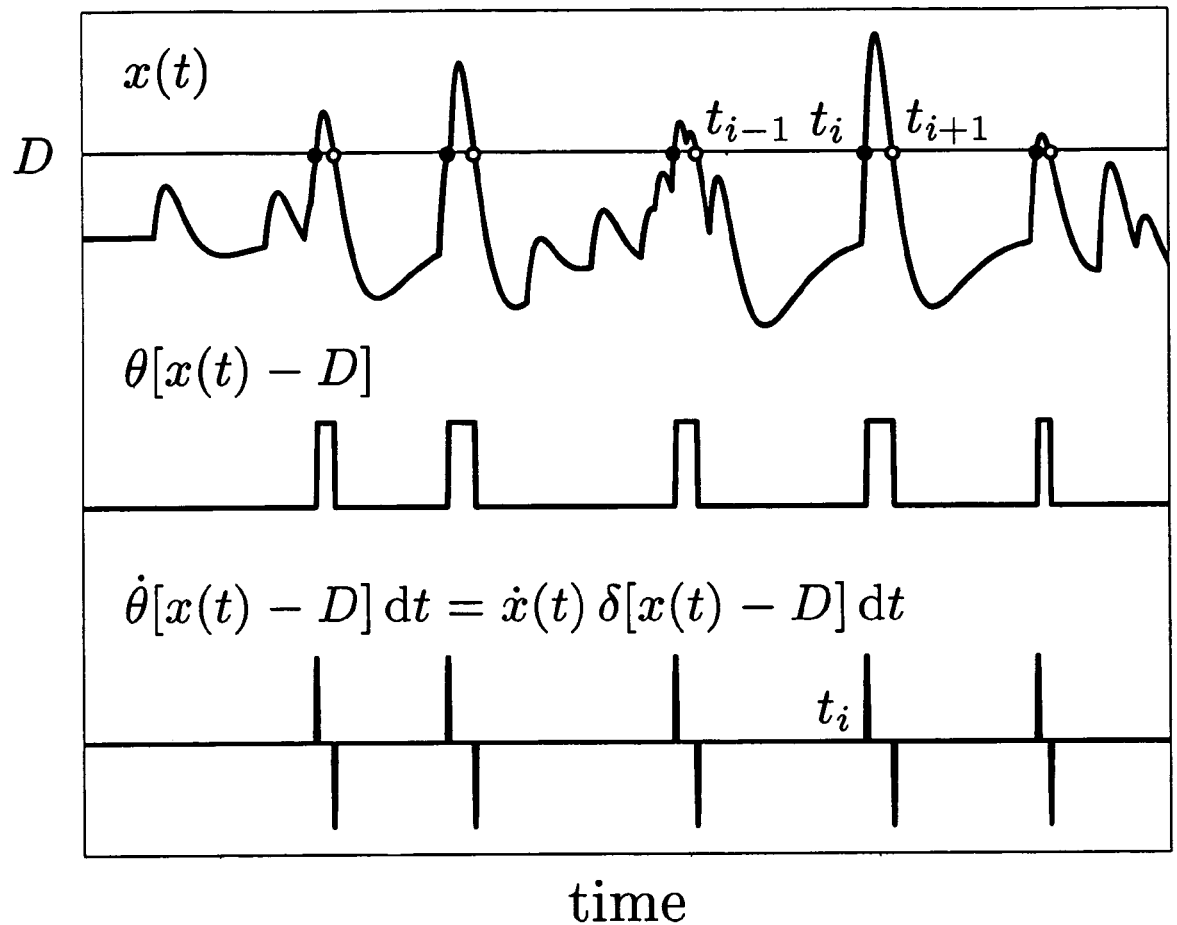
FIG. 3. Illustration of the counting process for a continuous signal. The upper part of the figure shows a computer generated signal x(t) with crossings of the threshold D at times $t_i$. The Heaviside step function of the difference of the signal x(t) and the threshold D is shown in the middle of the figure. The differential of the function $\theta[x(t)-D]$ equals ±1 at times $t_i$ and is shown at the bottom of the figure. Reproduced from (Nikitin, 1998).
Figure 4:
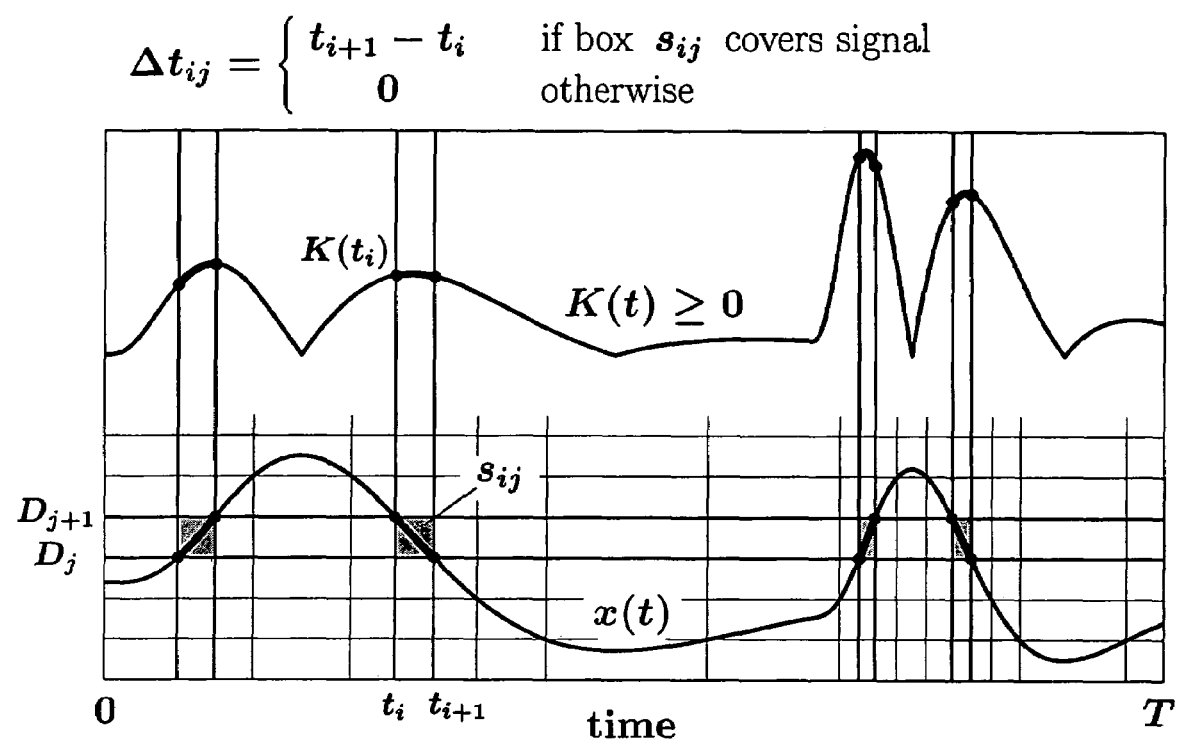
FIG. 4. Introduction to Modulated Threshold Density. Consider intersections of a scalar variable (signal) x(t) in the interval [0,T] with the thresholds $\{D_j\}$, where $D_{j+1}=D_j+\Delta D$. The instances of these crossings are labeled as $\{t_i\}$, $t_{i+1}>t_i$. The thresholds $\{D_j\}$ and the crossing times $\{t_i\}$ define a grid. We shall name a rectangle of this grid with the lower left coordinates $(t_i,D_j)$ as a $s_{ij}$ box. We will now identify the time interval $\Delta t_{ij}$ as $t_{i+1}-t_i$ if the box $s_{ij}$ covers the signal (as shown), and zero otherwise.
Figure 5:
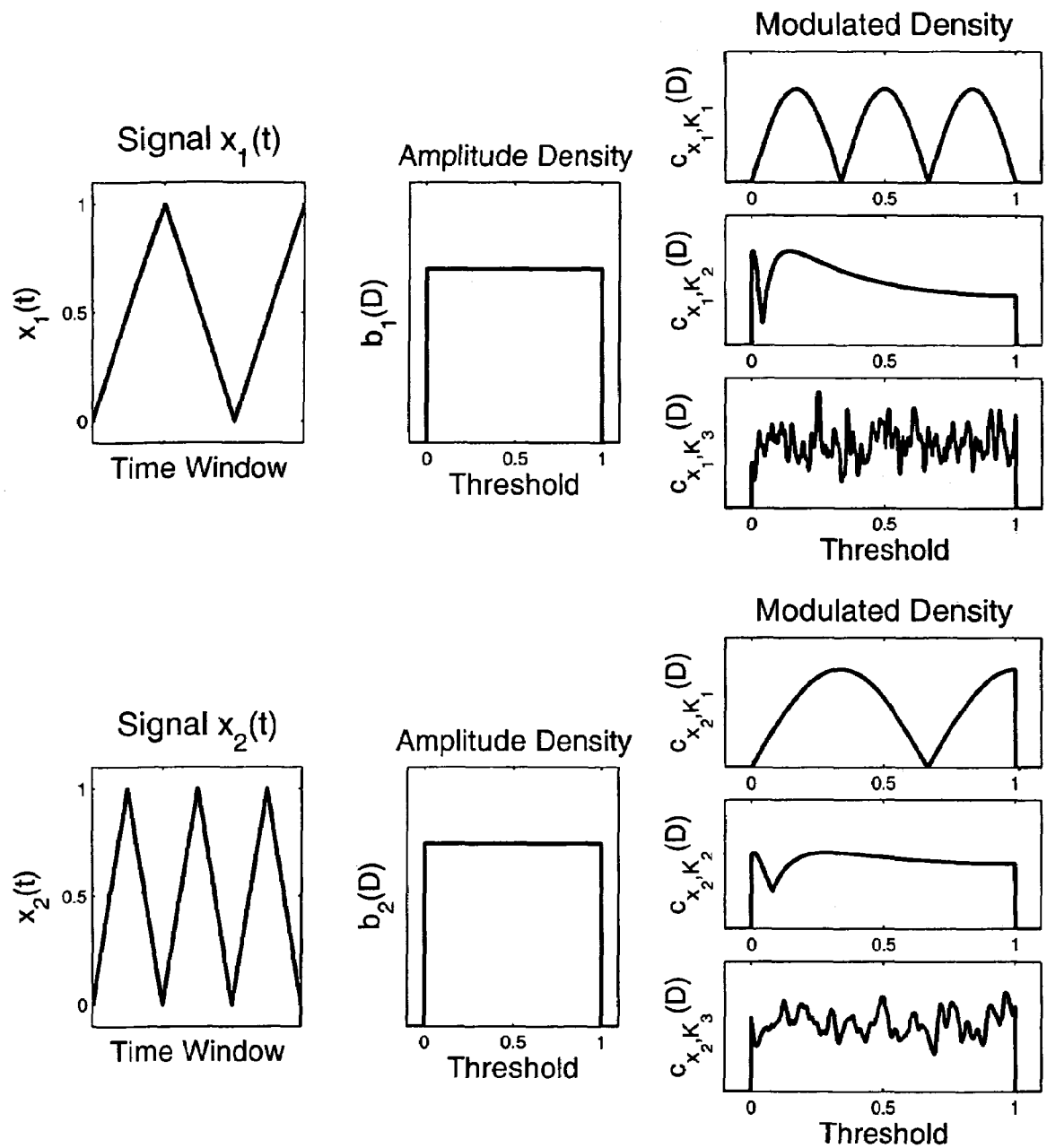
FIG. 5. Example of using modulated densities for measuring the input variable K in terms of the reference variable x. Notice that the amplitude densities of the fragments of the signals $x_1(t)$ and $x_2(t)$ shown in the left-hand panels are identical. Notice also that the modulating signals $K_1(t)$, $K_2(2)$, and $K_3(t)$ are identical for the respective modulated densities of the signals $x_1(t)$ and $x_2(t)$, while the modulated densities are clearly different. Thus even though the amplitude densities and the modulating signals are identical. different reference signals still result in different modulated densities.
Figure 6:
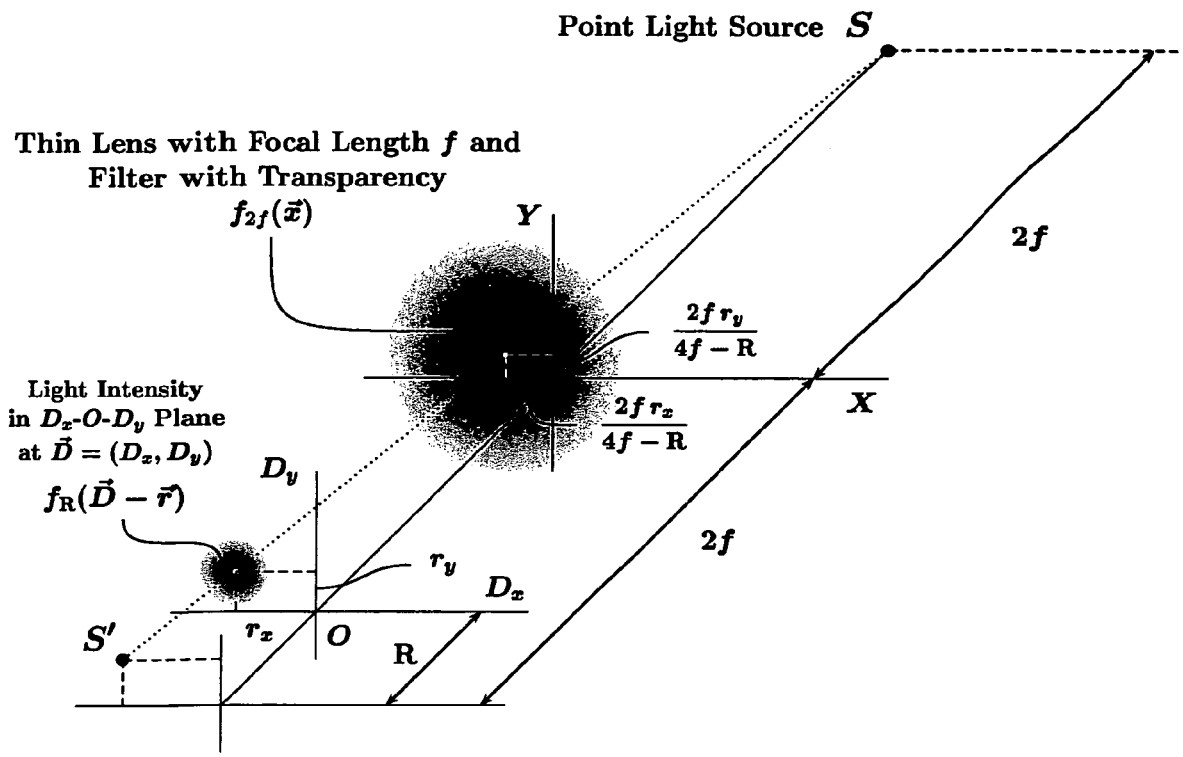
FIG. 6. Diagram illustrating an optical threshold smoothing filter (probe).
Figure 8:
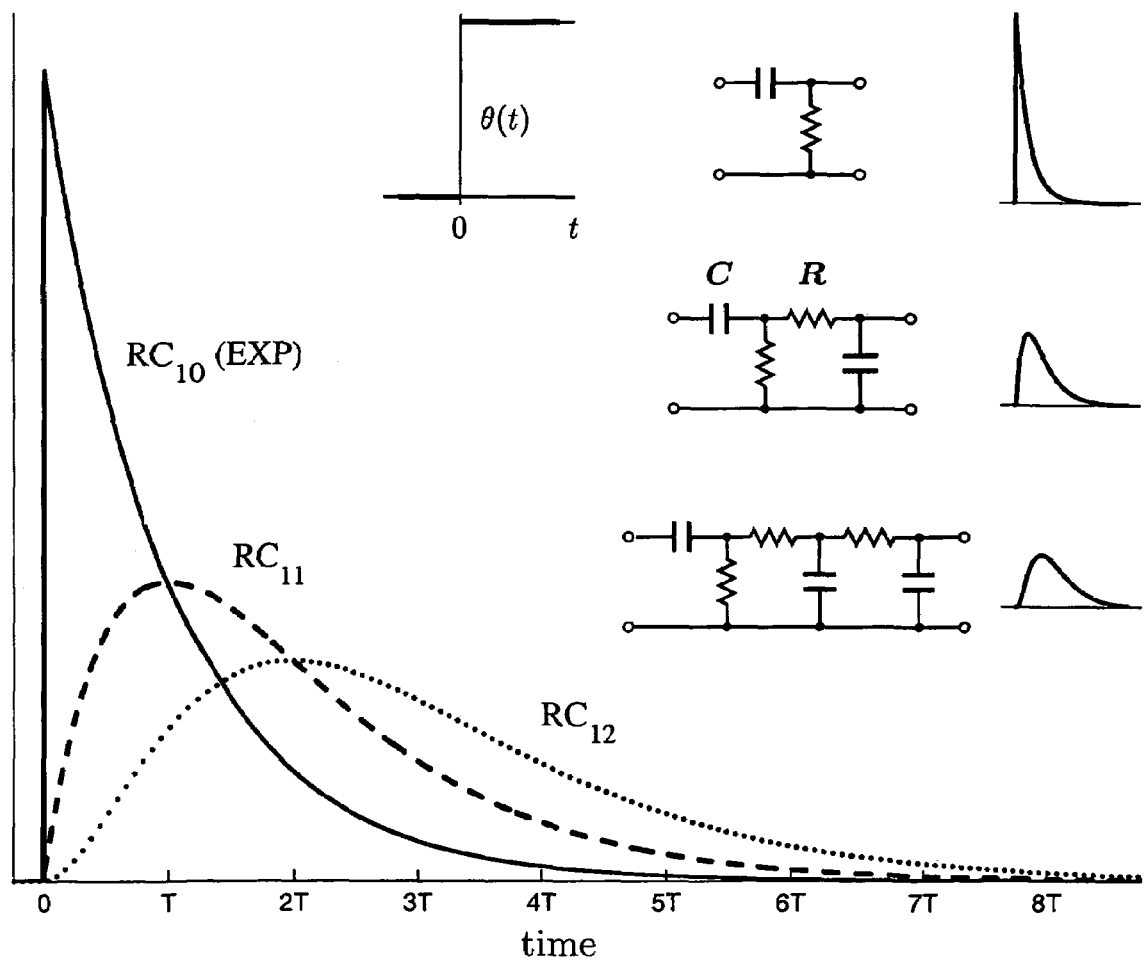
FIG. 8. $RC_{1n}$ impulse response functions for n=0 (exponential forgetting), n=1, and n=2.
Figure 9A:
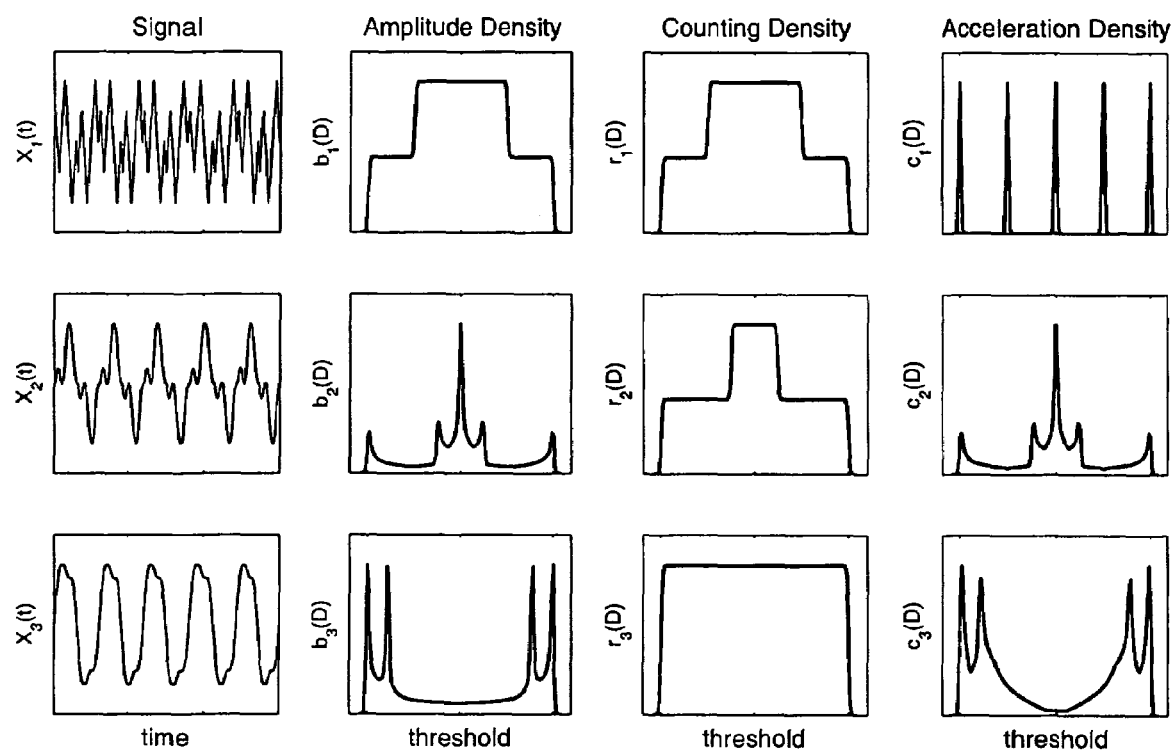
FIG. 9a. Amplitude, counting, and acceleration densities of a signal. The left column of the panels shows the fragments of three different signals in rectangular windows. The second column of the panels shows the amplitude densities, the third column shows the counting densities, and the right column shows the acceleration densities for these fragments. This figure illustrates that the acceleration and counting densities generally reveal different features of the signal than do the amplitude densities.
Figure 9B:
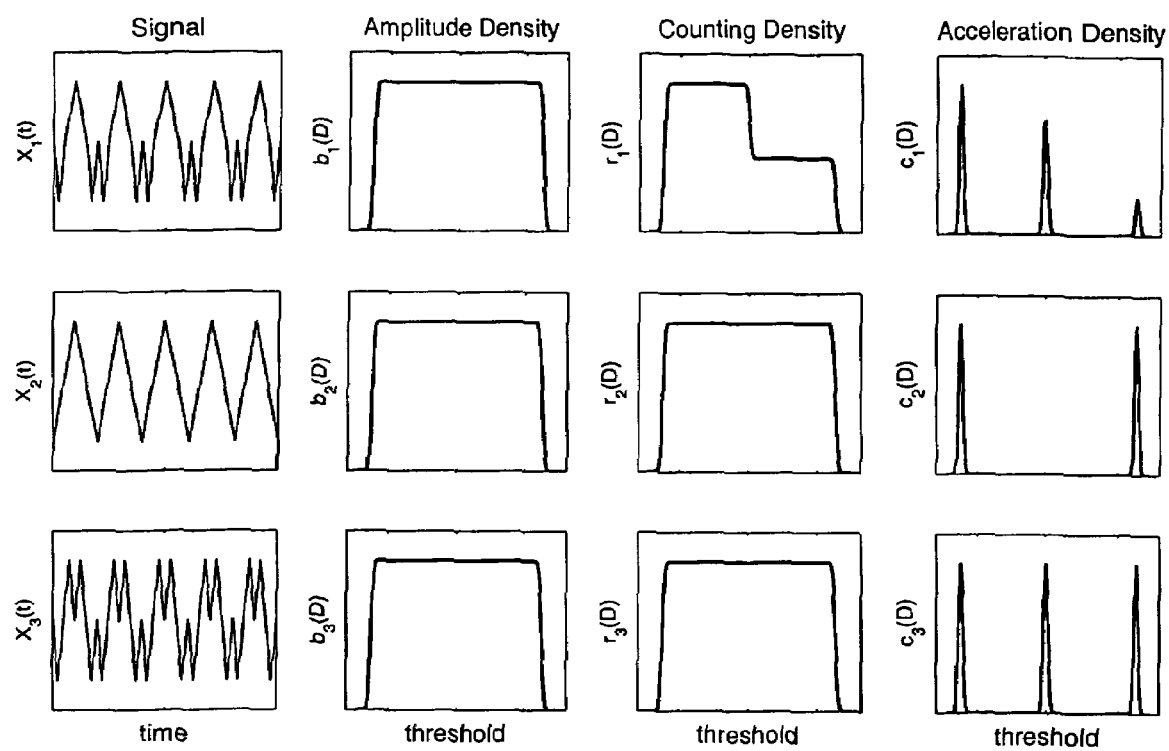

FIG. 9b. Amplitude, counting, and acceleration densities of a signal. The left column of the panels shows the fragments of three different signals in rectangular windows. The second column of the panels shows the amplitude densities, the third column shows the counting densities, and the right column shows the acceleration densities for these fragments. This figure illustrates that the acceleration and counting densities generally reveal different features of the signal than do the amplitude densities.

Figure 10:
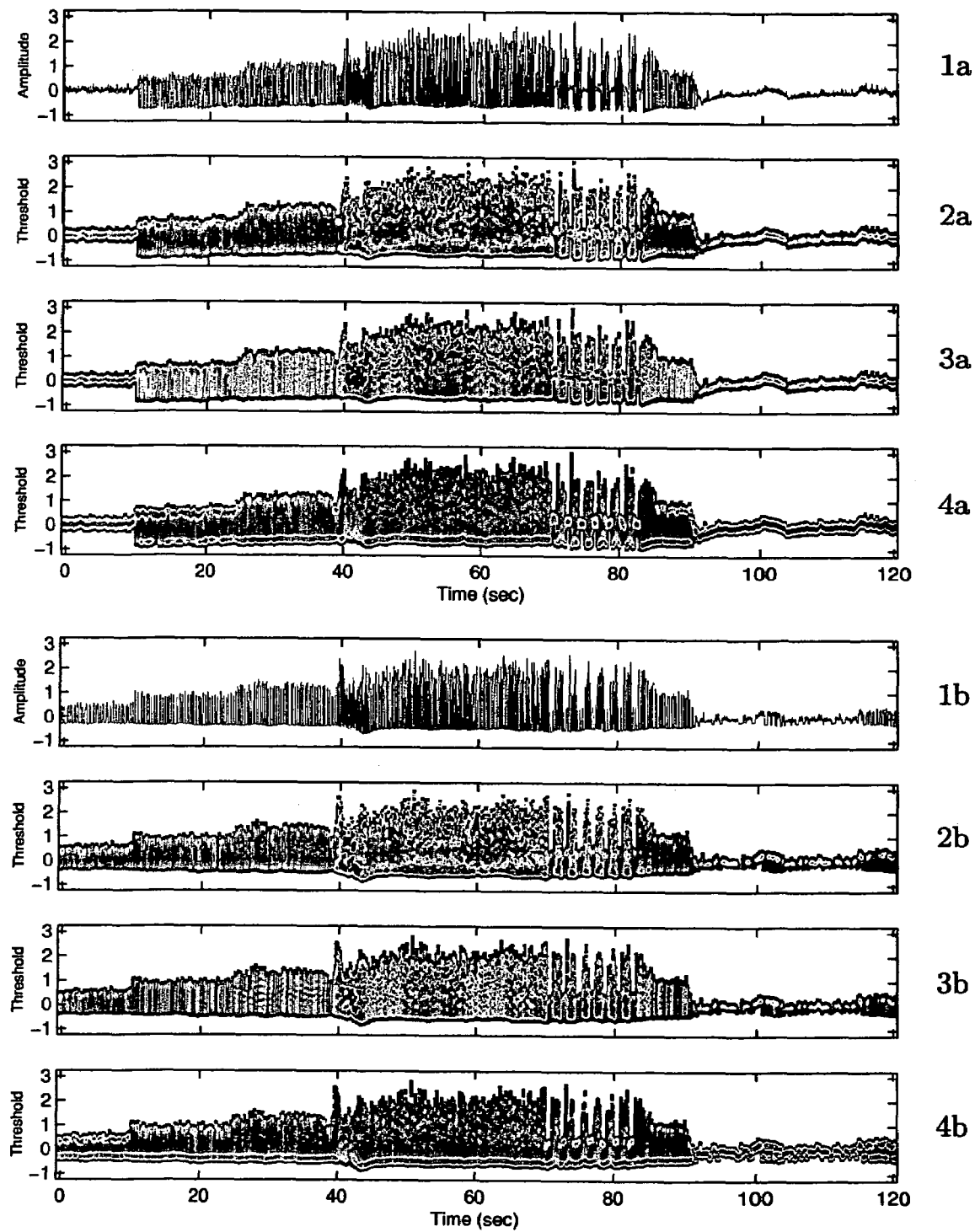

FIG. 10. Example of time dependent acceleration densities, threshold crossing rates, and amplitude densities computed in a 1-second rectangular moving window for two computer generated non-stationary signals (Panels 1a and 1b). Panels 2a and 2b show the acceleration densities, Panels 3a and 3b show the threshold crossing rates, and Panels 4a and 4b show the amplitude densities.

Figure 11:
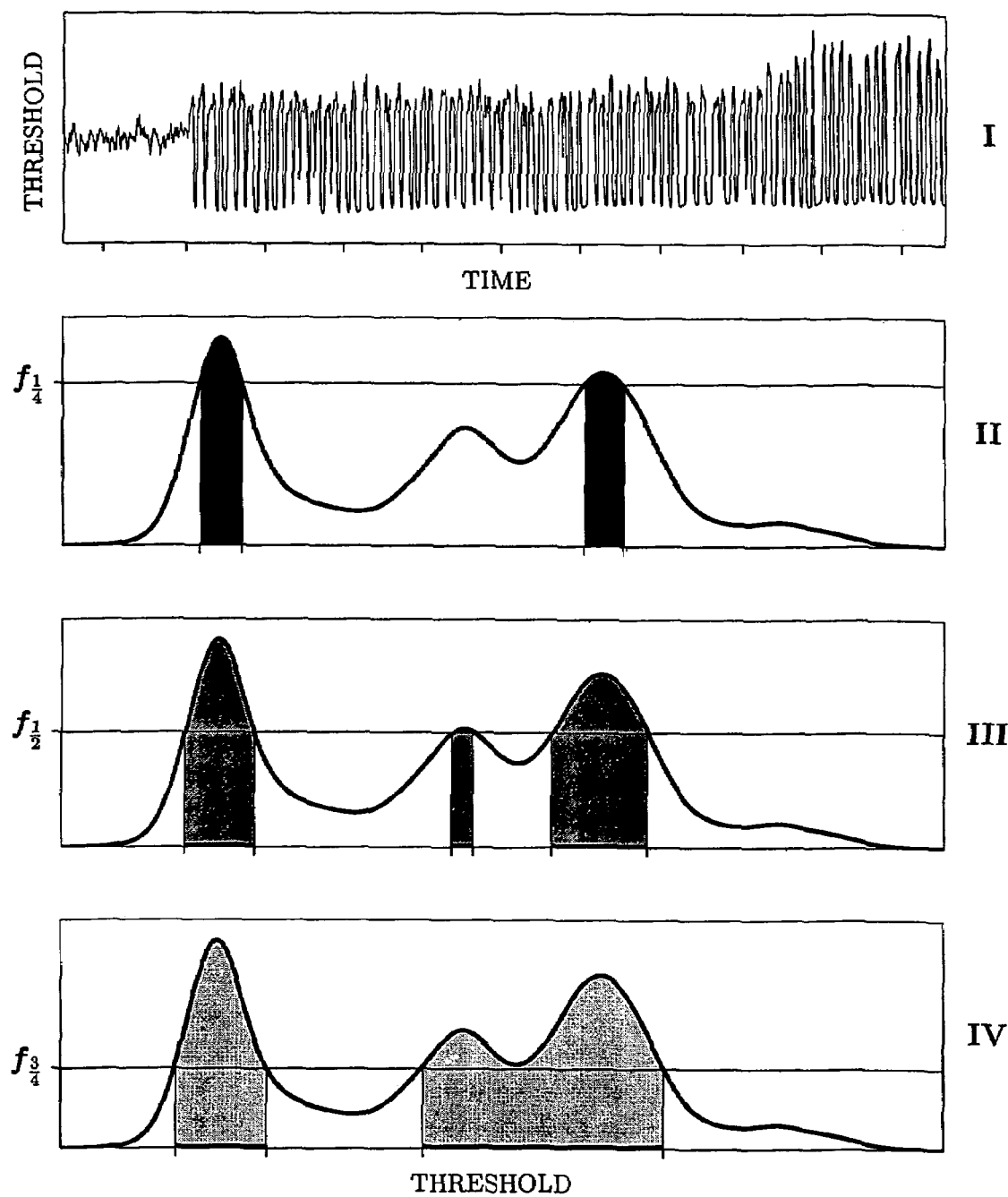

FIG. 11. Illustration of applicability of quantile densities, domains, and volumes to analysis of scalar variables.

Figure 12:
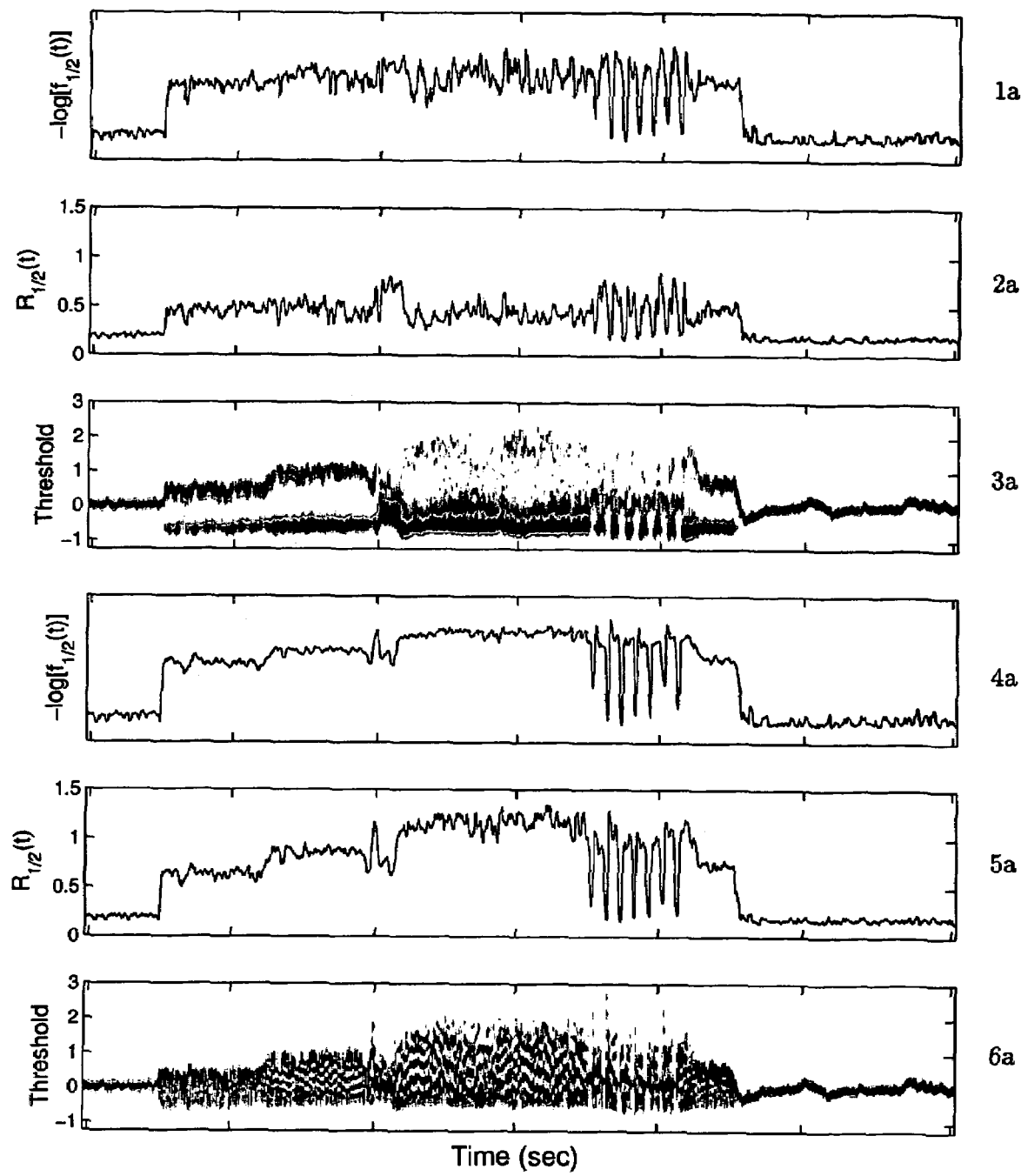
Figure 12:
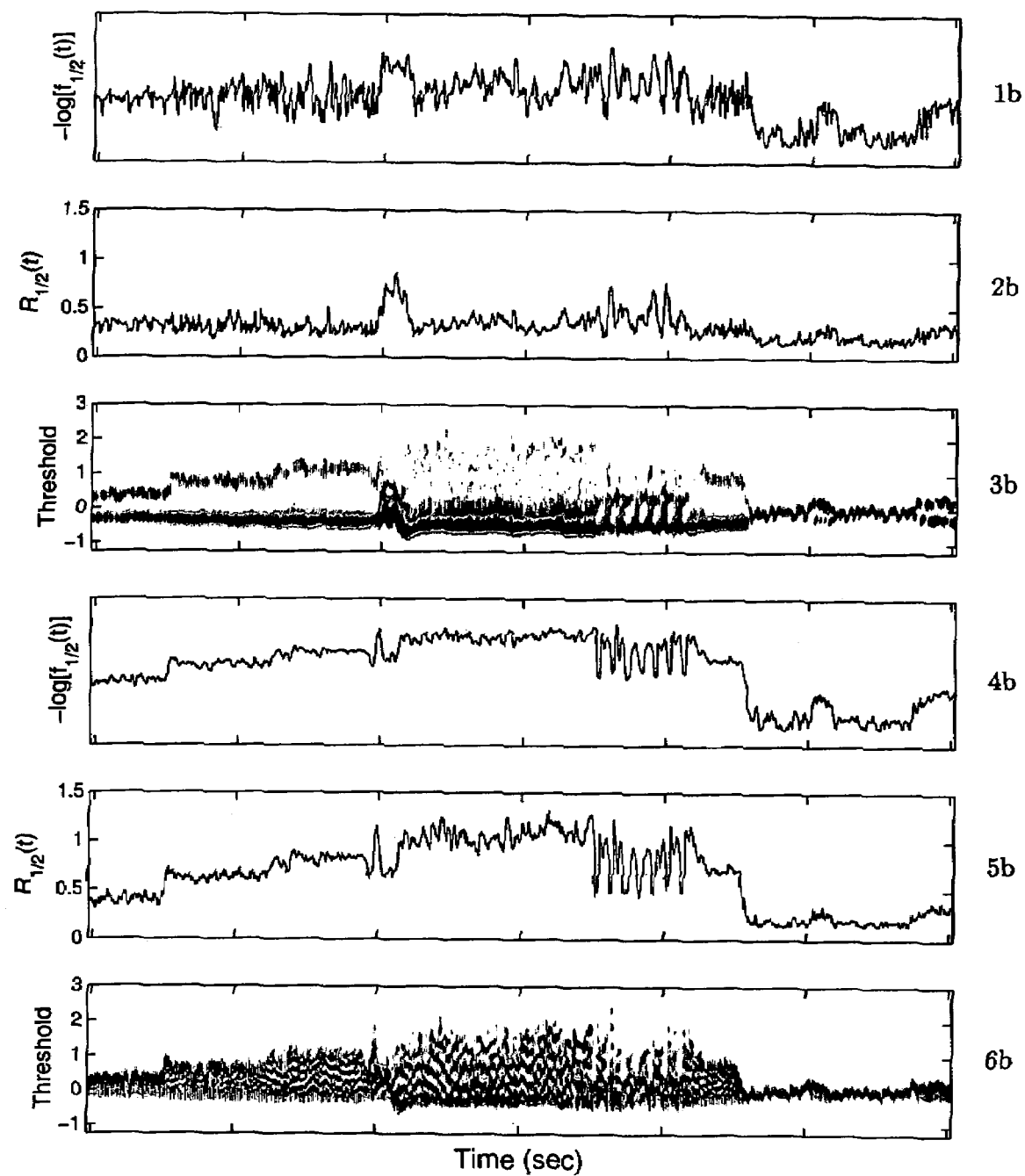

FIG. 12a. Quantile densities, volumes, and domains displayed as time dependent quantities computed in a 1-second rectangular sliding window for the signal shown in Panel 1a of FIG. 10.

FIG. 12b. Quantile densities, volumes, and domains displayed as time dependent quantities computed in a 1-second rectangular sliding window for the signal shown in Panel 1b of FIG. 10.

Figure 13:
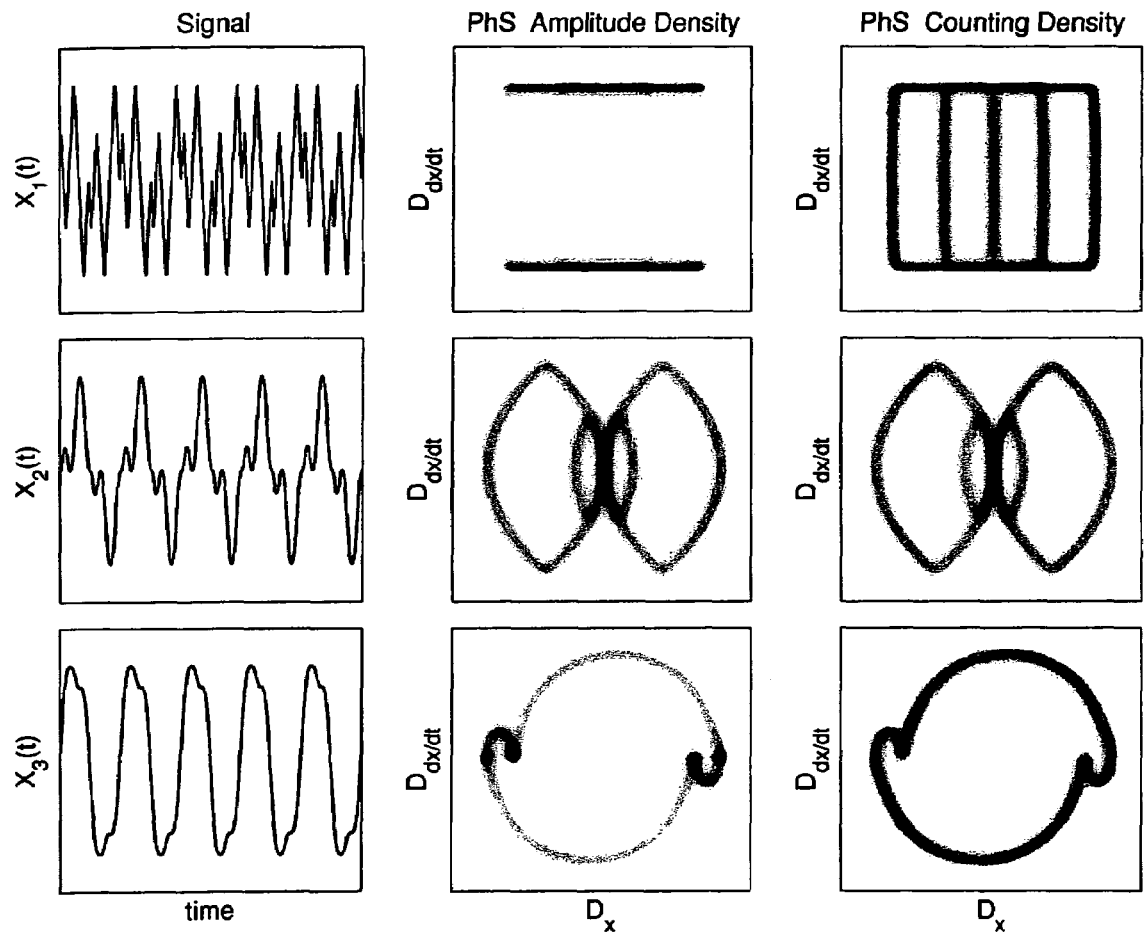

FIG. 13. Phase space densities of a signal. The first column of the panels in the figure shows the fragments of three different signals in rectangular windows. The second column of the panels shows the phase space amplitude densities, and the third column displays the phase space counting densities.

Figure 14:
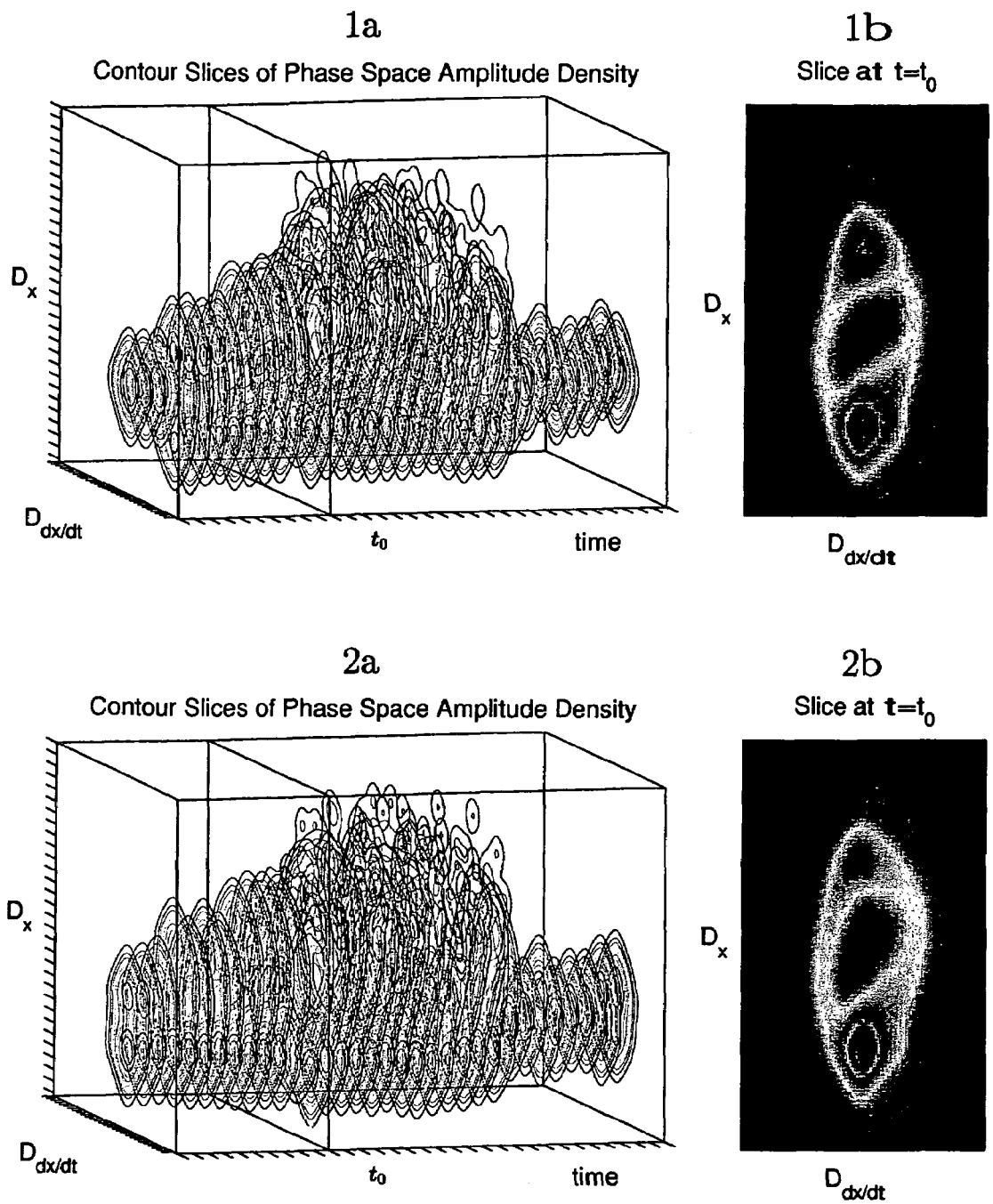

FIG. 14. Example of time dependent phase space amplitude densities computed according to Eq. (60) in a 1-second rectangular moving window for two computer generated non-stationary signals shown in Panels 1a and 1b of FIG. 10. The figure plots the level lines of the phase space amplitude densities (Panels 1a and 2a), at times indicated by the time ticks. Panels 1b and 2b show the time slices of these densities at time $t=t_0$.

Figure 15:
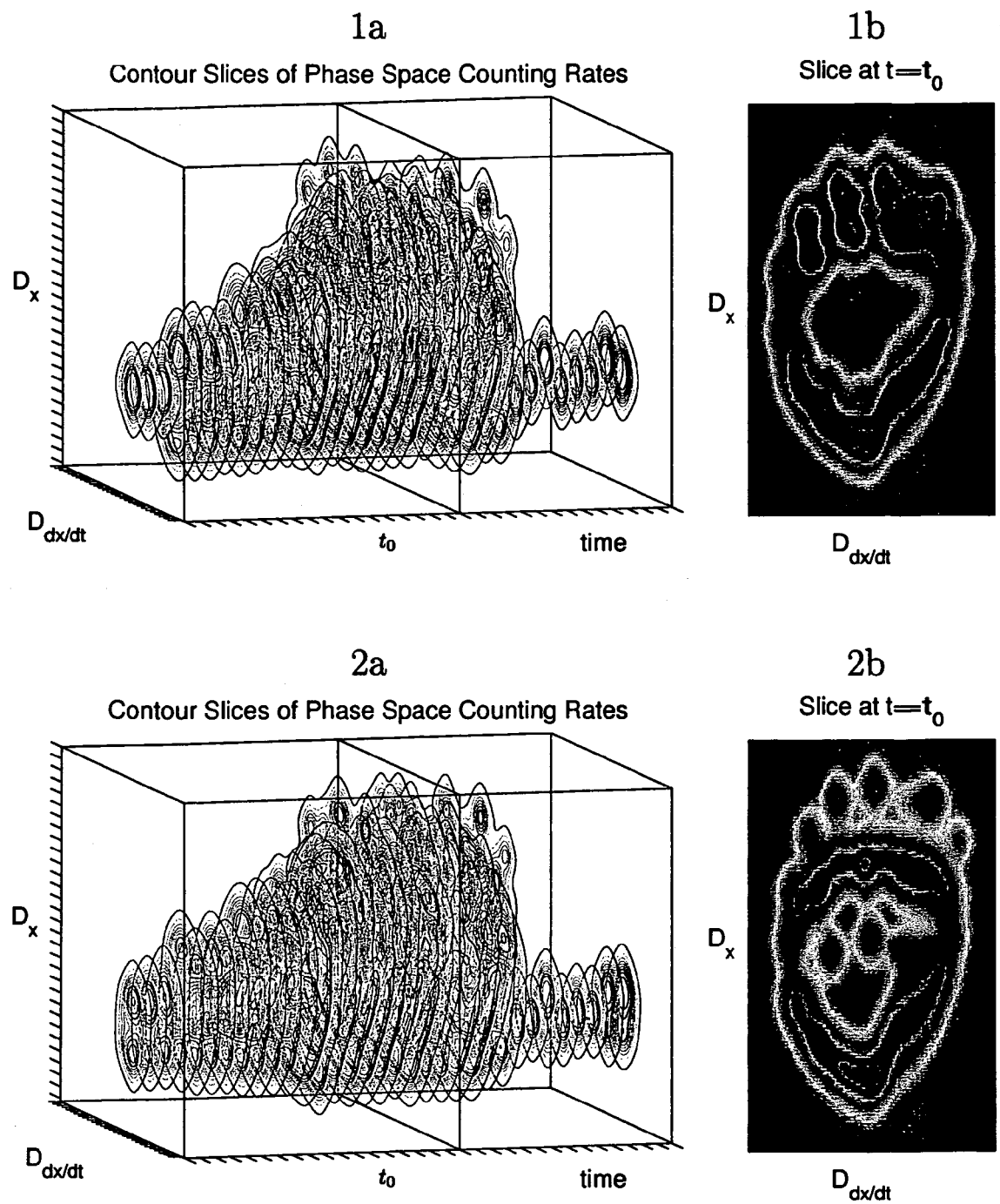

FIG. 15. Example of time dependent phase space counting rates computed according to Eq. (62) in a 1-second rectangular moving window for two computer generated non-stationary signals shown in Panels 1a and 1b of FIG. 10. The figure plots the level lines of the phase space counting rates (Panels 1a and 2a), at times indicated by the time ticks. Panels 1b and 2b show the time slices of these rates at time $t=t_0$.

FIG. 16. Boundaries of the median domains for the phase space amplitude densities. The upper panel shows the boundary for the signal of Panel 1a of FIG. 10, and the lower panel shows the median domain boundary for the signal of Panel 1b of FIG. 10.

FIG. 17. Boundaries of the median domains for the phase space counting densities. The upper panel shows the boundary for the signal of Panel 1a of FIG. 10, and the lower panel shows the median domain boundary for the signal of Panel 1b of FIG. 10.

Figure 18:
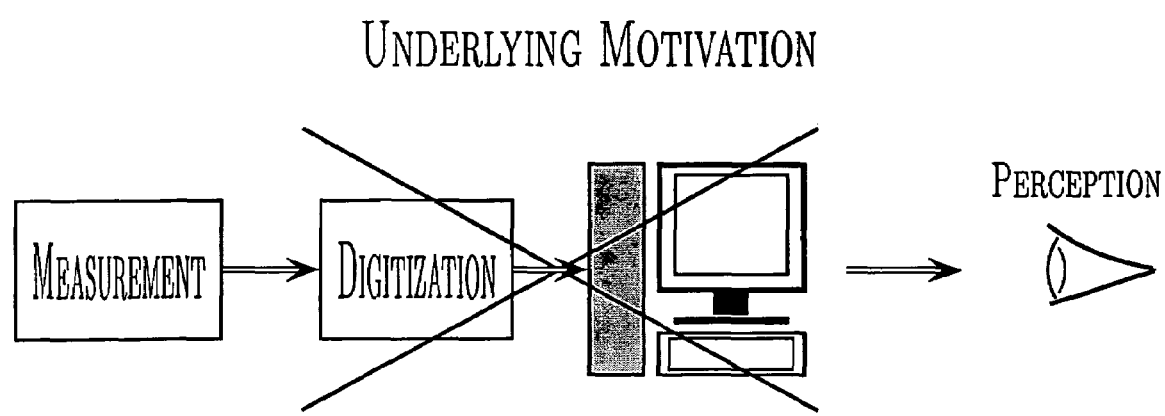

FIG. 18. Schematic statement of the underlying motivation behind AVATAR.

Figure 19:
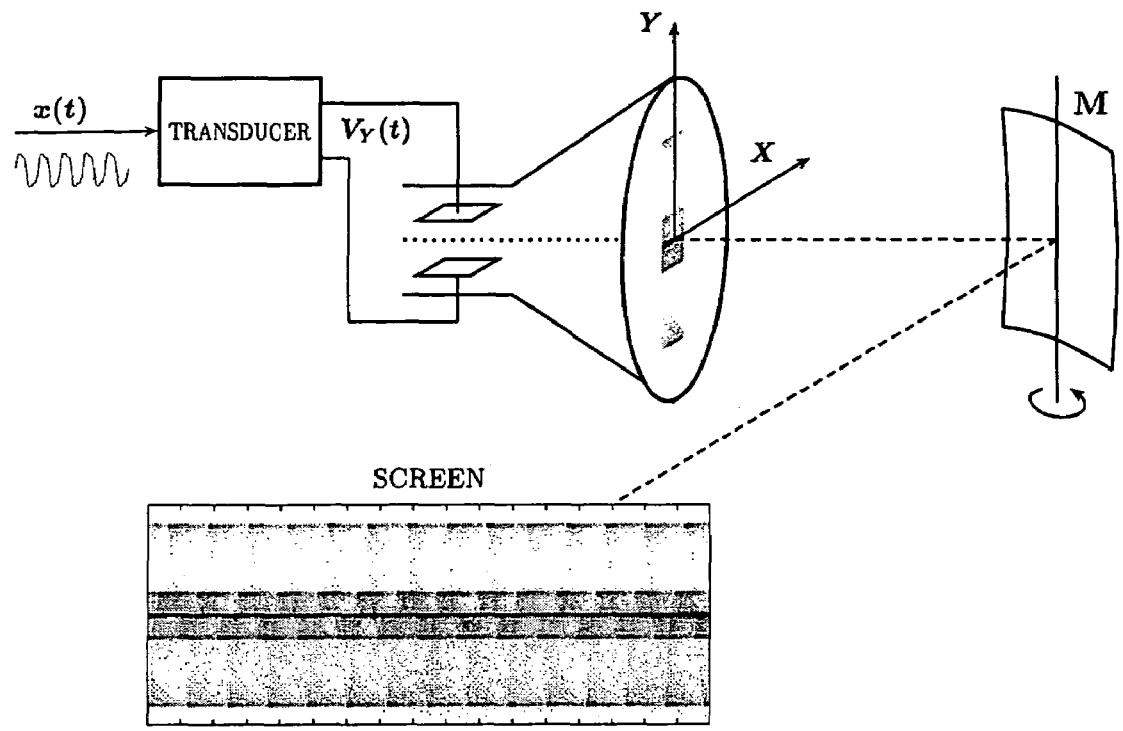

FIG. 19. Simplified conceptual schematic of a possible hardware device for displaying time dependent amplitude densities of a scalar variable.

Figure 20:
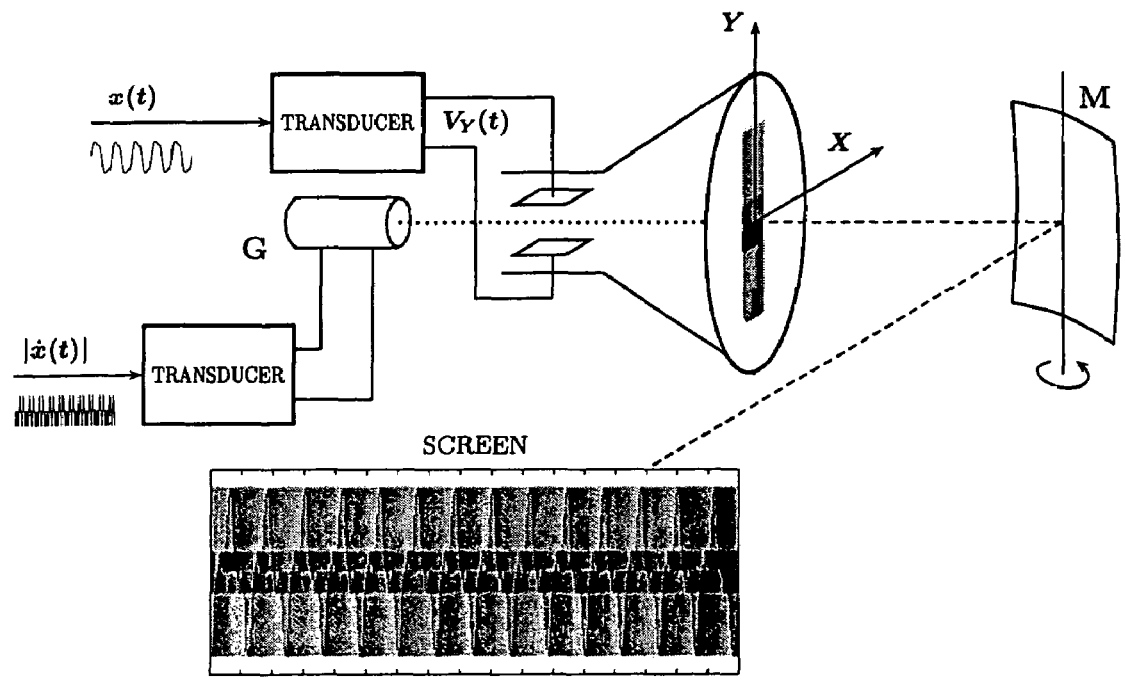

FIG. 20. Simplified conceptual schematic of a possible hardware device for displaying time dependent threshold crossing rates of a scalar variable.

Figure 21:
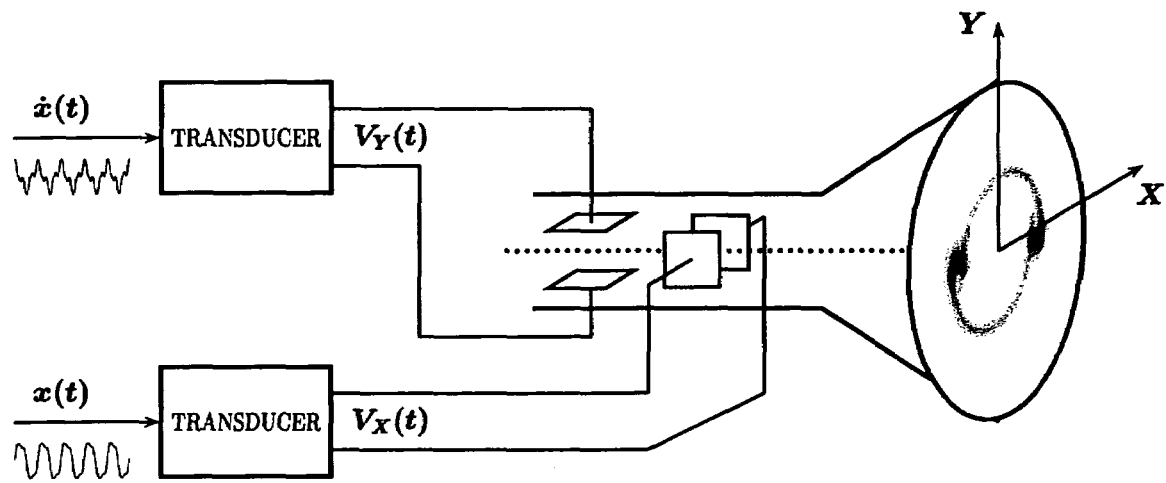

FIG. 21. Illustration of possible hardware device for displaying time slices of phase space amplitude densities.

Figure 22:
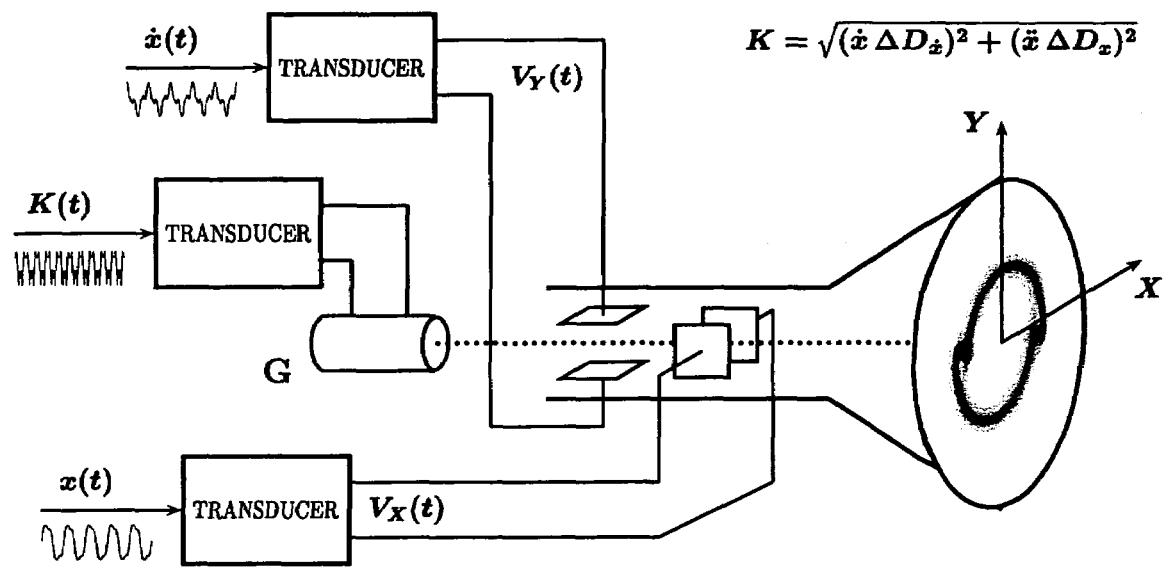

FIG. 22. Illustration of possible hardware device for displaying time slices of phase space counting rates.

Figure 23:
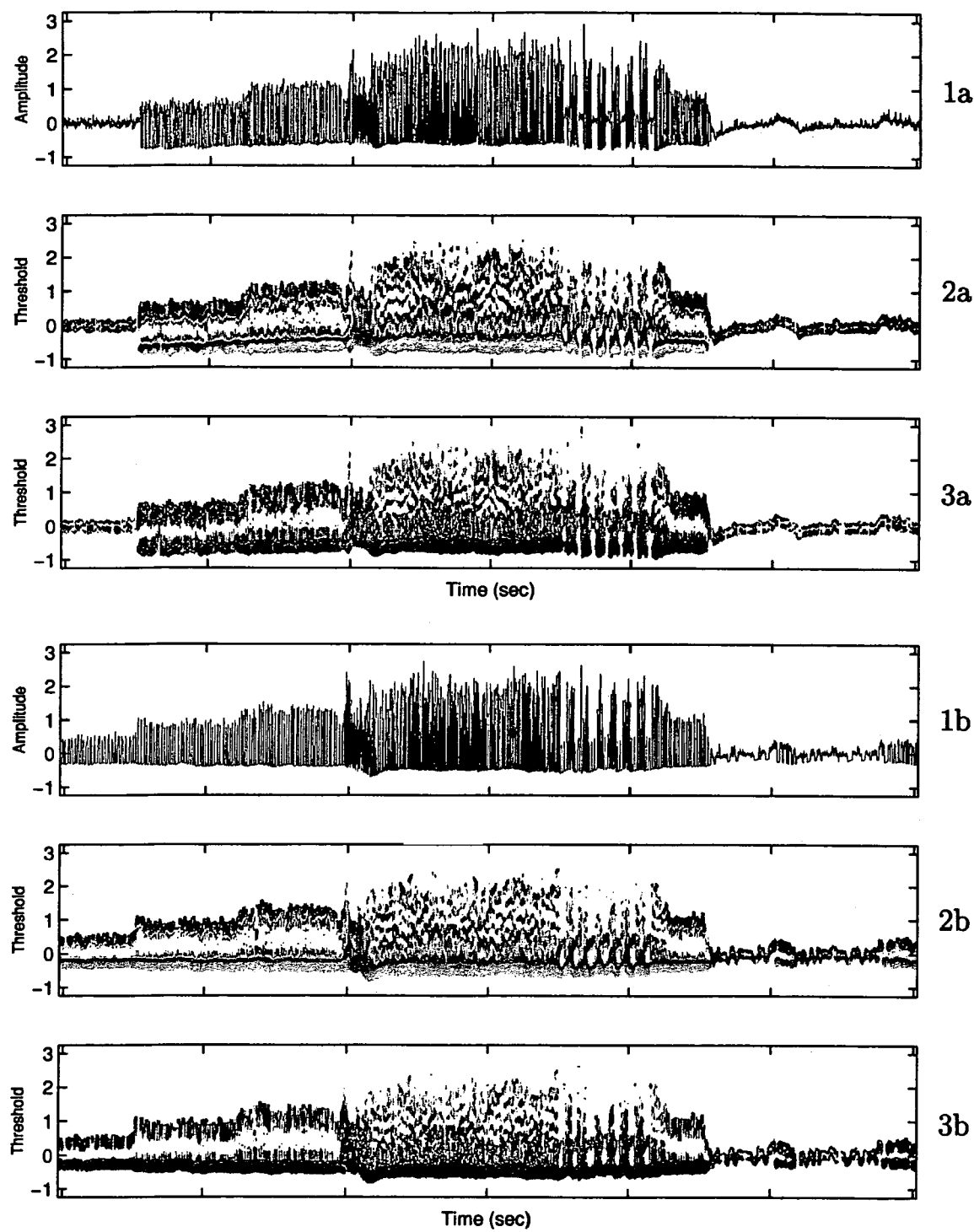

FIG. 23. Estimator $\Xi_q(D,t)$ of Eq. (63) in q=9/10 quantile domain, computed for the two computer generated nonstationary scalar signals shown in Panels 1a and 1b. Panels 2a and 2b display the values of the estimator for $K=|\dot{x}|$, and Panels 3a and 3b display these values for $K=|\ddot{x}|$.

Figure 24:
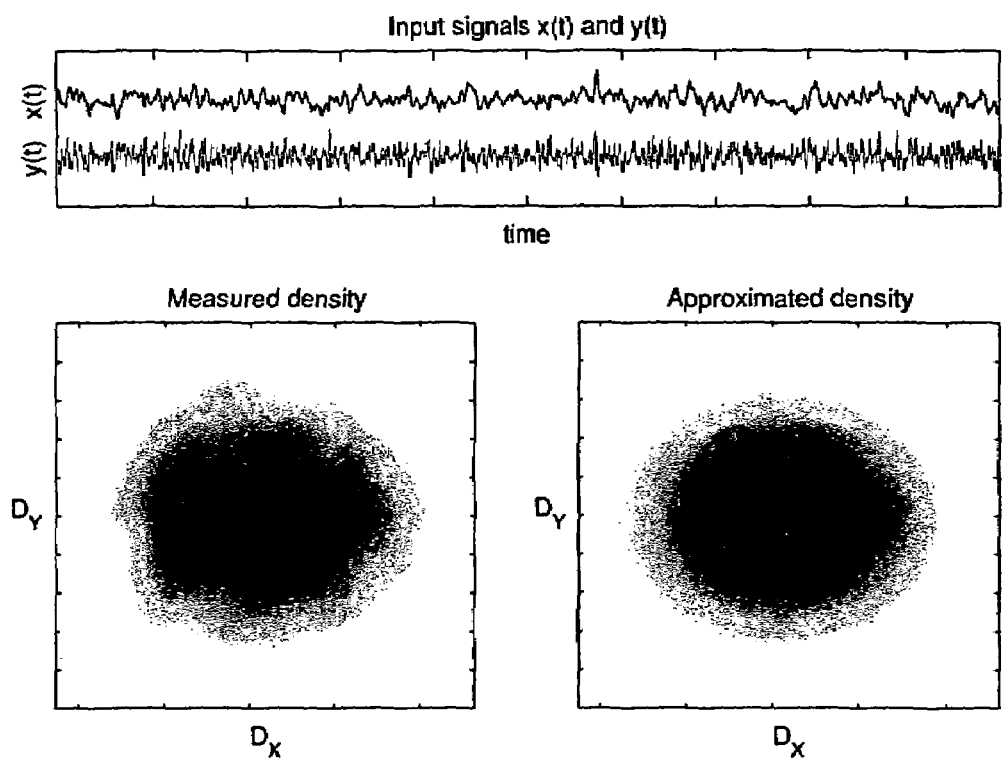

FIG. 24. Illustration of adequacy of the approximation of Eq. (73) when the signals x(t) and y(t) represent responses of linear detector systems to trains of pulses with high incoming rates, Poisson distributed in time.

Figure 25:
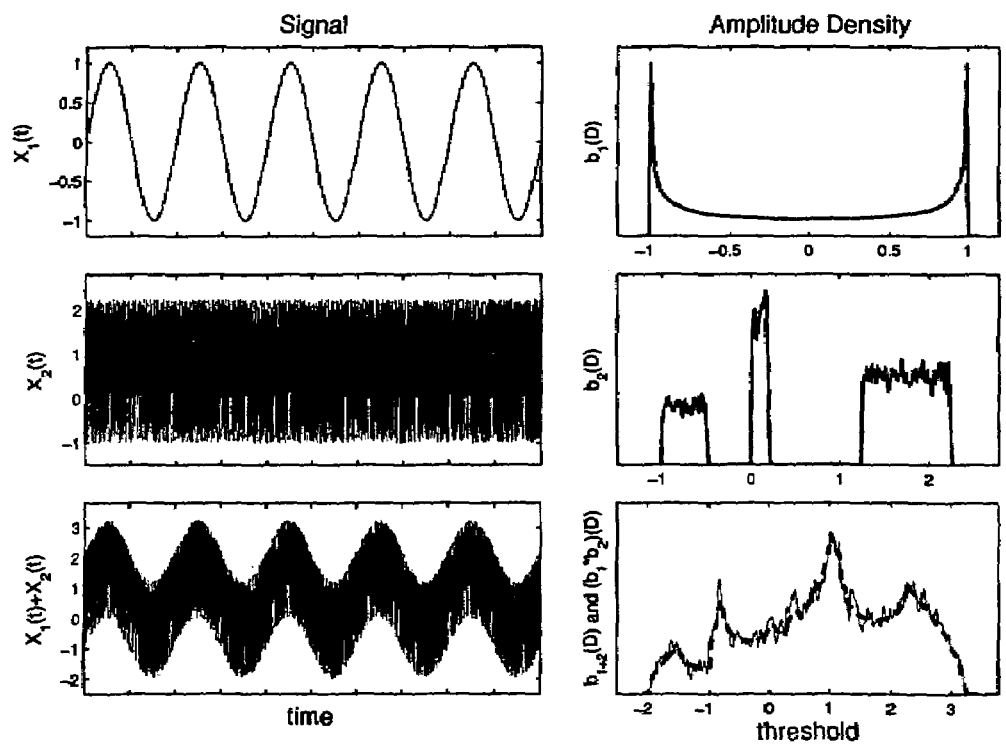

FIG. 25. Illustration of the resulting density as a convolution of the component densities for uncorrelated signals. The signals $x_1(t)$, $x_2(t)$, and $x_1(t)+x_2(t)$ are shown in the left column of the panels, and the respective panels in the right column show the respective amplitude densities. The signal $x_2(t)$ is random (non-Gaussian) noise. In the lower right panel, the measured density of the combined signal is shown by the solid line, and the density computed as the convolution of the densities $b_1(D)$ and $b_2(D)$ is shown by the dashed line.

Figure 26:
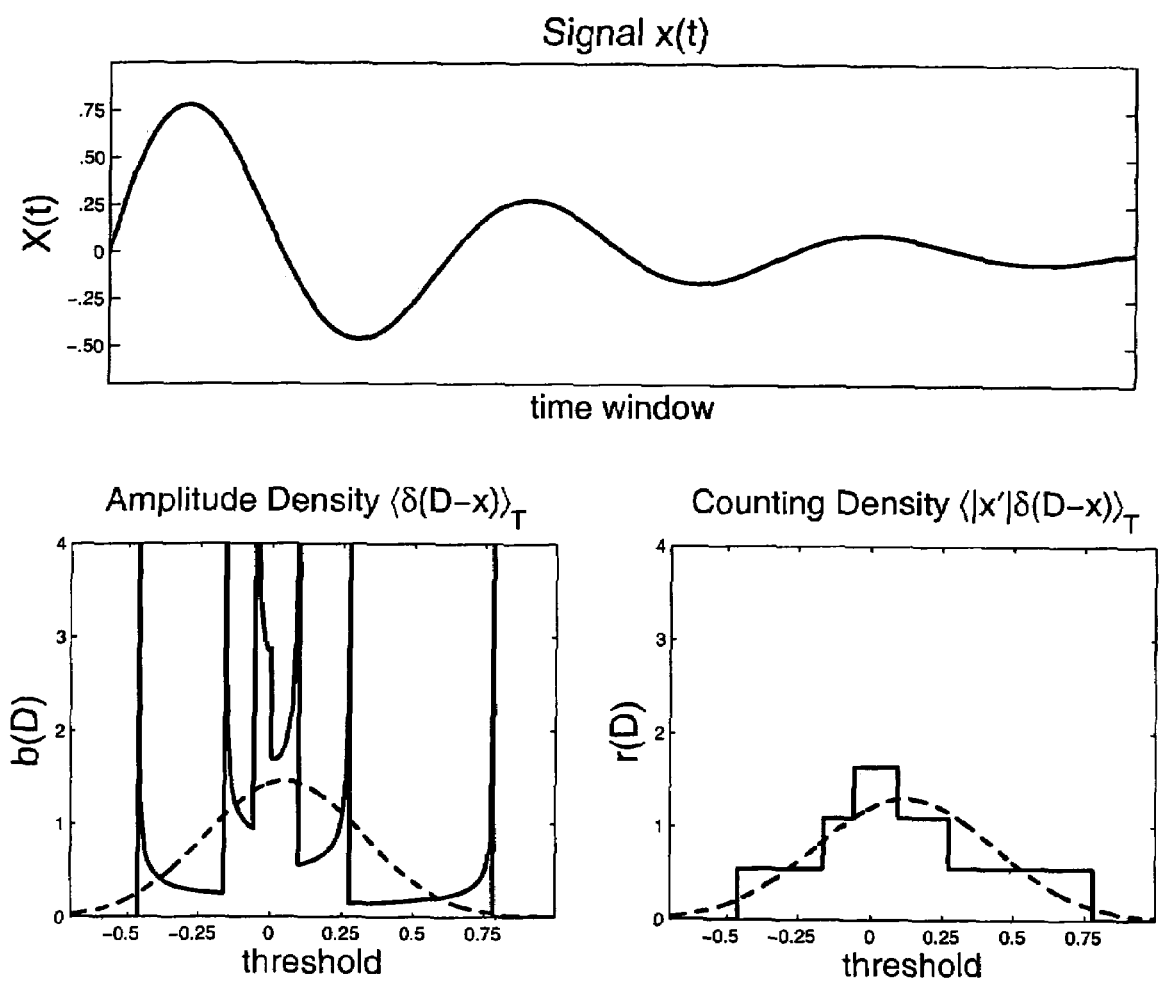

FIG. 26. The amplitude $\langle\delta(D-x)\rangle_T$ and the counting $(\langle|\dot{x}|\rangle_T)^{-1}\langle|\dot{x}|\delta(D-x)\rangle_T$ densities of the fragment of the signal shown in the upper panel. One can see that the Gaussian unimodal approximation (dashed lines) is more suitable for the counting density than for the amplitude density.

Figure 27:
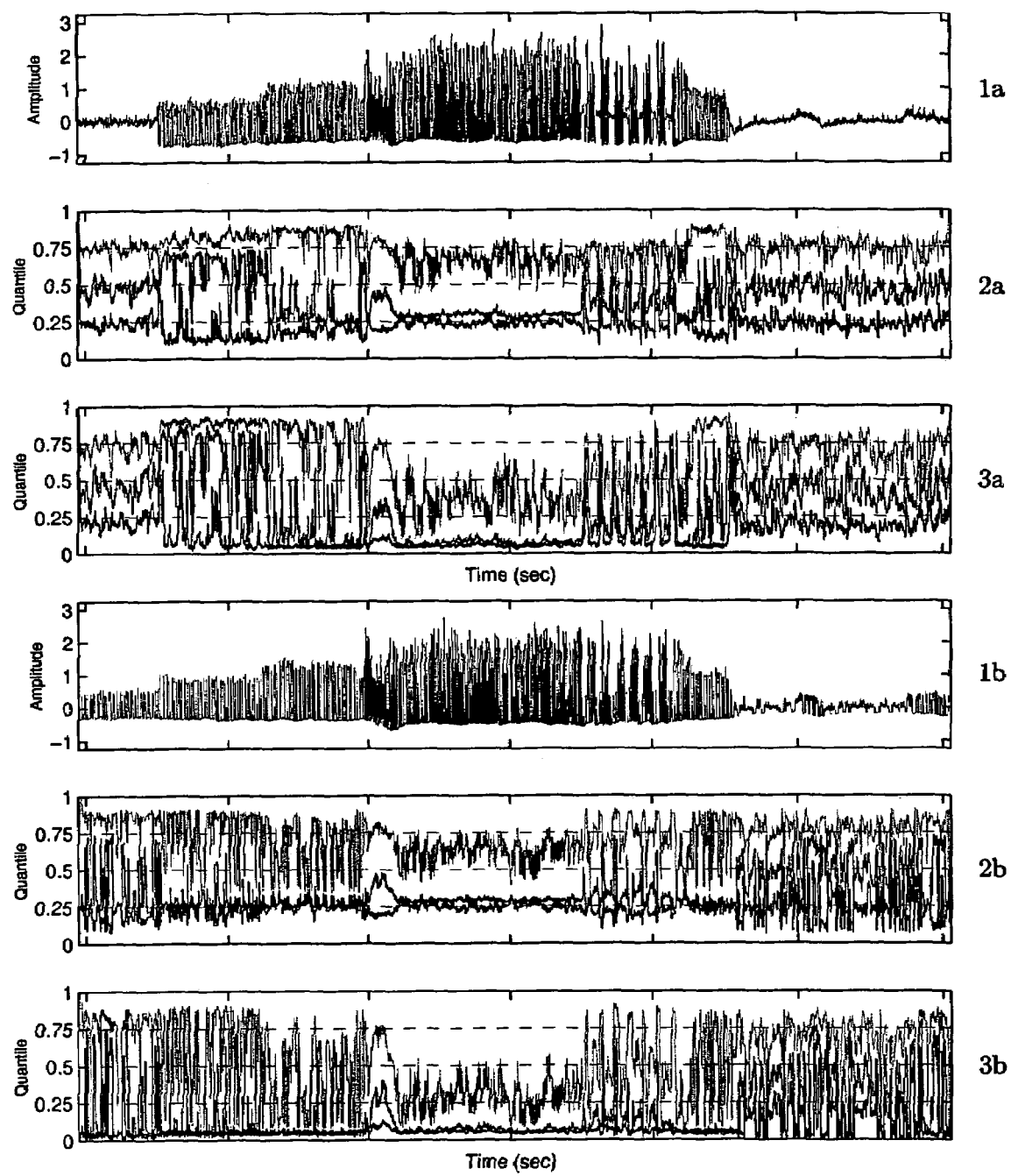

FIG. 27. Example of the usage of the estimator given by Eq. (92) for quantification of changes in a signal. The signals are shown in Panels 1a and 1b. The distributions $C_a(D,t)$ are computed in a 1-second rectangular moving window as the amplitude (for Panels 2a and 2b) and counting (for Panels 3a and 3b) cumulative distributions. Thus $y_q(t)$ are the outputs of the respective rank filters for these distributions. The estimators $Q_{ab}(t;q)$ are computed as the outputs of the Gaussian normalizer of Eq. (83). The values of these outputs for different quartile values are plotted by the gray (for q=½), black (for q=¼), and light gray (for q=¾). In this example, the estimator $Q_{ab}(t;q)$ quantifies the deviations of $C_a(D,t)$ from the respective normal distributions.

Figure 28:
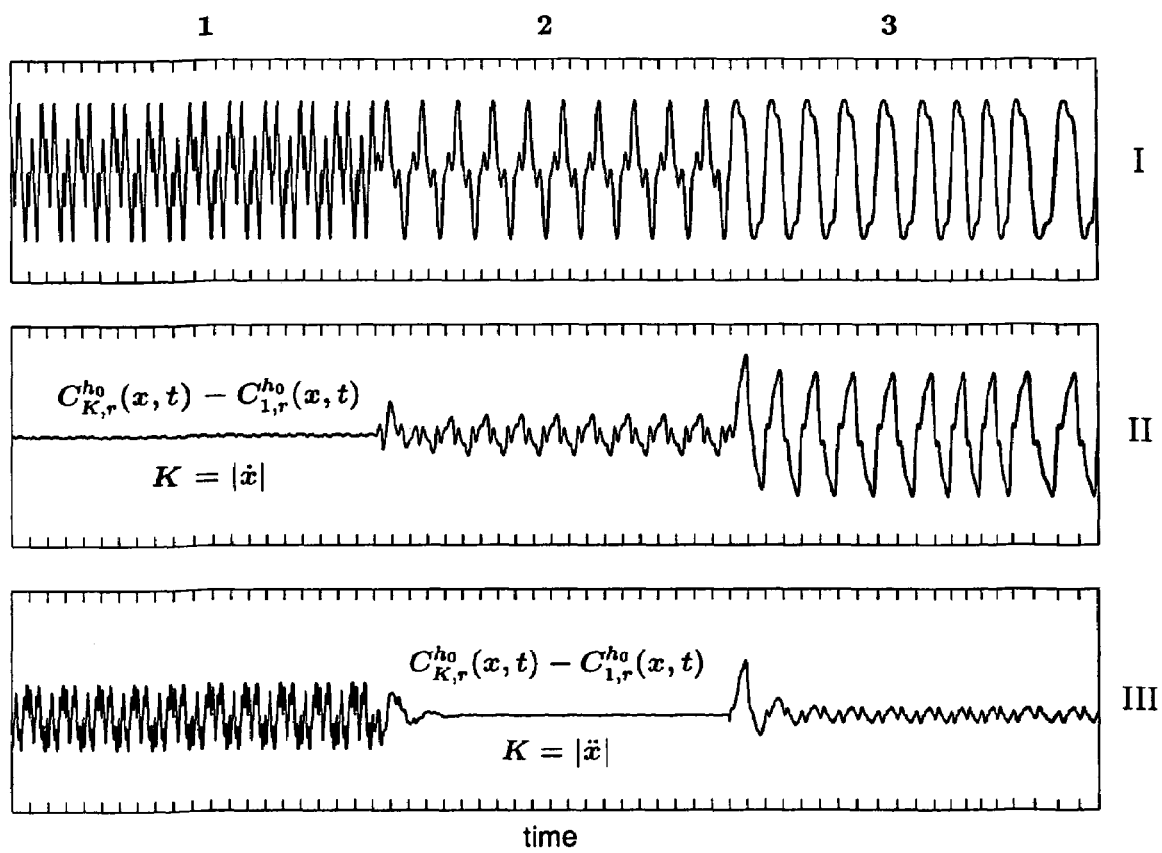

FIG. 28. Example of usage of rank normalization for discriminating between different pulse shapes of a variable. Panel I shows the input signal consisting of three different stretches, 1 through 3, corresponding to the variables shown in FIG. 9. Panel II displays the difference between $C_{|\dot{x}|,r}^{h_0}(x,t)$ and $C_{1,r}^{h_0}(x,t)$, where the reference signal r is a Gaussian process with the mean $K_{10}$ and the variance $K_{20}-K_{10}^2$, and $K_{nm}$ are computed for the input signal x(t). This difference is zero for the first stretch of the input signal, since for this stretch the amplitude and the counting densities are identical (see FIG. 9). Panel III displays the difference between $C_{|\ddot{x}|,r}^{h_0}(x,t)$ and $C_{1,r}^{h_0}(x,t)$. This difference is zero for the second stretch of the input signal, since for this stretch the amplitude and the acceleration densities are identical (see FIG. 9). The distance between the time ticks is equal to the constant T of the time filter.

Figure 29:
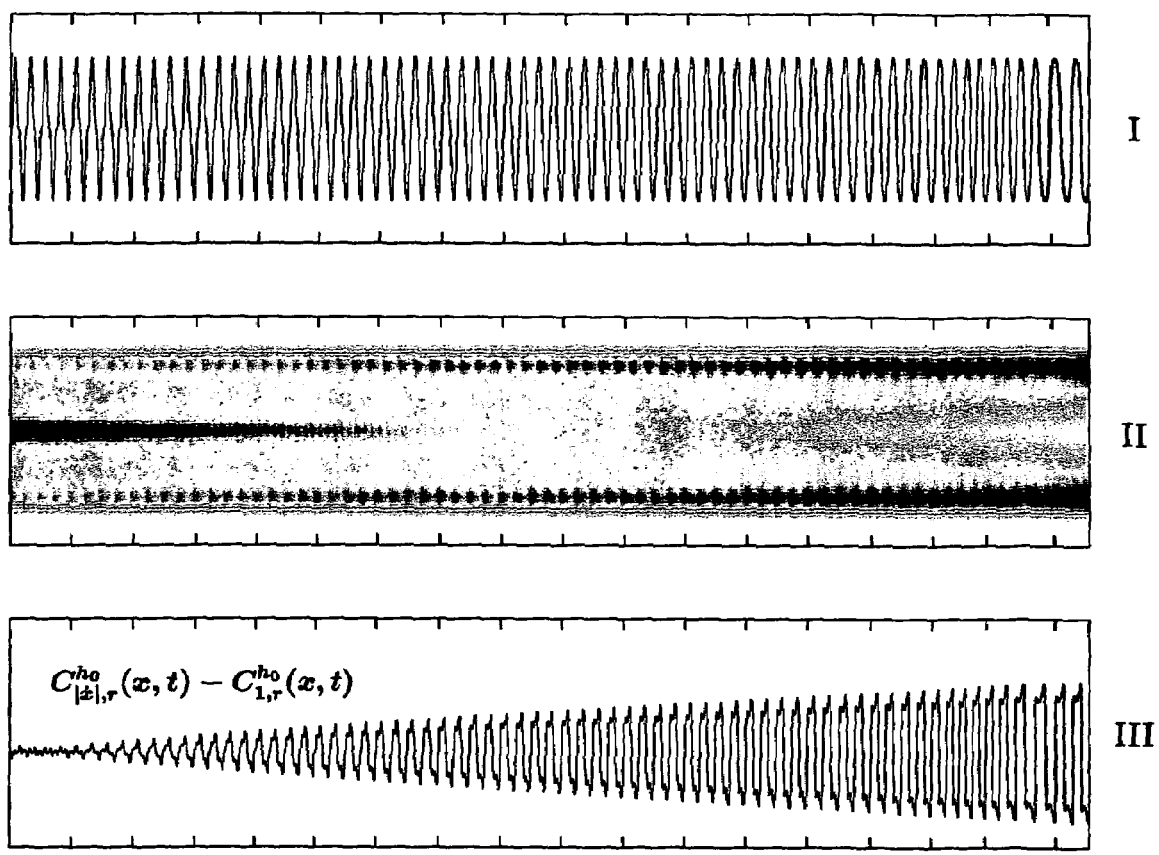

FIG. 29. Additional example of sensitivity of the difference between two rank normalized signals to the nature of the reference distributions. Panel I shows the input signal, and Panel II displays the amplitude density computed in an $RC_{10}$ window with the time constant T, equal to the distance between the time ticks. Panel III plots the difference between $C_{|x|,r}^{h_0}(x,t)$ and $C_{1,r}^{h_0}(x,t)$, where the reference signal r is a Gaussian process with the mean $K_{10}$ and the variance $K_{20}-K_{10}^2$, computed for the input signal x(t).

Figure 30:
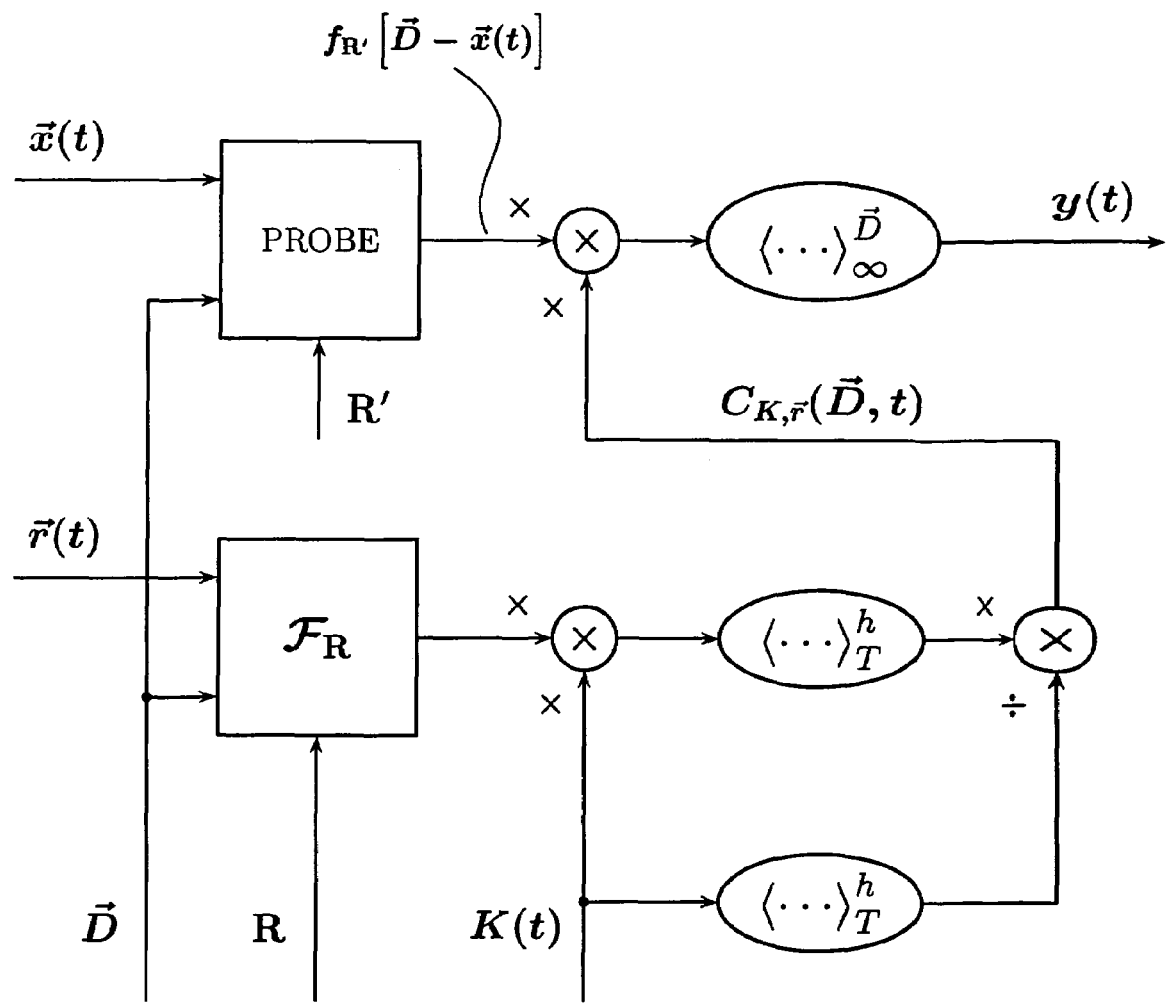

FIG. 30. Simplified flowchart of an analog rank normalizer.

FIG. 31. Simplified flowchart of a device for comparison of two signals by a means of rank normalization.

Figure 32:
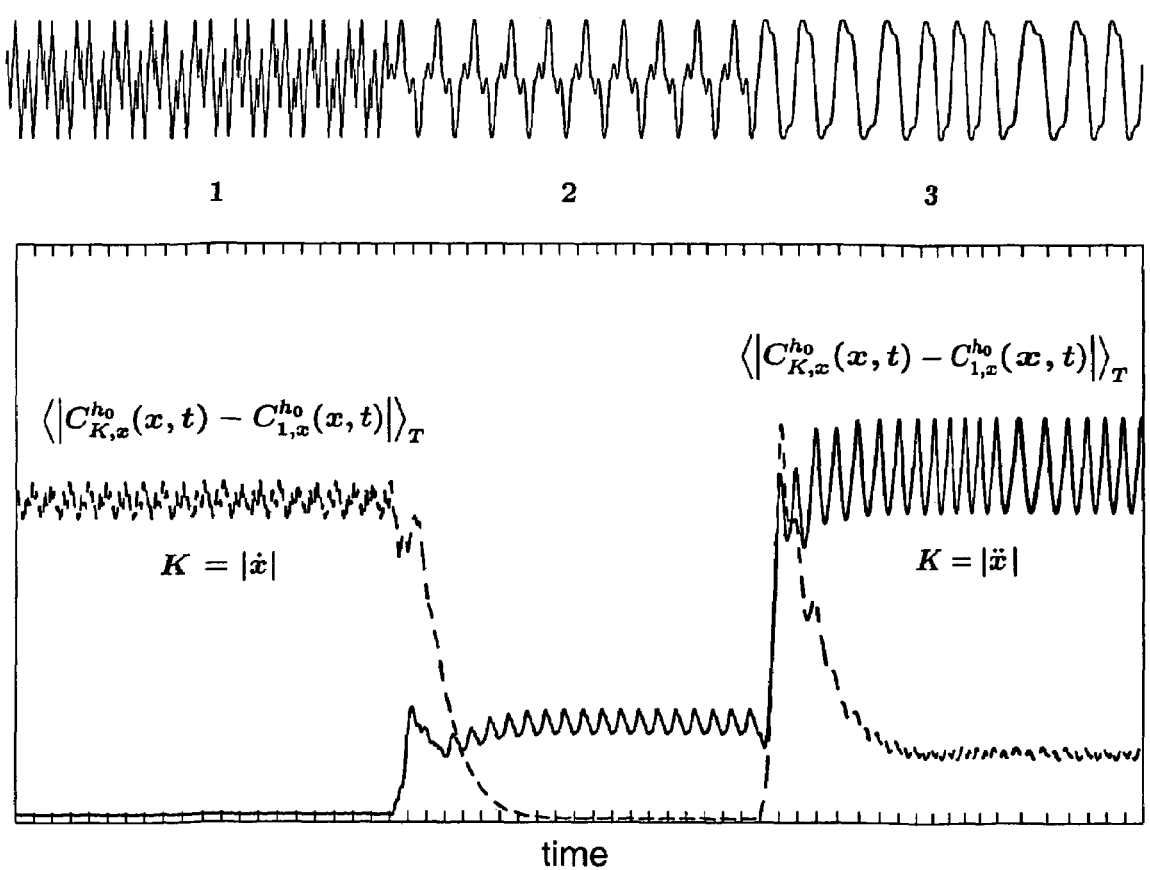

FIG. 32. Time averages of the absolute values of the differences, $\langle|C_{K,x}^{h_0}(x,t)-C_{1,x}^{h_0}(x,t)|\rangle_T$, for K=|x̃| and K=|x̃|, for the variable shown above the panel of the figure. The distance between the time ticks is equal to the time constants T of the filtering windows.

Figure 33:
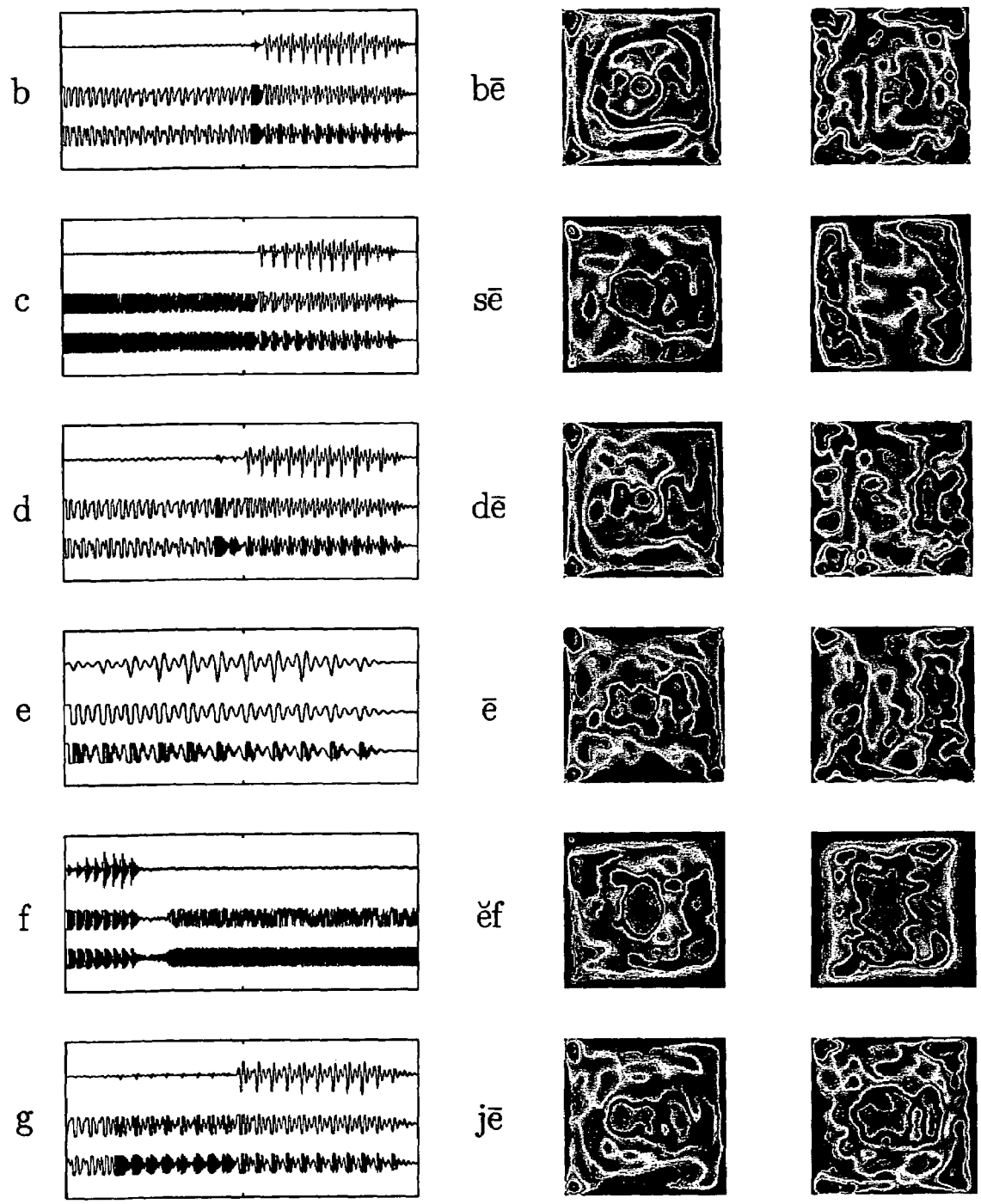

FIG. 33. Illustration of sensitivity of the amplitude and counting phase space densities to differences in the signal's wave form. The panels in the left column show the sound signals for several letters of the alphabet. The top signals in the individual panels are the original input signals. The normalized input signals and their normalized first derivatives, respectively, are plotted below the original input signals. The middle column of the panels shows the amplitude, and the right column the counting densities of these pairs of normalized signals.

Figure 34:
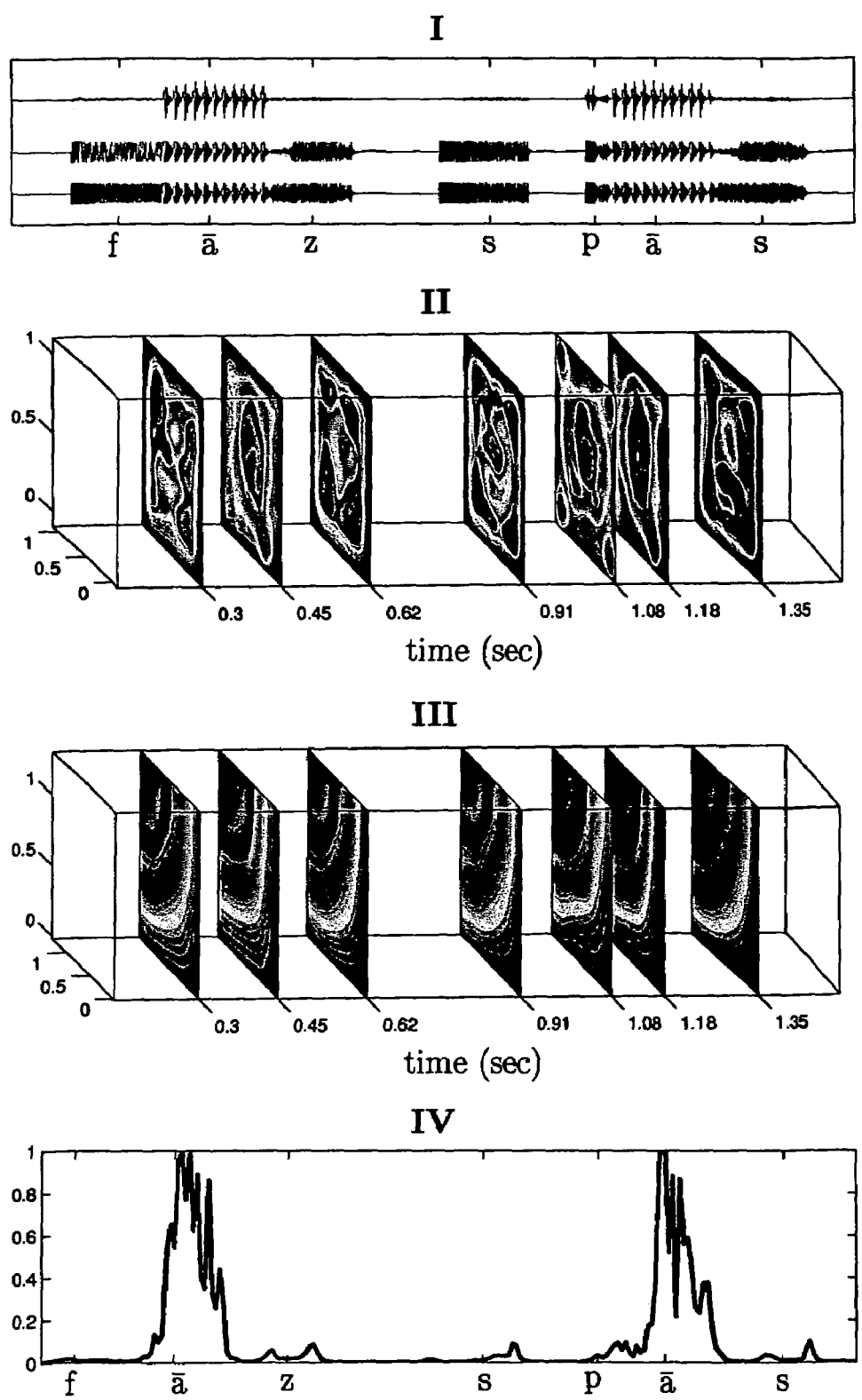

FIG. 34. Panel I: The original speech signal "Phase Space" is shown in the top of the panel. This signal is normalized with respect to a Gaussian process with the mean and variance of the original signal in a moving rectangular window of 45 ms, and the result is plotted just below the original signal. The bottom of the panel shows the time derivative of the speech signal, normalized the same way. Panel II: Time slices of the threshold density $c(D_x, D_y,t)$, where x and y are the normalized original signal and its normalized derivative, respectively, and $c(D_x, D_y,t)$ is their amplitude density in the time window 45 ms. The slices are taken approximately through the middles of the phonemes. Panel III: Time slices of the cumulative distribution $c(D_x, D_y,t)$, where x and y are the normalized original signal and its normalized derivative, respectively, and $c(D_x, D_y,t)$ is their distribution in the time window 45 ms. The slices are taken approximately through the middles of the phonemes. Panel IV: The value of the estimator of a type of Eq. (94), where the reference distribution is taken as the average distribution computed in the neighborhood of the phonemes "a".

Figure 35:
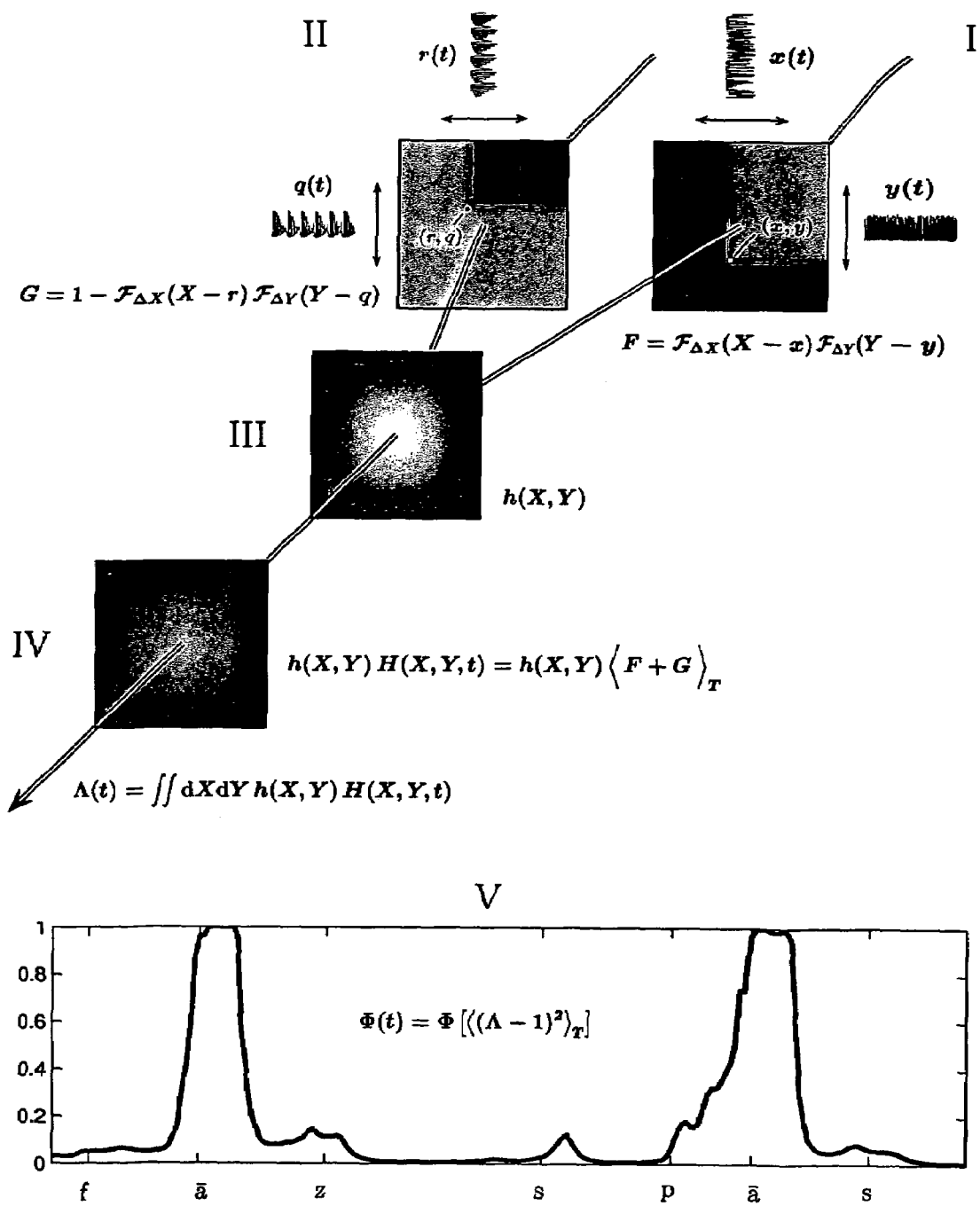

FIG. 35. Outline of an optical speech recognition device.

Figure 36:
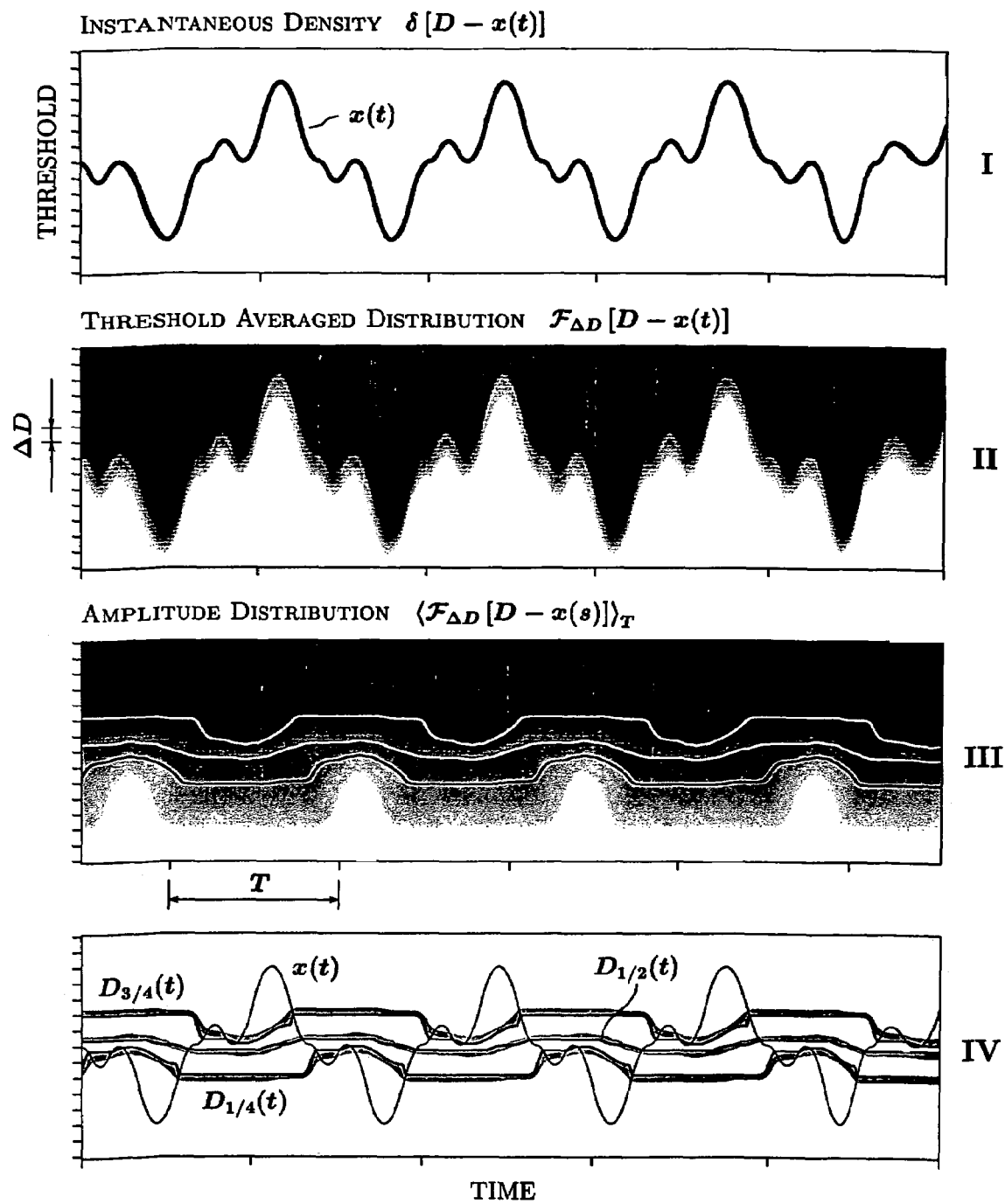

FIG. 36. Illustration of the relationship between the outputs of a rank filter and the level lines of the amplitude distribution of a scalar signal. Panel I shows the input signal x(t) on the time-threshold plane. This signal can be viewed as represented by its instantaneous density a $\delta[D-x(t)]$. Threshold integration by the discriminator $F_{AD}(D)$ transforms this instantaneous density into the threshold averaged distribution $F_{AD}[D-x(t)]$ (Panel II). This distribution is further averaged with respect to time, and the resulting distribution $B(D,t)=\langle F_{AD}[D-x(s)]\rangle_T$ is shown in Panel III. The quartile level lines are computed as the outputs of the rank filter given by Eq. (105), and are plotted in the same panel. Panel IV shows the input signal x(t), the level lines of the amplitude distribution for q=¼, ½, and ¾ (gray lines), and the outputs of a digital rank order filter (black lines).

Figure 37:
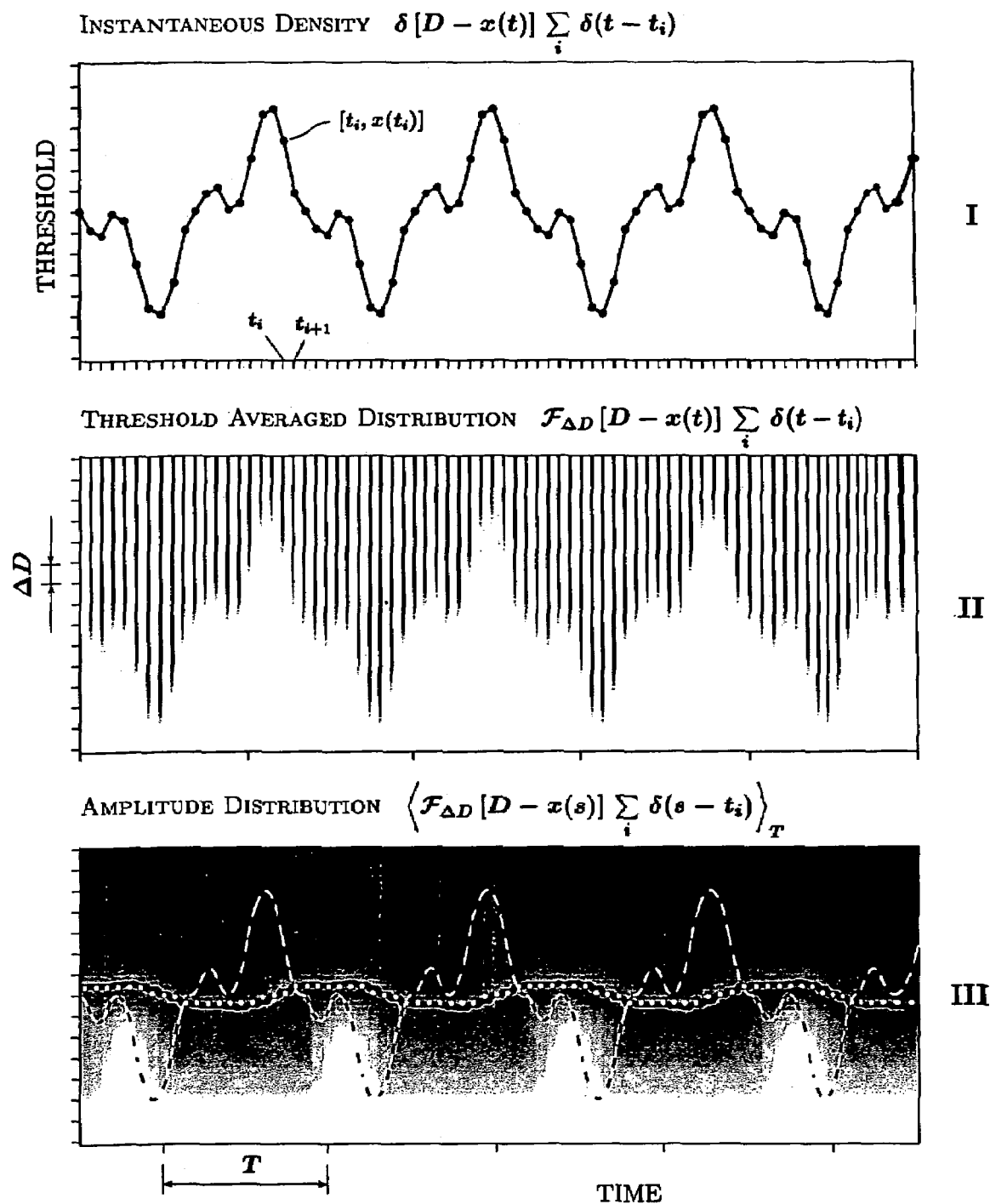

FIG. 37. Example of FIG. 36, repeated for the respective analog and digital median filters for the discrete input signals. The instantaneous density of a discrete signal can be represented by $\delta[D-x(t)]\Sigma_i\delta(t-t_i)$, as shown in Panel I. Panel II shows the threshold averaged distribution $FD_{AD}[D-x(t)]\Sigma_i\delta(t-t_i)$, and Panel III of the figure compares the level line $B(D,t)=\langle F_{AD}[D-x(s)]\Sigma_i\delta(s-t_i)\rangle_T=½$ (solid black line) with the respective output of a digital median filter (white dots).

Figure 38:
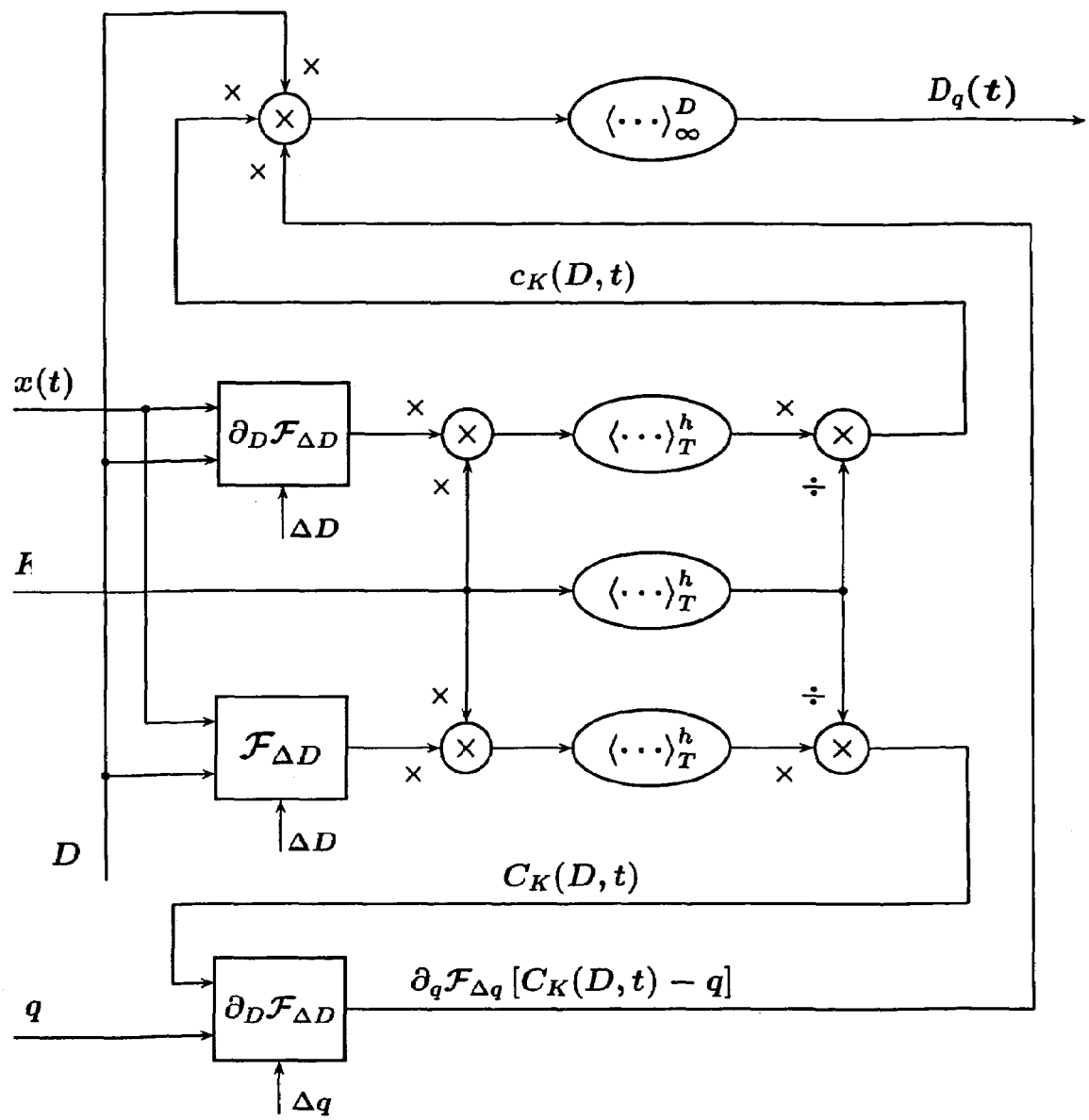

FIG. 38. Simplified schematic of a device for analog rank filtering.

Figure 39:
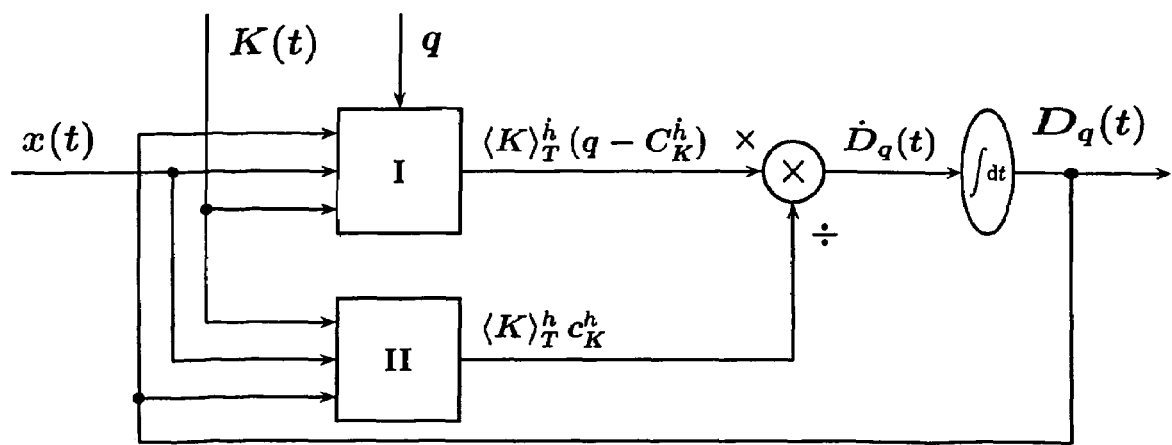

FIG. 39. Simplified schematic of a device for analog rank filtering. Module I of the device outputs the signal $\langle K\rangle_T^h[q-C_K^h(D_q,t)]$, and Module II estimates $\langle K\rangle_T^h c_K^h(D_{q,t})$. The outputs of Modules I and II are divided to form $D_q(t)$, which is integrated to produce the output of the filter $D_q(t)$.

Figure 40:
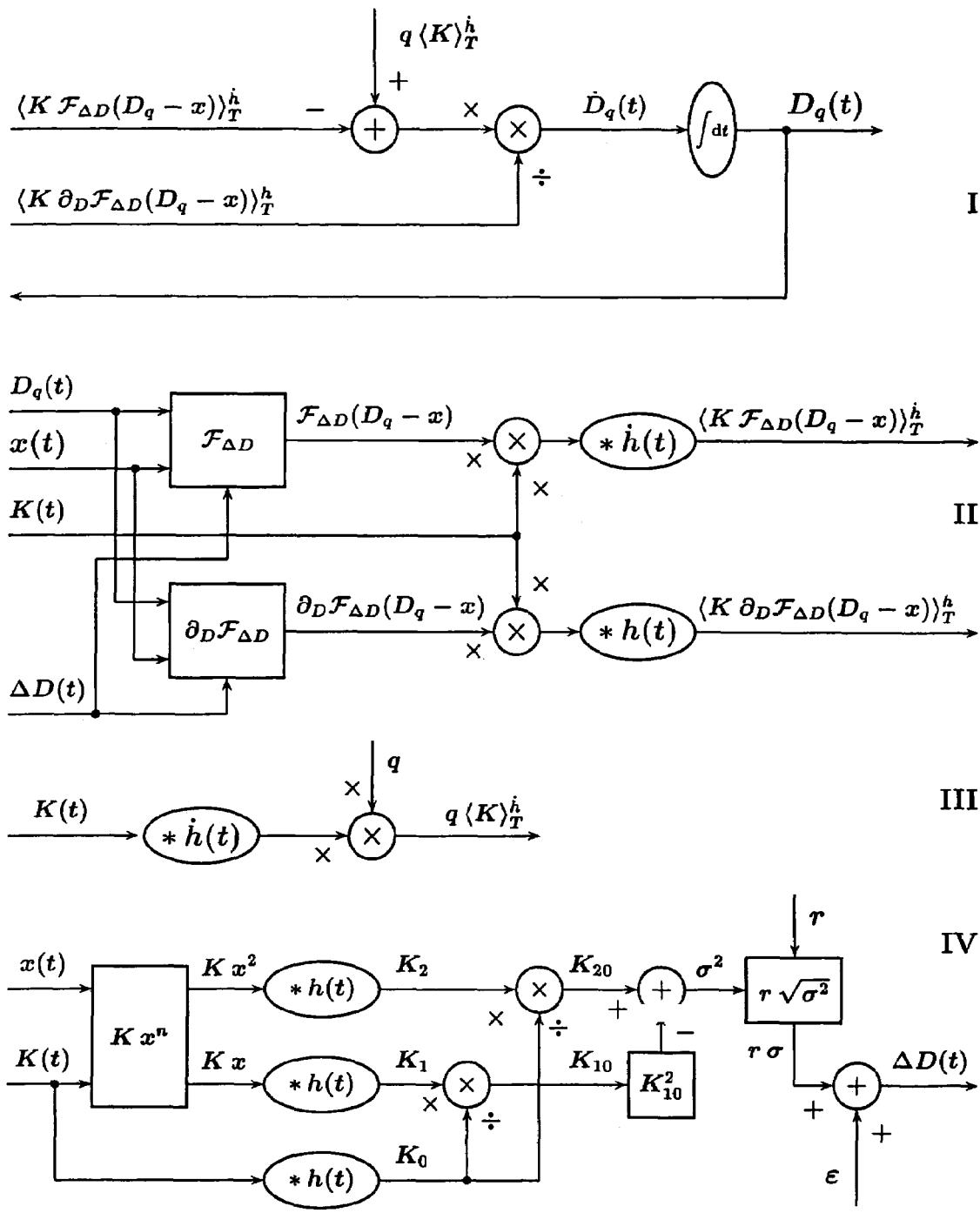

FIG. 40. Simplified schematic of the implementation of Eq. (113) in an analog device with the adaptation according to Eq. (111). Module I takes the outputs of Modules II and III as inputs. The output of Module I is also a feedback input of Module II. Module IV outputs $\Delta D(t)$, which is used as one of the inputs of Module II (the width parameter of the discriminator and the probe) for adaptation.

Figure 41:
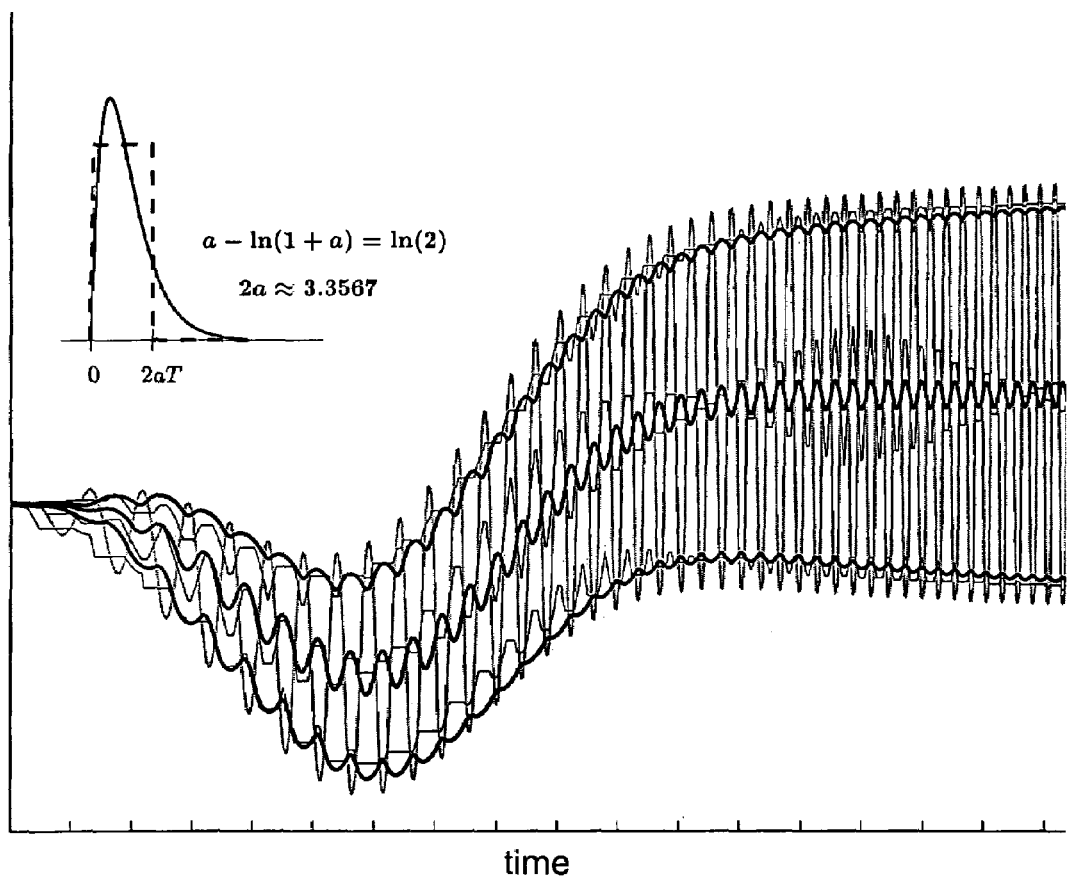

FIG. 41. Comparison of the quartile outputs (for q=0.25, 0.5, and 0.75 quantiles) of the Cauchy test function $RC_{11}$ AARF for signal amplitudes with the corresponding conventional square window digital order statistic filter. The outputs of the AARF are shown by the thick black solid lines, and the respective outputs of the square window order statistic filter are shown by the thin black lines. The time constant of the impulse response of the analog filter is T, and the corresponding width of the rectangular window is 2aT, where a is the solution of the equation a-ln(1+a)=ln(2). The incoming signal is shown by the gray line, and the distance between the time ticks is equal to 2aT.

Figure 42:
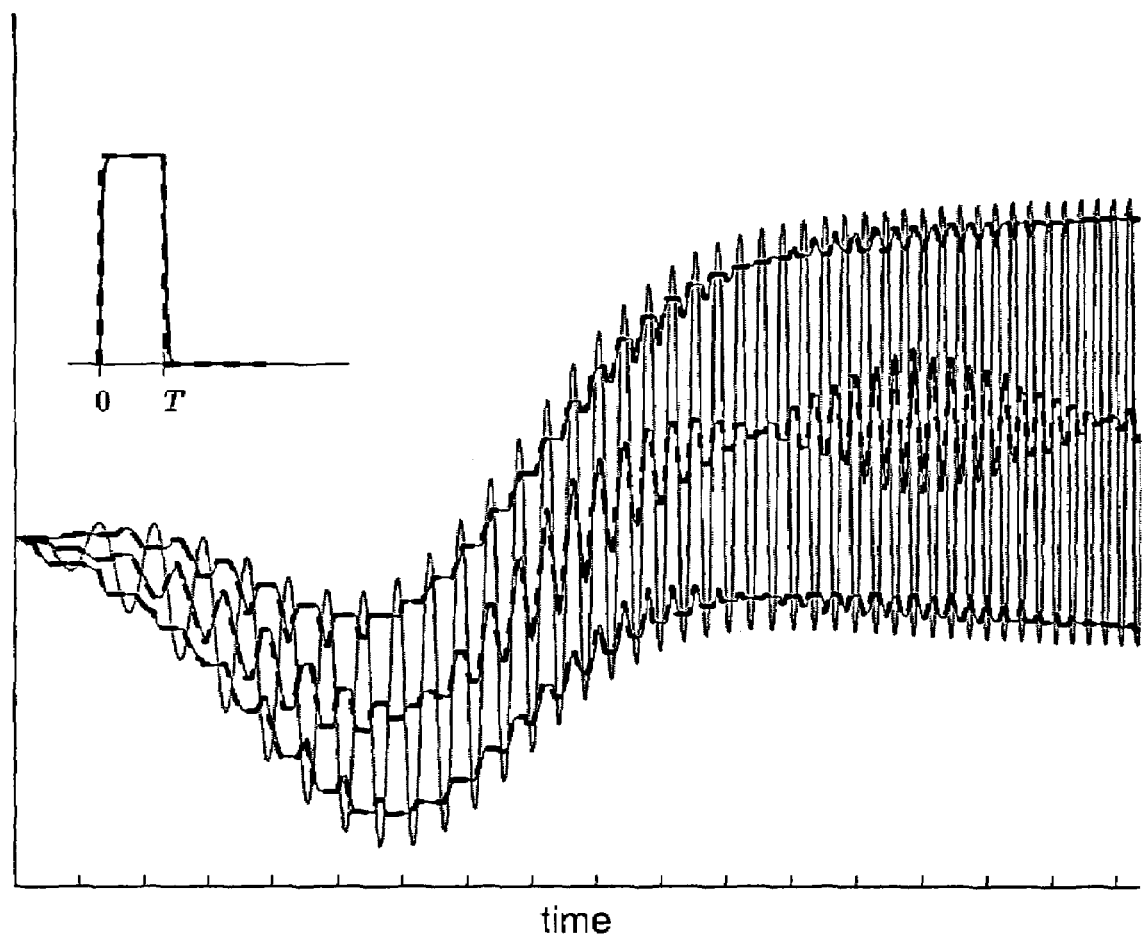

FIG. 42. Comparison of the quartile outputs (for q=0.25, 0.5, and 0.75 quantiles) of the Cauchy test function square window AARF for signal amplitudes with the corresponding conventional square window digital order statistic filter. The outputs of the AARF are shown by the black solid lines, and the respective outputs of the square window order statistic filter are shown by the dashed lines. The widths of the time windows are T in all cases. The incoming signal is shown by the gray line, and the distance between the time ticks is equal to T.

Figure 43:
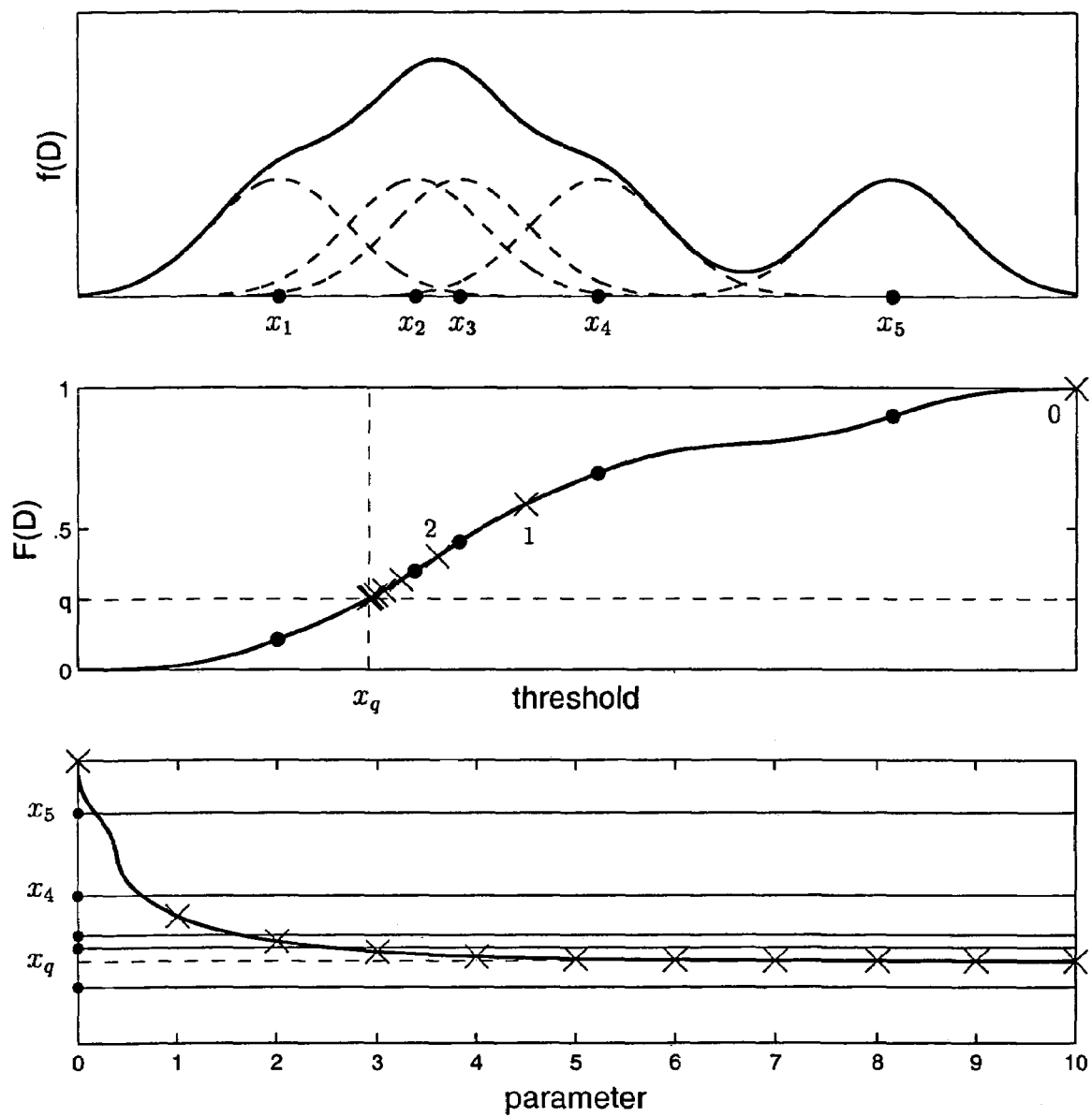

FIG. 43. Finding a rank of a discrete set of numbers according to Eq. (124). Five numbers $x_i$ are indicated by the dots on the X-axis of the top panel. The solid line shows the density resulting from the spatial averaging with a Gaussian test function, and the dashed lines indicate the contributions into this density by the individual numbers. The solid line in the middle panel plots the cumulative distribution. The crosses indicate $x_q(\alpha)$ and $F_D[x_q(\alpha)]$ at the successive integer values of the parameter $\alpha$. The bottom panel plots the evolution of the value of $X_q(\alpha)$ in relation to the values of $x_i$.

FIG. 44. Analog rank selection for an ensemble of variables. In Panel I, the solid line shows the 3rd octile of a set of four variables ($x_1(t)$ through $X_4(t)$, dashed lines), computed according to Eq. (129). In Panel II, the solid line shows the median (q=½ in Eq. (129)) of the ensemble. The thick dashed line plots the median digitally computed at each sampling time. The time constant of the analog rank selector is ten times the sampling interval.

Figure 45:
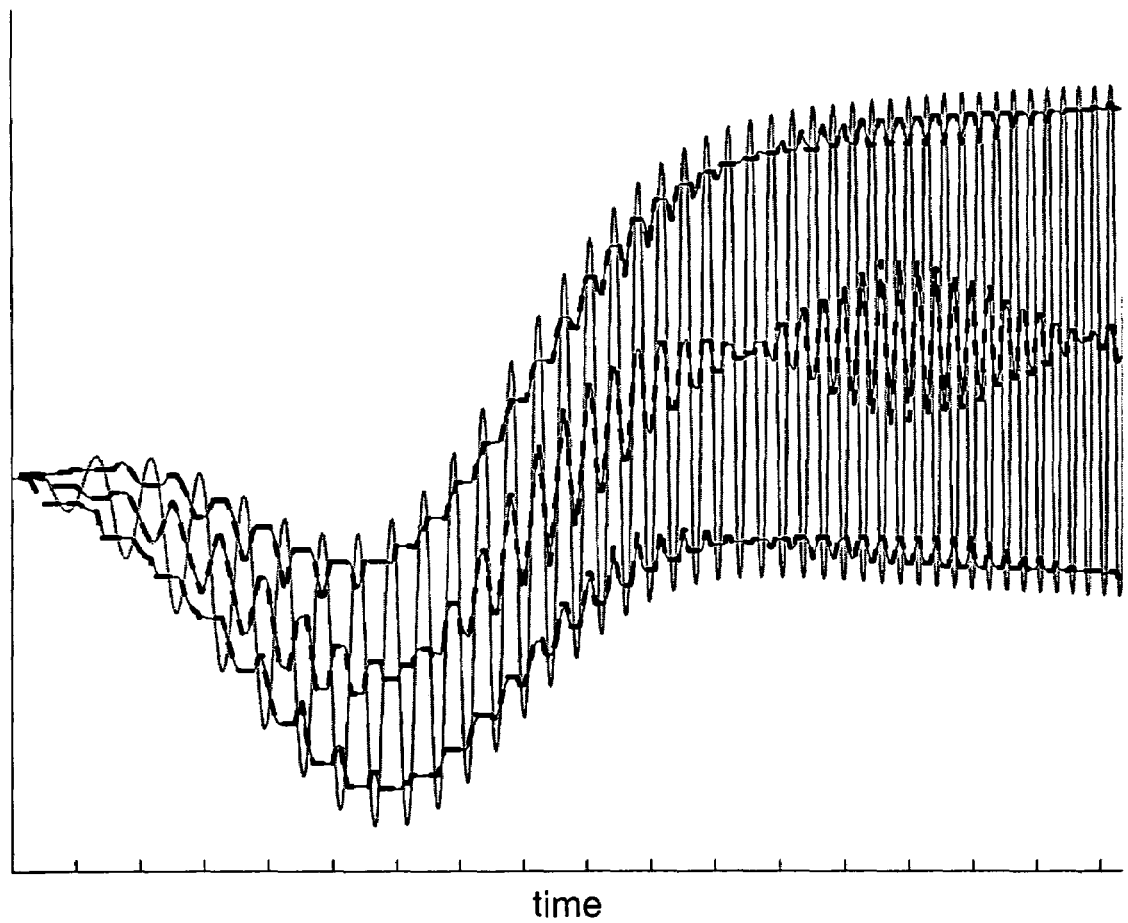

FIG. 45. Comparison of the quartile outputs (for q=0.25, 0.5, and 0.75 quantiles) of a square window digital order statistic filter (dashed lines) with its emulation be the Cauchy test function ARS (solid black lines). The incoming signal is shown by the gray line, and the distance between the time ticks is equal to the width of the time window T.

Figure 46:
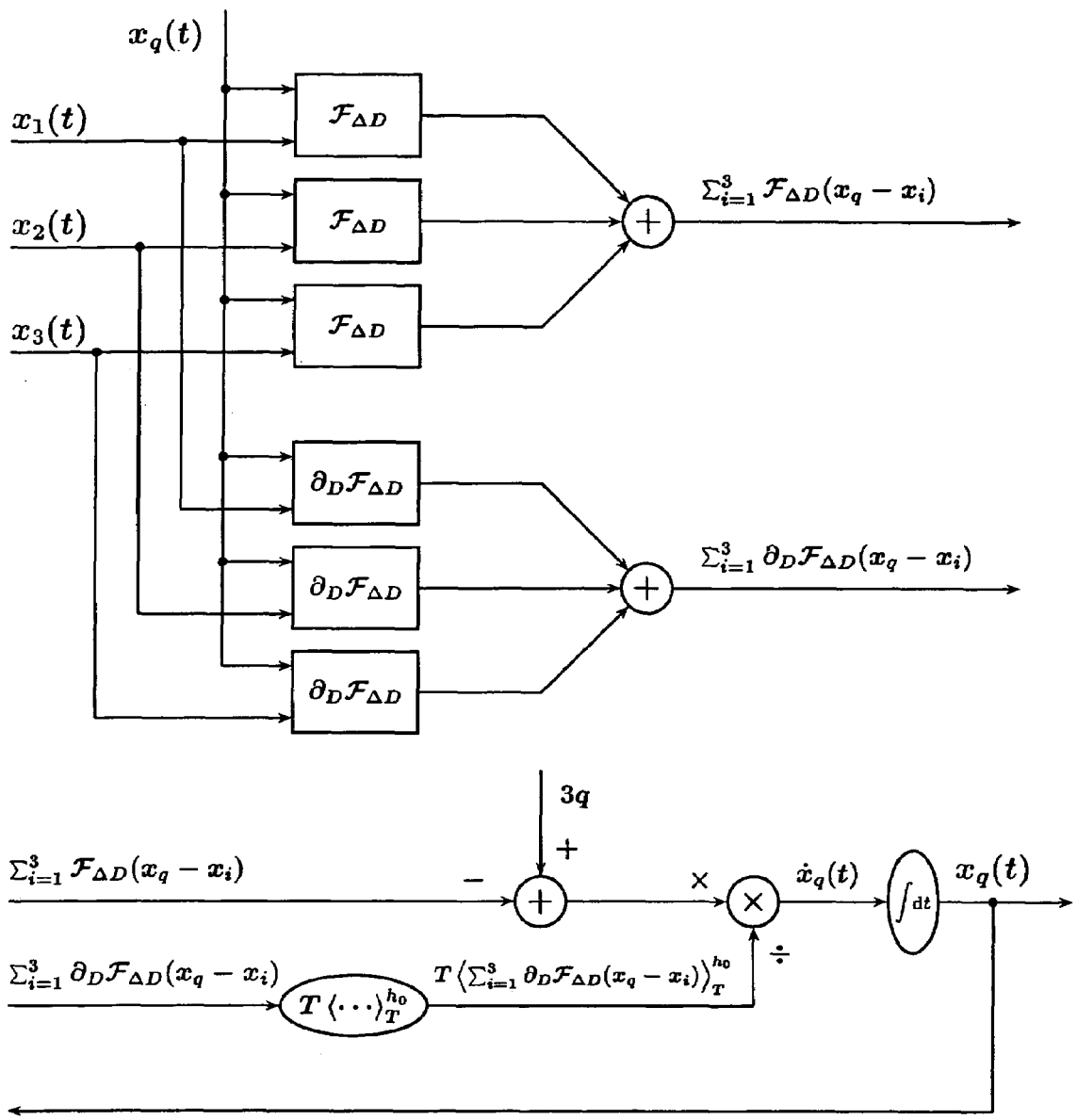

FIG. 46. Simplified schematic of a device (according to Eq. (129)) for analog rank selector for three input variables.

Figure 47:
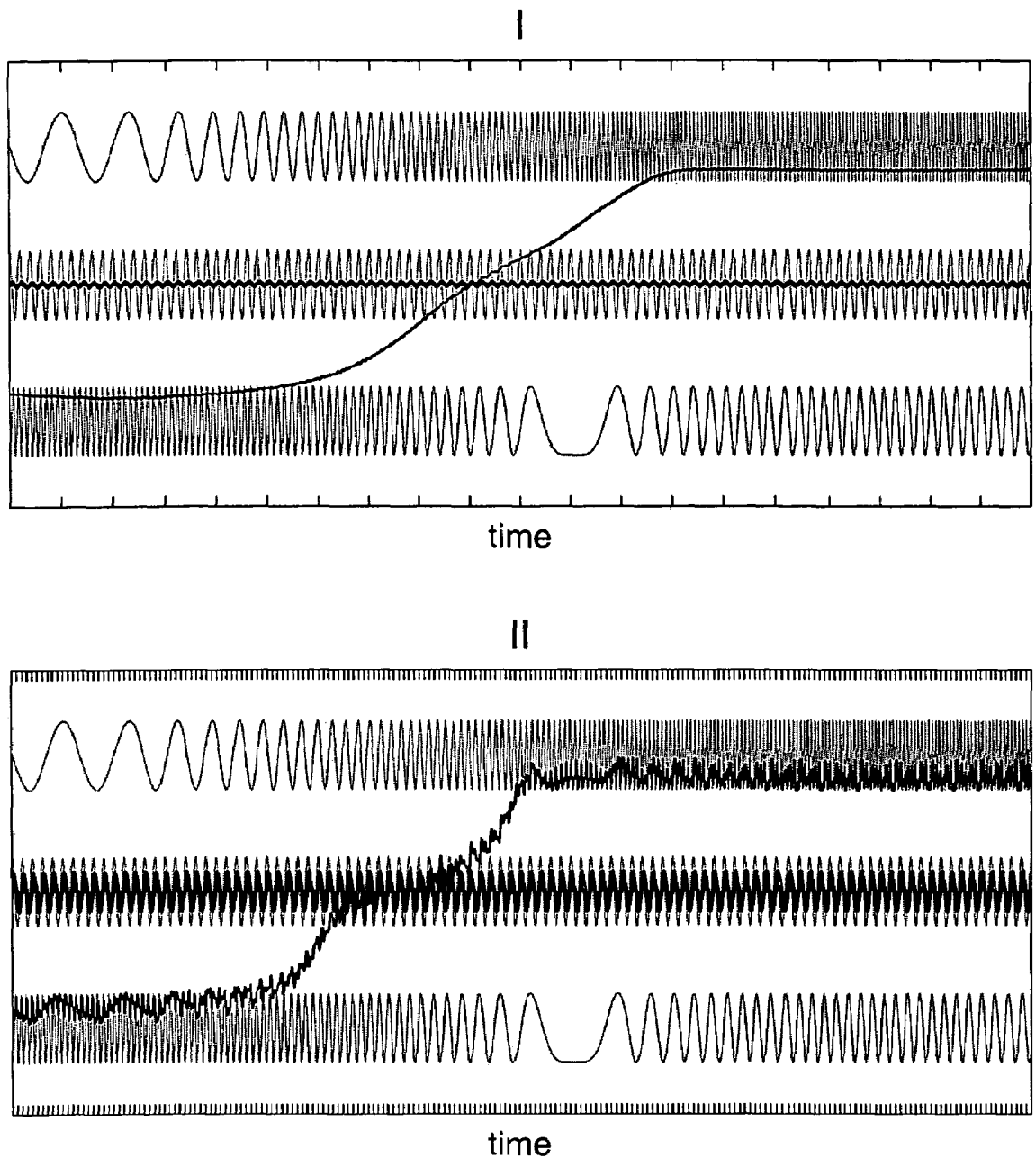

FIG. 47. Example of performance of AARFs for ensembles of variables. This figure also illustrates the fact that counting densities do not only reveal different features of the signal than do the amplitude densities, but also respond to different changes in the signal. The figure shows the outputs of median AARFs for an ensemble of three variables. The input variables are shown by the gray lines. The thicker black lines in Panels I and II show the outputs of the median AARFs for amplitudes, and the thinner black lines in both panels show the outputs of the median AARFs for counting densities. All AARFs employ Cauchy test function and $RC_{10}$ time averaging. The distance between the time ticks in both panels is equal to the time constant of the time filters.

FIG. 48. Diagram illustrating transformation of a scalar field into a modulated threshold density.

Figure 49:
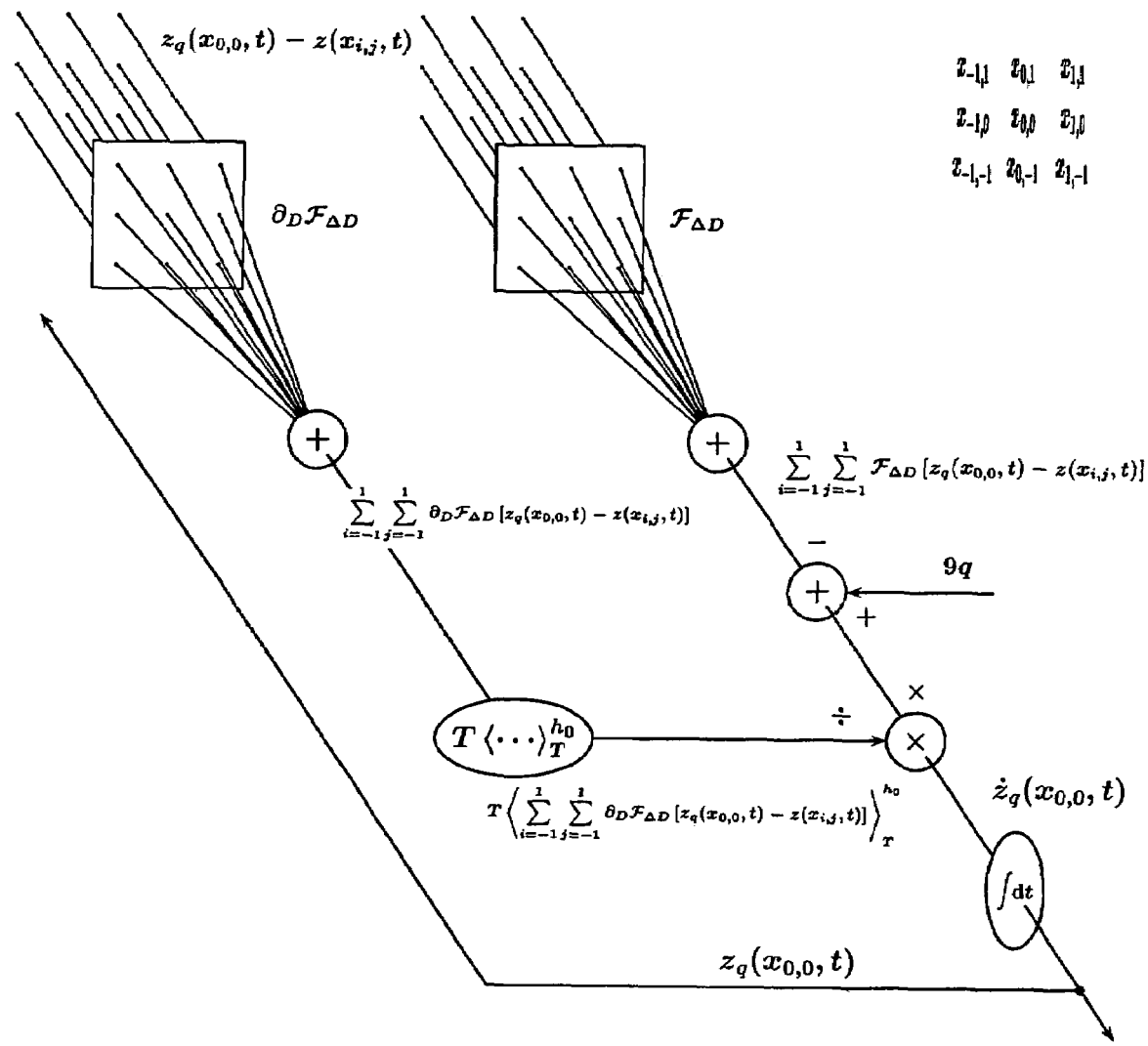

FIG. 49. Simplified schematic of a device (according to Eq. (133)) for analog rank filter of a discrete monochrome surface with 3×3 spatial averaging.

FIG. 50. Filtering out static impulse noise from an image according to the algorithm of Eq. (137). Panel 1: The original image Z. Panel 2: The image corrupted by a random unipolar impulse noise of high magnitude. About 50% of the image is affected. Panel 3a: The initial condition for the filtered image is a plane of constant magnitude. Panels 3b through 3g: The snapshots of the filtered image Q (the first decile of the corrupted one, q=¹⁄₁₀) at steps n.

FIG. 51. Filtering out time-varying impulse noise according to the algorithm of Eq. (137). Panels 1a through 1c: Three consecutive frames of an image corrupted by a random (bipolar) impulse noise of high magnitude. About 40% of the image is affected. Panels 2a through 2c: The image filtered through a smoothing filter. $(Z)_{i,j}=\Sigma_{m,n} w_{mn} Z_{i-m,j-n}$. Panels 3a through 3c: The rank filtered image Q (the median, q=½). The smoothing filter in Eq. (137) is the same used in Panels 2a through 2c.

FIG. 52. Diagram illustrating transformation of a vector field into a modulated threshold density.

Figure 53:
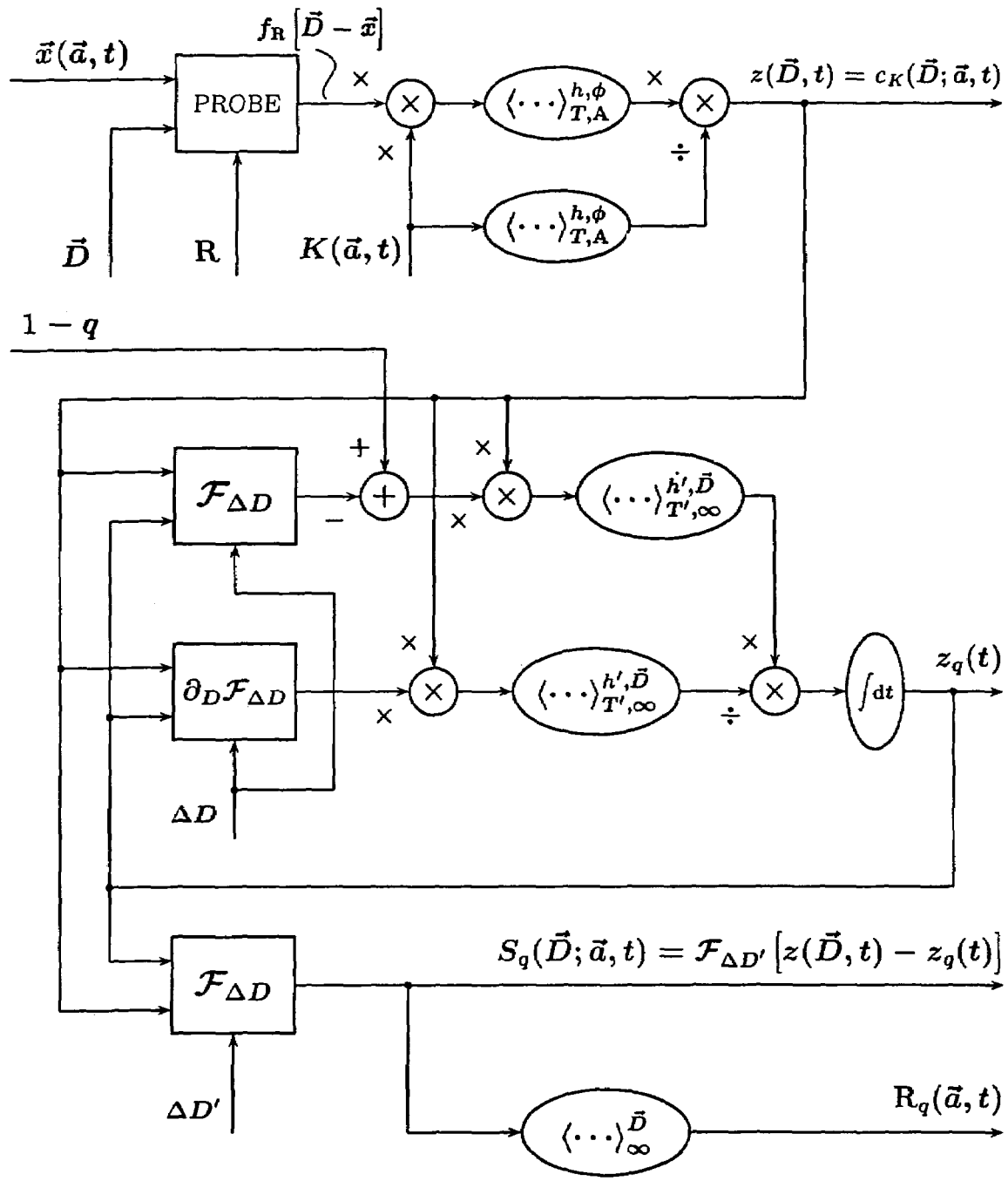

FIG. 53. Diagram of a process for the transformation of the incoming vector field x(a,t) into a modulated threshold density $c_K(D;a,t)$, and the subsequent evaluation of the quantile density $z_q(t)$, quantile domain factor $S_q(D;a,t)$, and the quantile volume $R_q(a,t)$ of this density.

Figure 54A:
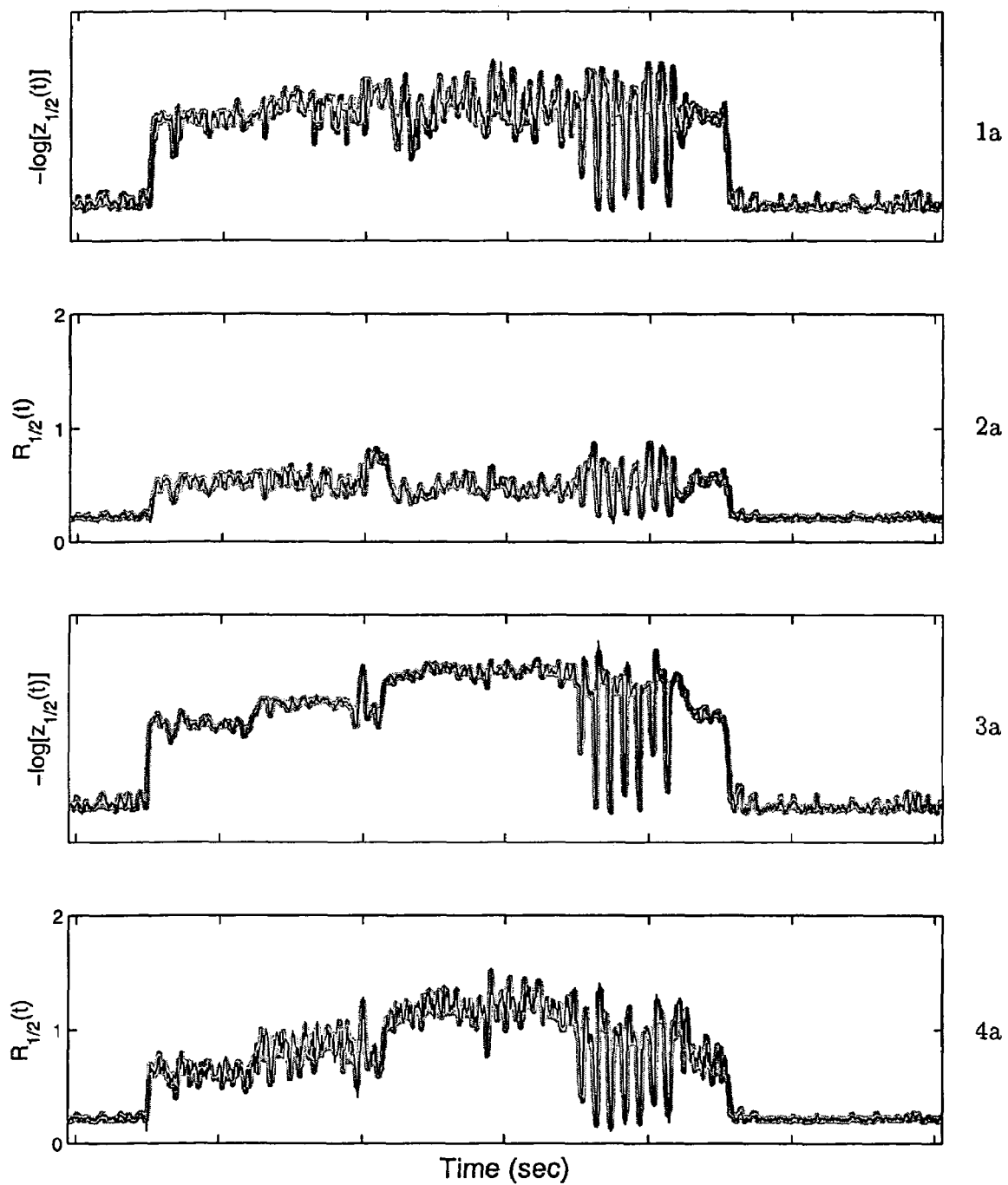
Figure 54:
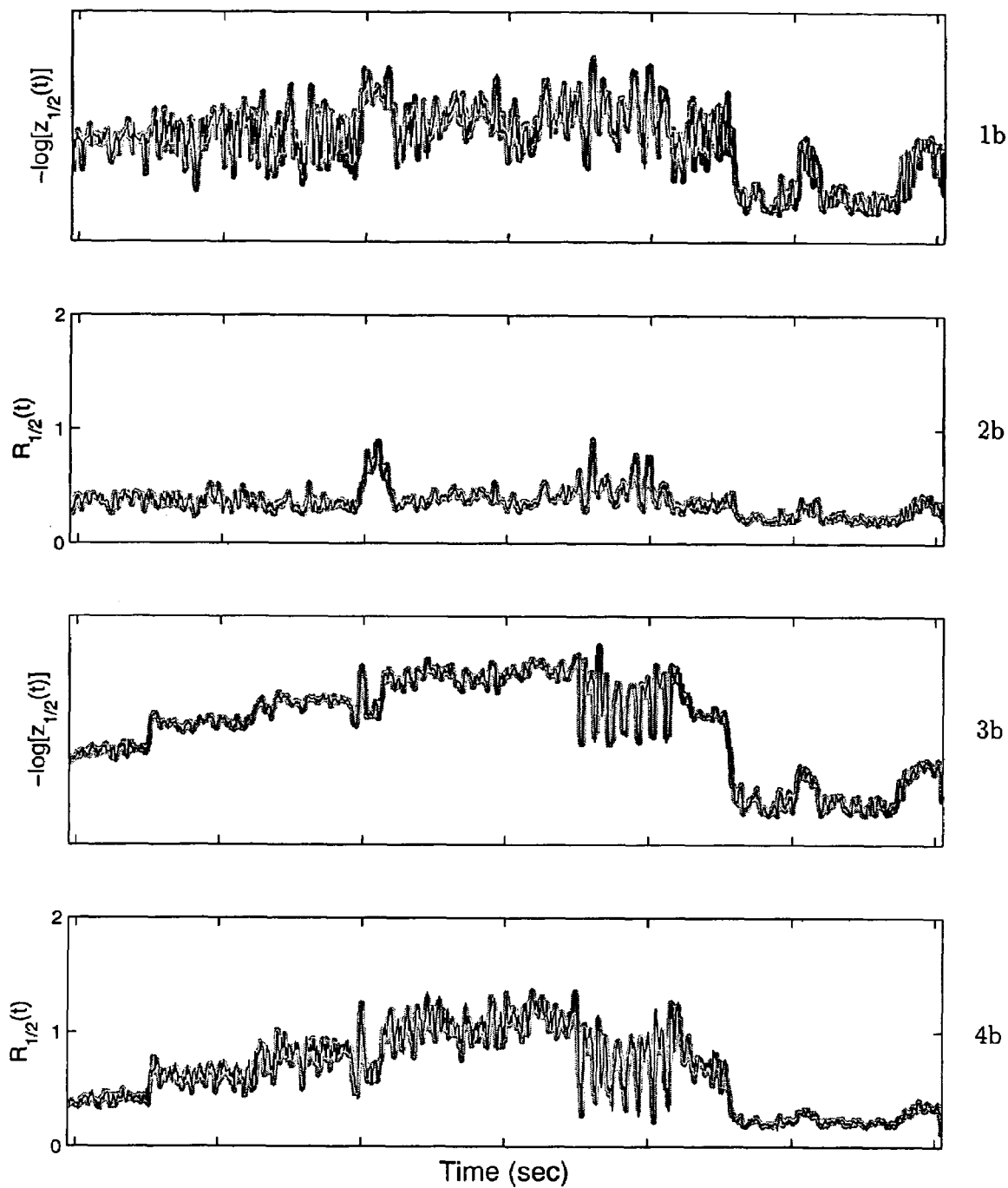

FIG. 54a. Comparison of the median densities and volumes computed directly from the definitions (Eqs. (24) and (25), gray lines) with those computed through Eqs. (143) and (145) (black lines). Panels 1a and 2a relate to the amplitude densities, and Panels 3a and 4a relate to the counting densities.

FIG. 54b. Comparison of the median densities and volumes computed directly from the definitions (Eqs. (24) and (25), gray lines) with those computed through Eqs. (143) and (145) (black lines). Panels 1b and 2b relate to the amplitude densities, and Panels 3b and 4b relate to the counting densities.

Figure 55:
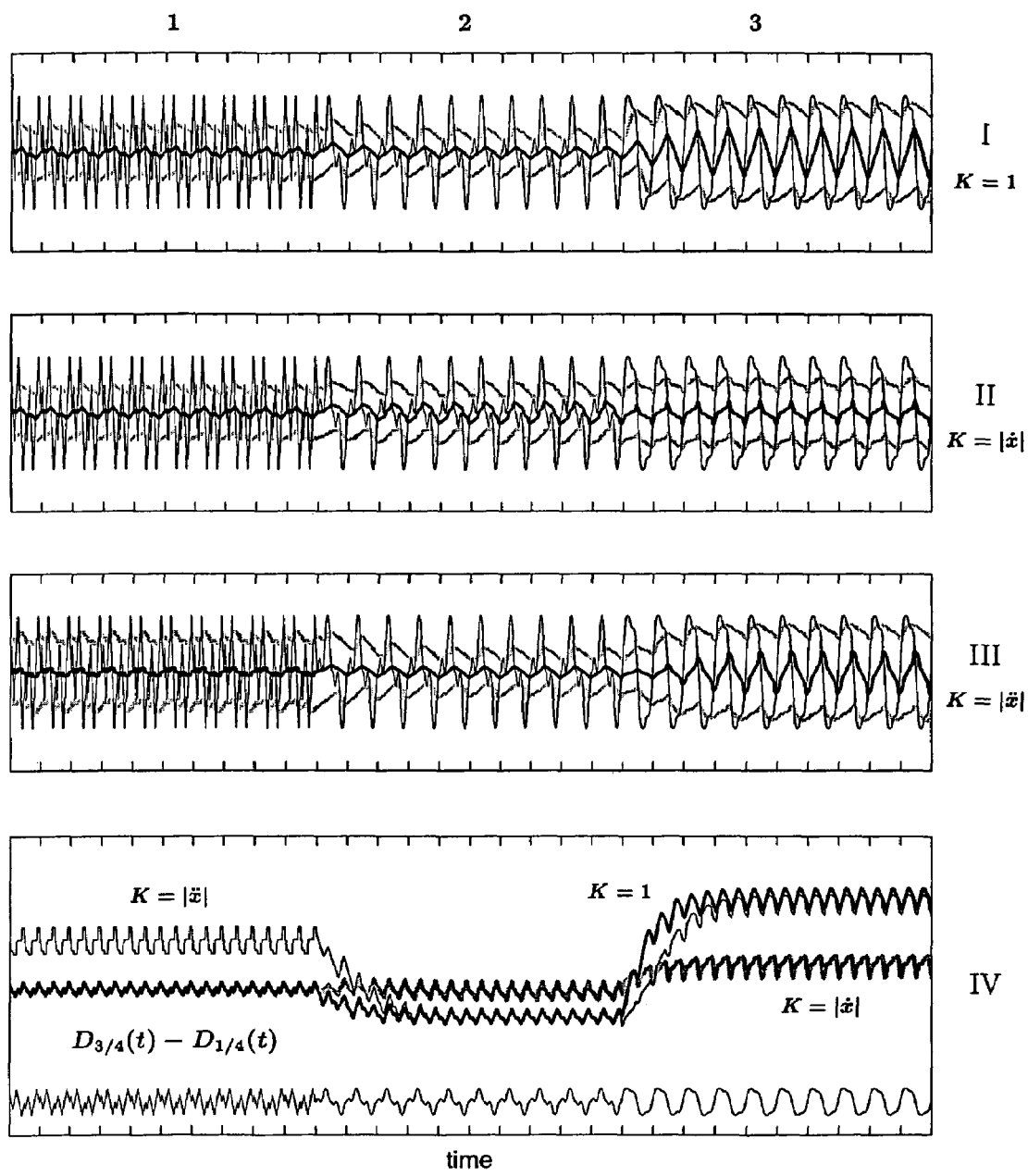

FIG. 55. Quartile outputs (for q=¼ through ¾ quantiles) of the $RC_{10}$ Cauchy test function AARFs for the signal amplitudes (Panel I), threshold crossing rates (Panel II), and threshold crossing accelerations (Panel III). The signal consists of three different stretches, 1 through 3, corresponding to the signals shown in FIG. 9. In Panels I through III, the signal is shown by the thin black solid lines, the medians are shown by the thick black solid lines, and other quartiles are shown by the gray lines. Panel IV plots the differences between the third and the first quartiles of the outputs of the filters. The incoming signal (¹⁄₁₀ of the amplitude) is shown at the bottom of this panel. The distance between the time ticks is equal to the time constant of the filters T.

Figure 56:
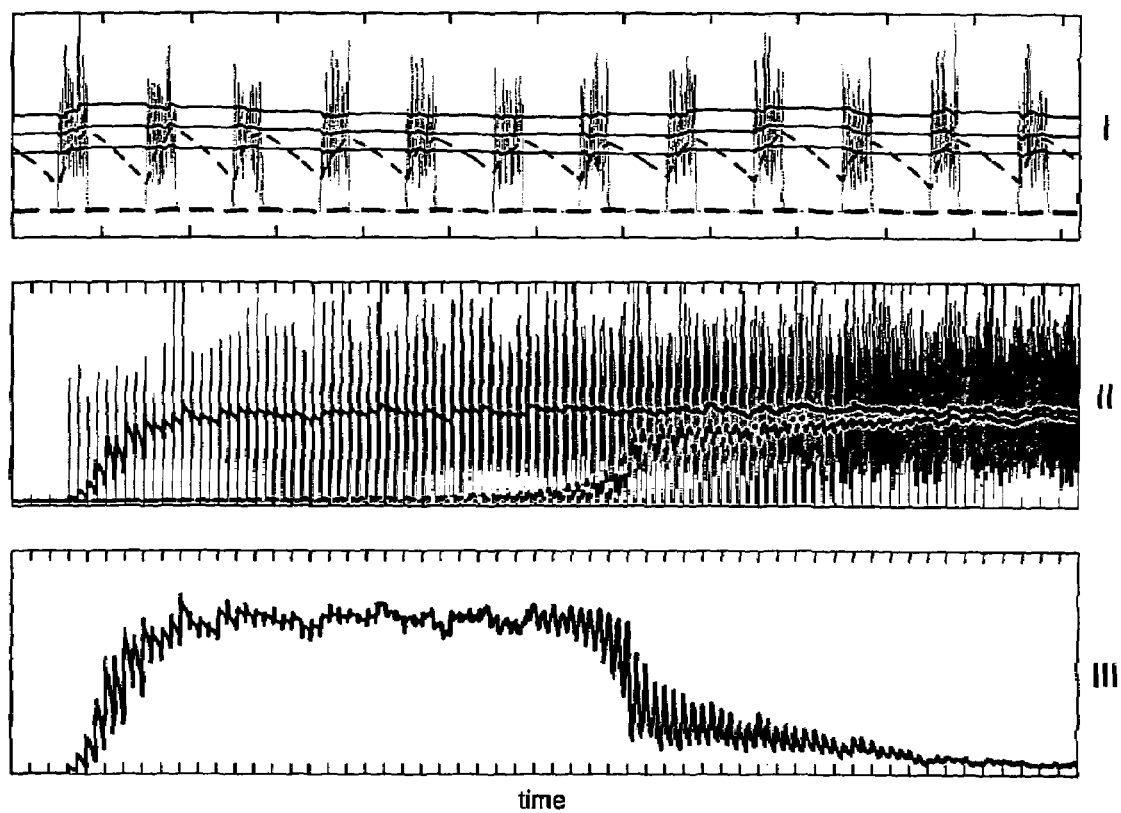

FIG. 56. Detection of intermittency. Panel I illustrates that outputs of AARFs for signal amplitudes and threshold crossing rates for a signal with intermittency can be substantially different. The quartile outputs (for q=0.25, 0.5, and 0.75 quantiles) of an AARF for signal threshold crossing rates are shown by the solid black lines, and the respective outputs of an AARF for signal amplitudes by dashed lines. Panel II shows the median outputs of AARFs for threshold crossing rates (black solid lines) and amplitudes (dashed lines), and Panel III plots the difference between these outputs. In Panels I and II, the input signal is shown by gray lines.

Figure 57:
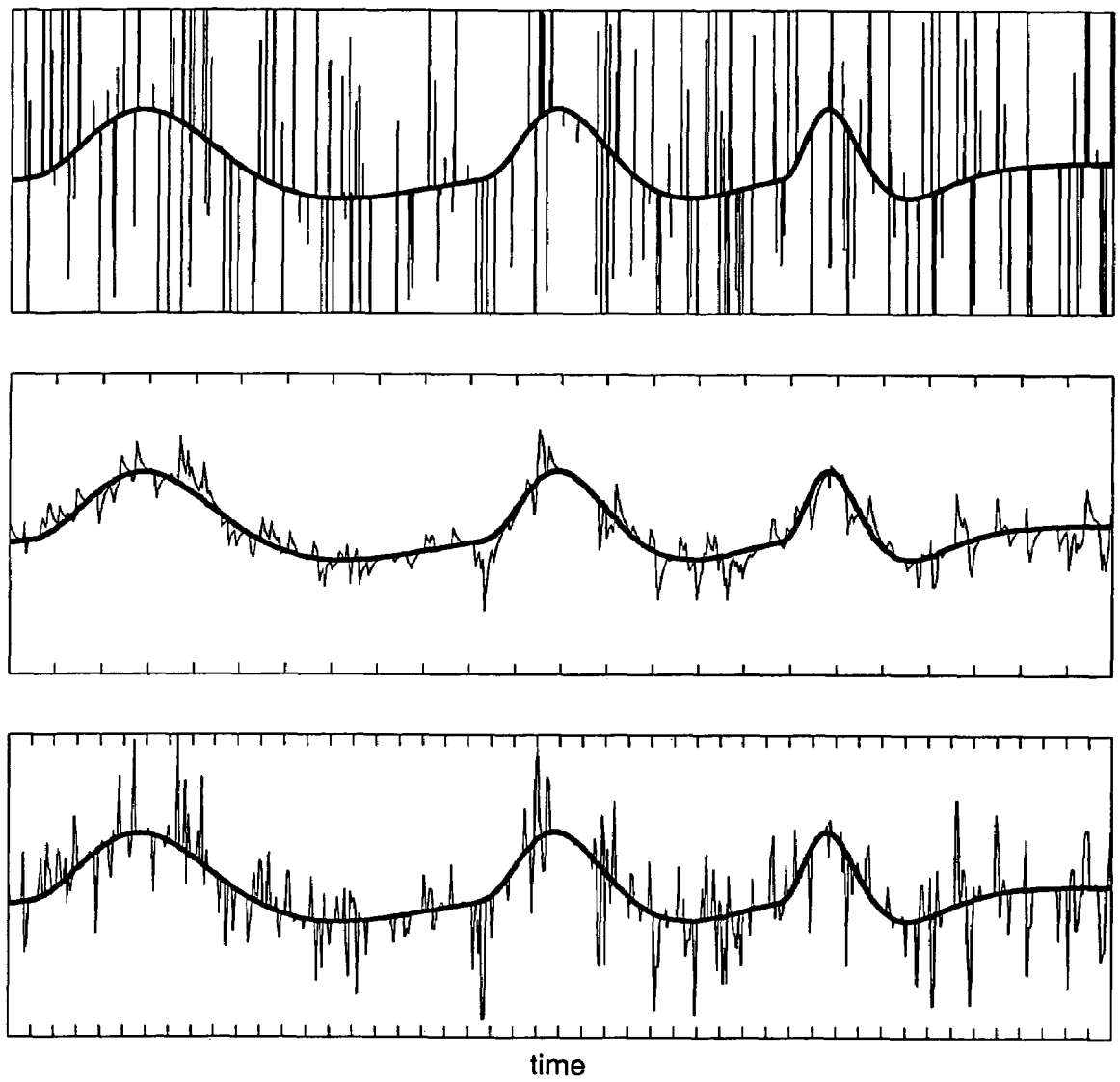

FIG. 57. Insensitivity of median amplitude AARFs and ARSs to outliers. The original uncorrupted signal is shown by the thick black line in the upper panel, and the signal+noise total by a thinner line. In the middle panel, the noisy signal is filtered through an $RC_{10}$ Cauchy test function median AARF (thick line), and an averaging $RC_{10}$ filter with the same time constant (thinner line). The distance between the time ticks is equal to 10T, where T is the time constant of the filters. In the lower panel, the signal is filtered through an ARS emulator of a 5-point digital median filter (thick line), and a 5-point running mean filter (thinner line). The distance between the time ticks is equal to 50 sampling intervals.

Figure 58:
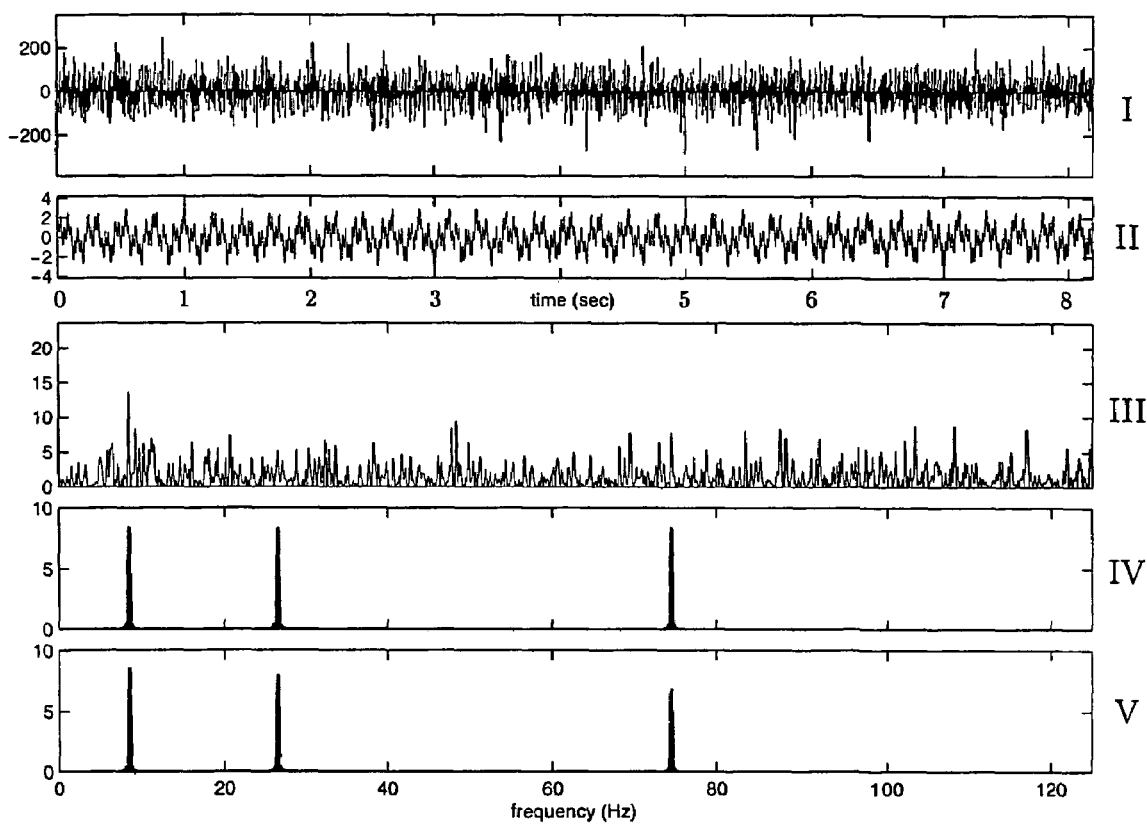

FIG. 58. Outlier noise (Panel I) is added to the signal shown in Panel II. The total power of the noise is more than 500 times larger than the power of the signal, but the noise affects only ≈25% of the data points. The periodogram of the signal+noise total is shown in Panel III, and the periodogram of the signal only is shown in Panel IV. The composite signal is filtered through an ARS emulator of a 10-point digital median filter, and the periodogram of the result is shown in Panel V.

Figure 59:
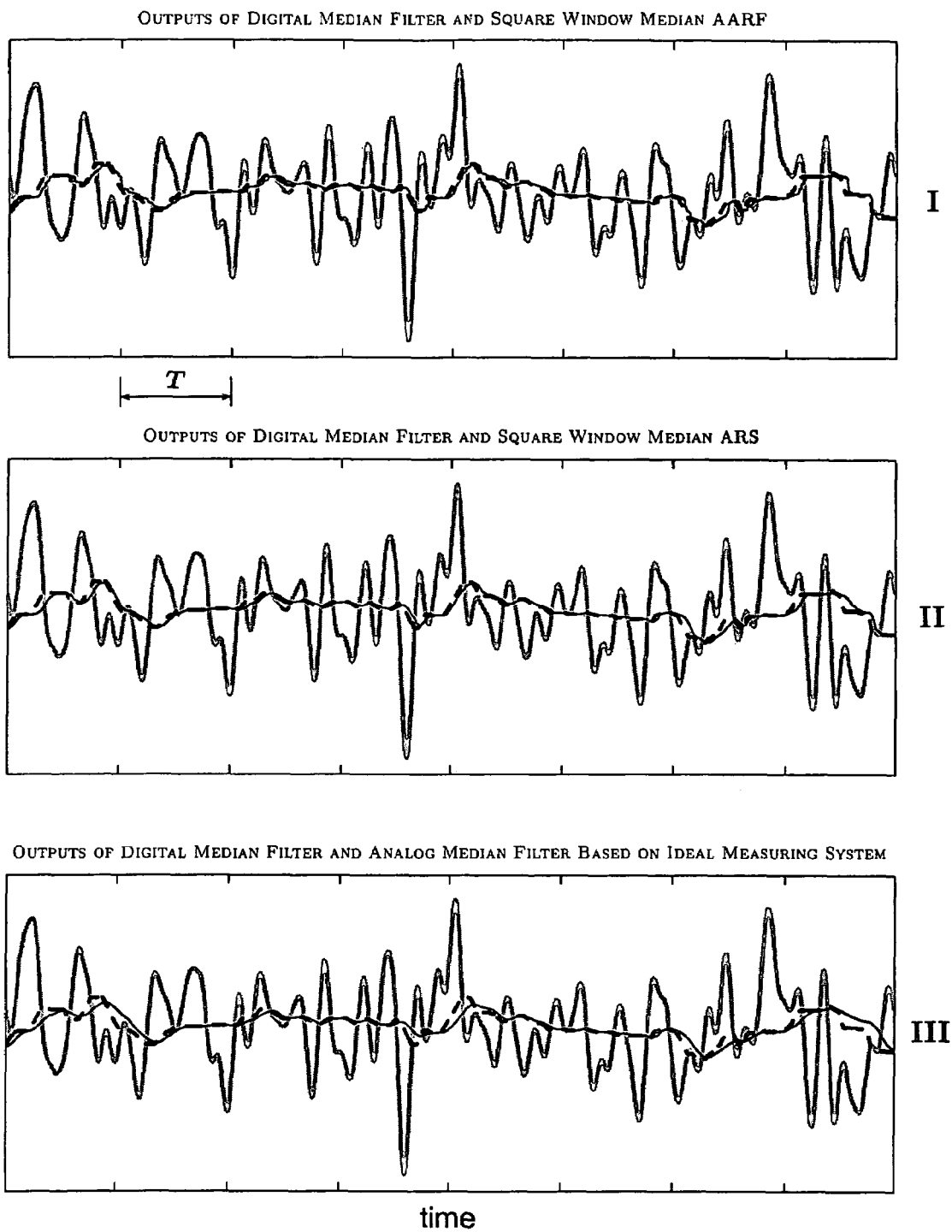

FIG. 59a. Comparison of the outputs of a digital median filter (dashed lines) with the respective outputs of an AARF, an ARS, and an ARFs based on an ideal measuring system (solid lines), for a signal (gray lines) with strong pileup effects.

FIG. 59b. Comparison of the outputs of a digital median filter (dashed lines) with the respective outputs of an AARF, an ARS, and an ARFs based on an ideal measuring system (solid lines), for an asymmetric square wave signal (gray lines).

Figure 60:
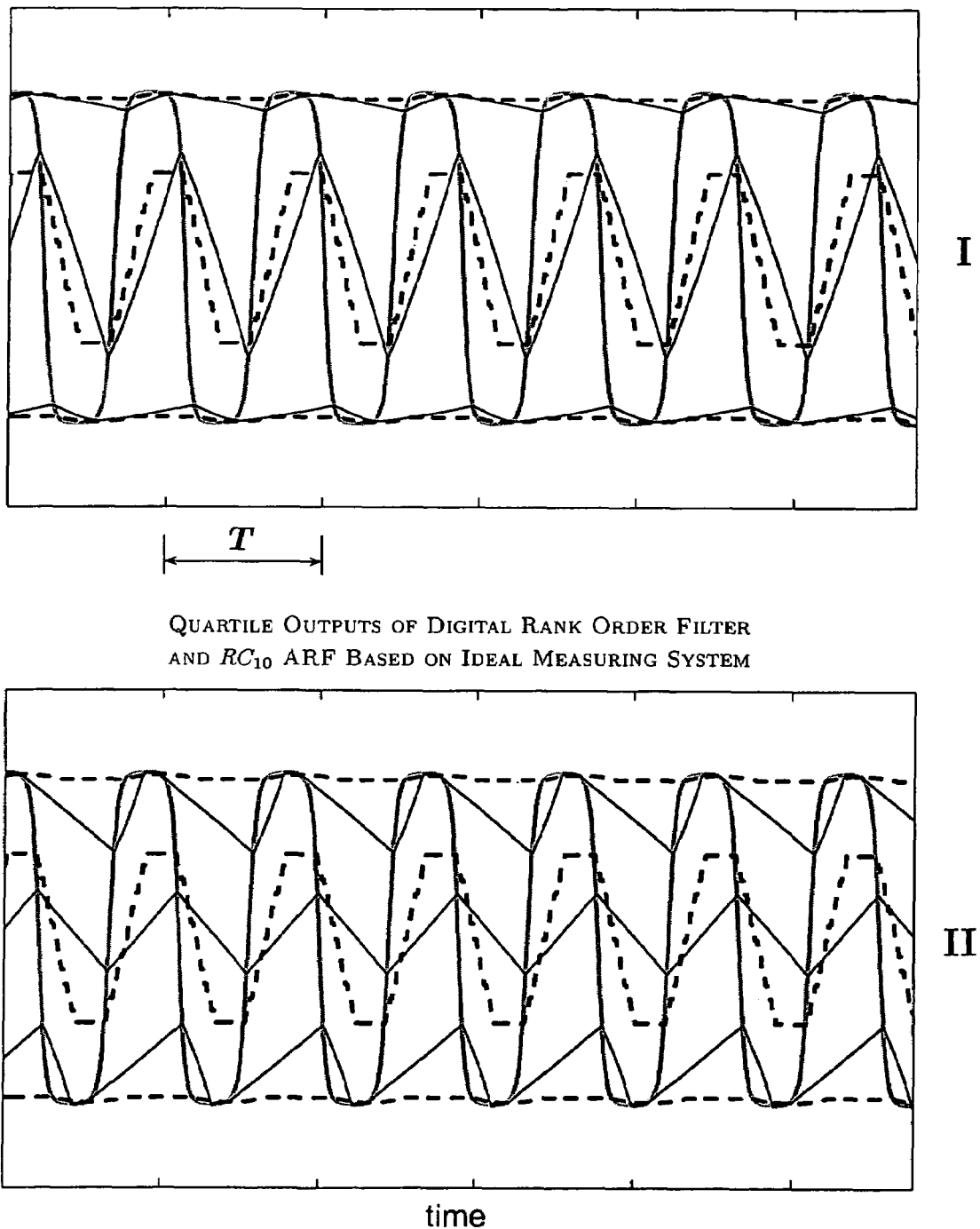

FIG. 60. Comparison of the quartile outputs of a digital square window rank filter (dashed lines in both panels) with the respective outputs of the $RC_{10}$ AARF (solid black lines in Panel I), and with the quartile outputs of the $RC_{10}$ ARF, based on an ideal measuring system (solid black lines in Panel II).

Figure 61:
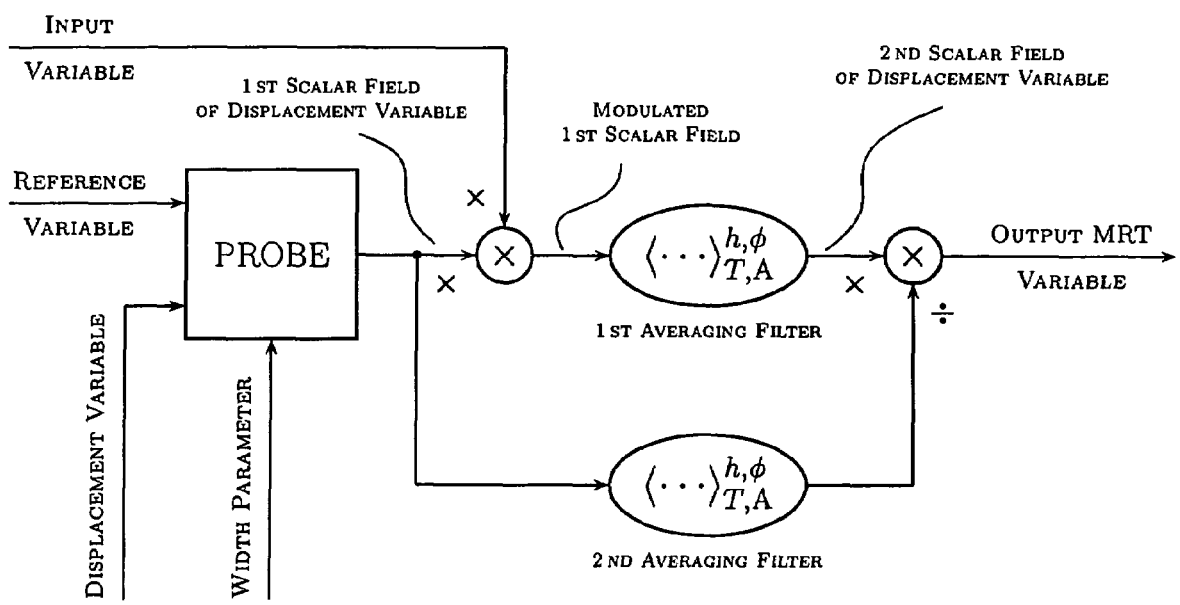

FIG. 61. Schematic of transforming an input variable into an output Mean at Reference Threshold variable.

Figure 62:
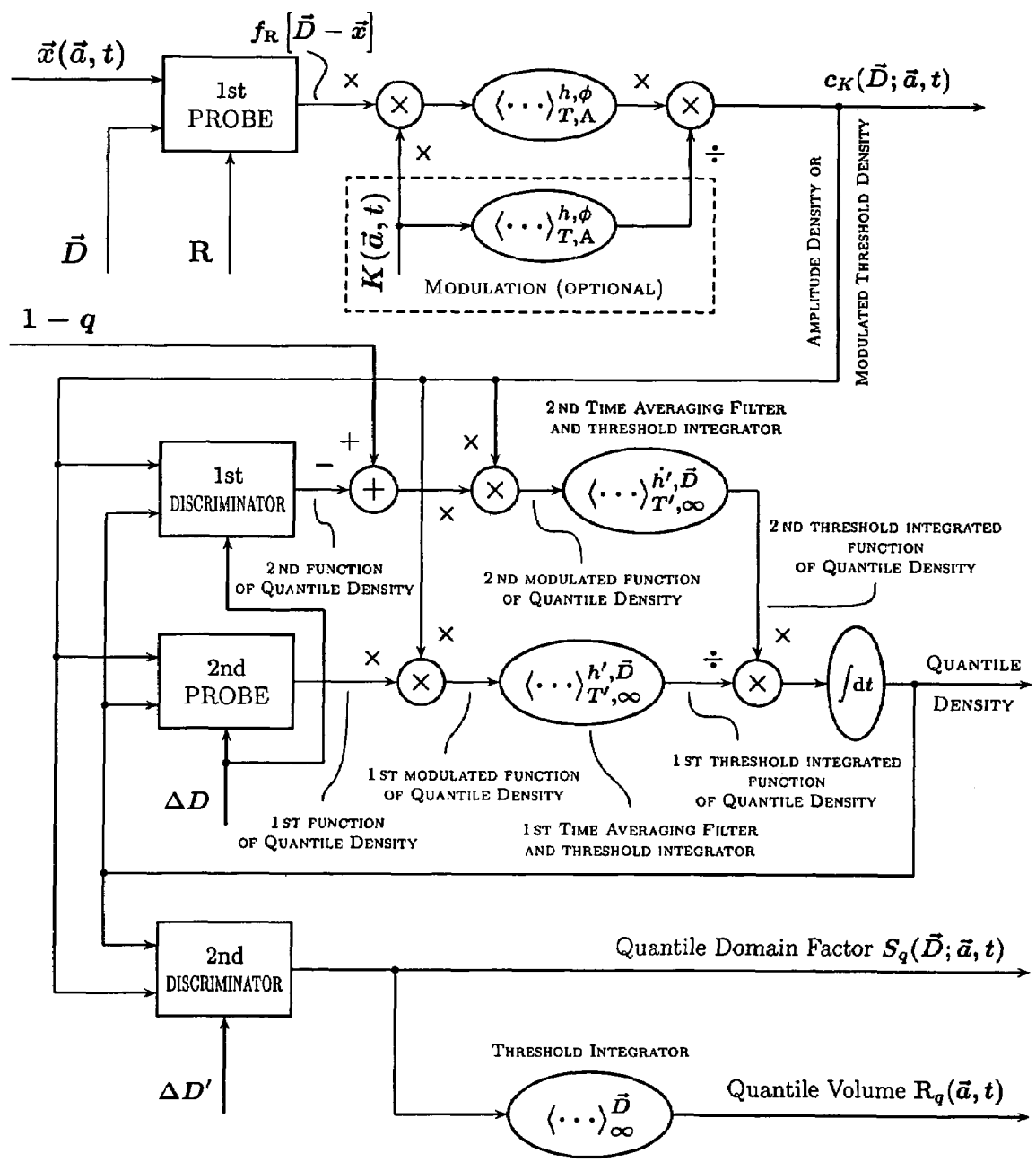

FIG. 62. Schematic of transforming an input variable into output Quantile Density, Quantile Domain Factor, and Quantile Volume variables.

Figure 63:
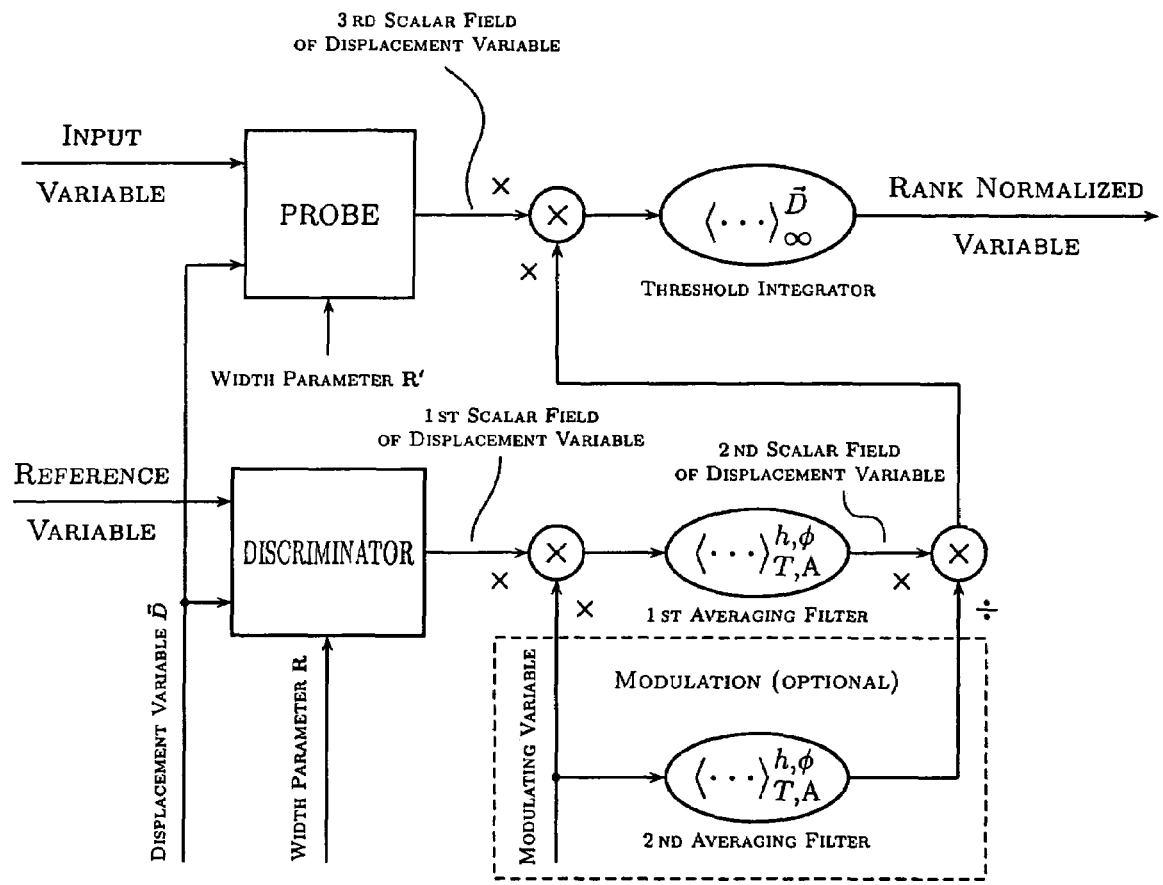

FIG. 63. Schematic of Rank Normalization of an input variable with respect to a reference variable.

Figure 64:
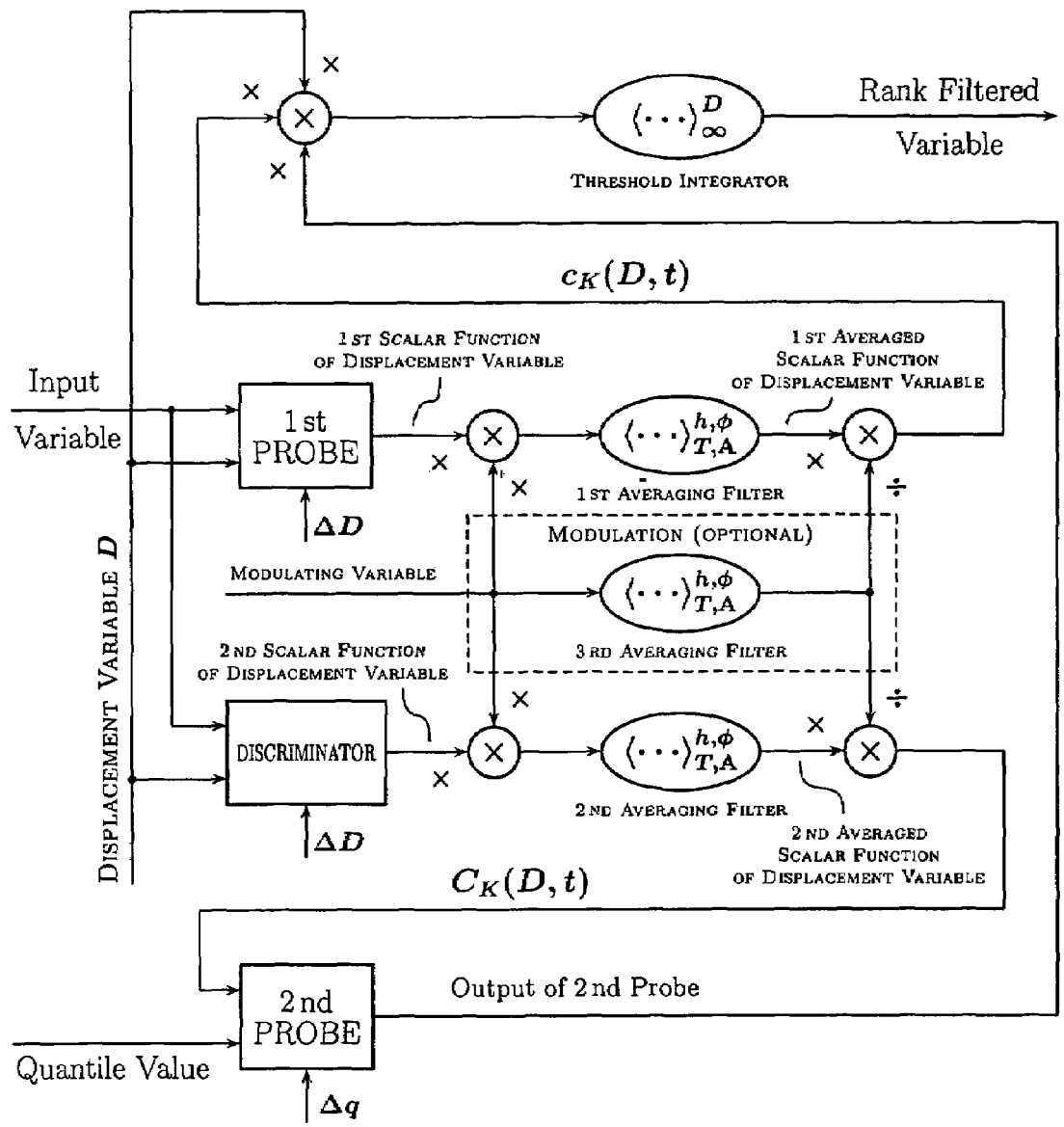

FIG. 64. Schematic of an explicit Analog Rank Filter.

Figure 65:
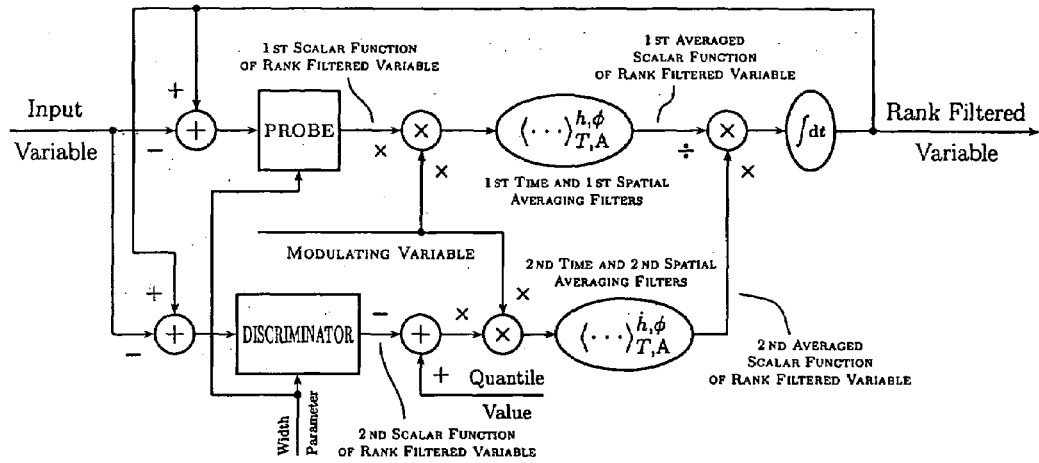

FIG. 65. Schematic of an Analog Rank Filter for a single scalar variable or a scalar field variable.

Figure 66:
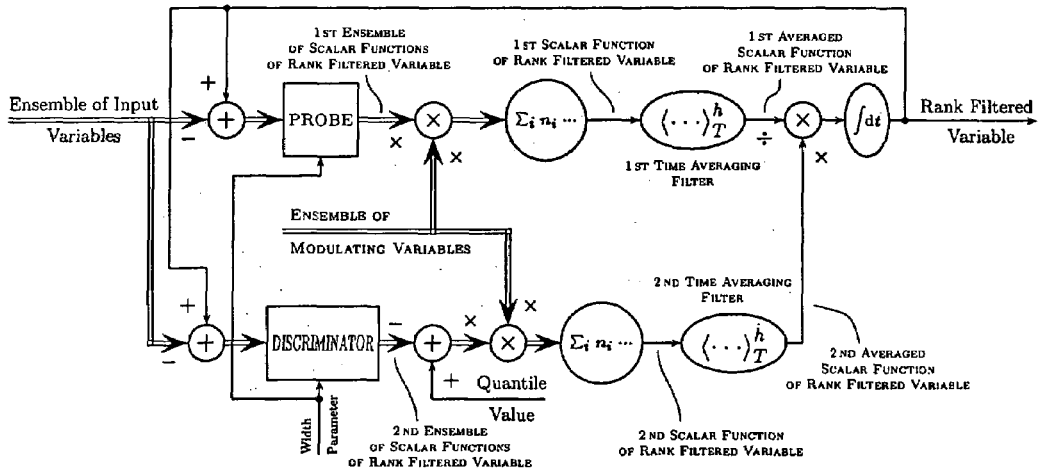

FIG. 66. Schematic of an Analog Rank Filter for an ensemble of scalar variables.

BEST MODES FOR CARRYING OUT THE INVENTION

1 Main Equations for Practical Embodiments (i) Modulated threshold density, Eq. (52):

$$c_K(D, t) = \frac{\langle K(s) f_R [D - x(s)] \rangle_T}{\langle K(s) \rangle_T}.$$

(ii) Mean at reference threshold, Eq. (53):

$$\{M_x K\}_T(D, t) = \frac{\langle K(s) f_R [D - x(s)] \rangle_T}{\langle f_R [D - x(s)] \rangle_T}$$

$$= \frac{\left\langle K(s) \prod_{i=1}^{n} \partial_{D_i} \mathcal{F}_{\Delta D_i} [D_i - x_i(s)] \right\rangle_T}{\left\langle \prod_{i=1}^{n} \partial_{D_i} \mathcal{F}_{\Delta D_i} [D_i - x_i(s)] \right\rangle_T}.$$

(iii) Amplitude density, Eq. (54):

$$b(D, t) = \left\langle \prod_{i=1}^{n} \partial_{D_i} \mathcal{F}_{\Delta D_i} [D_i - x_i(s)] \right\rangle_T.$$

(iv) Counting density, Eq. (55):

$$r(D, t) = \frac{\left\langle \sqrt{\sum_{i=1}^{n} \left[\frac{\dot{x}_i(s)}{\Delta D_i}\right]^2} \prod_{i=1}^{n} \partial_{D_i} \mathcal{F}_{\Delta D_i} [D_i - x_i(s)] \right\rangle_T}{\left\langle \sqrt{\sum_{i=1}^{n} \left[\frac{\dot{x}_i(s)}{\Delta D_i}\right]^2} \right\rangle_T}.$$

(v) Counting rates, Eq. (56):

$$\mathcal{R}(D, t) = \left\langle \sqrt{\sum_{i=1}^{n} \left[\frac{\dot{x}_i(s)}{\Delta D_i}\right]^2} \prod_{i=1}^{n} \Delta D_i \partial_{D_i} \mathcal{F}_{\Delta D_i} [D_i - x_i(s)] \right\rangle_T.$$

(vi) Phase space amplitude density, Eq. (60):

$$b(D_x, D_{\dot{x}}, t) = \langle \partial_{D_x} F_{\Delta D_x}[D_x - x(s)] \partial_{D_{\dot{x}}} F_{\Delta D_{\dot{x}}}[D_{\dot{x}} - \dot{x}(s)] \rangle_T.$$

(vii) Phase space counting density, Eq. (61):

$$r(D_x, D_{\dot{x}}, t) =$$

-continued $$\frac{\left\langle \sqrt{\left(\frac{\dot{x}}{D_x}\right)^2 + \left(\frac{\ddot{x}}{D_{\dot{x}}}\right)^2} \partial_{D_x} \mathcal{F}_{\Delta D_x}[D_x - x(s)] \partial_{D_{\dot{x}}} \mathcal{F}_{\Delta D_{\dot{x}}}[D_{\dot{x}} - \dot{x}(s)] \right\rangle_T}{\left\langle \sqrt{\left(\frac{\dot{x}}{D_x}\right)^2 + \left(\frac{\ddot{x}}{D_{\dot{x}}}\right)^2} \right\rangle_T}.$$

(viii) Phase space counting rates, Eq. (62):

$$R(D_x, D_{\dot{x}}, t) = \langle \sqrt{(\dot{x} D_x)^2 + (\ddot{x} D_{\dot{x}})^2} \partial_{D_x} F_{\Delta D_x}[D_x - x(s)] \partial_{D_{\dot{x}}} F_{\Delta D_{\dot{x}}}[D_{\dot{x}} - \dot{x}(s)] \rangle_T.$$

(ix) Estimator of differences in quantile domain between the mean at reference threshold and the time average, Eq. (63):

$$\Xi_q(D, t) = \frac{|\{M_x K\}_T(D, t) - \langle K \rangle_T|}{|\langle K \rangle_T|} \theta[\langle f_R(D - x) \rangle_T - f_q(t)].$$

(x) Modulated cumulative distribution, Eq. (64):

$$C_K(D, t) = \int_{-\infty}^{D} d^n r c_K(r, t) = \frac{\langle K(s) \mathcal{F}_R[D - x(s)] \rangle_T}{\langle K(s) \rangle_T}.$$

(xi) Rank normalization with respect to the reference distribution $C_{K,r}(D,t)$, Eq. (86):

$$y(t) = \langle f_R[D - x(t)] C_{K,r}(D, t) \rangle_{-\infty}^{D}.$$

(xii) Rank normalization by a discriminator with an arbitrary input-output response, Eq. (88):

$$y(t) = \mathcal{F}_{R_r(t)}[D_r(t) - x(t)] = \prod_{i=1}^{n} \mathcal{F}_{\Delta D_{r,i}(t)}[D_{r,i}(t) - x_i(t)].$$

(xiii) Rank normalization of a scalar variable by a discriminator with an arbitrary input-output response, Eq. (89):

$$y(t) = \mathcal{F}_{\sqrt{2(K_{20} - K_{10}^2)}}[K_{10}(t) - x(t)].$$

(xiv) Estimator of differences between two distributions, Eq. (92):

$$\left. \begin{array}{c} Q_{ab}(t; q) = C_b[y_q(t), t] \\ C_a[y_q(t), t] = q \end{array} \right\}.$$

(xv) Statistic for comparison of two distributions, Eq. (95):

$$\Lambda_{ab}(t) = \int_{-\infty}^{\infty} d^n x h(x) H[C_a(x, t), C_b(x, t), c_a(x, t), c_b(x, t)].$$

(xvi) Statistic of Cramér-von Mises type, Eq. (97):

$$\Lambda_{ab}(t) = \int_{-\infty}^{\infty} dC_a(x, t) w[C_a(x, t)] W[C_a(x, t) - C_b(x, t)] =$$

$$= \int_{-\infty}^{\infty} dx_1 \cdots \int_{-\infty}^{\infty} dx_n \frac{\partial^n C_a(x, t)}{\partial x_1 \ldots \partial x_n} w[C_a(x, t)] W[C_a(x, t) - C_b(x, t)] =$$

-continued $$= \int_{-\infty}^{\infty} d^n x c_a(x,t) w[C_a(x,t)] W[C_a(x,t) - C_b(x,t)].$$

(xvii) Probabilistic comparison of amplitudes, Eq. (102):

$$P_q(t) = \int_{-\infty}^{\infty} ds g_1(t-s) C_{1,x}^{g_2}\left[\frac{x(s)}{q}, t\right] = \left\langle C_{1,x}^{g_2}\left[\frac{x(s)}{q}, t\right] \right\rangle_T^{g_1}.$$

(xviii) Analog rank filter, Eq. (105):

$$D_q(t) = \int_{-\infty}^{\infty} dD Dc_K(D,t) \delta[C_K(D,t) - q]$$
$$\approx \langle Dc_K(D,t) \partial_q \mathcal{F}_{\Delta q}[C_K(D,t) - q] \rangle_\infty^D.$$

(xix) Adaptive analog rank filter, Eq. (113):

$$\dot{D}_q = \frac{q\langle K(s)\rangle_T^h - \langle K(s)\mathcal{F}_{\Delta D(s)}[D_q(s) - x(s)]\rangle_T^h}{\langle K(s)\partial_D \mathcal{F}_{\Delta D(s)}[D_q(s) - x(s)]\rangle_T^h}.$$

(xx) Alternative embodiment of adaptive analog rank filter, Eq. (117):

$$\dot{D}_q = \frac{q\langle K(s)\rangle_T^h - \langle K(s)\mathcal{F}_{\Delta D(s)}[D_q(t) - x(s)]\rangle_T^h}{\Delta T \langle\langle K(s)\partial_D \mathcal{F}_{\Delta D(s)}[D_q(t) - x(s)]\rangle_T^h\rangle_{\Delta T}^{h_0}}.$$

(xxi) Threshold averaged instantaneous density for a continuous ensemble of variables, Eq. (120):

$$b(D; t, n(\mu)) = \int_{-\infty}^{\infty} d\mu n(\mu) f_R[D - x_\mu(t)].$$

(xxii) Threshold averaged instantaneous cumulative distribution for a continuous ensemble of variables, Eq. (121):

$$B(D; t, n(\mu)) = \int_{-\infty}^{\infty} d\mu n(\mu) F_R[D - x_\mu(t)].$$

(xxiii) Modulated density for a continuous ensemble of variables. Eq. (122):

$$c_K(D; t, n(\mu)) = \int_{-\infty}^{\infty} d\mu n(\mu) \frac{\langle K_\mu(s) f_R[D - x_\mu(s)]\rangle_T}{\langle K_\mu(s)\rangle_T}.$$

(xxiv) Modulated cumulative distribution for a continuous ensemble of variables. Eq. (123):

$$C_K(D; t, n(\mu)) = \int_{-\infty}^{\infty} d\mu n(\mu) \frac{\langle K_\mu(s) F_R[D - x_\mu(s)]\rangle_T}{\langle K_\mu(s)\rangle_T}.$$

(xxv) Analog rank selector for a continuous ensemble, Eq. (126):

$$\dot{x}_q = -\frac{\int_{-\infty}^{x_q(t)} d\varepsilon \partial_t g_T(t,\varepsilon)}{g_T[t, x_q(t)]} = -\frac{\langle B_{n(\mu)}(\alpha, x_q)\rangle_T^\phi}{\langle b_{n(\mu)}(\alpha, x_q)\rangle_T^\phi}.$$

(xxvi) $RC_{10}$ analog rank selector for a discrete ensemble. Eq. (129):

$$\dot{x}_q = e^{t/T} \frac{q - \sum_i n_i \mathcal{F}_{\Delta D}[x_q(t) - x_i(t)]}{\int_{-\infty}^t d\alpha e^{\alpha/T} \sum_i n_i \partial_D \mathcal{F}_{\Delta D}[x_q(\alpha) - x_i(\alpha)]}$$
$$= \frac{q - \sum_i n_i \mathcal{F}_{\Delta D}[x_q(t) - x_i(t)]}{T\langle \sum_i n_i \partial_D \mathcal{F}_{\Delta D}[x_q(s) - x_i(s)]\rangle_T^{h_0}}.$$

(xxvii) Adaptive analog rank filter for a discrete ensemble of variables, Eq. (130):

$$D_q = \frac{q\langle \sum_i n_i K_i(s)\rangle_T^h - \langle \sum_i n_i K_i(s) \mathcal{F}_{\Delta D(s)}[D_q(s) - x_i(s)]\rangle_T^h}{\langle \sum_i n_i K_i(s) \partial_D \mathcal{F}_{\Delta D(s)}[D_q(s) - x_i(s)]\rangle_T^h}.$$

(xxviii) Modulated threshold density for a scalar field, Eq. (131):

$$c_K(D; a, t) = \frac{\langle K(r,s) \partial_D \mathcal{F}_{\Delta D}[D - z(r,s)]\rangle_{T,R}^{h,f}}{\langle K(r,s)\rangle_{T,R}^{h,f}}.$$

(xxix) $RC_{10}$ analog rank selector/filter for a scalar field (n-dimensional surface). Eq. (133):

$$\dot{z}_q = \frac{q - \langle \mathcal{F}_{\Delta D}[z_q(x,t) - z(r,t)]\rangle_R^f}{T\langle\langle \partial_D \mathcal{F}_{\Delta D}[z_q(x,s) - z(r,s)]\rangle_R^f\rangle_T^{h_0}}.$$

(xxx) Analog rank filter for a scalar field, Eq. (134):

$$D_q(a,t) = \int_{-\infty}^{\infty} dD Dc_K(D; a, t) \partial_q F_{\Delta q}[C_K(D; a, t) - q].$$

(xxxi) Adaptive analog rank filter for a scalar field, Eq. (135):

$$\dot{D}_q(a,t) = \frac{q\langle K(r,s)\rangle_{T,A}^{h,f} - \langle K(r,s)\mathcal{F}_{\Delta D(a,s)}[D_q(a,s) - x(r,s)]\rangle_{T,A}^{h,f}}{\langle K(r,s) \partial_D \mathcal{F}_{\Delta D(a,s)}[D_q(a,s) - x(r,s)]\rangle_{T,A}^{h,f}}.$$

(xxxii) Numerical algorithm for analog rank processing of an image given by the matrix $Z=Z_{ij}(t)$, Eq. (136):

$$\left.\begin{aligned} Q_k &= Q_{k-1} + (q-F)/f_k \\ F &= \sum_{m,n} w_{mn} \mathcal{F}_{\Delta D}[Q_{k-1} - (Z_{i-m,j-n})_{k-1}] \\ f_k &= g + \frac{N-1}{N} f_{k-1} \\ g &= \sum_{m,n} w_{mn} \partial_D \mathcal{F}_{\Delta D}[Q_{k-1} - (Z_{i-m,j-n})_{k-1}] \end{aligned}\right\}.$$

(xxxiii) Modulated threshold density for a vector field, Eq. (138):

$$c_K(D; a, t) = \frac{\langle K(r,s) f_R[D - x(r,s)] \rangle_{T,A}^{h,f}}{\langle K(r,s) \rangle_{T,A}^{h,f}}.$$

(xxxiv) Modulated threshold density for an ensemble of vector fields, Eq. (139):

$$c_K(D; a, t, n(\mu)) = \int_{-\infty}^{\infty} d\mu n(\mu) \frac{\langle K_\mu(r,s) f_R[D - x_\mu(r,s)] \rangle_{T,A}^{h,f}}{\langle K_\mu(r,s) \rangle_{T,A}^{h,f}}.$$

(xxxv) Mean at reference threshold for a vector field input variable, Eq. (140):

$$\{M_x K\}_{T,A}(D; a, t) = \frac{\langle K(r,s) f_R[D - x(r,s)] \rangle_{T,A}}{\langle f_R[D - x(r,s)] \rangle_{T,A}}$$

$$= \frac{\left\langle \prod_{i=1}^{n} K_i(r,s) \partial_{D_i} \mathcal{F}_{\Delta D_i}[D_i - x_i(r,s)] \right\rangle_{T,A}}{\left\langle \prod_{i=1}^{n} \partial_{D_i} \mathcal{F}_{\Delta D_i}[D_i - x_i(r,s)] \right\rangle_{T,A}}.$$

(xxxvi) Analog quantile density filter, Eq. (142):

$$\dot{z}_q(t) = -\frac{\partial_t C_z[z_q(t); a, t]}{c_z[z_q(t); a, t]} =$$

$$= \frac{\left\langle \int_{-\infty}^{\infty} d^n r\, z(r,s)\{1 - q - \mathcal{F}_{\Delta D}[z_q(t) - z(r \cdot s)]\} \right\rangle_T^h}{\left\langle \int_{-\infty}^{\infty} d^n r\, z(r,s) \partial_D \mathcal{F}_{\Delta D}[z_q(t) - z(r \cdot s)] \right\rangle_T^h} =$$

$$\approx \frac{\left\langle \int_{-\infty}^{\infty} d^n r\, z(r,s)\{1 - q - \mathcal{F}_{\Delta D}[z_q(s) - z(r,s)]\} \right\rangle_T^h}{\left\langle \int_{-\infty}^{\infty} d^n r\, z(r,s) \partial_D \mathcal{F}_{\Delta D}[z_q(s) - z(r,s)] \right\rangle_T^h}.$$

(xxxvii) Analog quantile domain filter, Eq. (144):

$$S_q(D; a, t) = F_{\Delta D}[z(D, t) - z_q(t)].$$

(xxxviii) Analog quantile volume filter, Eq. (145):

$$R_q(a, t) = \int_{-\infty}^{\infty} d^n r\, S_q(r; a, t) = \langle S_q(r; a, t) \rangle_{\infty}^r.$$

2 Articles of Manufacture

Various embodiments of AVATAR may include hardware, firmware, and software embodiments, that is, may be wholly constructed with hardware components, programmed into firmware, or be implemented in the form of a computer program code.

Still further, the invention disclosed herein may take the form of an article of manufacture. For example, such an article of manufacture can be a computer-usable medium containing a computer-readable code which causes a computer to execute the inventive method.

We claim:

1. A method for analysis of variables operable to transform an input variable into an output variable comprising the following steps:
    (a) applying a Threshold Filter to a difference of a Displacement Variable and an input variable producing a first scalar field of said Displacement Variable; and
    (b) filtering said first scalar field of step (a) with a first Averaging Filter operable to perform a function selected from the group consisting of time averaging function, spatial averaging function, and time and spatial averaging function to produce a second scalar field of said Displacement Variable.

2. A method for analysis of variables operable to transform an input variable into an output variable as recited in claim 1 further comprising the step:
    modulating said first scalar field of step (a) by a Modulating Variable producing a modulated first scalar field of said Displacement Variable.

3. A method for analysis of variables as recited in claim 2 wherein said Threshold Filter is a Probe and said Modulating Variable is a norm of a first time derivative of the input variable.

4. A method for analysis of variables as recited in claim 3 wherein the input variable further comprises a vector combining the components of the input variable and first time derivatives of said components of the input variable.

5. A method for analysis of variables as recited in claim 2 further comprising the step:
    dividing said second scalar field of step (b) by said Modulating Variable where said Modulating Variable has been first filtered with a second Averaging Filter operable to perform a function selected from the group consisting of time averaging function, spatial averaging function, and time and spatial averaging function.

6. A method for analysis of variables as recited in claim 5 wherein said Threshold Filter is a Probe and said Modulating Variable is a norm of a first time derivative of the input variable.

7. A method for analysis of variables as recited in claim 6 wherein the input variable further comprises a vector combining the components of the input variable and first time derivatives of said components of the input variable.

8. A method for analysis of variables as recited in claim 5 wherein said Threshold Filter is a Discriminator and said Modulating Variable is a norm of a first time Derivative of the input variable.

9. A method for analysis of variables as recited in claim 8 wherein the input variable further comprises a vector combining the components of the input variable and first time derivatives of said components of the input variable.

10. A method for analysis of variables as recited in claim 5 wherein said Threshold Filter is a first Probe and where said second scalar field of step (b) is a Modulated Threshold Density.

11. A method for analysis of variables as recited in claim 10 wherein the input variable further comprises a vector combining the components of the input variable and first time derivatives of said components of the input variable.

12. A method for analysis of variables as recited in claim 10 further comprising the following steps:
   (a) applying a second Probe to a difference between a feedback of a Quantile Density variable and said Modulated Threshold Density producing a first function of said Quantile Density variable;
   (b) multiplying said first function of Quantile Density of step (a) by said Modulated Threshold Density producing a first modulated function of Quantile Density;
   (c) filtering said first modulated function of Quantile Density of step (b) with a first Time Averaging Filter producing a first time averaged modulated function of Quantile Density;
   (d) integrating said first time averaged modulated function of step (c) over the values of said Displacement Variable producing a first threshold integrated function of Quantile Density;
   (e) applying a first Discriminator to the difference between the feedback of said Quantile Density variable and said Modulated Threshold Density variable wherein said first Discriminator is a respective discriminator of said second Probe producing a second function of said Quantile Density variable;
   (f) subtracting a quantile value and said second function of Quantile Density of step (g) from a unity and multiplying the difference by said Modulated Threshold Density producing a second modulated function of Quantile Density;
   (g) filtering said second modulated function of Quantile Density of step (f) with a second Time Averaging Filter wherein the impulse response of said second Time Averaging Filter is a first derivative of the impulse response of said first Time Averaging Filter producing a second time averaged modulated function of Quantile Density;
   (h) integrating said second averaged modulated function of step (g) over the values of said Displacement Variable producing a second threshold integrated function of Quantile Density; and
   (i) dividing said second threshold integrated function of step (h) by said first threshold integrated function of step (d) and time-integrating the quotient to output said Quantile Density variable.

13. A method for analysis of variables as recited in claim 12 further comprising the step:
   applying a second Discriminator to the difference of said Modulated Threshold Density and said Quantile Density variable to output a Quantile Domain Factor variable.

14. A method for analysis of variables as recited in claim 13 further comprising the step:
   integrating said Quantile Domain Factor variable over the values of said Displacement Variable to output a Quantile Volume variable.

15. A method for analysis of variables as recited in claim 5 wherein said Threshold Filter is a Discriminator.

16. A method for analysis of variables as recited in claim 15 wherein the input variable further comprises a vector combining the components of the input variable and first time derivatives of said components of the input variable.

17. A method for analysis of variables as recited in claim 1 wherein said Threshold Filter is a first Probe and where said second scalar field of step (b) is an Amplitude Density.

18. A method for analysis of variables as recited in claim 17 wherein the input variable further comprises a vector combining the components of the input variable and first time derivatives of said components of the input variable.

19. A method for analysis of variables as recited in claim 17 further comprising the following steps:
   (a) applying a second Probe to a difference between a feedback of a Quantile Density variable and said Amplitude Density producing a first function of said Quantile Density variable;
   (b) multiplying said first function of Quantile Density of step (a) by said Amplitude Density producing a first modulated function of Quantile Density;
   (c) filtering said first modulated function of Quantile Density of step (b) with a first Time Averaging Filter producing a first time averaged modulated function of Quantile Density;
   (d) integrating said first time averaged modulated function of step (c) over the values of said Displacement Variable producing a first threshold integrated function of Quantile Density;
   (e) applying a first Discriminator to the difference between the feedback of said Quantile Density variable and said Amplitude Density wherein said first Discriminator is a respective discriminator of said second Probe producing a Second function of said Quantile Density variable;
   (f) subtracting a quantile value and said second function of Quantile Density of step (e) from a unity and multiplying the difference by said Amplitude Density producing a second modulated function of Quantile Density;
   (g) filtering said second modulated function of Quantile Density of step (f) with a second Time Averaging Filter wherein the impulse response of said second Time Averaging Filter is a first derivative of the impulse response of said first Time Averaging Filter producing a second time averaged modulated function of Quantile Density;
   (h) integrating said second time averaged modulated function of step (g) over the values of said Displacement Variable producing a second threshold integrated function of Quantile Density; and
   (i) dividing said second threshold integrated function of step (h) by said first threshold integrated function of step (d) and time-integrating the quotient to output said Quantile Density variable.

20. A method for analysis of variables as recited in claim 19 further comprising the step:
   applying a second Discriminator to the difference of said Amplitude Density and said Quantile Density variable to output a Quantile Domain Factor variable.

21. A method for analysis of variables as recited in claim 20 further comprising the step:
   integrating said Quantile Domain Factor variable over the values of said Displacement Variable to output a Quantile Volume variable.

22. A method for analysis of variables as recited in claim 1 wherein said Threshold Filter is a Discriminator.

23. A method for analysis of variables as recited in claim 22 wherein the input variable further comprises a vector combining the components of the input variable and first time derivatives of said components of the input variable.

24. A method for Rank Normalization of an input variable with respect to a reference variable comprising the following steps:

(a) applying a Discriminator to a difference of a Displacement Variable and a reference variable producing a first scalar field of said Displacement Variable;

(b) filtering said first scalar field of step (a) with a first Averaging Filter operable to perform a function selected from the group consisting of time averaging function, spatial averaging function, and time and spatial averaging function to produce a second scalar field of said Displacement Variable;

(c) applying a Probe to a difference of said Displacement Variable and an input variable producing a third scalar field of said Displacement Variable; and (d) multiplying said third scalar field of step (c) by said second scalar field of step (b) and integrating the product over the values of said Displacement Variable to output a Rank Normalized variable.

25. A method for Rank Normalization of an input variable with respect to a reference variable as recited in claim 24 wherein the reference variable is analogous to the input variable.

26. A method for Rank Normalization of an input variable with respect to a reference variable as recited in claim 24 further comprising the following steps:
(a) modulating said first scalar field of step (a) by a Modulating Variable; and
(b) dividing said second scalar field variable of step (b) by said Modulating Variable where said Modulating Variable has been first filtered with a second Averaging Filter operable to perform a function selected from the group consisting of time averaging function, spatial averaging function, and time and spatial averaging function.

27. A method for Rank Normalization of an input variable with respect to a reference variable as recited in claim 26 wherein the reference variable is analogous to the input variable.

28. A method for analysis of variables operable to transform an input variable into an output variable comprising the following steps:
(a) applying a Probe to a difference of a Displacement Variable and a reference variable producing a first scalar field of said Displacement Variable;
(b) modulating said first scalar field of step (a) by an input variable producing a modulated first scalar field of said Displacement Variable;
(c) filtering said modulated first scalar field of step (b) with a first Averaging Filter to produce a second scalar field of said Displacement Variable where said first Averaging Filter is operable to perform a function selected from the group consisting of time averaging function, spatial averaging function, and time and spatial averaging function; and
(d) dividing said second scalar field of step (c) by said first scalar field of step (a) where said first scalar field has been first filtered with a second Averaging Filter operable to perform a function selected from the group consisting of time averaging function, spatial averaging function, and time and spatial averaging function producing an output variable.

29. A method for analysis of variables operable to transform an input variable into an output variable comprising the following steps:
(a) applying a first Probe to a difference of a Displacement Variable and an input variable producing a first scalar function of said Displacement Variable;
(b) filtering said first scalar function of step (a) with a first Averaging Filter operable to perform a function selected from the group consisting of time averaging function, spatial averaging function, and time and spatial averaging function to produce a first averaged scalar function of said Displacement Variable;

(c) applying a Discriminator to the difference of said Displacement Variable and the input variable wherein said Discriminator is a respective discriminator of said first Probe producing a second scalar function of said Displacement Variable;

(d) filtering said second scalar function of step (c) with a second Averaging Filter operable to perform a function selected from the group consisting of time averaging function, spatial averaging function, and time and spatial averaging function producing a second averaged scalar function of said Displacement Variable;

(e) applying a second Probe to a difference of a quantile value and said second averaged scalar function of step (d) wherein the width parameter of said second Probe is substantially smaller than unity producing an output of the second Probe; and (f) multiplying said output of the second Probe of step (e) by said first averaged scalar function of step (b) and by said Displacement Variable and integrating the product over the values of said Displacement Variable to produce an output variable.

30. A method for analysis of variables operable to transform an input variable into an output variable as recited in claim 29 wherein said first scalar function of step (a) and said second scalar function of step (c) are modulated by a Modulating Variable further comprising the step:
dividing said first averaged scalar function of step (b) and said second averaged scalar function of step (d) by said Modulating Variable where said Modulating Variable has been first filtered with a third Averaging Filter operable to perform a function selected from the group consisting of time averaging function, spatial averaging function, and time and spatial averaging function.

31. A method for analysis of variables as recited in claim 30 wherein said Modulating Variable is an absolute value of a first time derivative of the input Variable.

32. A method for analysis of variables operable to transform an input scalar field variable into an output variable comprising the following steps:
(a) applying a Probe to a difference between a feedback of an output variable and an input variable producing a first scalar function of said output variable;
(b) filtering said first scalar function of step (a) with a first Averaging Filter operable to perform time and spatial averaging of said first scalar function producing a first averaged scalar function of said output variable;
(c) applying a Discriminator to the difference between the feedback of said output variable and the input variable wherein said Discriminator is a respective discriminator of said Probe producing a second scalar function of said output variable;
(d) subtracting said second scalar function of step (c) from a quantile value and filtering the difference with a second Averaging Filter wherein the impulse response of said second Averaging Filter is a first time derivative of the impulse response of said first Averaging Filter producing a second averaged scalar function of said output variable; and
(e) dividing said second averaged scalar function of step (d) by said first averaged scalar function of step (b) and time-integrating the quotient to output said output variable.

33. A method for analysis of variables as recited in claim 32 wherein the width parameter of said Discriminator and the respective Probe is indicative of variability of said Rank Filtered variable.

34. A method for analysis of variables operable to transform an input scalar field variable into an output variable comprising the following steps:
   (a) applying a Probe to a difference between a feedback of an output variable and an input variable producing a first scalar function of said output variable where said first scalar function is modulated by a Modulating Variable;
   (b) filtering said first scalar function of step (a) with a first Averaging Filter operable to perform time and spatial averaging of said first scalar function producing a first averaged scalar function of said output variable;
   (c) applying a Discriminator to the difference between the feedback of said output variable and the input variable wherein said Discriminator is a respective discriminator of said Probe producing a second scalar function of said output variable;
   (d) subtracting said second scalar function of step (c) from a quantile value and filtering the difference with a second Averaging Filter wherein said difference between said quantile value and said second scalar function is modulated by said Modulating Variable and wherein the impulse response of said second Averaging Filter is a first time derivative of the impulse response of said first Averaging Filter producing a second averaged scalar function of said output variable; and
   (e) dividing said second averaged scalar function of step (d) by said first averaged scalar function of step (b) and time-integrating the quotient to output said output variable.

35. A method for analysis of variables as recited in claim 34 wherein said Modulating Variable is an absolute value of a first time derivative of the input variable.

36. A method for analysis of variables as recited in claim 35 wherein the width parameter of said Discriminator and the respective Probe is indicative of variability of said Rank Filtered variable.

37. A method for analysis of variables as recited in claim 34 wherein the width parameter of said Discriminator and the respective Probe is indicative of variability of said Rank Filtered variable.

38. A method for analysis of variables operable to transform an input variable into an output variable comprising the following steps:
   (a) applying a Probe to a difference between a feedback of an output variable and an input variable producing a first scalar function of the output variable;
   (b) filtering said first scalar function of step (a) with a Time Averaging Filter having an exponentially forgetting impulse response and a first Spatial Averaging Filter operable on the spatial coordinates of the input variable producing a first averaged scalar function of the output variable;
   (c) applying a Discriminator to the difference between the feedback of the output variable and the input variable wherein said Discriminator is a respective discriminator of said Probe producing a second scalar function of the output variable;
   (d) filtering the difference between a quantile value and said second scalar function of step (c) with a second Spatial Averaging Filter operable on the spatial coordinates of the input variable producing a second averaged scalar function of the output variable; and
   (e) dividing said second averaged scalar function of step (d) by said first averaged scalar function of step (b) and by the time constant of the impulse response of said Time Averaging Filter and time-integrating the quotient to produce said output variable.

39. A method for image analysis operable to transform an input image signal into an output signal comprising the following steps:
   (a) applying a Threshold Filter to a difference of a Displacement Variable and an input image signal producing a first scalar field of said Displacement Variable; and
   (b) filtering said first scalar field of step (a) with a first Averaging Filter operable to perform a function selected from the group consisting of time averaging function, spatial averaging function, and time and spatial averaging function to produce a second scalar field of said Displacement Variable.

40. A method for image analysis operable to transform an input image signal into an output signal as recited in claim 39 further comprising the step:
   modulating said first scalar field of step (a) by a Modulating Variable producing a modulated first scalar field of said Displacement Variable.

41. A method for image analysis as recited in claim 40 wherein said Threshold Filter is a Probe and said Modulating Variable is a norm of a first time derivative of the input image signal.

42. A method for image analysis as recited in claim 41 wherein the input image signal further comprises a vector combining the components of the input image signal and first time derivatives of said components of the input image signal.

43. A method for image analysis as recited in claim 40 further comprising the step:
   dividing said second scalar field of step (b) by said Modulating Variable where said Modulating Variable has been first filtered with a second Averaging Filter operable to perform a function selected from the group consisting of time averaging function, spatial averaging function, and time and spatial averaging function.

44. A method for image analysis as recited in claim 43 wherein said Threshold Filter is a Probe and said Modulating Variable is a norm of a first time derivative of the input image signal.

45. A method for image analysis as recited in claim 44 wherein the input image signal further comprises a vector combining the components of the input image signal and first time derivatives of said components of the input image signal.

46. A method for image analysis as recited in claim 43 wherein said Threshold Filter is a Discriminator and said Modulating Variable is a norm of a first time derivative of the input image signal.

47. A method for image analysis as recited in claim 46 wherein the input image signal further comprises a vector combining the components of the input image signal and first time derivatives of said components of the input image signal.

48. A method for image analysis as recited in claim 43 wherein said Threshold Filter is a Probe.

49. A method for image analysis as recited in claim 48 wherein the input image signal further comprises a vector combining the components of the input image signal and first time derivatives of said components of the input image signal.

50. A method for image analysis as recited in claim 43 wherein said Threshold Filter is a Discriminator.

51. A method for image analysis as recited in claim 50 wherein the input image signal further comprises a vector combining the components of the input image signal and first time derivatives of said components of the input image signal.

52. A method for image analysis as recited in claim 39 wherein said Threshold Filter is a Probe.

53. A method for image analysis as recited in claim 52 wherein the input image signal further comprises a vector combining the components of the input image signal and first time derivatives of said components of the input image signal.

54. A method for image analysis as recited in claim 39 wherein said Threshold Filter is a Discriminator.

55. A method for image analysis as recited in claim 54 wherein the input image signal further comprises a vector combining the components of the input image signal and first time derivatives of said components of the input image signal.

56. An apparatus for analysis of variables operable to transform an input variable into an output variable comprising:
- a Threshold Filter operable to apply a Threshold Filter to a difference of a Displacement Variable and an input variable producing a first scalar field of said Displacement Variable; and
- a first Averaging Filter operable to perform a function selected from the group consisting of time averaging function, spatial averaging function, and time and spatial averaging function so as to filter said first scalar field to produce a second scalar field of said Displacement Variable.

57. An apparatus for analysis of variables operable to transform an input variable into an output variable as recited in claim 56 further comprising:
- a modulator operable to modulate said first scalar field by a Modulating Variable producing a modulated first scalar field of said Displacement Variable.

58. An apparatus for analysis of variables as recited in claim 57 wherein said Threshold Filter is a Probe and said Modulating Variable is a norm of a first time derivative of the input variable.

59. An apparatus for analysis of variables as recited in claim 58 wherein the input variable further comprises a vector combining the components of the input variable and first time derivatives of said components of the input variable.

60. An apparatus for analysis of variables as recited in claim 57 further comprising:
- a second Averaging Filter operable to alter said Modulating Variable with a second Averaging Filter to produce an averaged Modulating Variable where said second Averaging Filter is operable to perform a function selected from the group consisting of time averaging function, spatial averaging function, and time and spatial averaging function; and
- a divider operable to divide said second scalar field by said averaged Modulating Variable.

61. An apparatus for analysis of variables as recited in claim 60 wherein said Threshold Filter is a Probe and said Modulating Variable is a norm of a first time derivative of the input variable.

62. An apparatus for analysis of variables as recited in claim 61 wherein the input variable further comprises a vector combining the components of the input variable and first time derivatives of said components of the input variable.

63. An apparatus for analysis of variables as recited in claim 60 wherein said Threshold Filter is a Discriminator and said Modulating Variable is a norm of a first time derivative of the input variable.

64. An apparatus for analysis of variables as recited in claim 63 wherein the input variable further comprises a vector combining the components of the input variable and first time derivatives of said components of the input variable.

65. An apparatus for analysis of variables as recited in claim 60 wherein said Threshold Filter is a Probe.

66. An apparatus for analysis of variables as recited in claim 65 wherein the input variable further comprises a vector combining the components of the input variable and first time derivatives of said components of the input variable.

67. An apparatus for analysis of variables as recited in claim 60 wherein said Threshold Filter is a Discriminator.

68. An apparatus for analysis of variables as recited in claim 67 wherein the input variable further comprises a vector combining the components of the input variable and first time derivatives of said components of the input variable.

69. An apparatus for analysis of variables as recited in claim 56 wherein said Threshold Filter is a Probe.

70. An apparatus for analysis of variables as recited in claim 69 wherein the input variable further comprises a vector combining the components of the input variable and first time derivatives of said components of the input variable.

71. An apparatus for analysis of variables as recited in claim 56 wherein said Threshold Filter is a Discriminator.

72. An apparatus for analysis of variables as recited in claim 71 wherein the input variable further comprises a vector combining the components of the input variable and first time derivatives of said components of the input variable.

73. An apparatus for Rank Normalization of an input variable with respect to a reference variable comprising:
- a Discriminator operable to apply a Discriminator to a difference of a Displacement Variable and a reference variable producing a first scalar field of said Displacement Variable;
- a first Averaging Filter operable to perform a function selected from the group consisting of time averaging function, spatial averaging function, and time and spatial averaging function so as to alter said first scalar field to produce a second scalar field of said Displacement Variable;
- a Probe operable to apply a Probe to a difference of said Displacement Variable and an input variable producing a third scalar field of said Displacement Variable;
- a multiplier operable to multiply said third scalar field by said second scalar field to produce a product; and
- an integrator operable to integrate said product over the values of said Displacement Variable to output a Rank Normalized variable.

74. An apparatus for Rank Normalization of an input variable with respect to a reference variable as recited in claim 73 wherein the reference variable is analogous to the input variable.

75. An apparatus for Rank Normalization of an input variable with respect to a reference variable as recited in claim 73 further comprising:

a modulator operable to modulate said first scalar field by a Modulating Variable;

a second Averaging Filter operable to alter said Modulating Variable to produce an averaged Modulating Variable where said second Averaging Filter is operable to perform a function selected from the group consisting of time averaging function, spatial averaging function, and time and spatial averaging function; and a divider operable to divide said second scalar field by said averaged Modulating Variable.

76. An apparatus for Rank Normalization of an input variable with respect to a reference variable as recited in claim 75 wherein the reference variable is analogous to the input variable.

77. An apparatus for analysis of variables operable to transform an input variable into an output variable comprising:

a Probe operable to apply a Probe to a difference of a Displacement Variable and a reference variable producing a first scalar field of said Displacement Variable;

a modulator operable to modulate said first scalar field by an input variable producing a modulated first scalar field of said Displacement Variable;

a first Averaging Filter operable to alter said modulated first scalar field, said first Averaging Filter operable to perform a function selected from the group consisting of time averaging function, spatial averaging function, and time and spatial averaging function so as to produce a second scalar field of said Displacement Variable;

a second Averaging Filter operable to alter said first scalar field, said second Averaging Filter operable to perform a function selected from the group consisting of time averaging function, spatial averaging function, and time and spatial averaging function so as to produce an averaged first scalar field; and a divider operable to divide said second scalar field by said averaged first scalar field.

78. An apparatus for Rank Normalization of an input variable with respect to a reference variable comprising:

(a) a component operable to determine a measure of central tendency of an Amplitude Density of a reference variable;

(b) a component operable to determine a measure of variability of said Amplitude Density of the reference variable; and (c) a Discriminator operable to apply a Discriminator to a difference of said measure of central tendency and the input variable wherein the width parameter of said Discriminator is indicative of said measure of variability.

79. An apparatus for Rank Normalization of an input variable with respect to a reference variable as recited in claim 78 wherein the reference variable is analogous to the input variable.

80. An apparatus for Rank Normalization of an input variable with respect to a reference variable comprising:

(a) a component operable to determine a measure of central tendency of a Modulated Threshold Density of a reference variable;

(b) a component operable to determine a measure of variability of said Modulated Threshold Density of the reference variable; and (c) a Discriminator operable to apply a Discriminator to a difference of said measure of central tendency and the input variable wherein the width parameter of said Discriminator is indicative of said measure of variability.

81. An apparatus for Rank Normalization of an input variable with respect to a reference variable as recited in claim 80 wherein the reference variable is analogous to the input variable.

* * * * *